United States Patent
Oowaki et al.

(10) Patent No.: US 6,545,323 B2
(45) Date of Patent: *Apr. 8, 2003

(54) SEMICONDUCTOR MEMORY DEVICE INCLUDING A PAIR OF MOS TRANSISTORS FORMING A DETECTION CIRCUIT

(75) Inventors: Yukihito Oowaki, Yokohama (JP); Masako Yoshida, Yokohama (JP); Makoto Yoshimi, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/014,662

(22) Filed: Dec. 14, 2001

(65) Prior Publication Data

US 2002/0056878 A1 May 16, 2002

Related U.S. Application Data

(62) Division of application No. 09/658,573, filed on Sep. 8, 2000, now Pat. No. 6,342,408, which is a continuation of application No. 09/291,042, filed on Apr. 14, 1999, now Pat. No. 6,130,461, which is a continuation of application No. 08/569,844, filed on Dec. 8, 1995, now Pat. No. 5,895,956.

(30) Foreign Application Priority Data

Dec. 8, 1994 (JP) .............................................. 6-305215
Mar. 16, 1995 (JP) .............................................. 7-083455

(51) Int. Cl.[7] .............................................. H01L 29/76
(52) U.S. Cl. ........................ 257/365; 257/347; 257/349; 257/350; 257/351; 257/365; 257/366; 257/368; 257/369; 257/616; 438/284; 438/752
(58) Field of Search .................................. 257/365, 366, 257/368, 369, 347, 349, 350, 351, 616; 438/284, 752

(56) References Cited

U.S. PATENT DOCUMENTS

| 3,919,569 A | 11/1975 | Gaensslen et al. |
| 4,111,719 A | 9/1978 | Mader et al. |
| 4,377,030 A | 3/1983 | Pettenpaul et al. |

(List continued on next page.)

FOREIGN PATENT DOCUMENTS

| DE | 3527098 A1 | 1/1987 |
| JP | 1-33949 | 7/1989 |
| JP | 3-119764 | 5/1991 |

(List continued on next page.)

OTHER PUBLICATIONS

Anonymous, Enhanced FET design, Jun. 1992, Derwent Information LTD, 1992–224313.

IBM Technical Disclosure Bulletin, Dec. 1989, US, NN8912141.

(List continued on next page.)

Primary Examiner—Carl Whitehead, Jr.
Assistant Examiner—Edgardo Ortiz
(74) Attorney, Agent, or Firm—Oblon, Spivak, McClelland, Maier & Neustadt, P.C.

(57) ABSTRACT

A semiconductor device includes a semiconductor layer used as a substrate formed on an insulating film, a plurality of MOS transistors arranged on the semiconductor layer and each having a gate, a source, and a drain, a pair of MOS transistors of the plurality of MOS transistors constituting a detection circuit for detecting magnitudes of potentials applied to the gates as a difference between conductances of the pair of transistors, and a diffusion layer region of the same conductivity type as that of the semiconductor layer, arranged on one of portions of the sources and drains of the pair of MOS transistors constituting the detection circuit, for connecting portions serving as the substrates of the pair of MOS transistors to each other.

34 Claims, 88 Drawing Sheets

U.S. PATENT DOCUMENTS

| | | | |
|---|---|---|---|
| 5,001,528 A | | 3/1991 | Bahraman |
| 5,272,365 A | * | 12/1993 | Nakagawa .................. 257/194 |
| 5,298,773 A | | 3/1994 | Woodruff |
| 5,496,745 A | | 3/1996 | Ryum et al. |
| 5,683,934 A | * | 11/1997 | Candelaria .................. 437/134 |
| 5,726,459 A | * | 3/1998 | Hsu et al. ..................... 257/55 |
| 5,757,045 A | | 5/1998 | Tsai et al. |
| 5,895,956 A | * | 4/1999 | Oowaki et al. ............. 257/330 |
| 6,051,452 A | | 4/2000 | Shigyo et al. |
| 6,130,461 A | * | 10/2000 | Oowaki et al. ............. 257/369 |
| 6,285,073 B1 | * | 9/2001 | Cooper et al. ............. 257/648 |

FOREIGN PATENT DOCUMENTS

| | | |
|---|---|---|
| JP | 5-3322 | 1/1993 |
| JP | 405006995 A | 1/1993 |
| JP | 6-163920 | 6/1994 |
| JP | 616370 A2 | 9/1994 |
| TW | 251379 A | 7/1995 |

OTHER PUBLICATIONS

IBM Technical Disclosure Bulletin, Jul. 1992, US, NN9207472.

* cited by examiner

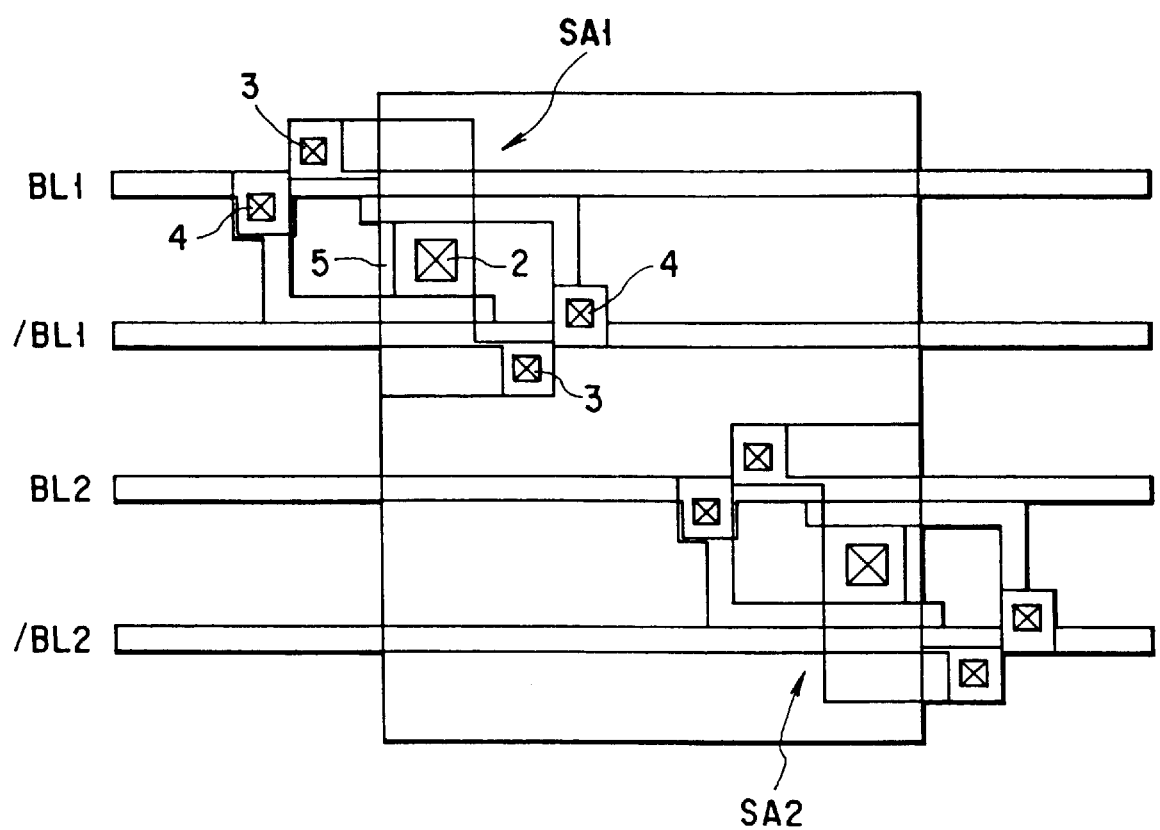
F I G. 13

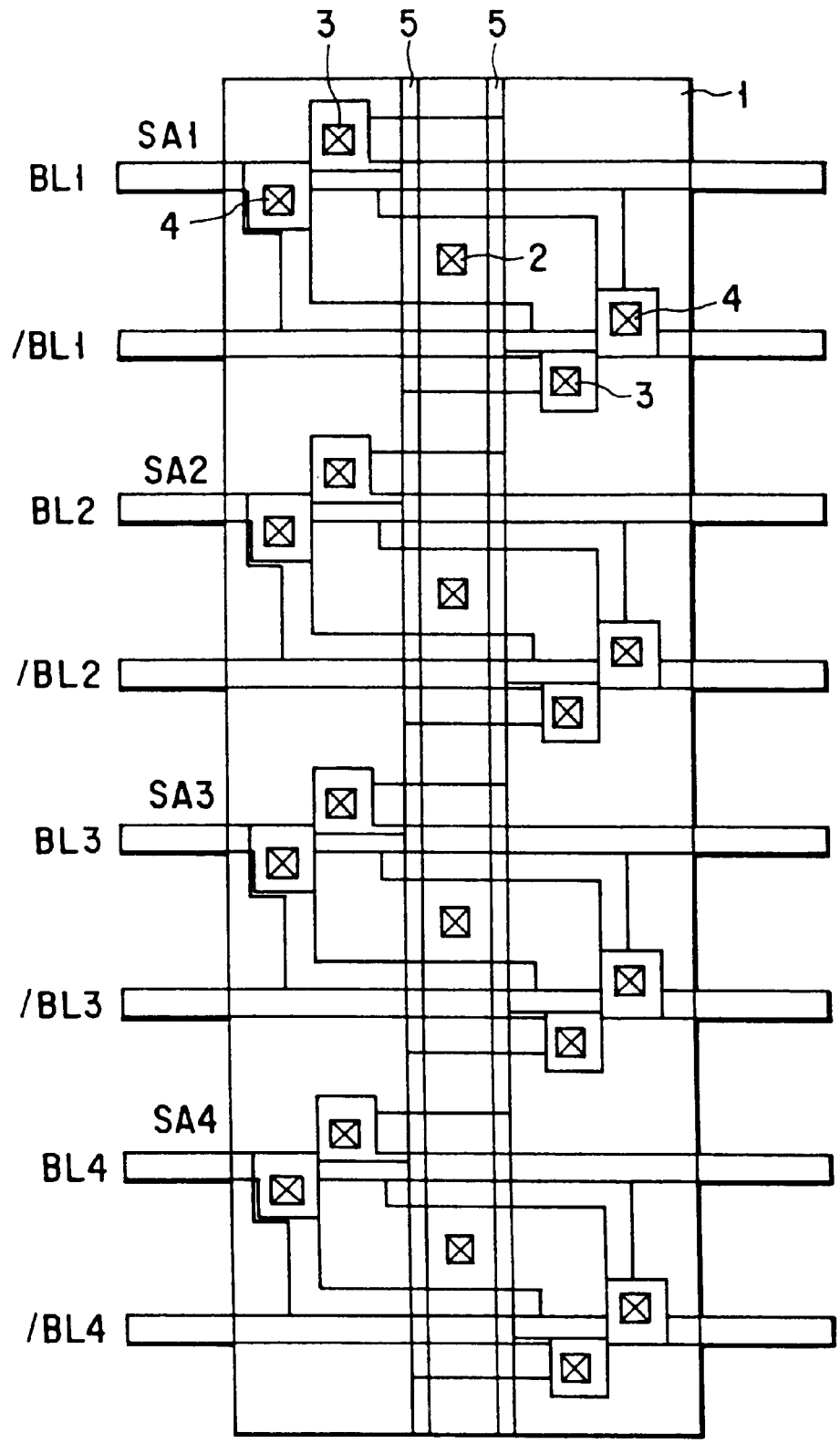
F I G. 18

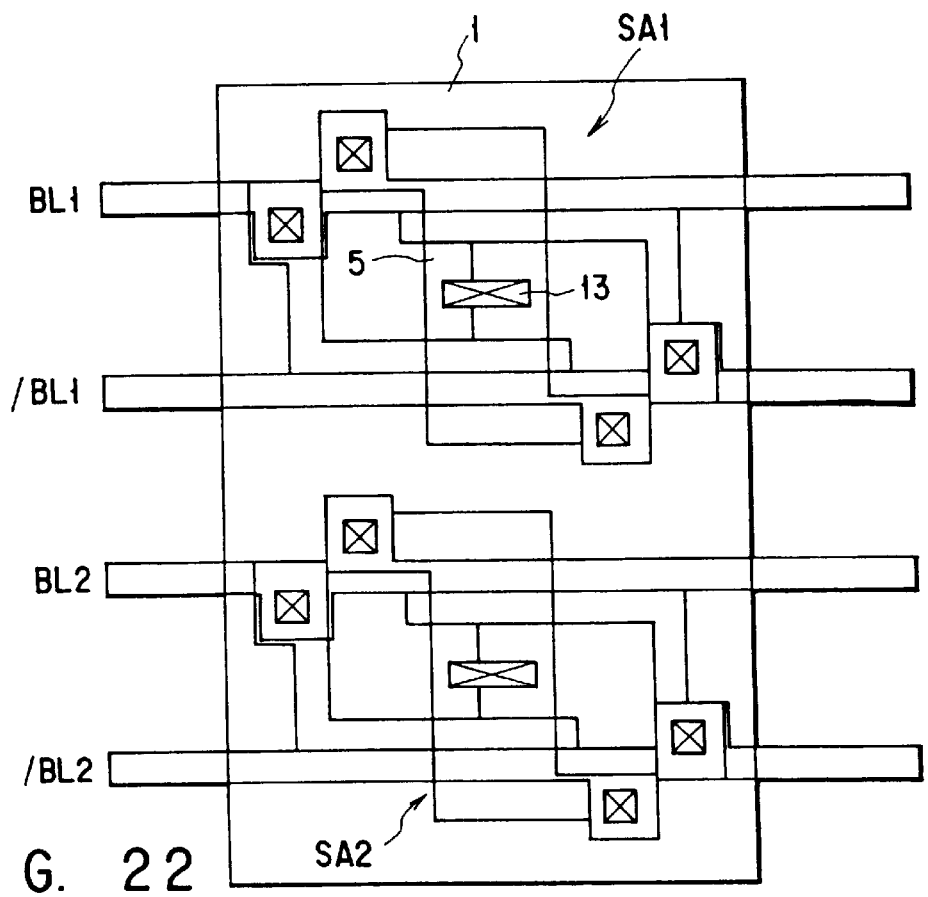
F I G. 22
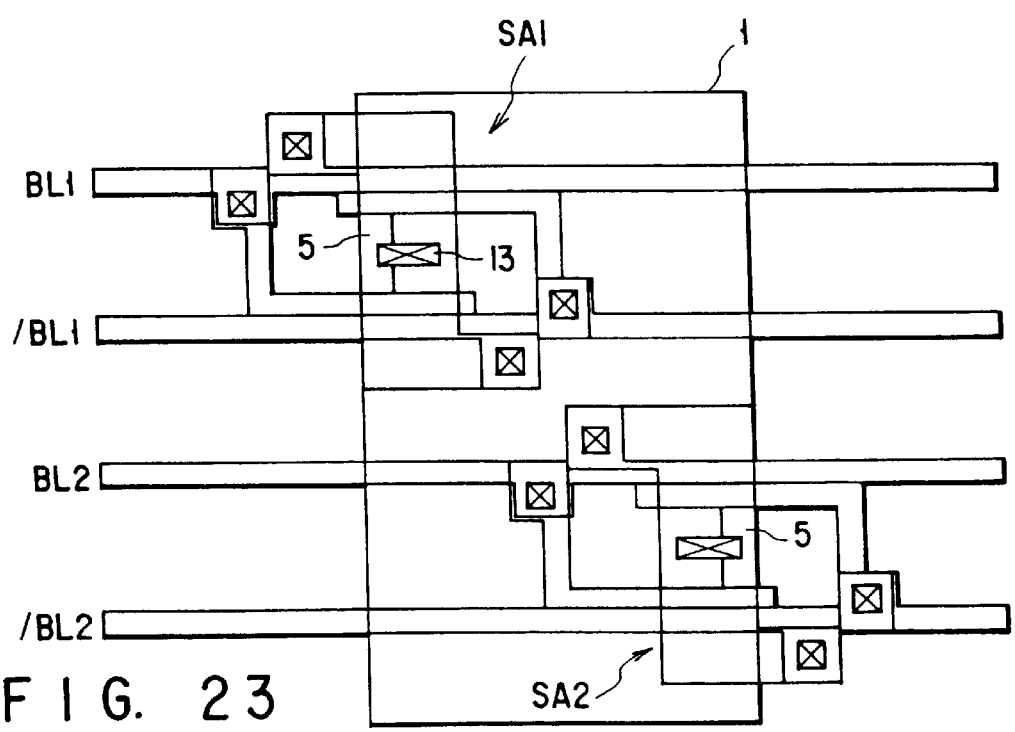
F I G. 23

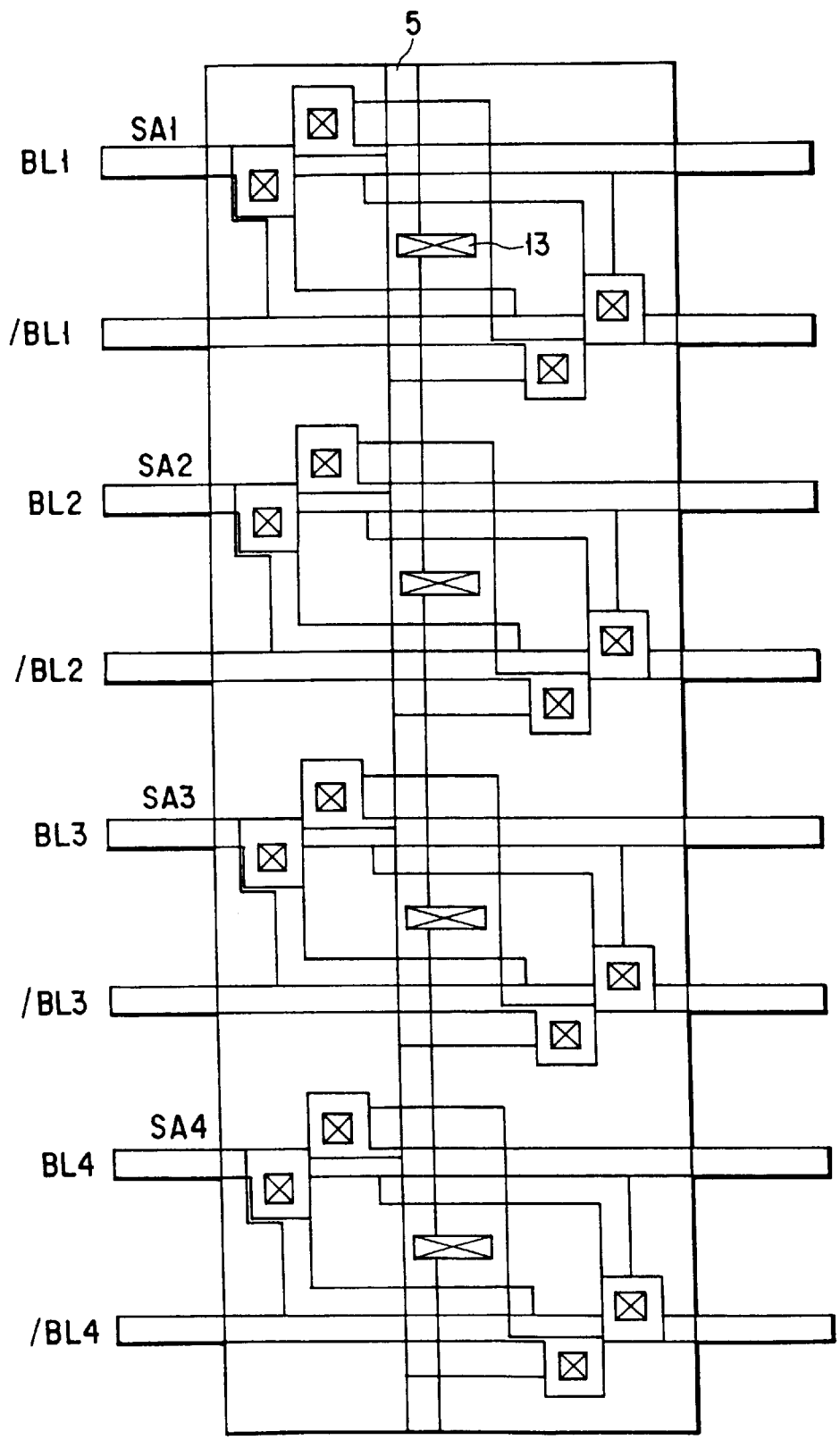
F I G. 26

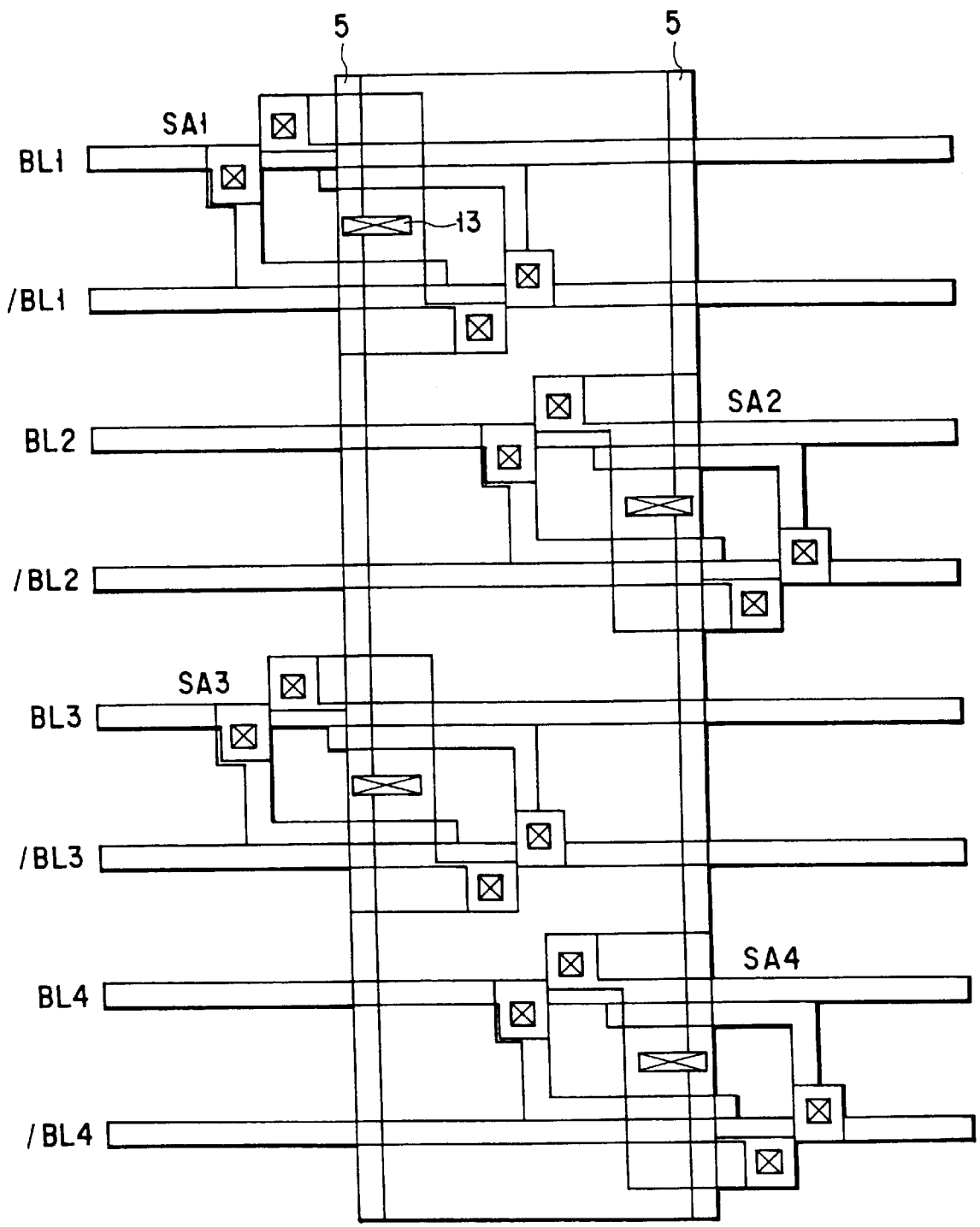
F I G. 27

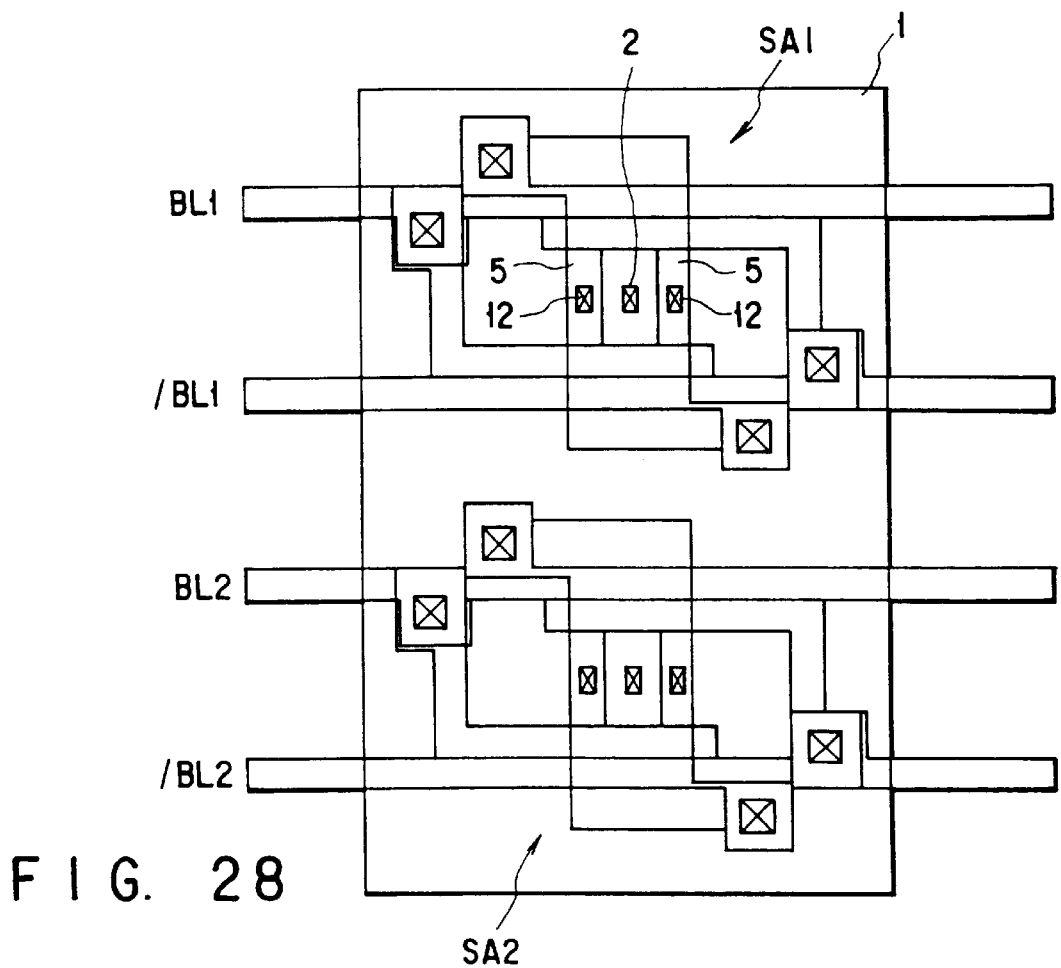
F I G. 28
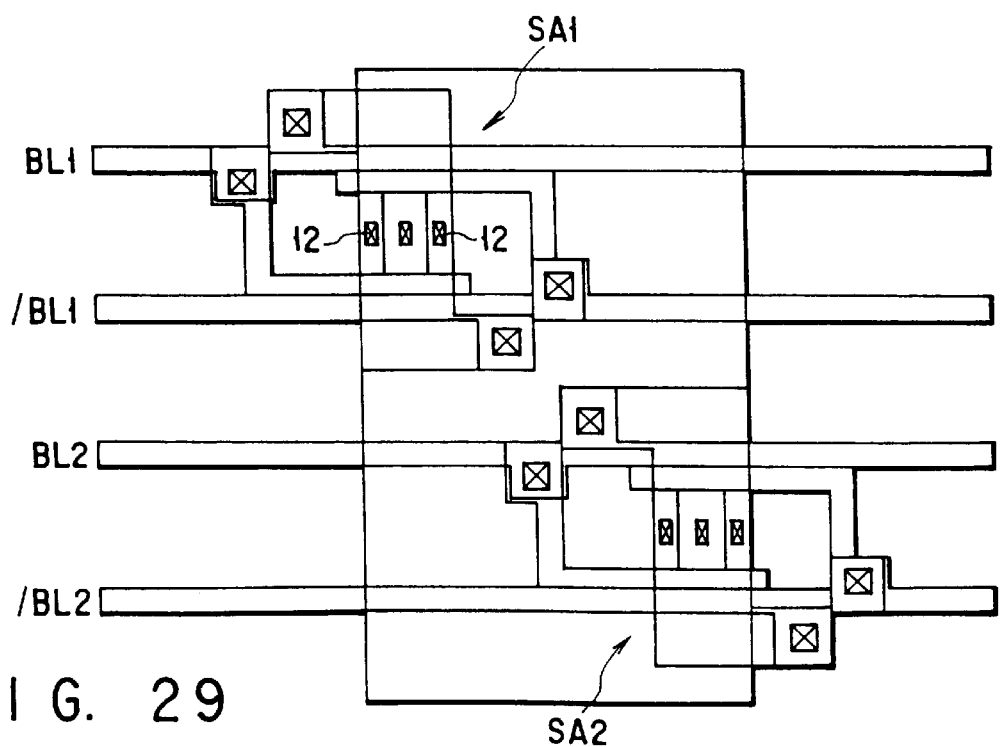
F I G. 29

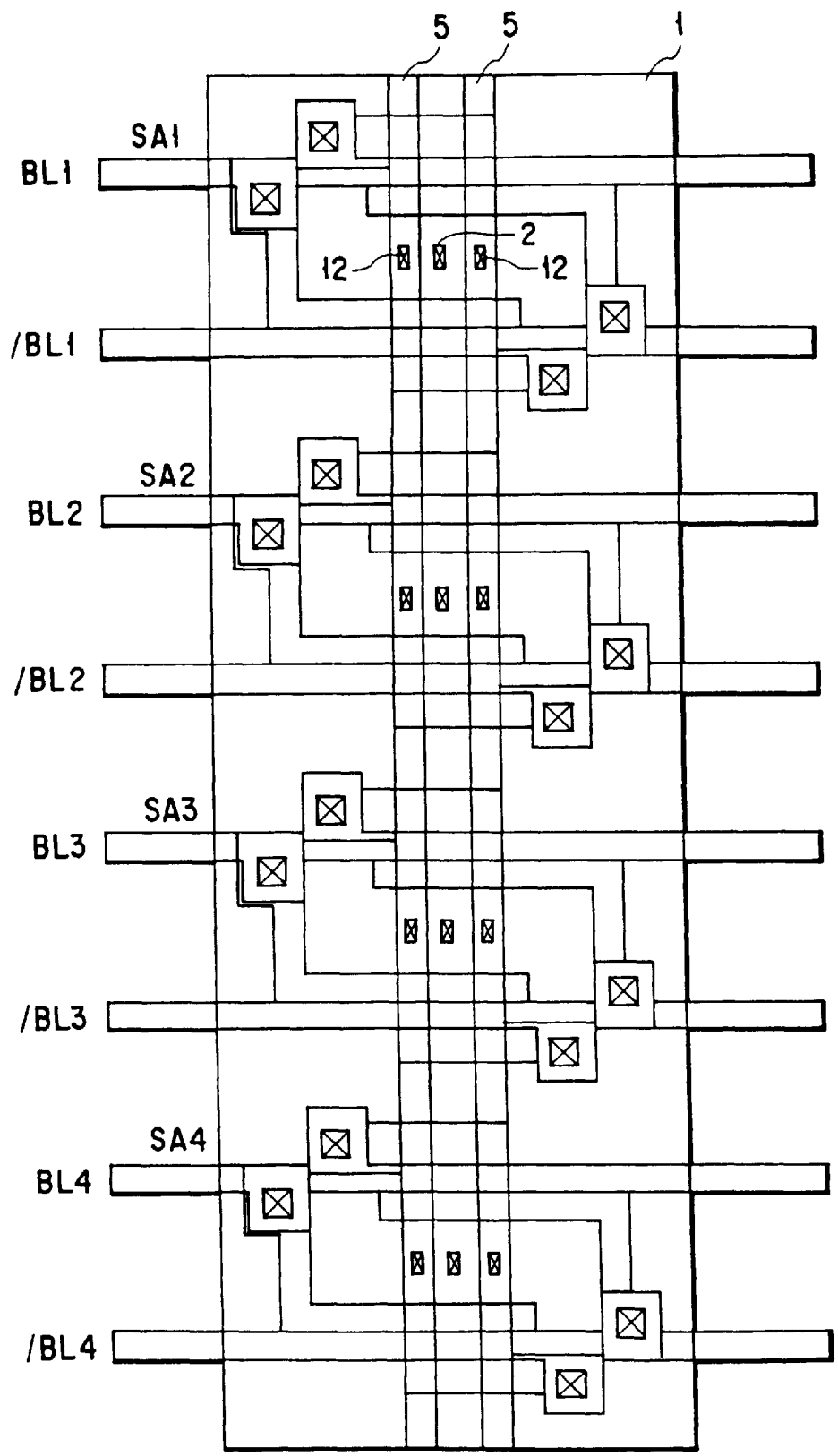
F I G. 32

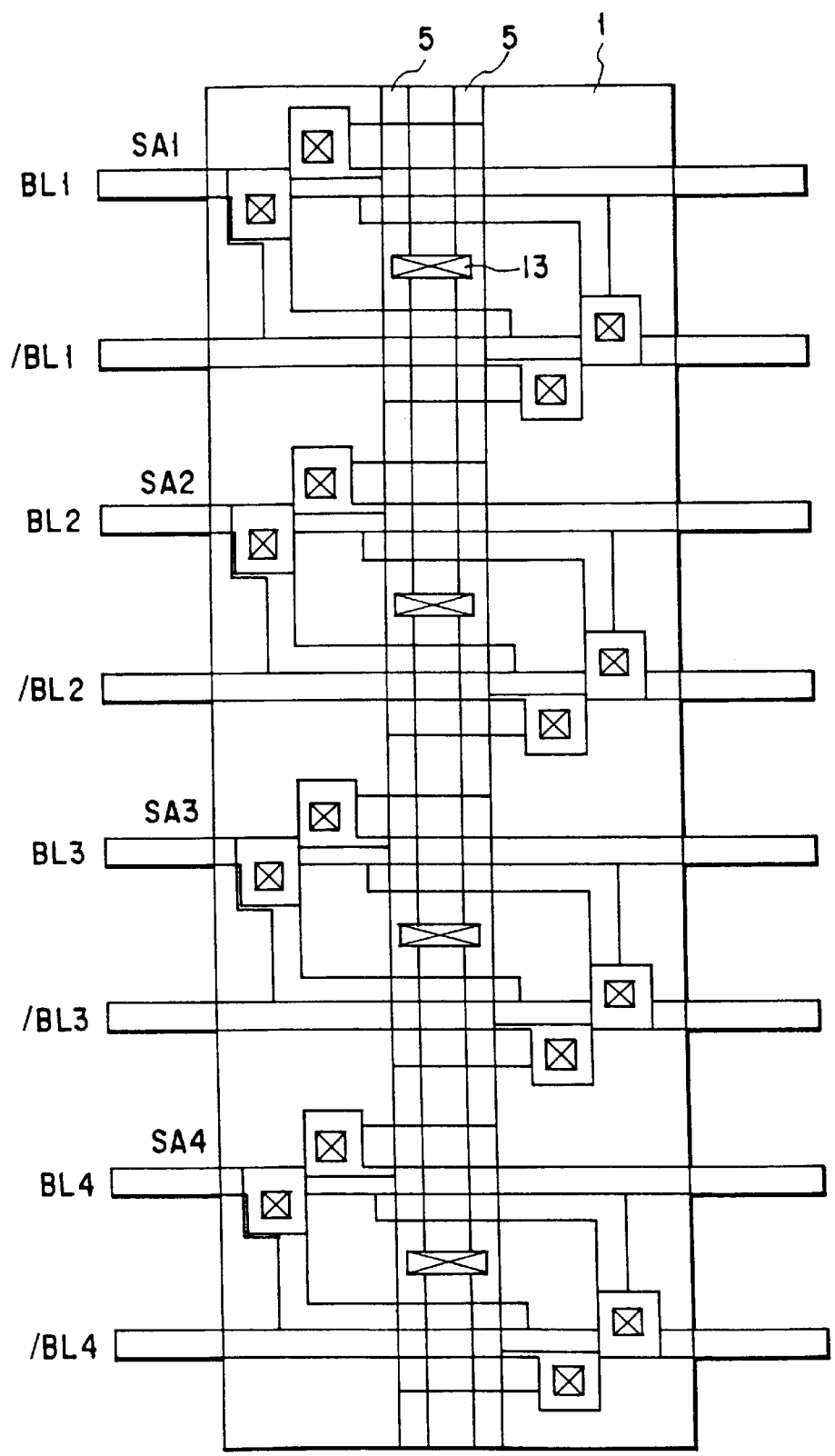
F I G. 34

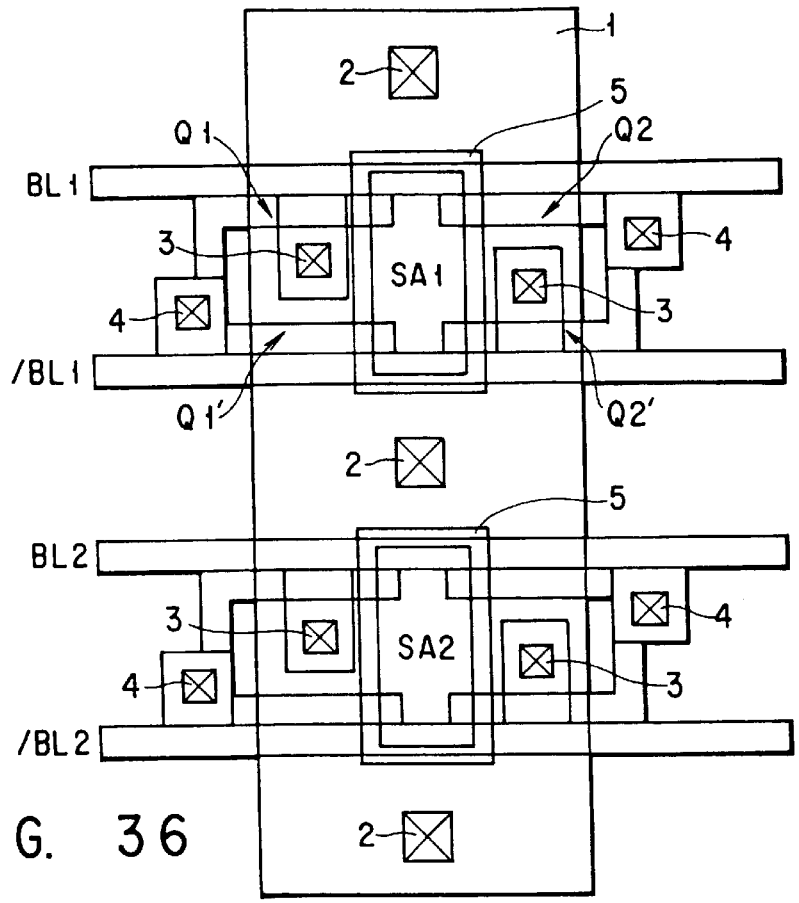
F I G. 36
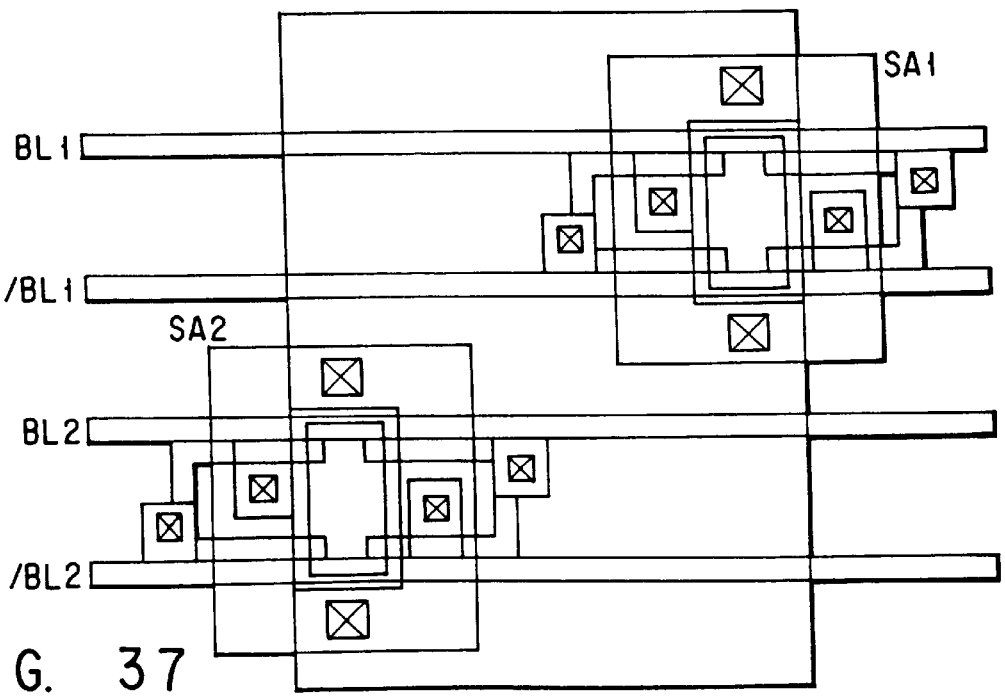
F I G. 37

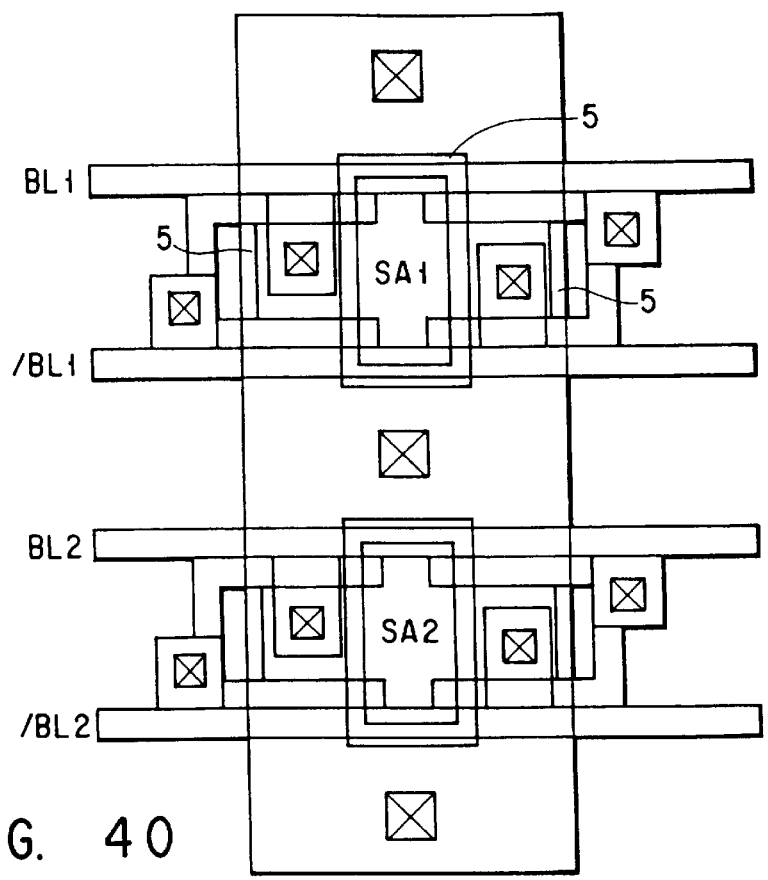
F I G. 40
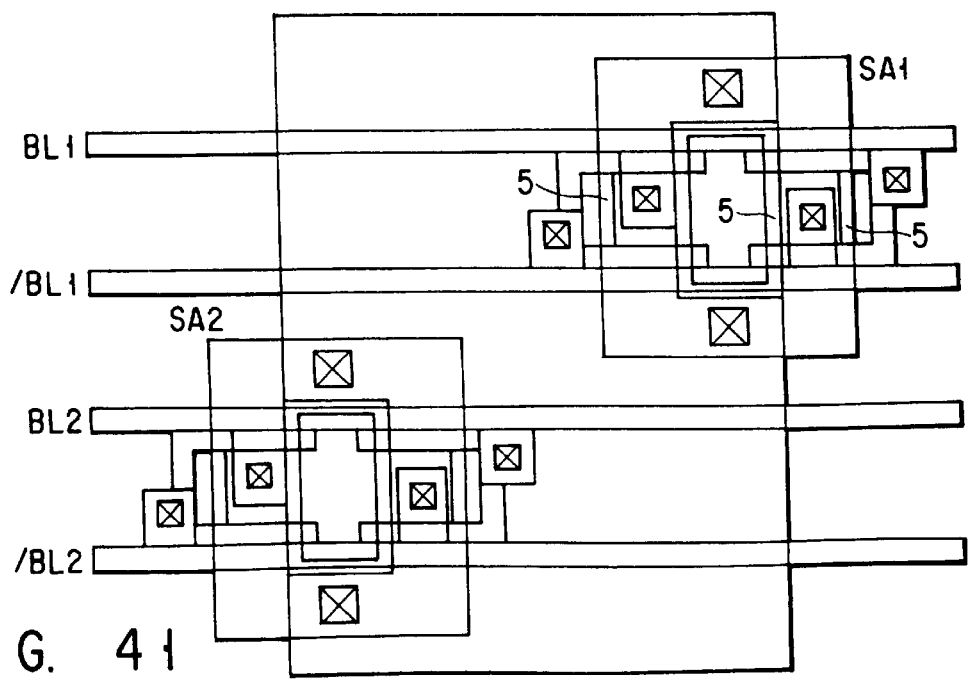
F I G. 41

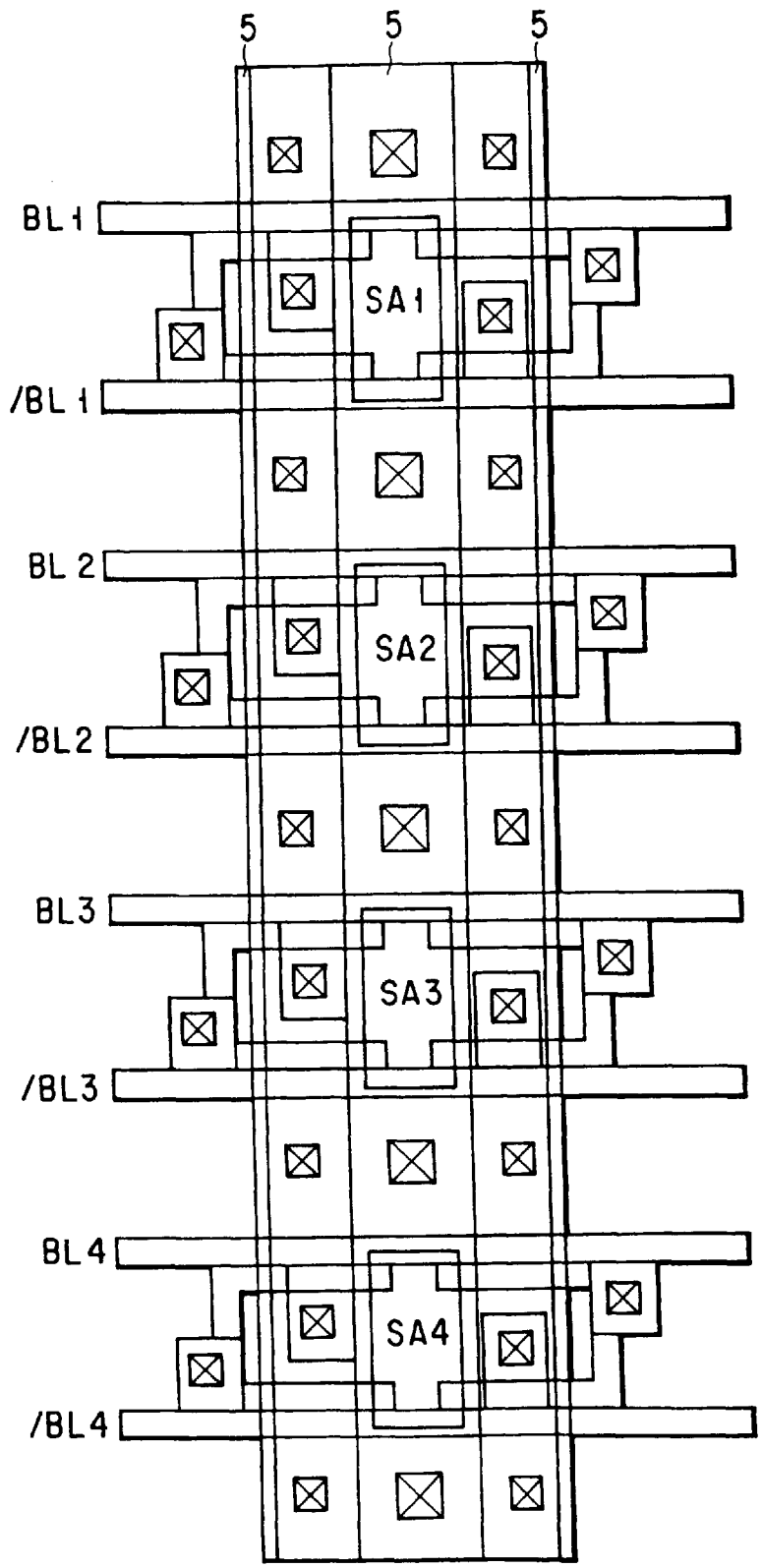
F I G. 42

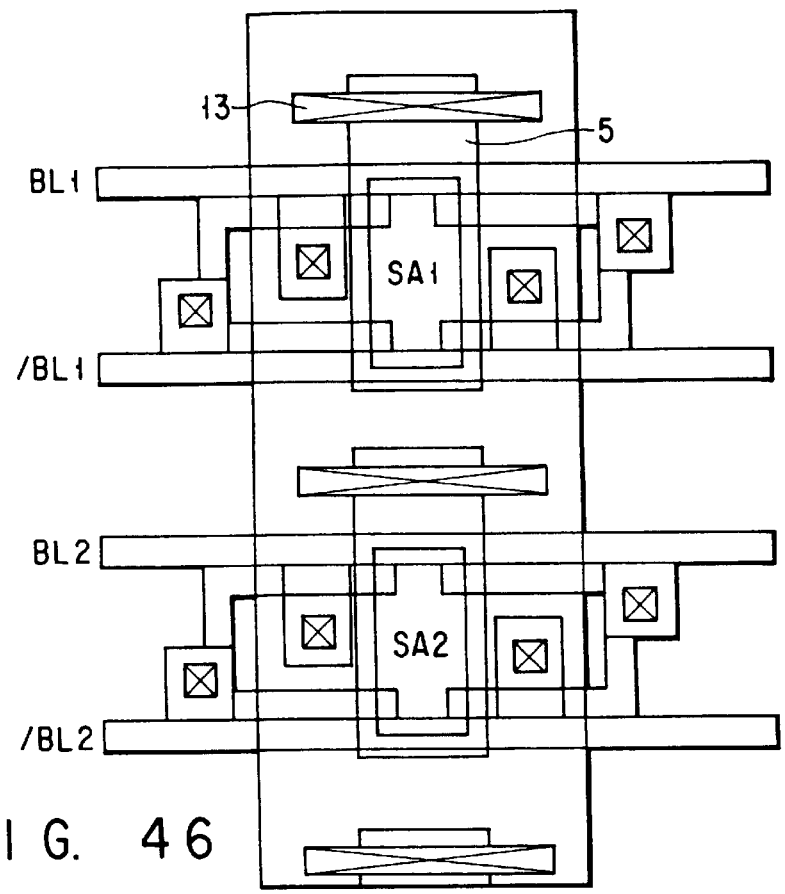
F I G. 46
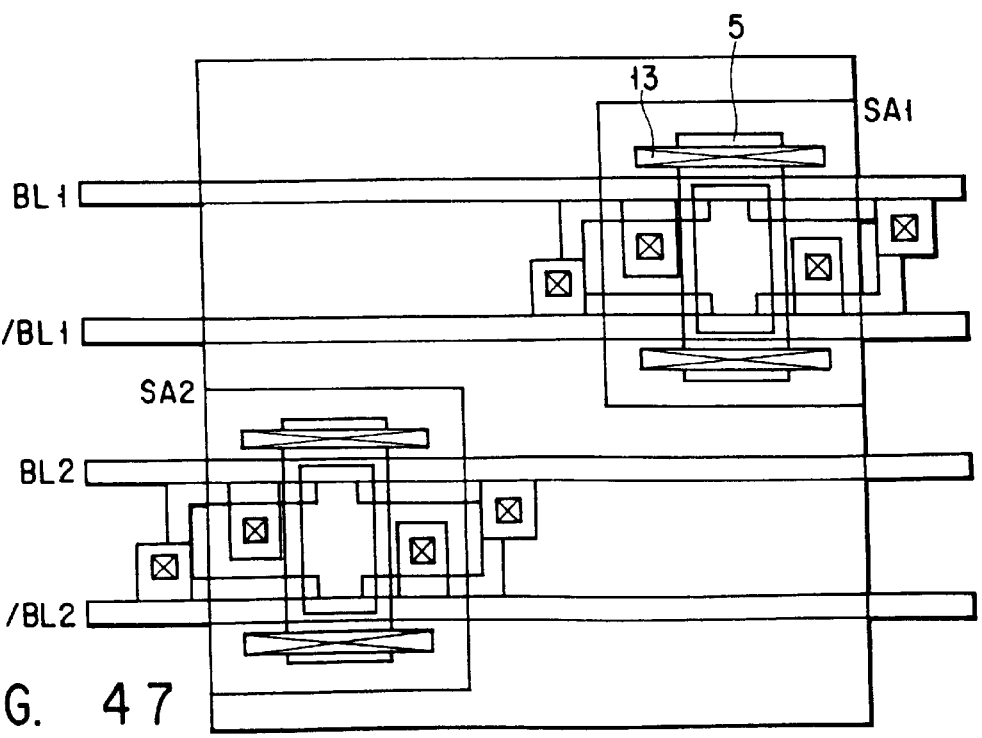
F I G. 47

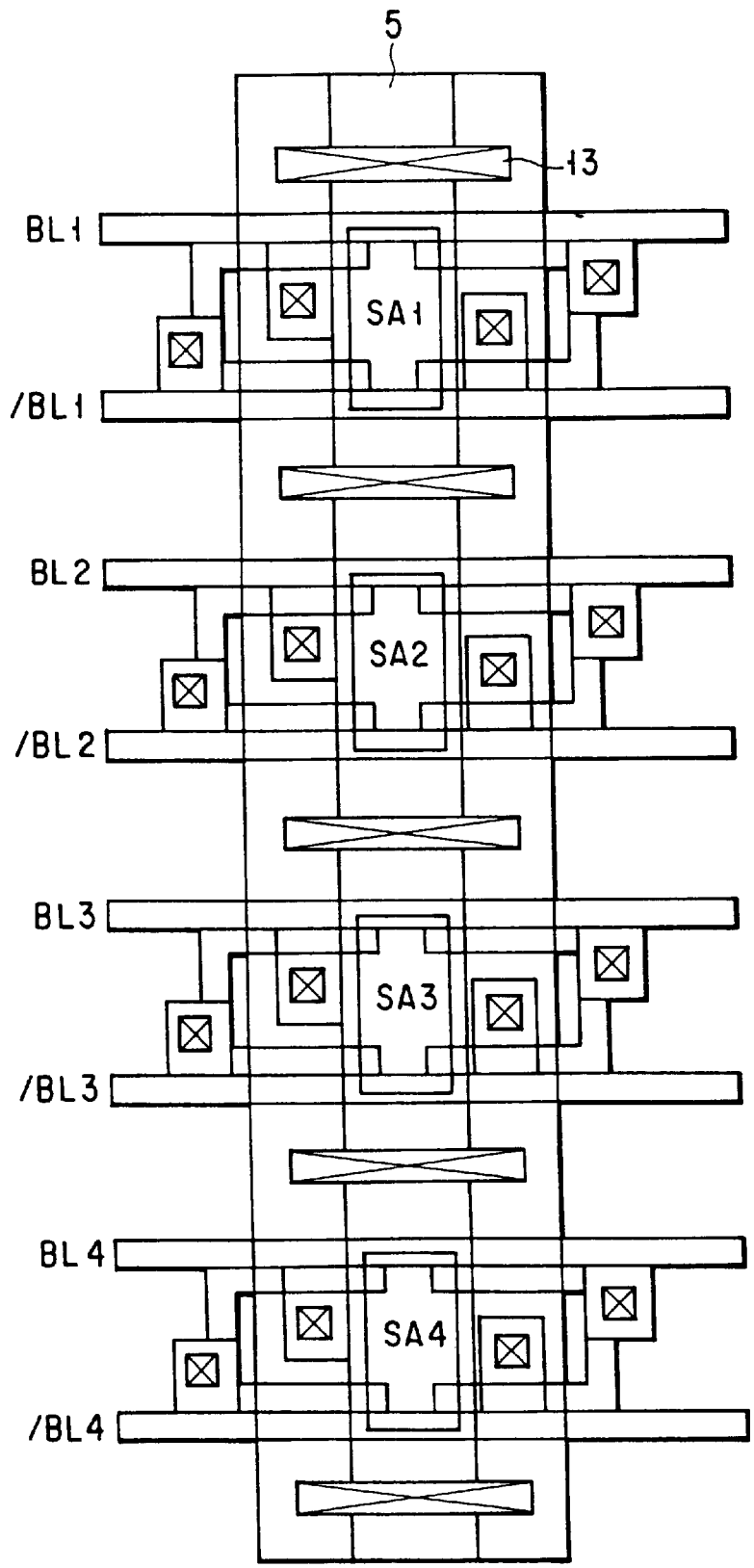
F I G. 50

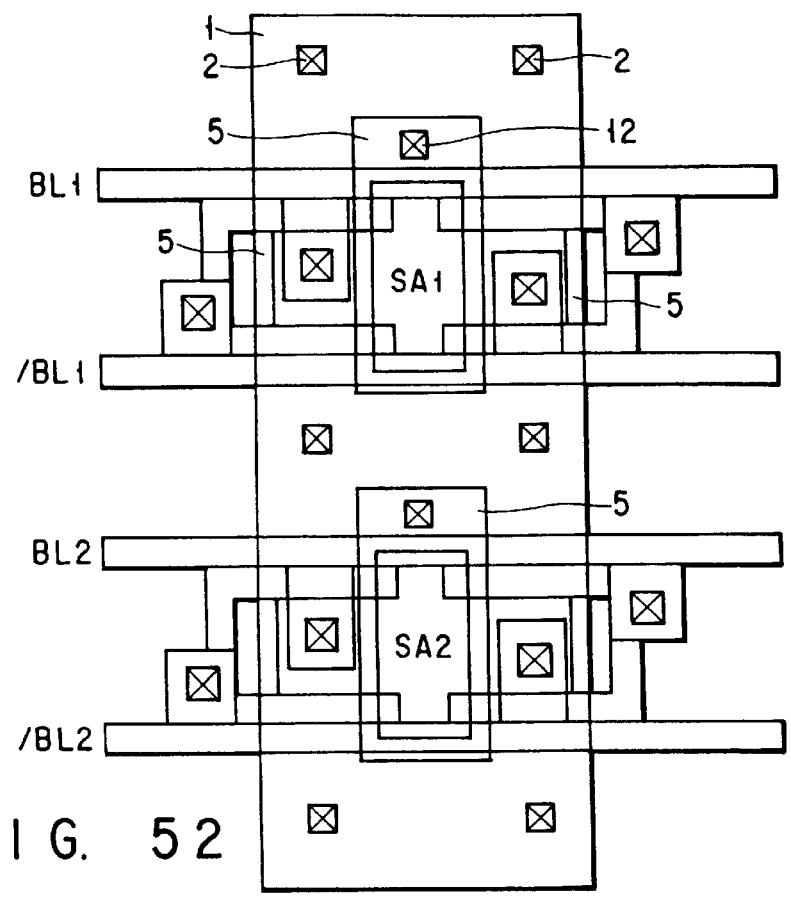
F I G. 52
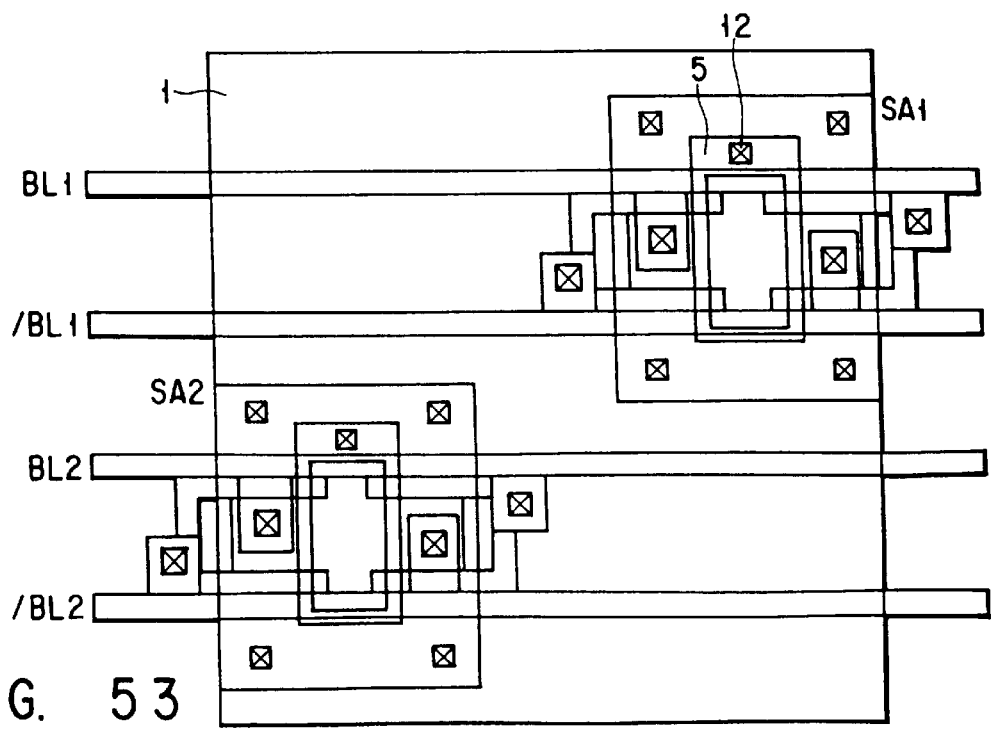
F I G. 53

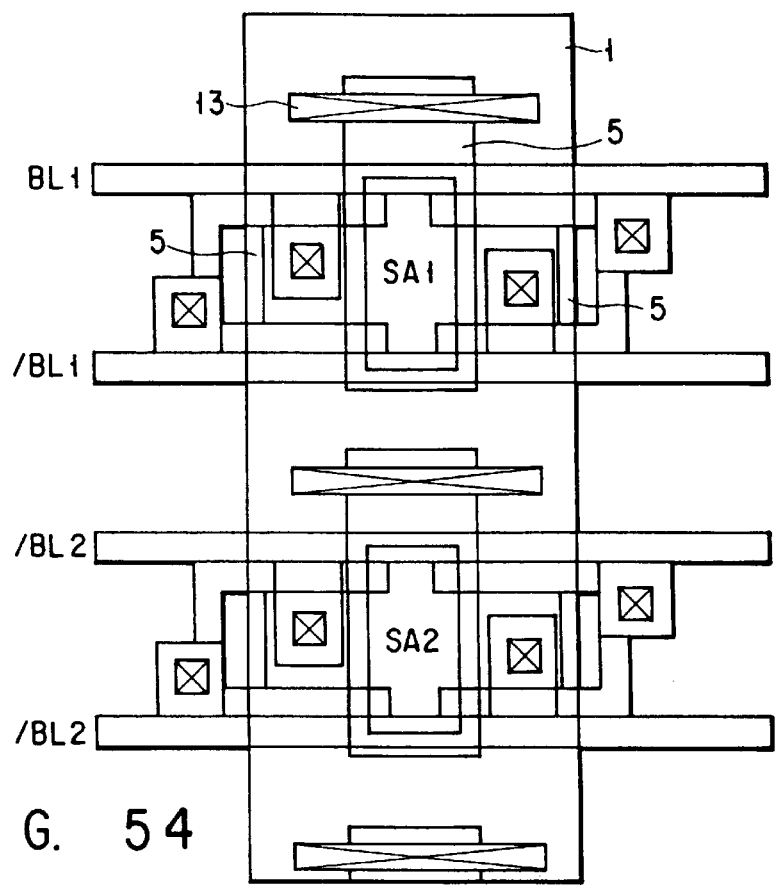
F I G. 54
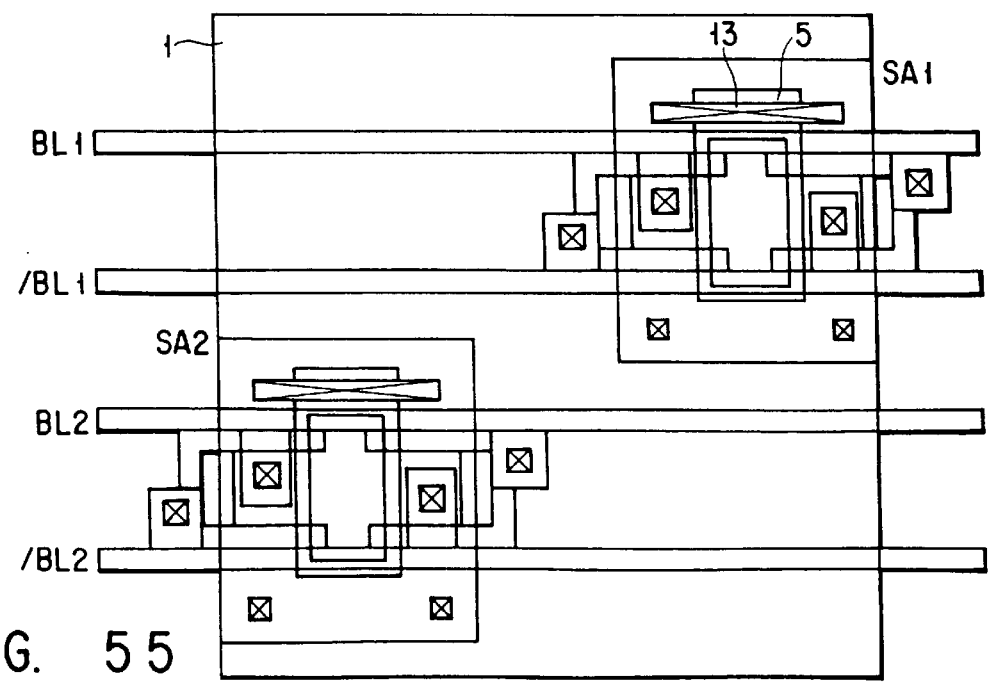
F I G. 55

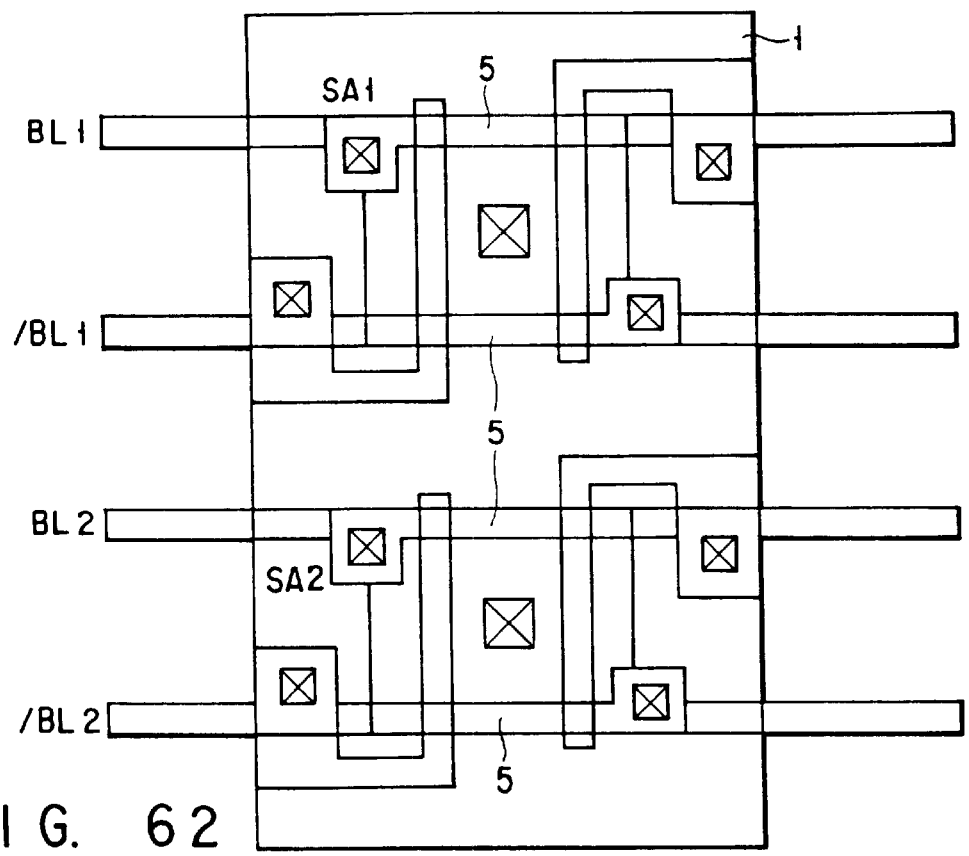
F I G. 62
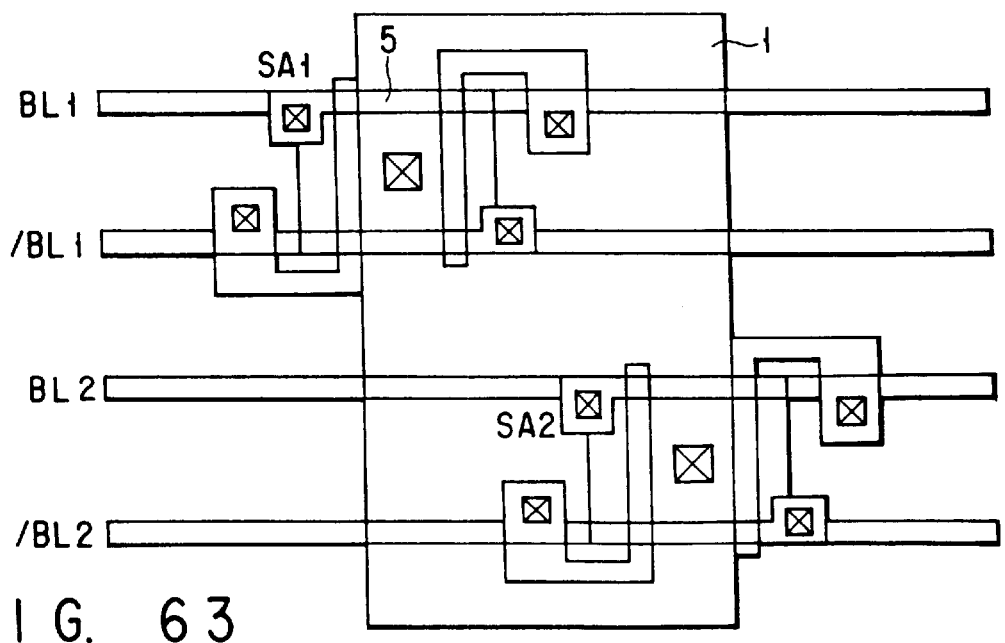
F I G. 63

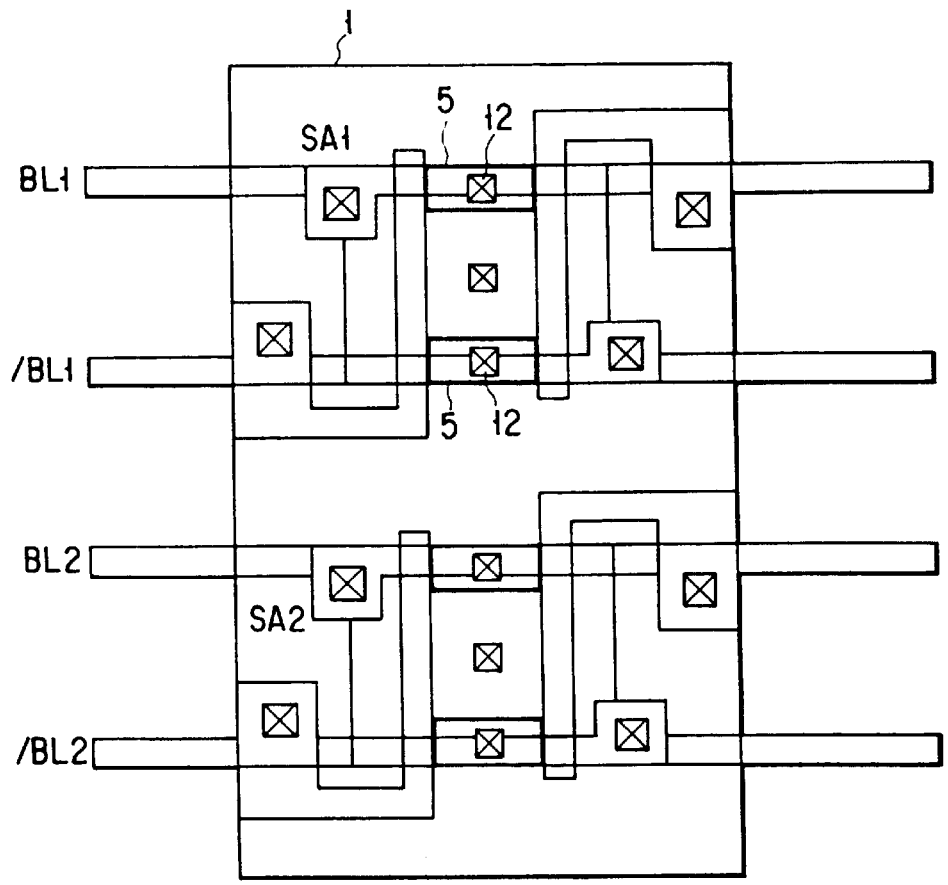
F I G. 68
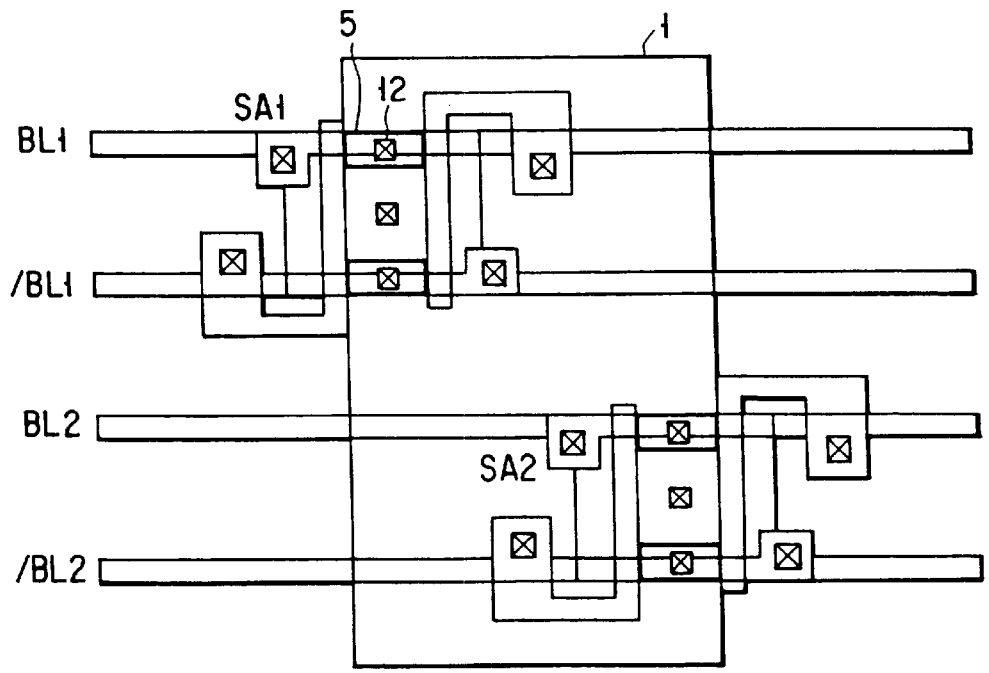
F I G. 69

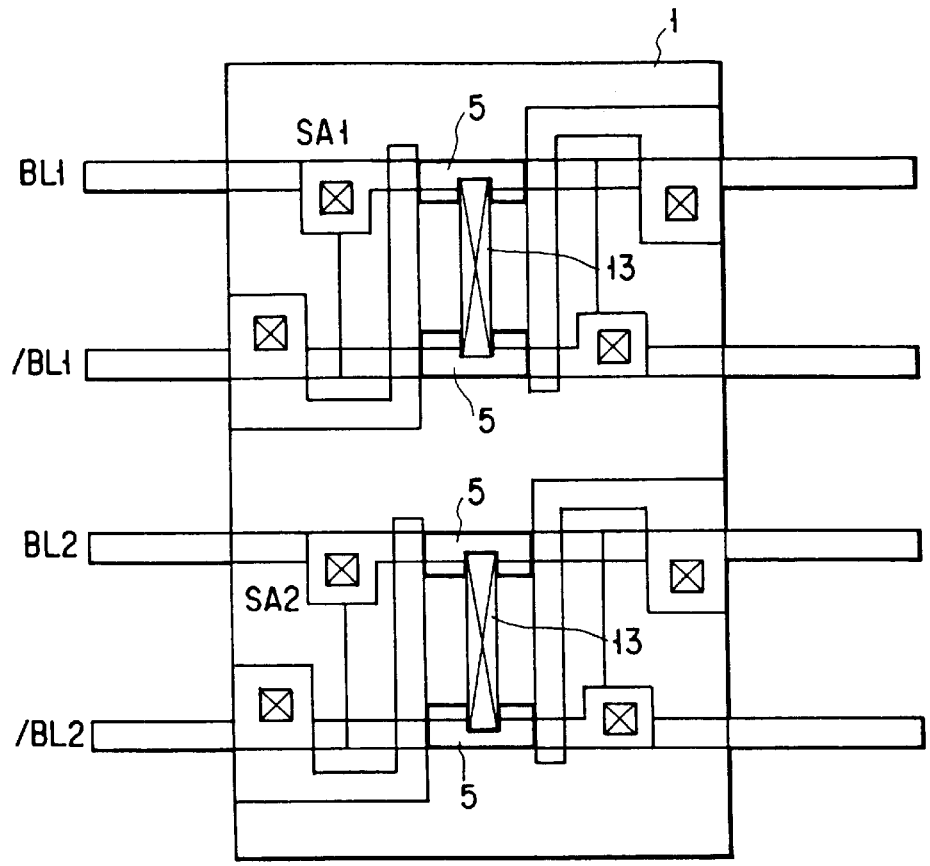
F I G. 70
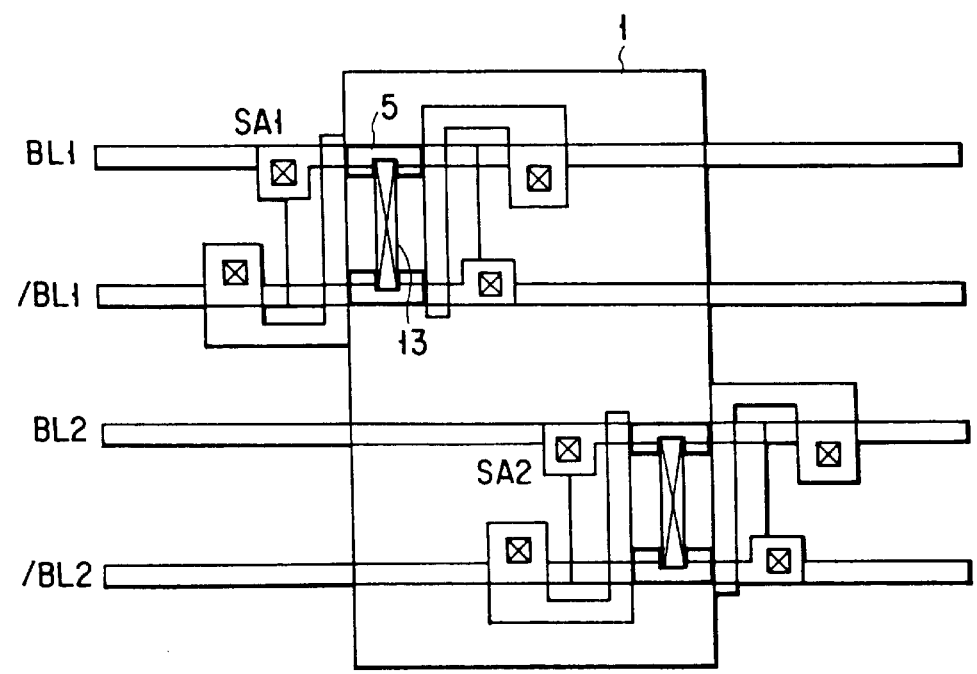
F I G. 71

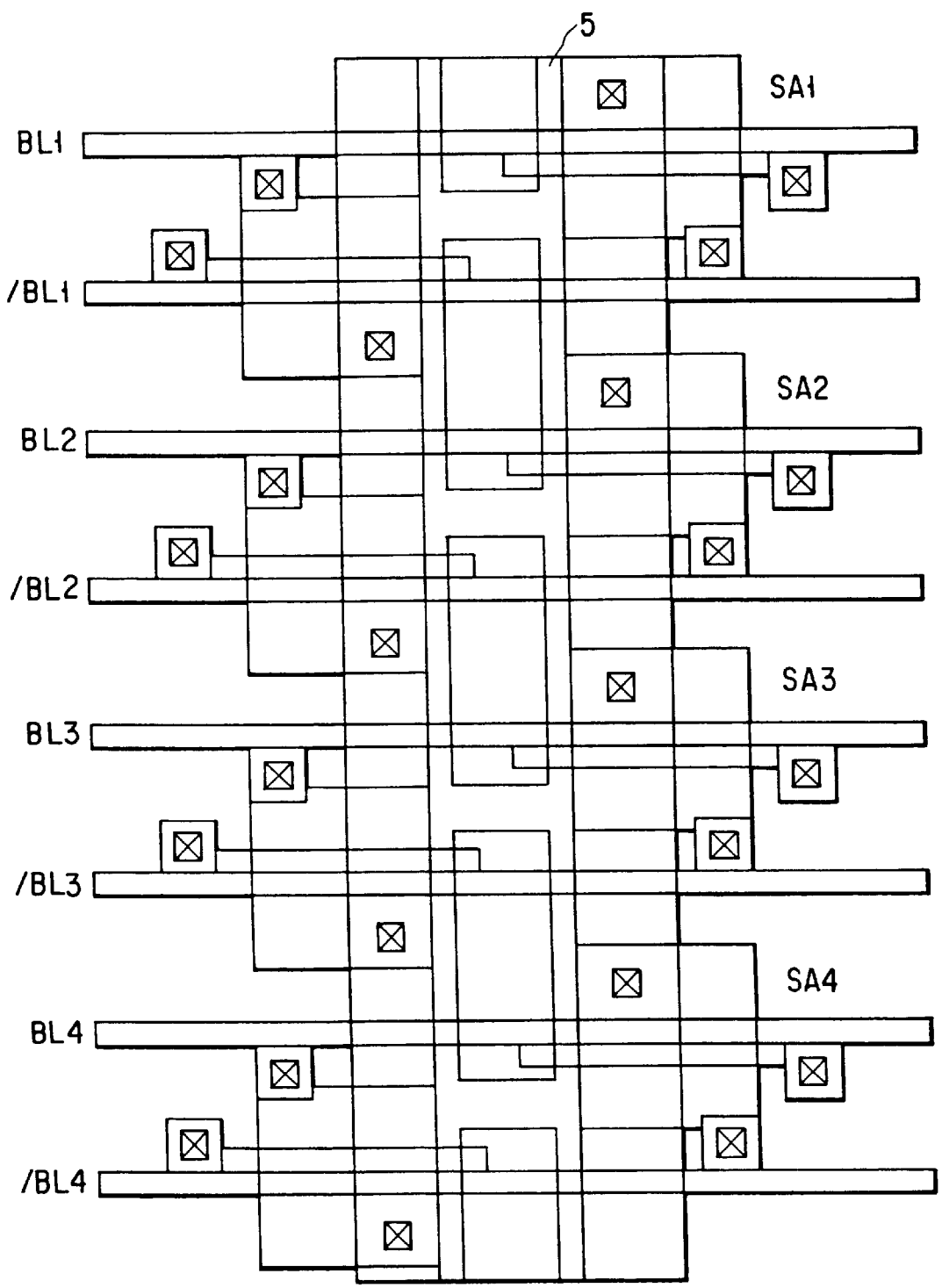
F I G. 74

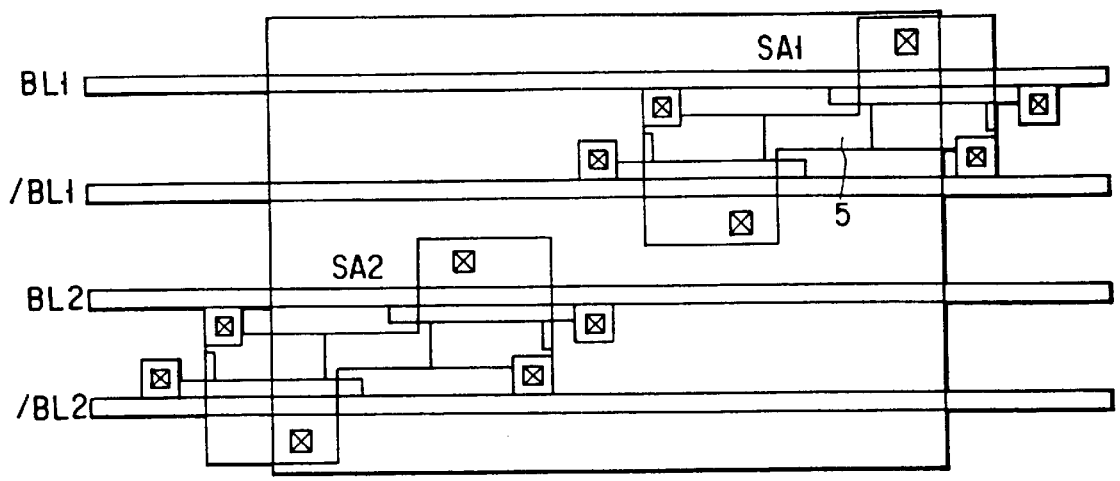
F I G. 77
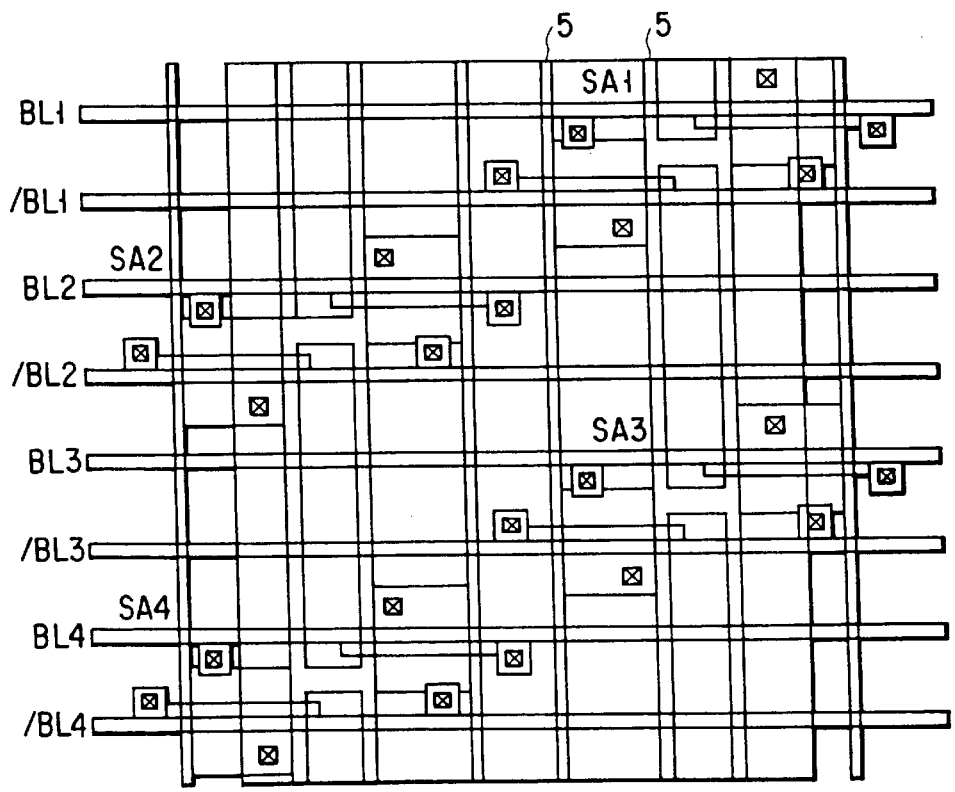
F I G. 79

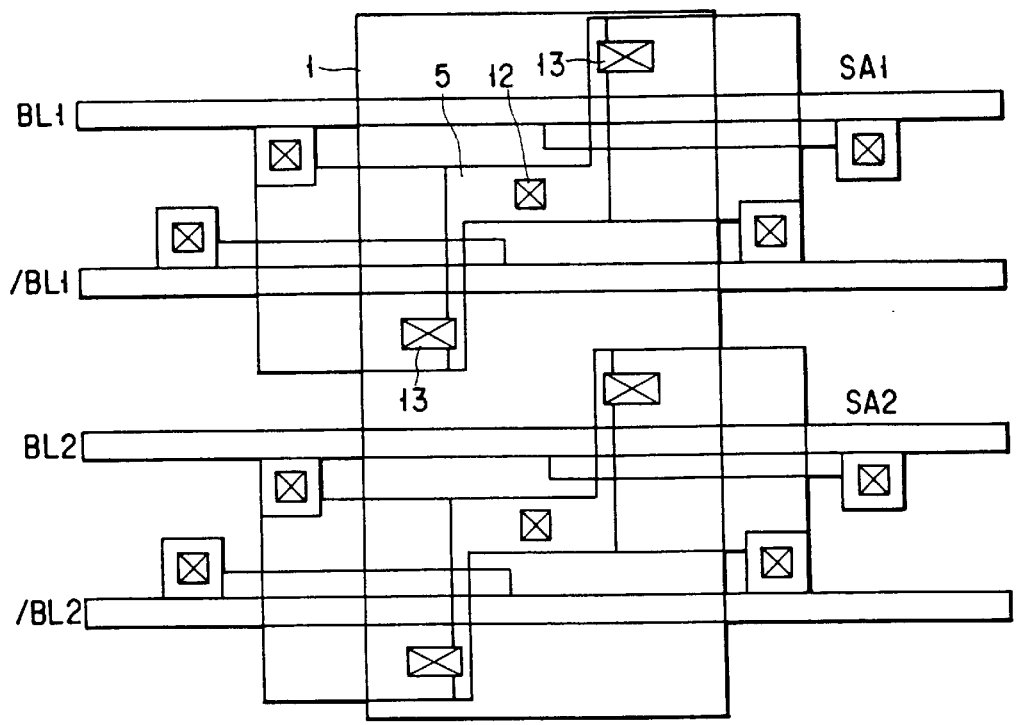
F I G. 82
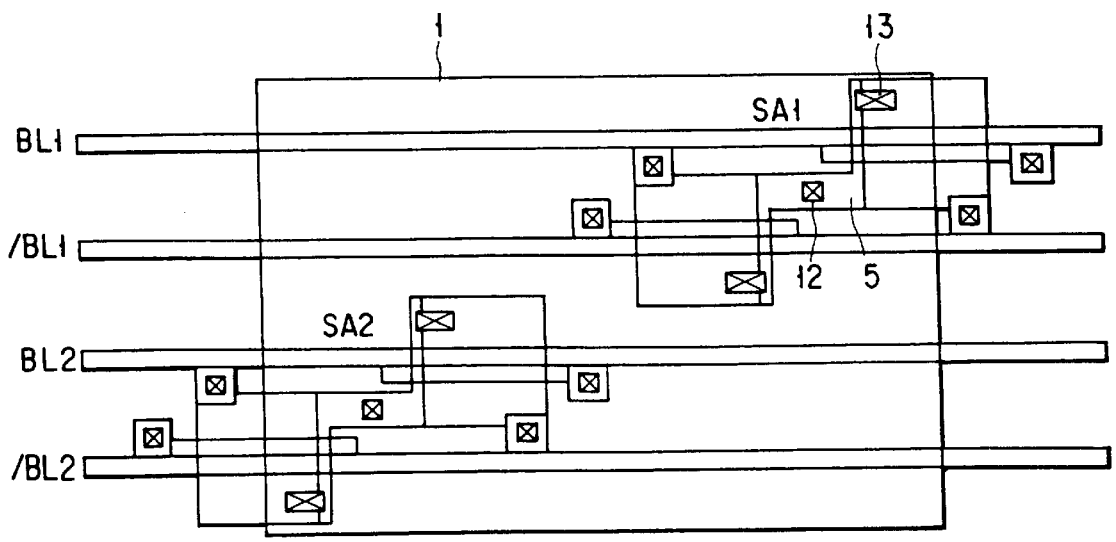
F I G. 83

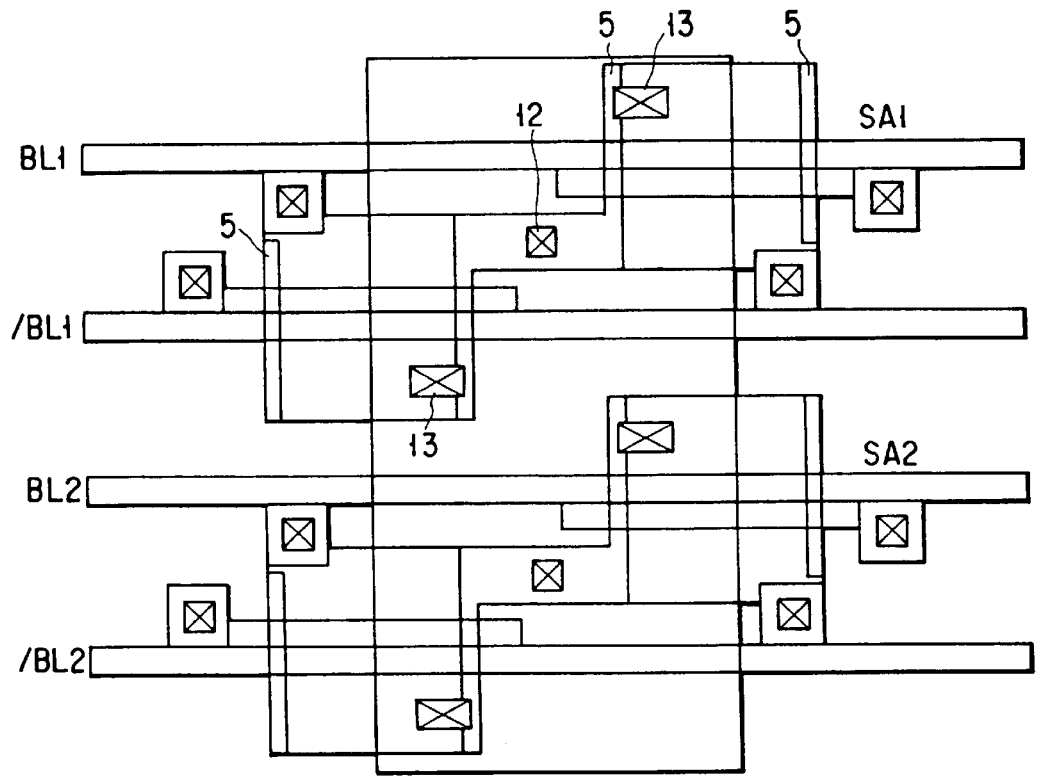
F I G. 90
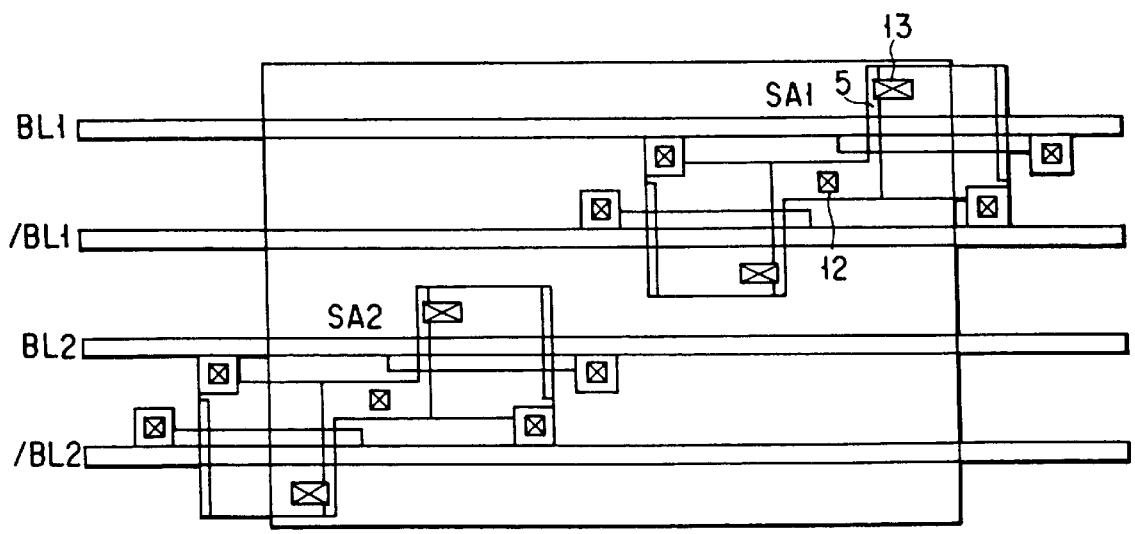
F I G. 91

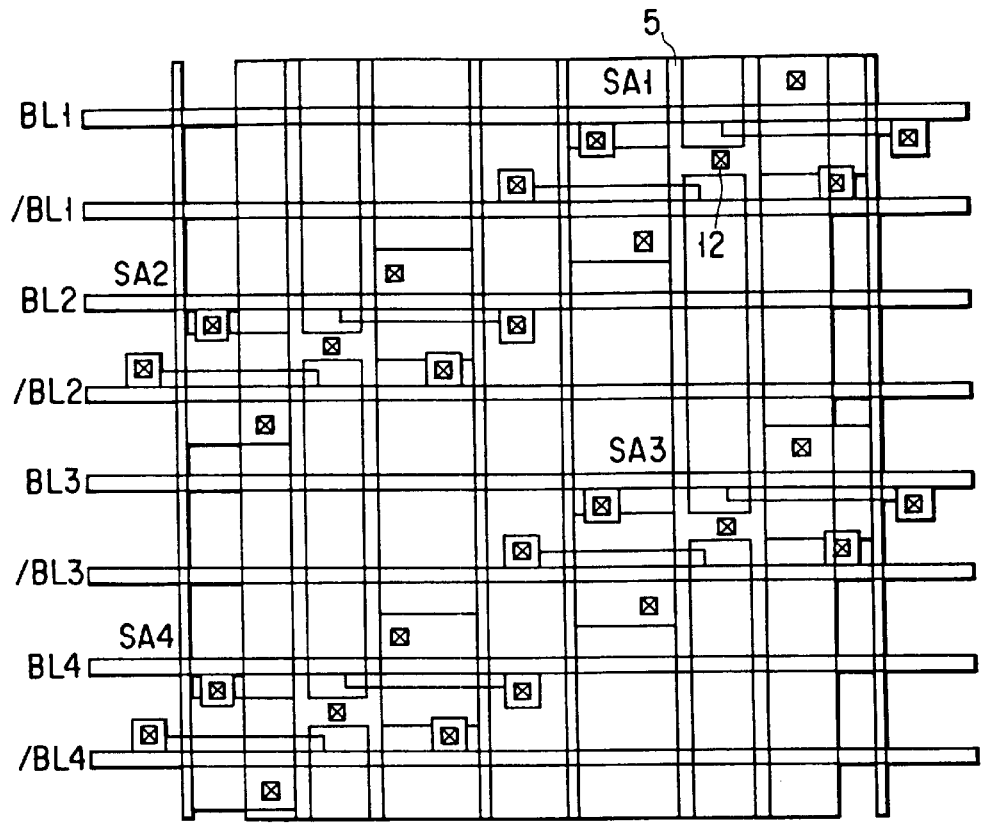
F I G. 93
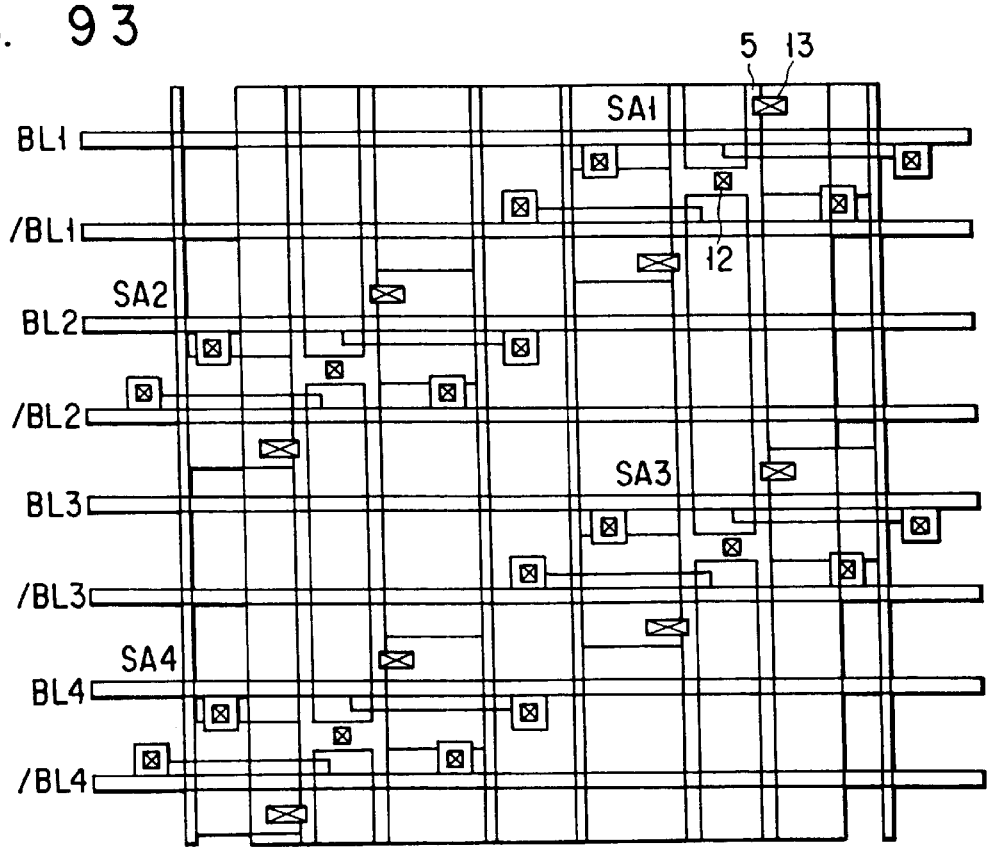
F I G. 95

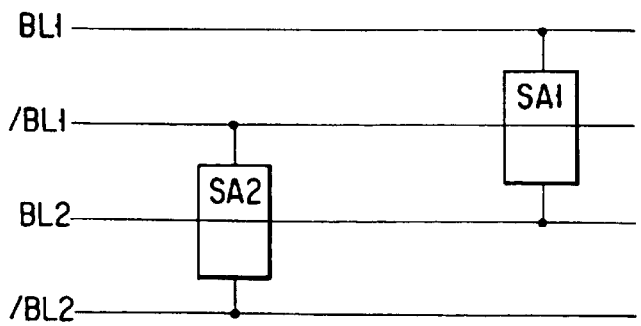
F I G. 96
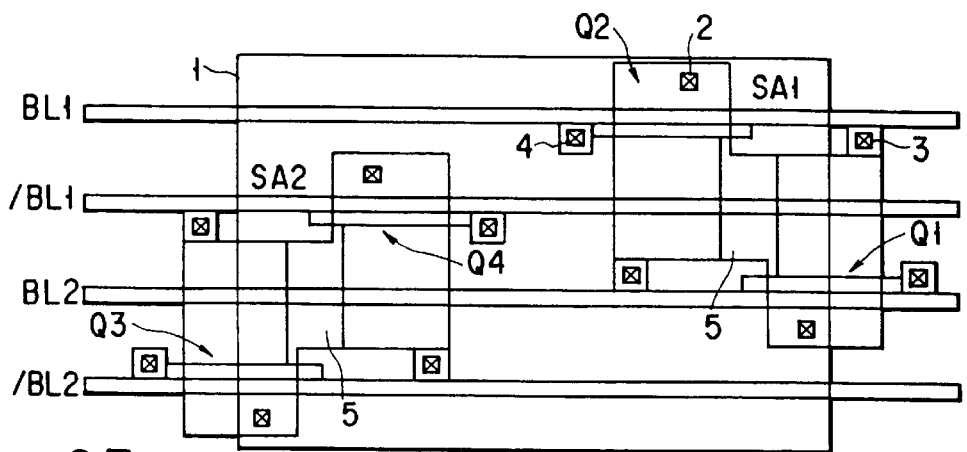
F I G. 97
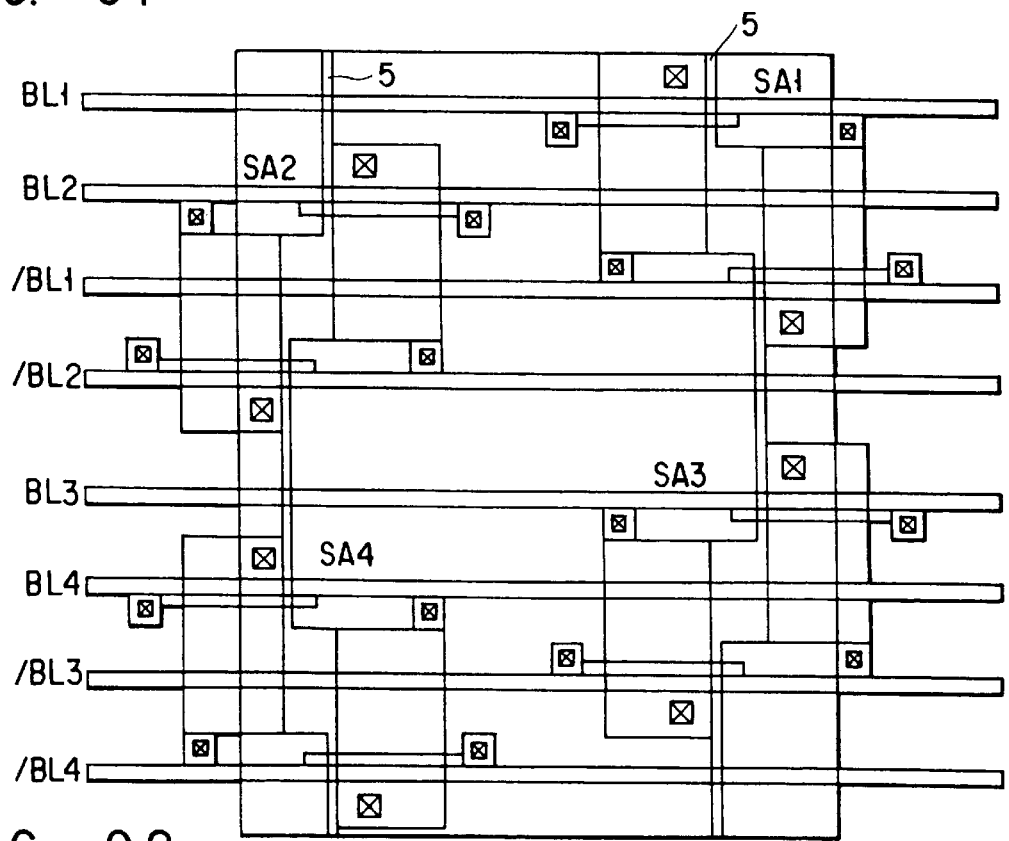
F I G. 98

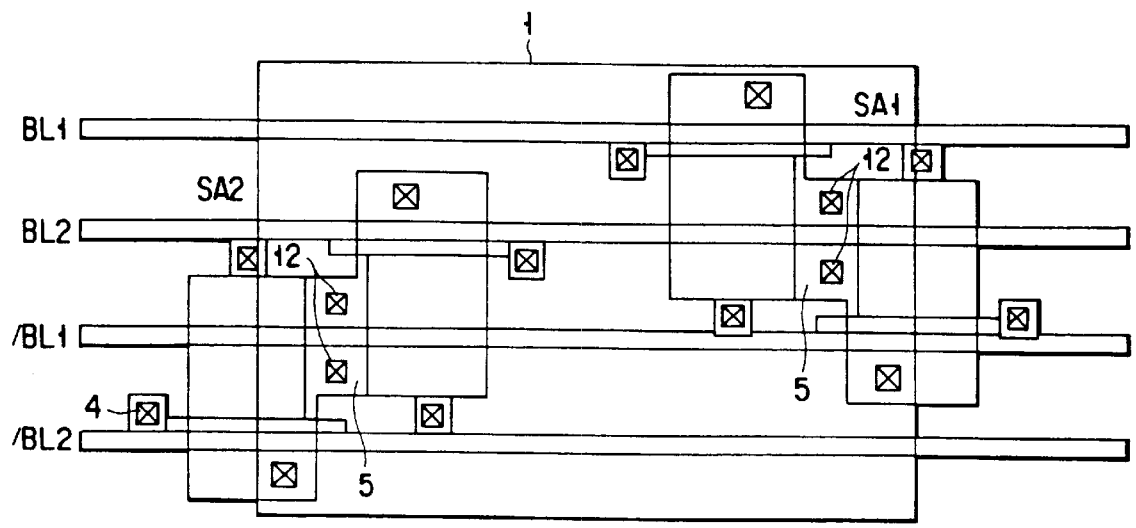
F I G. 101
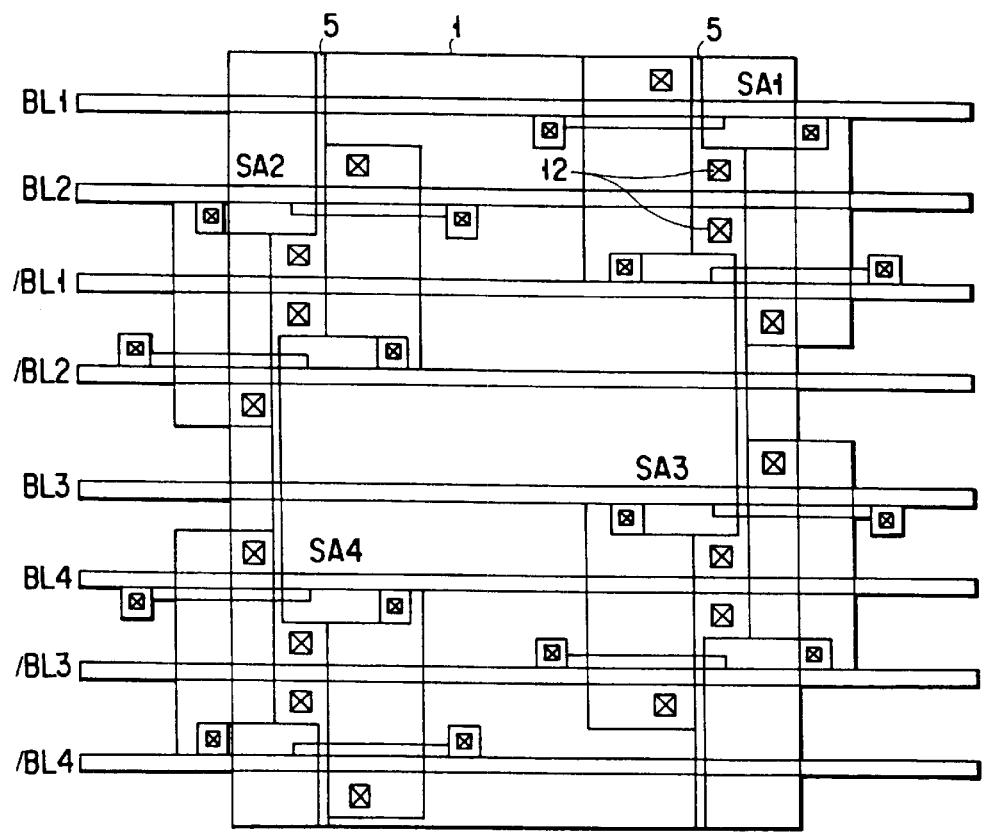
F I G. 102

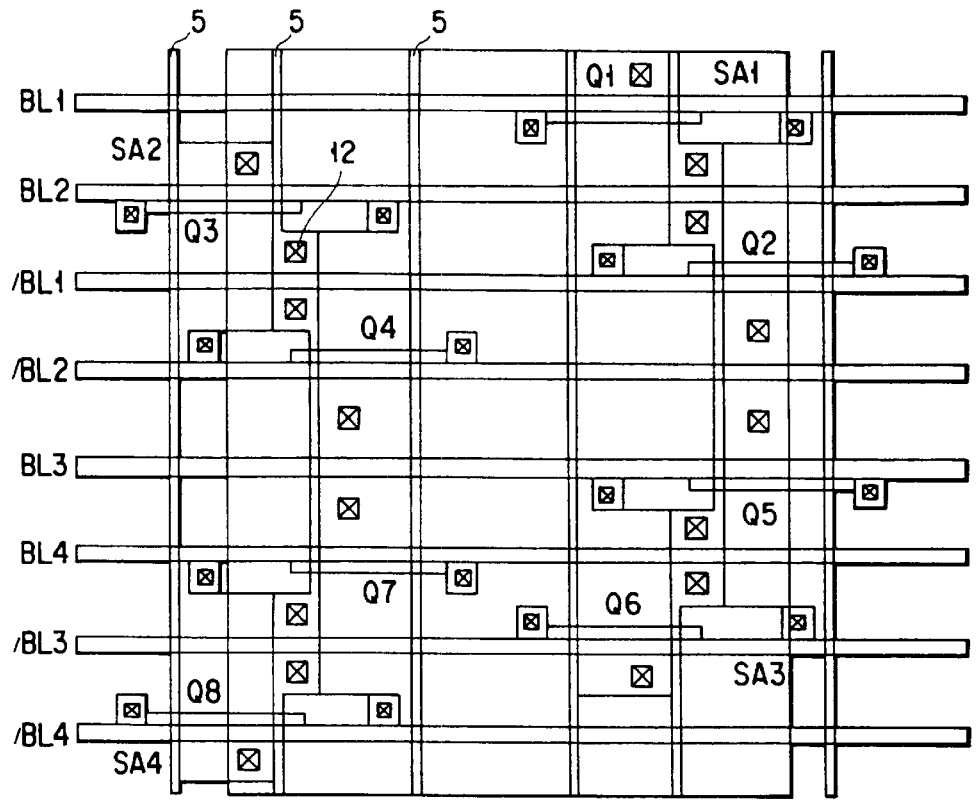
F I G. 115
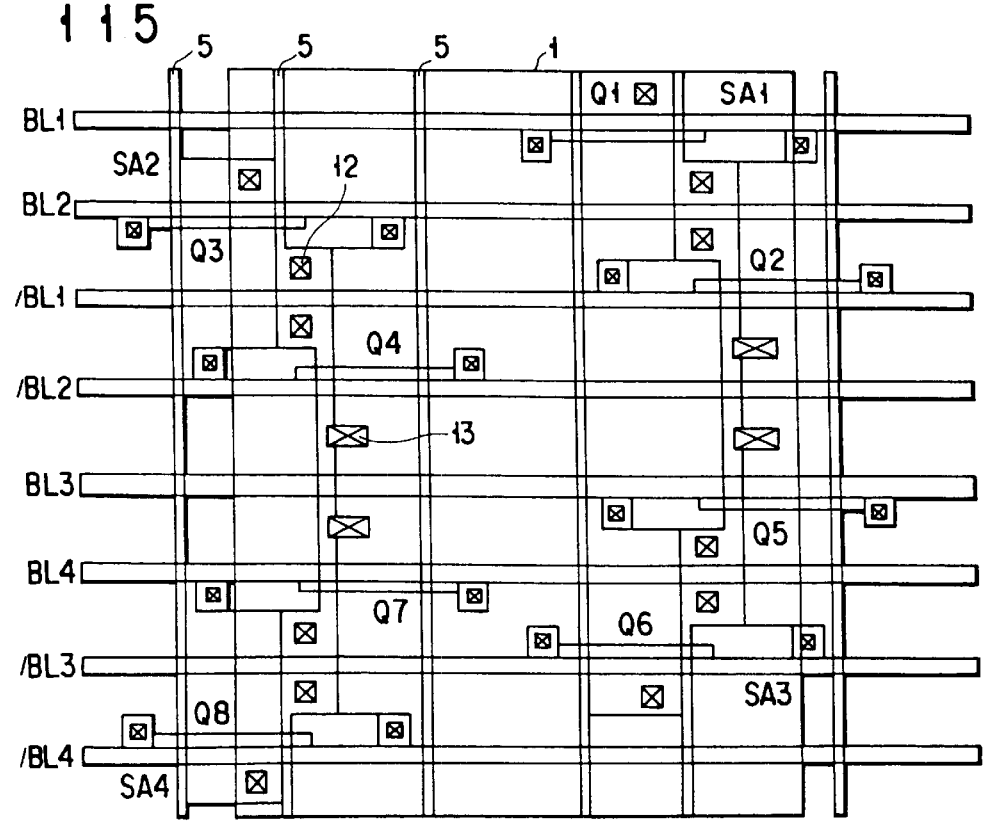
F I G. 116

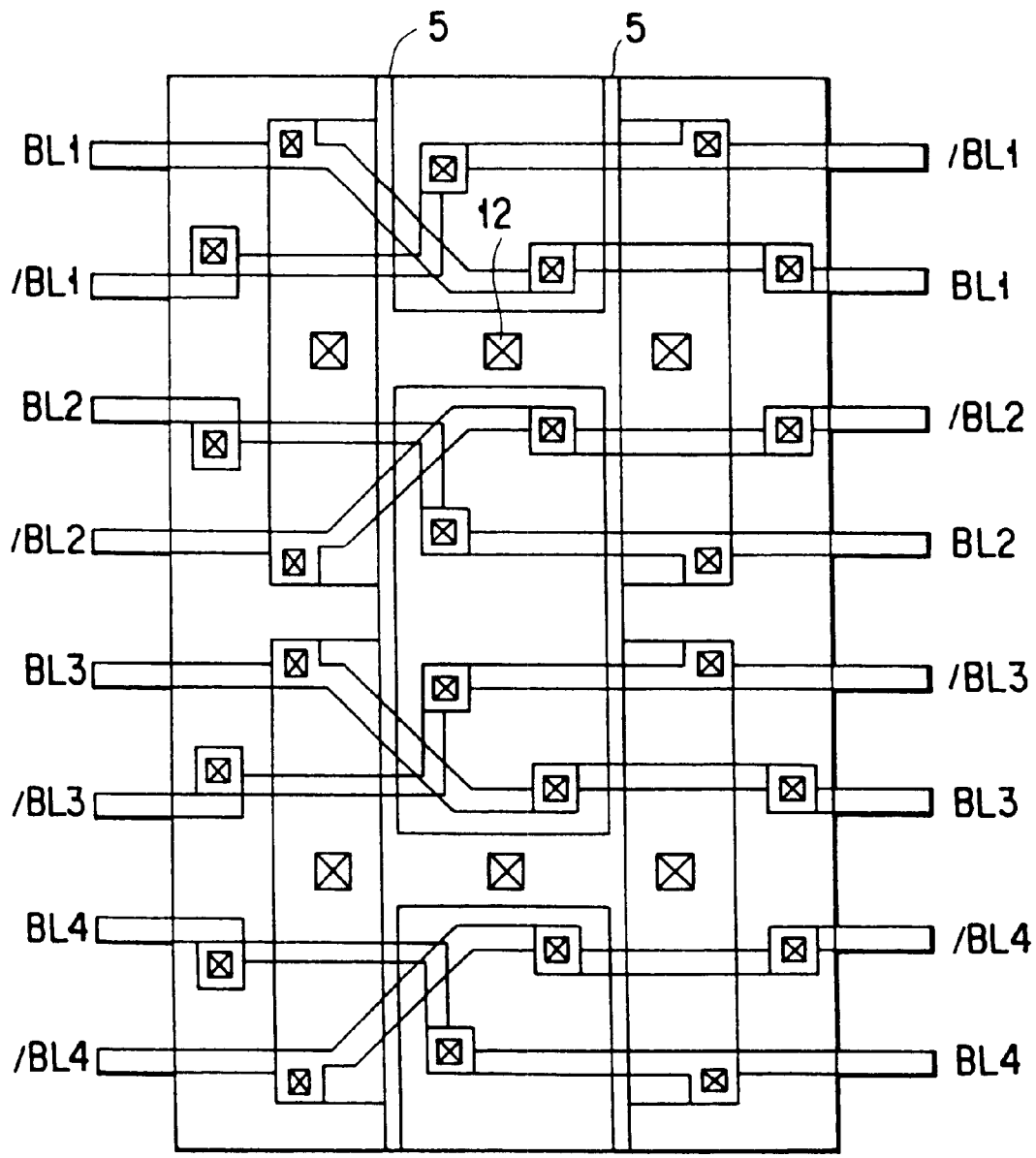
F I G. 123

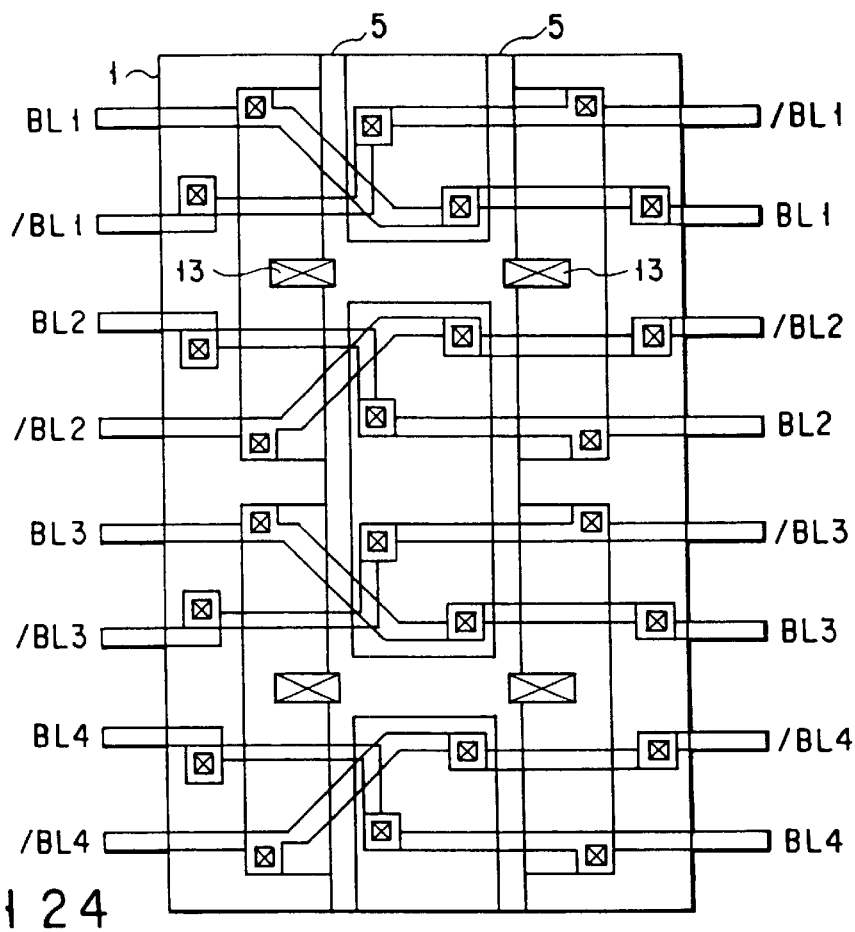
F I G. 124
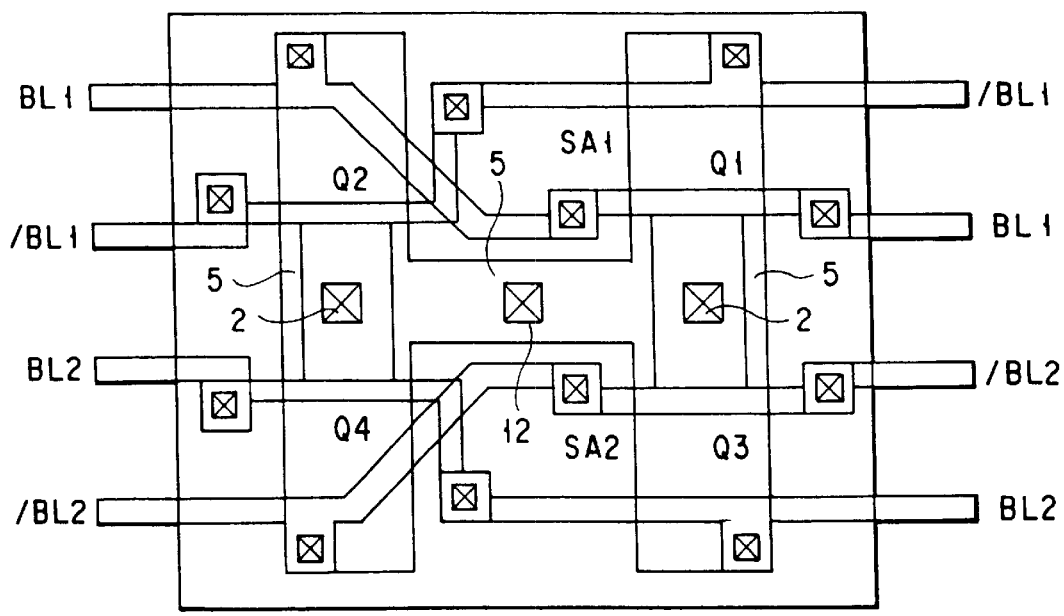
F I G. 125

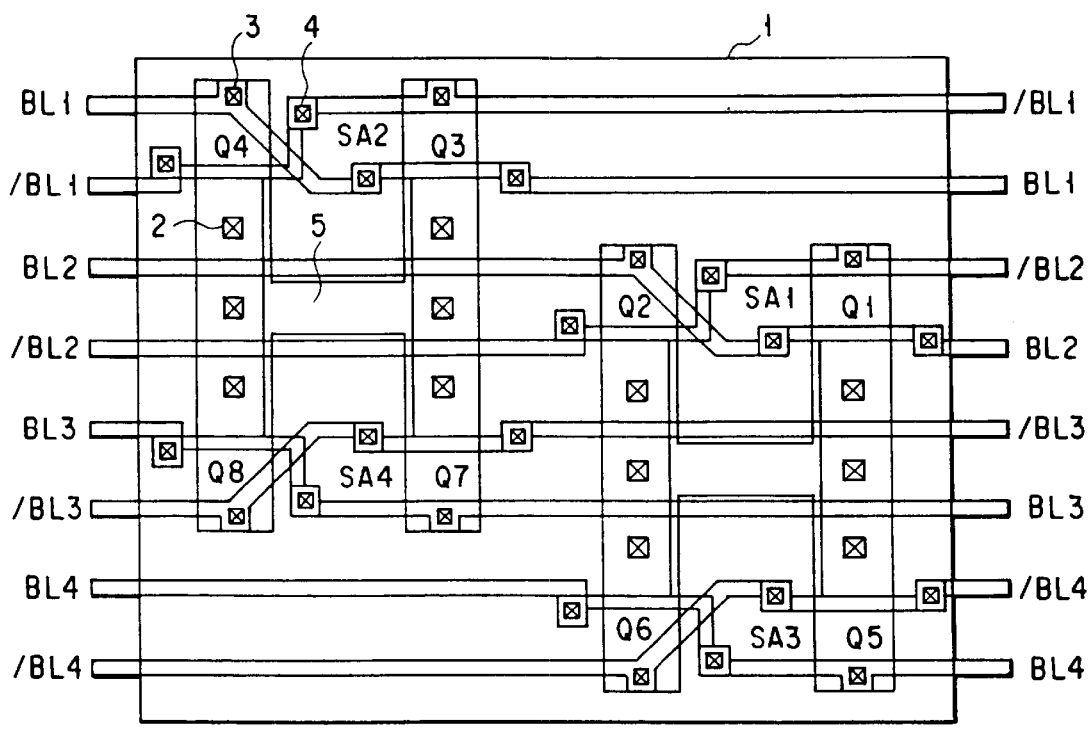
F I G. 129
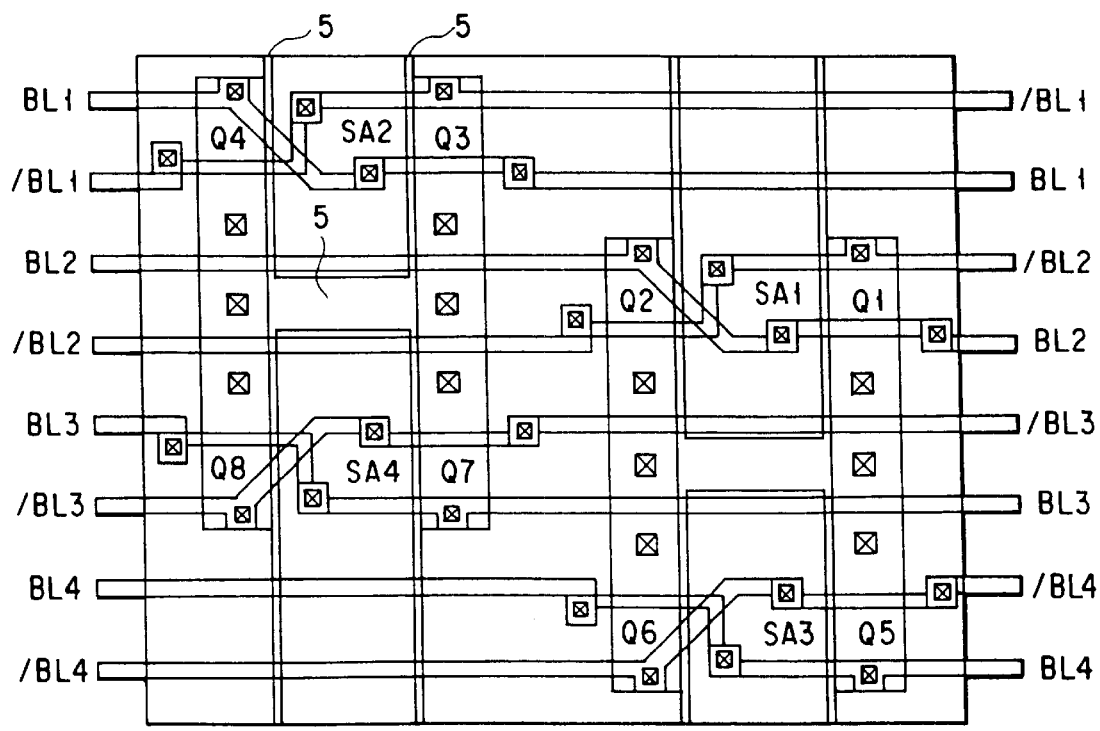
F I G. 130

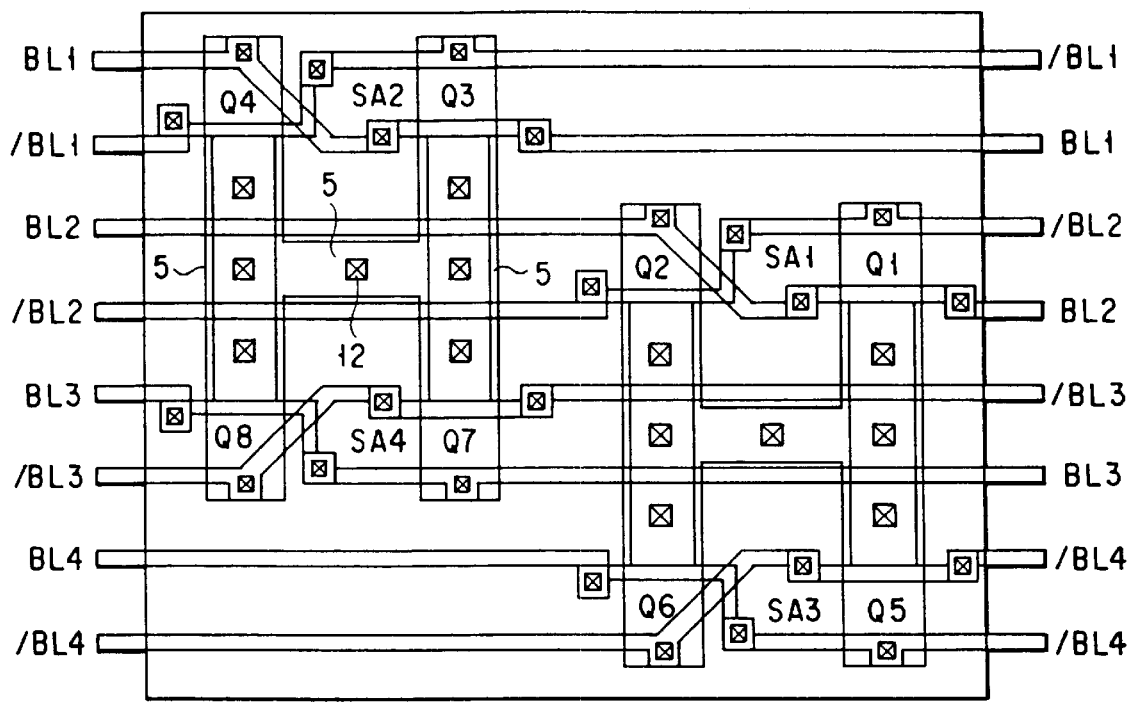
F I G. 137
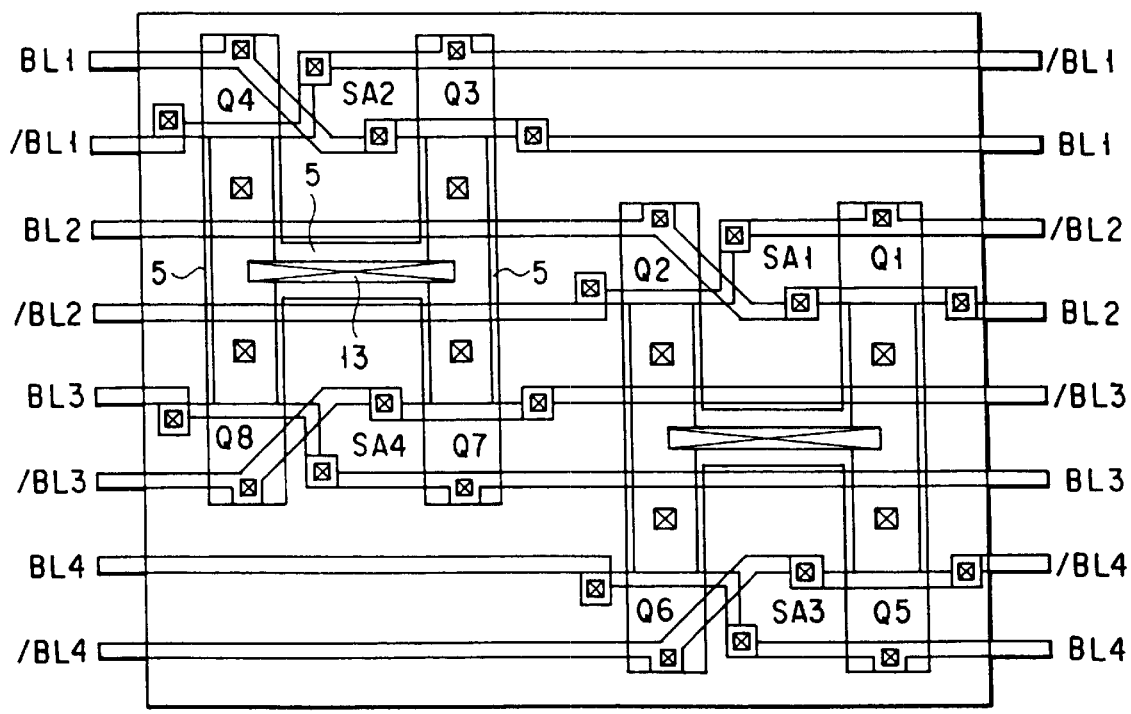
F I G. 138

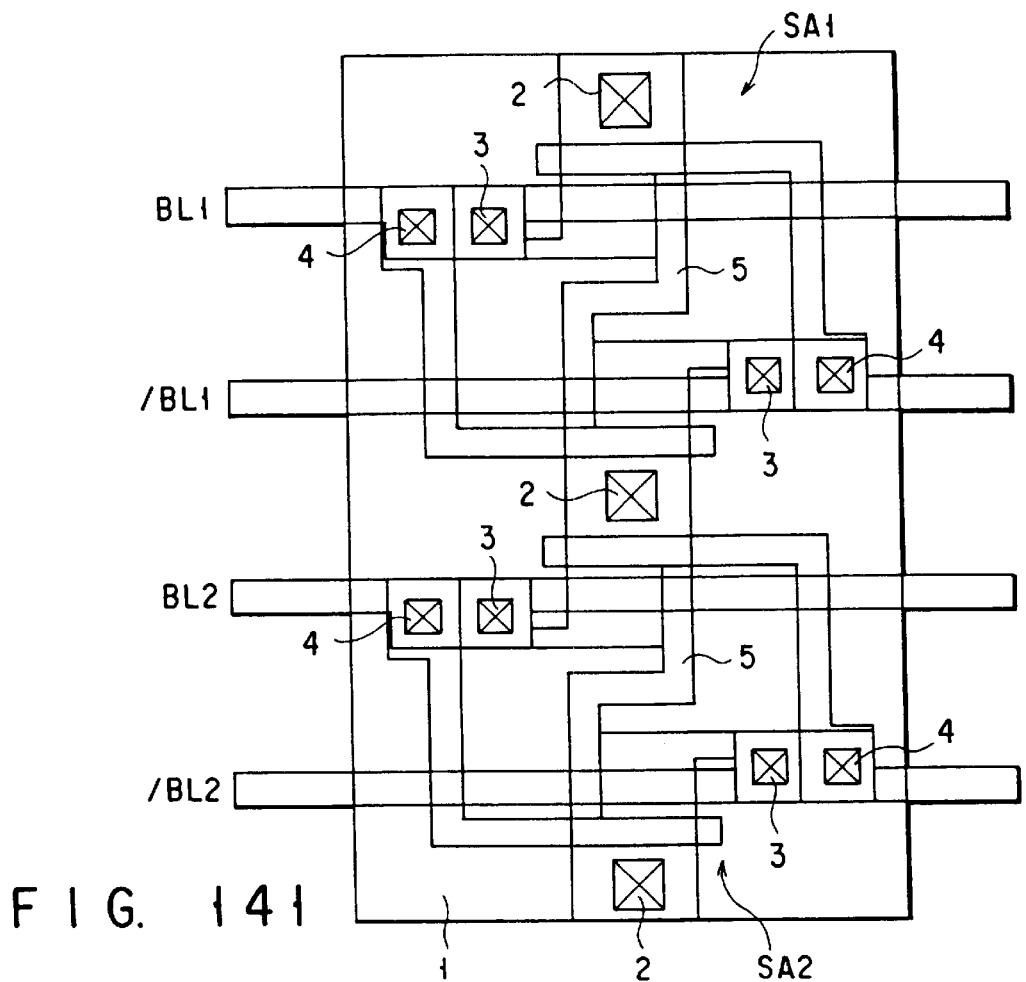
F I G. 141
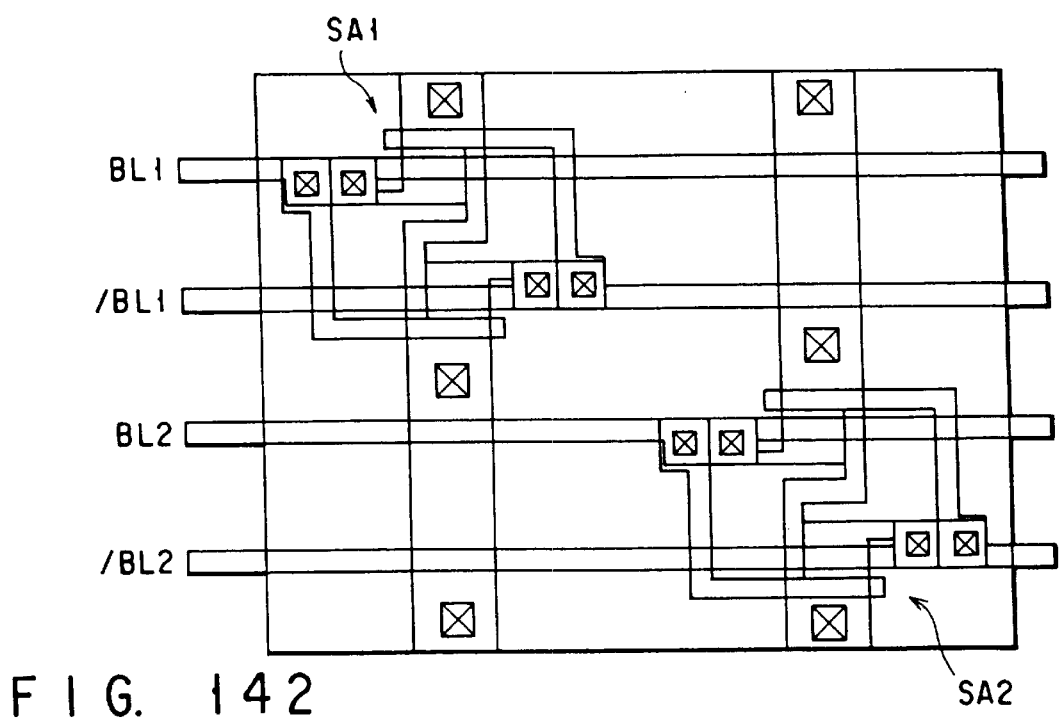
F I G. 142

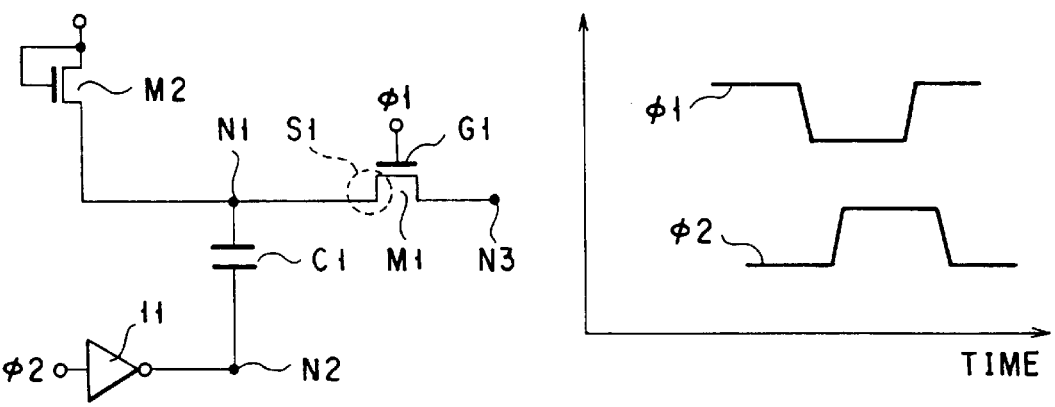
F I G. 143A    F I G. 143B
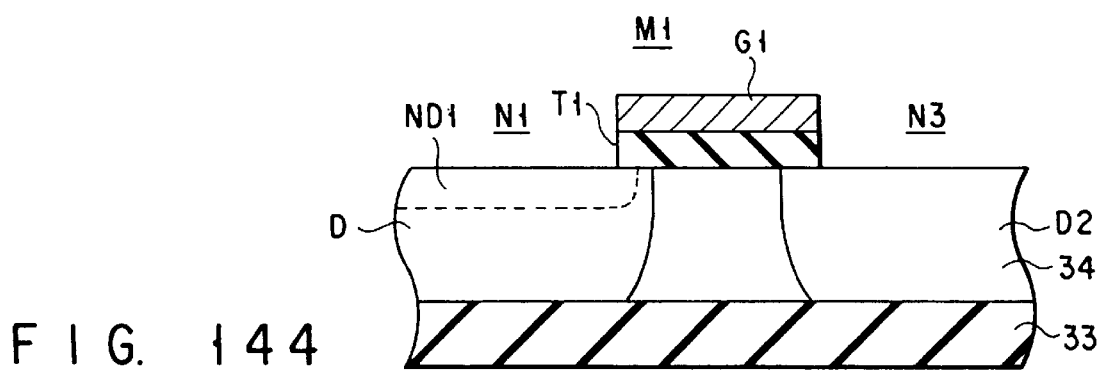
F I G. 144
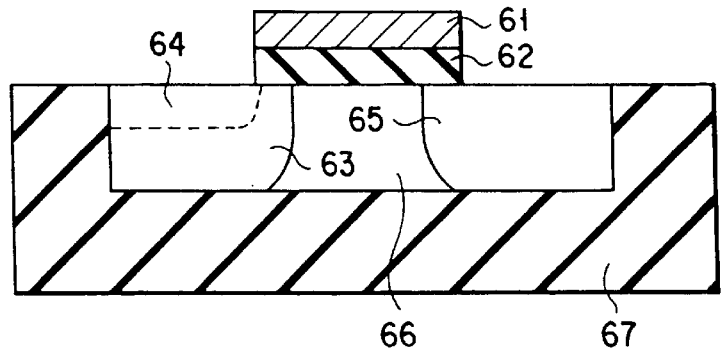
F I G. 145A
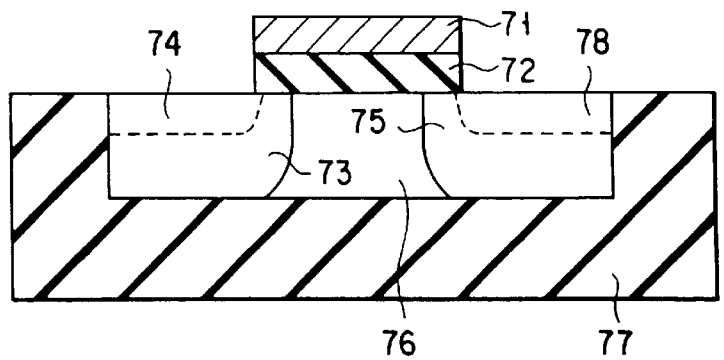
F I G. 145B

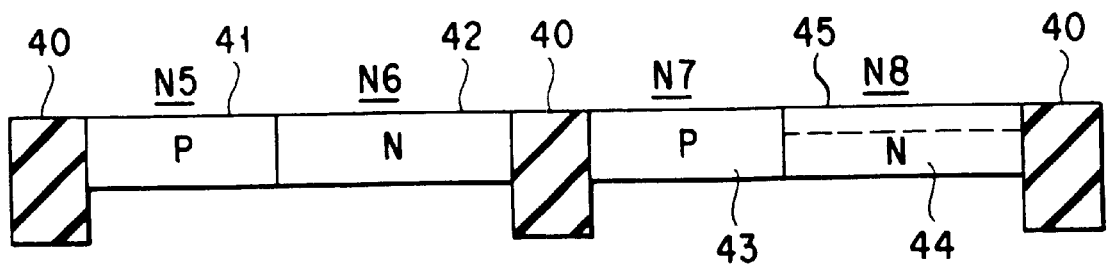
F I G. 146A
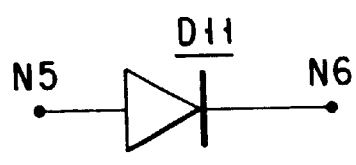
F I G. 146B
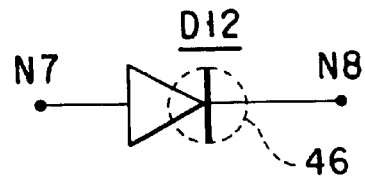
F I G. 146C
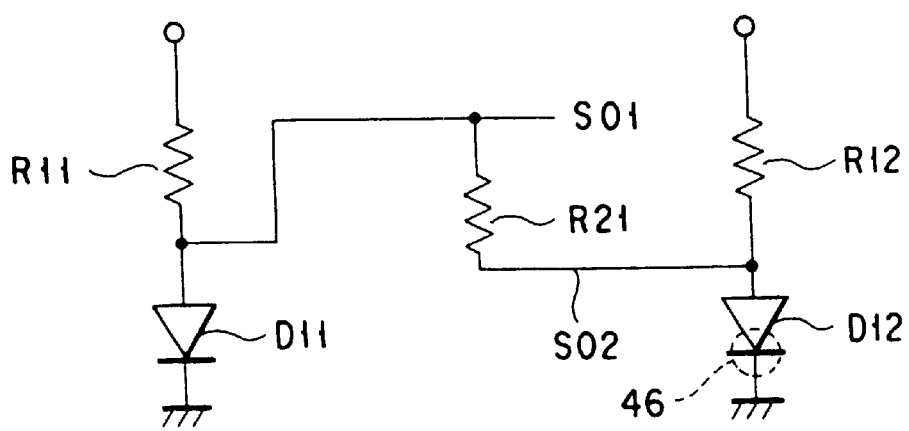
F I G. 147

SEMICONDUCTOR MEMORY DEVICE INCLUDING A PAIR OF MOS TRANSISTORS FORMING A DETECTION CIRCUIT

This application is a Division of application Ser. No. 09/658,573 now U.S. Pat. No. 6,342,408 Filed on Sep. 8, 2000, which was a continuation of Ser. No. 09/291,042, filed Apr. 14, 1999, now U.S. Pat. No. 6,130,461, which was a continuation of Ser. No. 08/569,844, file Dec. 8, 1995 now U.S. Pat. No. 5,895,956.

BACKGROUND OF THE INVENTION

1. Field of the Invention

The present invention relates to a semiconductor device in which a MOS transistor is formed on a semiconductor film on an insulating film and, more particularly, to a semiconductor device in which a MOS transistor constituting a sensor amplifier or a boosting circuit of a DRAM is improved.

2. Description of the Related Art

High performance of a recent semiconductor integrated circuit in, especially, a silicon MOS transistor technique is considerably developed. In this silicon MOS transistor technique, it is known that a micropatterned, high-speed, and high-performance element can be realized by forming a MOS transistor on an SOI (Silicon-On-Insulator) film (to be referred to as an SOI-MOSFET hereinafter).

FIG. 1 is a plan view showing a layout pattern of a conventional sense amplifier using such an SOI-MOSFET, and FIGS. 2A and 2B are sectional views showing the conventional sense amplifiers along lines 2A—2A and 2B—2B in FIG. 1, respectively.

FIG. 1 shows a sense amplifier SA, a bit line BL, a control line 1 for connecting a common source terminal of the sense amplifier SA, a source-contact portion 2, a drain-contact portion 3, and a gate-contact portion 4.

FIGS. 2A and 2B show a p-type monocrystal silicon film 7 as an SOI film. A silicon oxide film ($SiO_2$ film) 6 is formed on the bottom and side surfaces of the p-type monocrystal silicon film 7. The silicon oxide film 6 on the bottom surface is an insulating film of an SOI substrate, and the silicon oxide film 6 on each side surface is an element isolation insulation film.

An n-type source region 8 and an n-type drain region 9 are selectively formed in the p-type monocrystal silicon film 7. A gate electrode 11 is arranged on the p-type monocrystal silicon film 7 in a channel region between the n-type source region 8 and the n-type drain region 9 through a gate oxide film 10.

In the SOI-MOSFET, due to a so-called substrate floating effect, problems such as a low drain breakdown voltage or an unstable drain current in a switching operation are posed.

In particular, in a flip-flop type sense amplifier used in a DRAM or the like or a current mirror type differential amplifier, when an n-type SOI-MCSFET is used in a potential difference detection unit, holes are stored in an SOI-MOSFET channel portion, and the threshold value of the SOI-MOSFET decreases. Since the decrease in threshold value depends on the number of stored holes, the decrease in threshold value depends on a transistor. For this reason, the threshold value is unbalanced, and detection sensitivity to a potential difference. When the decrease in threshold value is considerably large, an erroneous operation may be caused.

In a pump circuit constituting a boosting circuit or a lowering circuit, when a capacitor constituting a pump has first and second electrodes, and an SOI-MOSFET is used as a switching means for connecting the first electrode of the capacitor to an output, a decrease in drain breakdown voltage is caused by the substrate floating effect of the SOI-MOSFET.

For example, in the lowering circuit, when the first potential is boosted at a timing at which the potential of the second electrode is charged by a capacitor driver circuit, the SOI-MOSFET must be turned off. When an n-type SOI-MOSFET is used the above SOI-MOSFET, the potential of the first electrode serving as a drain is boosted, the capacity coupling between the drain and the substrate portion of the SOI-MOSFET boosts the potential of this substrate portion, and the cut-off characteristics of the SOI-MOSFET are degraded. In the worst case, drain breakdown is caused. In addition, holes generated by slight drain breakdown are stored for a reason except for the above capacity coupling, and drain breakdown is caused by the substrate floating effect.

Furthermore, although an accurate reference voltage generation circuit is required to use the reference voltage as a reference for checking whether an input signal is set to be "H" or "L" in a DRAM or the like, a bulk type pn diode used in a conventional DRAM or the like cannot be used in the SOI-MOSFET without increasing the number of steps (costs). Therefore, means for generating a stable reference potential without largely increasing the number of steps is desired.

As described above, since no contact with the substrate can be obtained in the semiconductor device using the conventional SOI-MOSFET, a substrate floating effect is disadvantageously caused. In particular, in sense amplifiers for amplifying a fine potential read out on a bit line pair, since the substrate potentials of two transistors constituting a pair of sense amplifiers are set in a floating state, the threshold values of the transistors are difference from each other, and an accurate sensing operation cannot be performed (subject matter 1). In addition to realization of the accurate sensing operation, high-density integration (subject matter 2), moderation of design rules (subject matter 3), and a countermeasure against noise (subject matter 4) must be realized.

Furthermore, in a pump circuit constituting a boosting circuit or a lowering circuit, the cut-off characteristics of an SOI-MOSFET are degraded, and drain breakdown is caused in the worst case (subject matter 5). In the SOI-MOSFET, a stable reference potential cannot be generated without largely increasing the number of steps (subject matter 6).

SUMMARY OF THE INVENTION

It is an object of the present invention to provide a semiconductor device which can prevent a substrate floating effect of an SOI-MOSFET to realize a highly reliable sense amplifier or the like and realizes high-density integration, moderation of design rules, and a reduction in noise.

Means for solving subject matter 1 is as follows. That is, a diffusion layer region of the same conductivity type as that of a substrate is formed in a common source region, or a portion of each drain region in a sense amplifier formed by an SOI-MOSFET to connect the substrates of a pair of transistors to each other, thereby making the potentials of the substrates equal to each other (arrangement 1-1). In order to make the above means further effective, a contact is formed in the common diffusion layer region to connect the common diffusion layer region to a power supply line or a signal line (arrangement 1-2).

According to arrangement 1 of the present invention, in a sense amplifier constituted by an SOI-MOSFET which detects and amplifies a micro-potential difference, the substrate potentials of a pair of transistors are equal to each other. For this reason, the threshold values of the transistors change in the same manner, and a potential difference can be accurately detected. For this reason, an erroneous sensing operation can be prevented.

In addition, since the contact with a substrate is formed, the substrate potentials are not set in a floating state, and problems such as storage of holes in a channel portion and a decrease in drain breakdown voltage are solved. Therefore, a highly reliable DRAM can be realized.

Means for solving subject matter 2 is that the substrate contact and a source contact are used common (arrangement 2-1), or that a p-type region is common to upper and lower (in a word line direction) sense amplifiers (arrangement 2-2).

According to arrangement 2, the substrate contact and the source contact are used common, a contact-contact interval is not required, and high-density integration can be obtained. When p-type regions are connected to each other in a word line direction, an implant-implant interval is not required, and high-density integration can be obtained. In addition, when p-type regions are connected to each other in a word line direction, the substrate potentials and threshold values of the sense amplifiers on pair of adjacent bits can be made equal to each other, and sensing operations can be started at the same timing. For this reason, a sense amplifier is not erroneously operated in reception of noise from an adjacent column.

Means for solving subject matter 3 employs an arrangement in which sense amplifiers are shifted from each other in a bit line direction (arrangement 3-1), an arrangement using a layout in which a through bit line is arranged and one sense amplifier is arranged every four bit lines (arrangement 3-2), or an arrangement in which a gate is vertically arranged (arrangement 3-3). When two p-type regions are formed in both the ends a gate polysilicon portion (arrangement 3-4), a layout strong to a shift in mask alignment of an implant can be obtained.

According to arrangement 3 of the present invention, when the sense amplifiers are shifted from each other in the bit line direction (lateral direction), and a layout in which one sense amplifier is arranged every four bit lines, design rules in the vertical direction can be moderated. When the gate polysilicon portion of a transistor is vertically arranged, a gate length L of the transistor can be increased, and variations in threshold value can be decreased. In addition, when two p-type regions are formed in both the ends of a gate polysilicon, a layout strong to a shift in mask alignment of an implant can be obtained.

Means for solving subject matter 4 is that bit lines cross each other (arrangement 4).

According to arrangement 4 of the present invention, when a pair of bit lines cross each other, noise generated by adjacent bit lines can be eliminated.

In addition to arrangements 1 to 4 described above, various combinations such as arrangements 1-1 and 2-2, arrangements 1-1 and 3-2, arrangements 1-1 and 2-2, arrangements 3-4 and, . . . , can be used. Therefore, the effects of these arrangements can be added to each other.

A means for solving subject matter 5 employs an arrangement in which an n-type (in case of a boosting circuit) or p-type (in case of a lowering circuit) SOI-MOSFET is used, the gate length of the SOI-MOSFET is set to be larger than the minimum gate length of an SOI-MOSFET constituting a circuit except for the boosting circuit or the lowering circuit, a semiconductor having a bandgap width smaller than a channel portion is formed in at least a portion of the source/drain region of the SOI-MOSFET constituting the boosting circuit or lowering circuit (arrangement 5).

Arrangement 5 comprises a pn diode using a junction between a p-type diffusion layer formed simultaneously with a portion of the source region of the SOI-MOSFET and consisting of the same material as that of the source region and a first n-type diffusion layer, and a pn diode using a junction between a p-type semiconductor having a bandgap width equal to that of the channel portion and the first n-type semiconductor. The difference between the threshold values of the two pn junction diodes is used as a reference potential.

According to arrangement 5 of the present invention, with respect to a boosting circuit, a capacitor performs discharge from the second electrode of the capacitor, and the potential of the first electrode is lowered, in the n-type SOI-MOSFET (M1) in which the first electrode and the output are connected to each other, the potential of the substrate portion of the SOI-MOSFET is lowered by capacity coupling between the substrate portion and the first electrode. For this reason, the cut-off characteristics change to be improved, and trigger which causes drain breakdown can be advantageously avoided. When the potential of the first electrode is lower than an output voltage, holes generated for some reasons such as slight drain breakdown are absorbed in a narrow bandgap semiconductor portion to suppress a substrate floating effect, thereby preventing drain breakdown. In addition, when the gate length of the SOI-MOSFET is increased, an electric field to be applied is moderated, and a drain breakdown voltage can be increased.

In a means for solving subject matter 6, the bandgap width of at least a portion of the source region of the SOI-MOSFET is smaller than that of the channel region, a first pn diode using a junction between a p-type diffusion layer formed simultaneously with a portion of the source region of the SOI-MOSFET and consisting of the same material as that of the source region and a first n-type diffusion layer, and a second pn diode using a junction between a p-type semiconductor having a bandgap width equal to that of the channel portion and the first n-type semiconductor are arranged (arrangement 6).

In arrangement 6, the SOI-MOSFET is an n-type SOI-MOSFET, and at least a pair of n-type SOI-MOSFETs are arranged on the semiconductor integrated circuit. The pair of n-type SOI-MOSFETs have gates which respectively receive potentials 1 and 2, and a circuit for discriminating the magnitudes of the potentials 1 and 2 on the basis of the difference between the conductances of the pair of n-type SOI-MOSFETs is constituted, and the channel regions of the pair of SOI-MOSFETs are connected to each other by an impurity diffusion layer of the same conductivity type as that of the channel region described above.

According to arrangement 6 of the present invention, a semiconductor having a bandgap width smaller than that of the channel portion is used as a portion of the source region of the n-type SOI-MOSFET, and the pn diode using the junction between the p-type diffusion layer formed simultaneously with the portion of the source region of the SOI-MOSFET and consisting of the same material as that of the source region and the first n-type diffusion layer, and the pn diode using the junction between the p-type semiconductor having a bandgap width equal to that of the channel portion and the first n-type semiconductor are arranged. When the difference between the threshold values of these diodes is used as a reference potential, this reference potential is not easily changed by a change in temperature.

As described above, according to the present invention, in a sense amplifier constituted by SOI-MOSFETs, the substrate potentials of the SOI-MOSFETs can be made equal to each other, or the SOI-MOSFETs can be connected to a control line. For this reason, a substrate floating effect can be prevented, and an erroneous operation or the like caused by a change in threshold value can be prevented. In addition, high-density integration can be obtained with moderating design rules. Therefore, a high-density semiconductor device which has high reliability and effectively uses the advantages of the SOI-MOSFET can be realized.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 13 is a plan view showing another layout pattern of the sense amplifiers according to the second embodiment;

FIG. 18 is a plan view showing a layout pattern of sense amplifiers according to the fifth embodiment;

FIG. 22 is a plan view showing a layout pattern of sense amplifiers according to the seventh embodiment;

FIG. 23 is a plan view showing another layout pattern of the sense amplifiers according to the seventh embodiment;

FIG. 26 is a plan view showing a layout pattern of sense amplifiers according to the ninth embodiment;

FIG. 27 is a plan view showing another layout pattern of the sense amplifiers according to the ninth embodiment;

FIG. 28 is a plan view showing a layout pattern of sense amplifiers according to the 10th embodiment;

FIG. 29 is a plan view showing another layout pattern of the sense amplifiers according to the 10th embodiment;

FIG. 32 is a plan view showing a layout pattern of sense amplifiers according to the 12th embodiment;

FIG. 34 is a plan view showing a layout pattern of sense amplifiers according to the 13th embodiment;

FIG. 36 is a plan view showing a layout pattern of sense amplifiers according to the 14th embodiment;

FIG. 37 is a plan view showing another layout pattern of the sense amplifiers according to the 14th embodiment;

FIG. 40 is a plan view showing a layout pattern of sense amplifiers according to the 16th embodiment;

FIG. 41 is a plan view showing another layout pattern of the sense amplifiers according to the 16th embodiment;

FIG. 42 is a plan view showing a layout pattern of sense amplifiers according to the 17th embodiment;

FIG. 46 is a plan view showing a layout pattern of sense amplifiers according to the 19th embodiment;

FIG. 47 is a plan view showing another layout pattern of the sense amplifiers according to the 19th embodiment;

FIG. 50 is a plan view showing a layout pattern of sense amplifiers according to the 21st embodiment;

FIG. 52 is a plan view showing a layout pattern of sense amplifiers according to the 22nd embodiment;

FIG. 53 is a plan view showing another layout pattern of the sense amplifiers according to the 22nd embodiment;

FIG. 54 is a plan view showing a layout pattern of sense amplifiers according to the 23rd embodiment;

FIG. 55 is a plan view showing another layout pattern of the sense amplifiers according to the 23rd embodiment;

FIG. 62 is a plan view showing a layout pattern of sense amplifiers according to the 27th embodiment;

FIG. 63 is a plan view showing another layout pattern of the sense amplifiers according to the 27th embodiment;

FIG. 68 is a plan view showing a layout pattern of sense amplifiers according to the 30th embodiment;

FIG. 69 is a plan view showing another layout pattern of the sense amplifiers according to the 30th embodiment;

FIG. 70 is a plan view showing a layout pattern of sense amplifiers according to the 31st embodiment;

FIG. 71 is a plan view showing another layout pattern of the sense amplifiers according to the 31st embodiment;

FIG. 74 is a plan view showing a layout pattern of sense amplifiers according to the 33rd embodiment;

FIG. 77 is a plan view showing another layout pattern of the sense amplifiers according to the 34th embodiment;

FIG. 79 is a plan view showing another layout pattern of the sense amplifiers according to the 35th embodiment;

FIG. 82 is a plan view showing a layout pattern of sense amplifiers according to the 37th embodiment;

FIG. 83 is a plan view showing another layout pattern of the sense amplifiers according to the 37th embodiment;

FIG. 90 is a plan view showing a layout pattern of sense amplifiers according to the 41st embodiment;

FIG. 91 is a plan view showing another layout pattern of the sense amplifiers according to the 41st embodiment;

FIG. 93 is a plan view showing another layout pattern of the sense amplifiers according to the 42nd embodiment;

FIG. 95 is a plan view showing another layout pattern of the sense amplifiers according to the 43rd embodiment;

FIG. 96 is a circuit diagram showing the arrangement of sense amplifiers according to the 44th embodiment;

FIG. 97 is a plan view showing a layout pattern of the sense amplifiers according to the 44th embodiment;

FIG. 98 is a plan view showing a layout pattern of sense amplifiers according to the 45th embodiment;

FIG. 101 is a plan view showing a layout pattern of sense amplifiers according to the 48th embodiment;

FIG. 102 is a plan view showing a layout pattern of sense amplifiers according to the 49th embodiment;

FIG. 115 is a plan view showing a layout pattern of sense amplifiers according to the 61st embodiment;

FIG. 116 is a plan view showing a layout pattern of sense amplifiers according to the 62nd embodiment;

FIG. 119 is a plan view showing a layout pattern of sense amplifiers according to the 65th embodiment;

FIG. 120 is a plan view showing a layout pattern of sense amplifiers according to the 66th embodiment;

FIG. 121 is a plan view showing a layout pattern of sense amplifiers according to the 67th embodiment;

FIG. 122 is a plan view showing a layout pattern of sense amplifiers according to the 68th embodiment;

FIG. 123 is a plan view showing a layout pattern of sense amplifiers according to the 69th embodiment;

FIG. 124 is a plan view showing a layout pattern of sense amplifiers according to the 70th embodiment;

FIG. 125 is a plan view showing a layout pattern of sense amplifiers according to the 71st embodiment;

FIG. 126 is a plan view showing a layout pattern of sense amplifiers according to the 72nd embodiment;

FIG. 127 is a plan view showing a layout pattern of sense amplifiers according to the 73rd embodiment;

FIG. 128 is a plan view showing a layout pattern of sense amplifiers according to the 74th embodiment;

FIG. 129 is a plan view showing a layout pattern of sense amplifiers according to the 75th embodiment;

FIG. 130 is a plan view showing a layout pattern of sense amplifiers according to the 76th embodiment;

Figure 131:
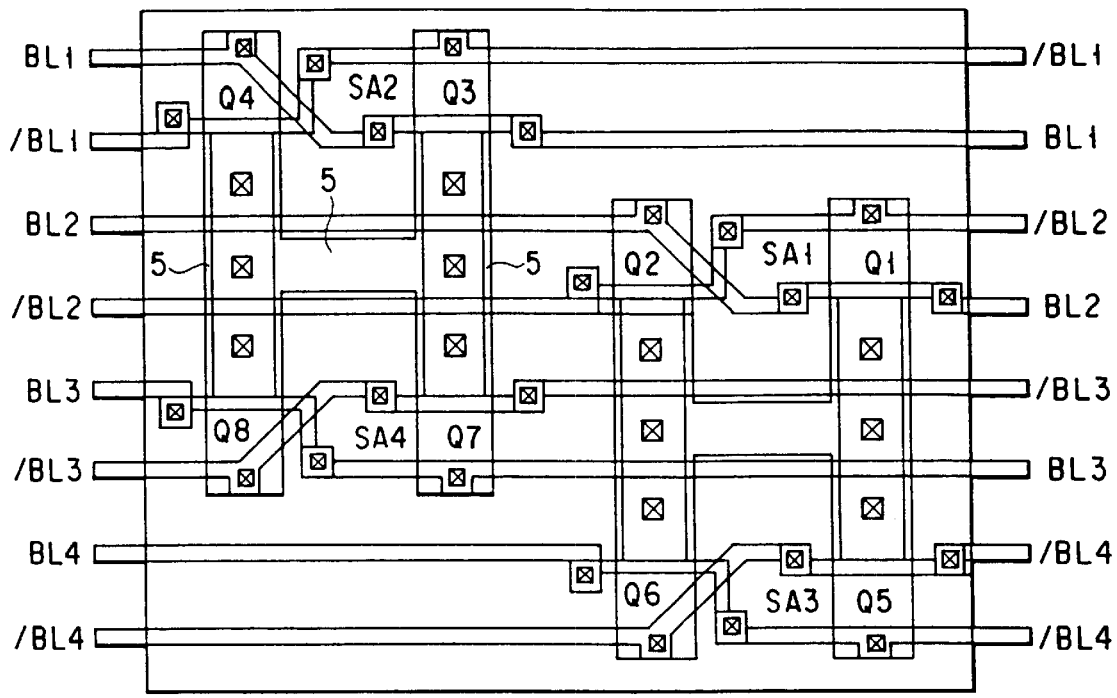
Figure 132:
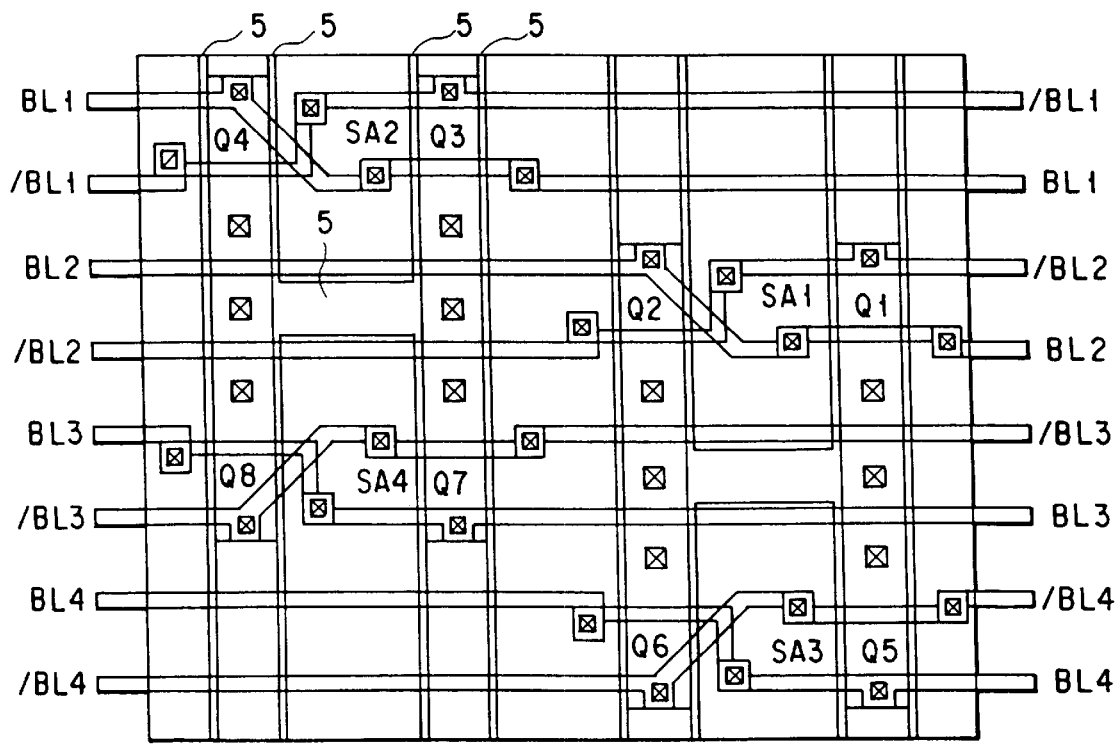
Figure 133:
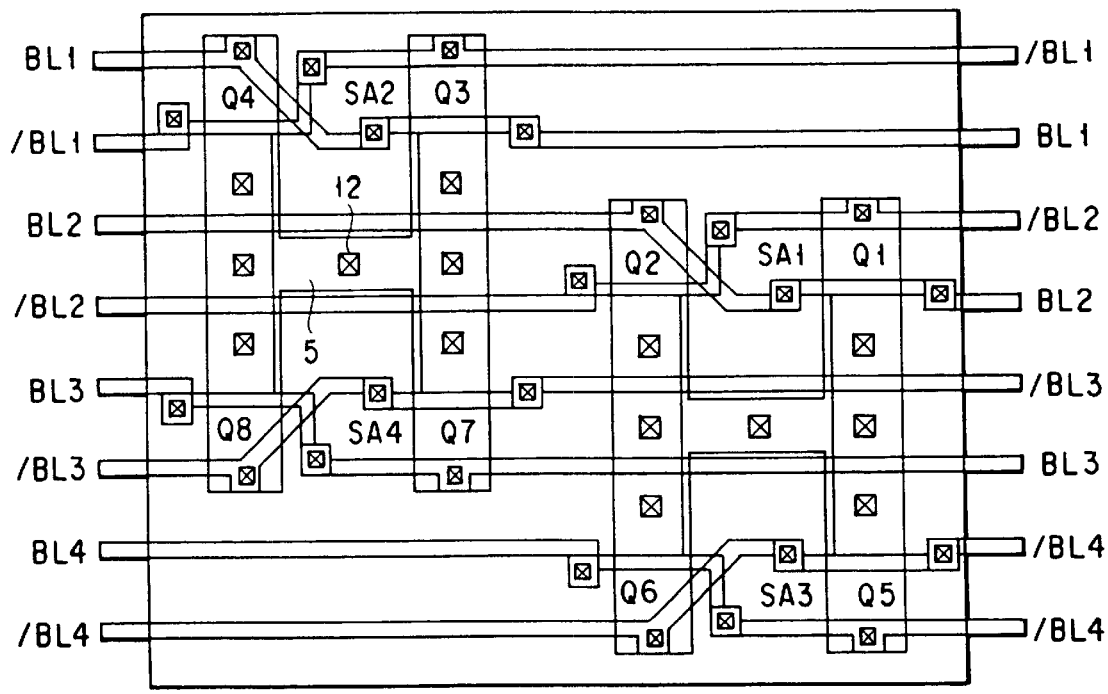
Figure 134:
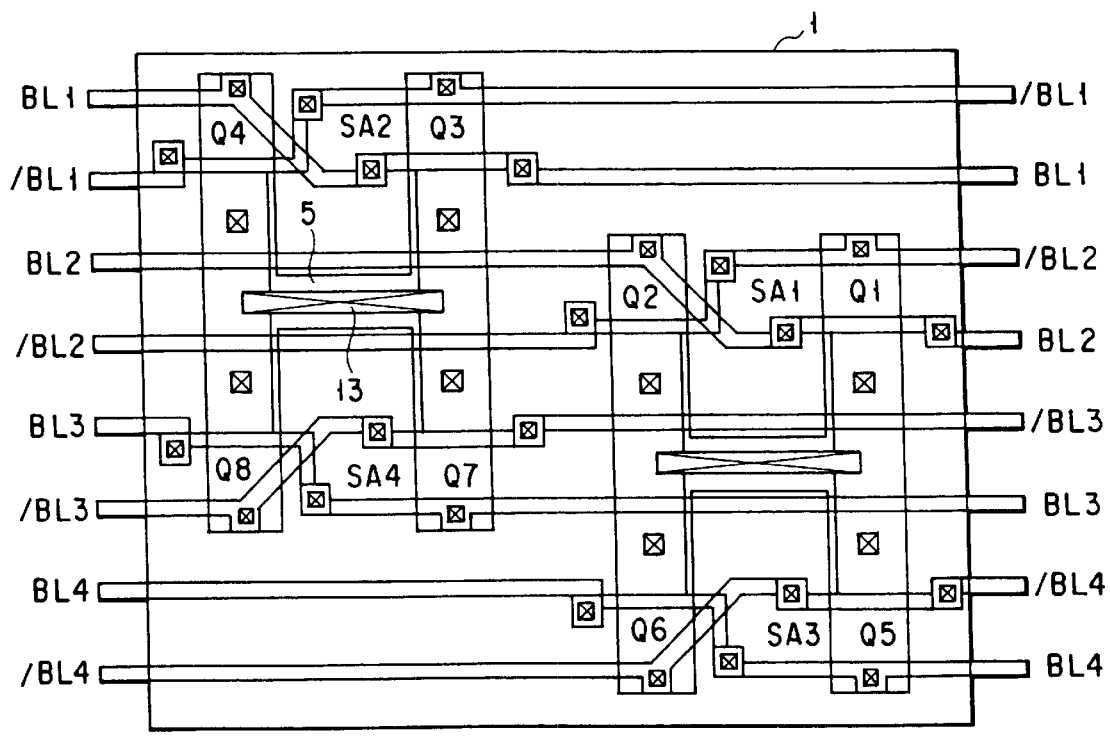
Figure 135:
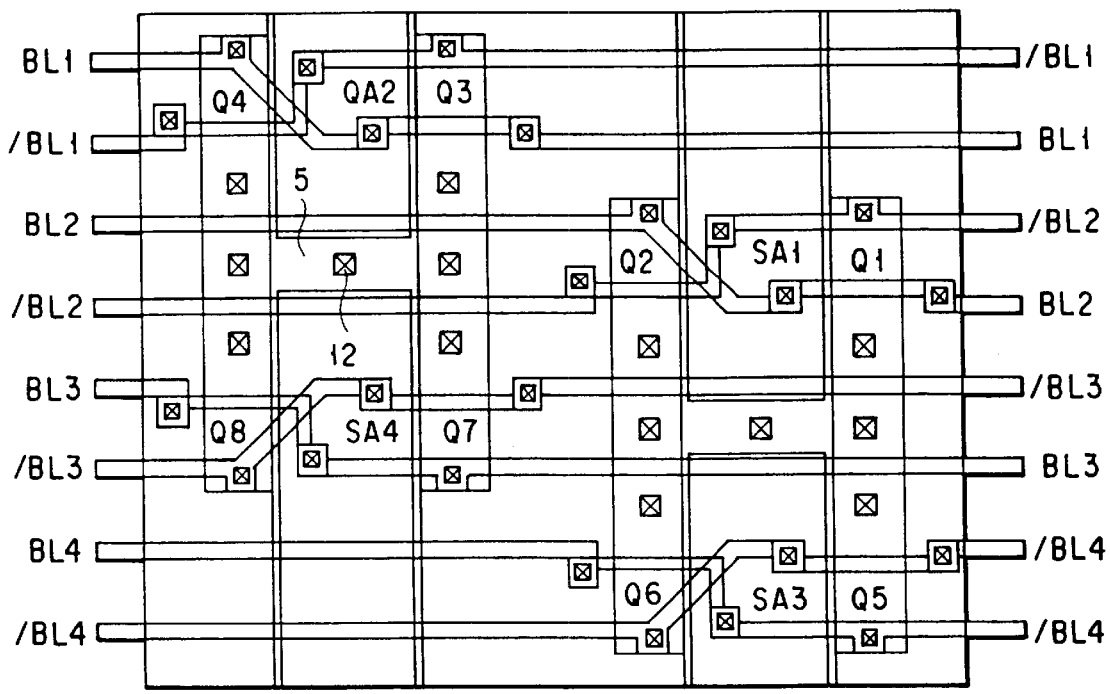
Figure 136:
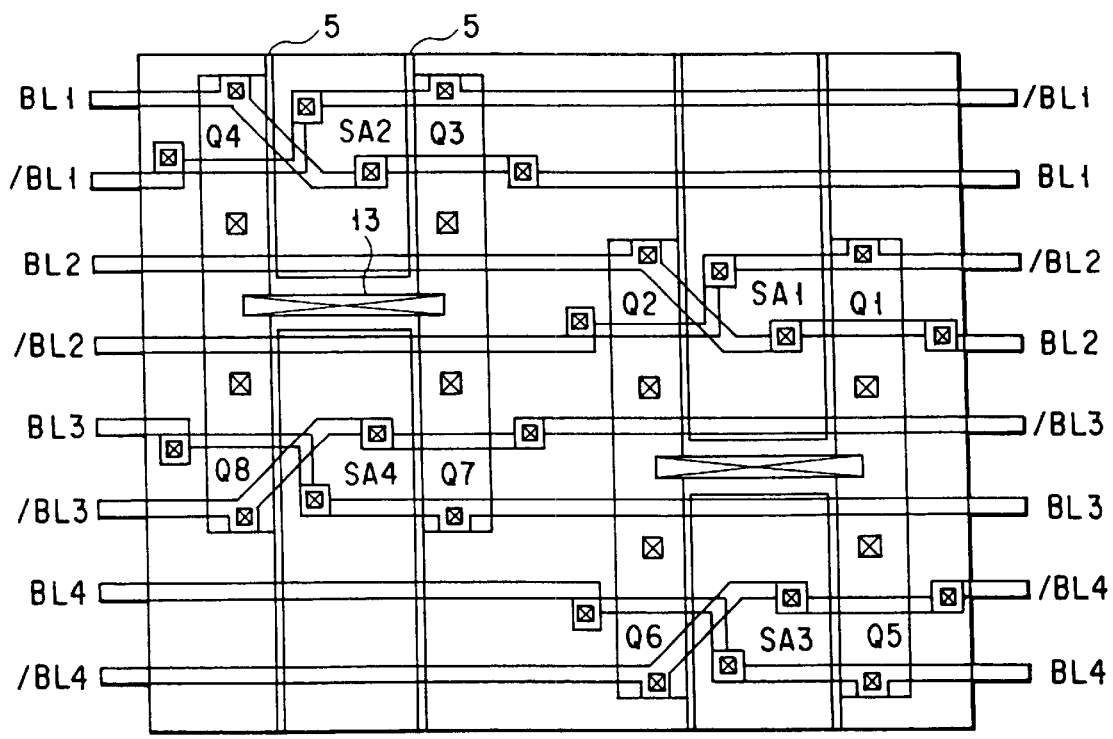
Figure 139:
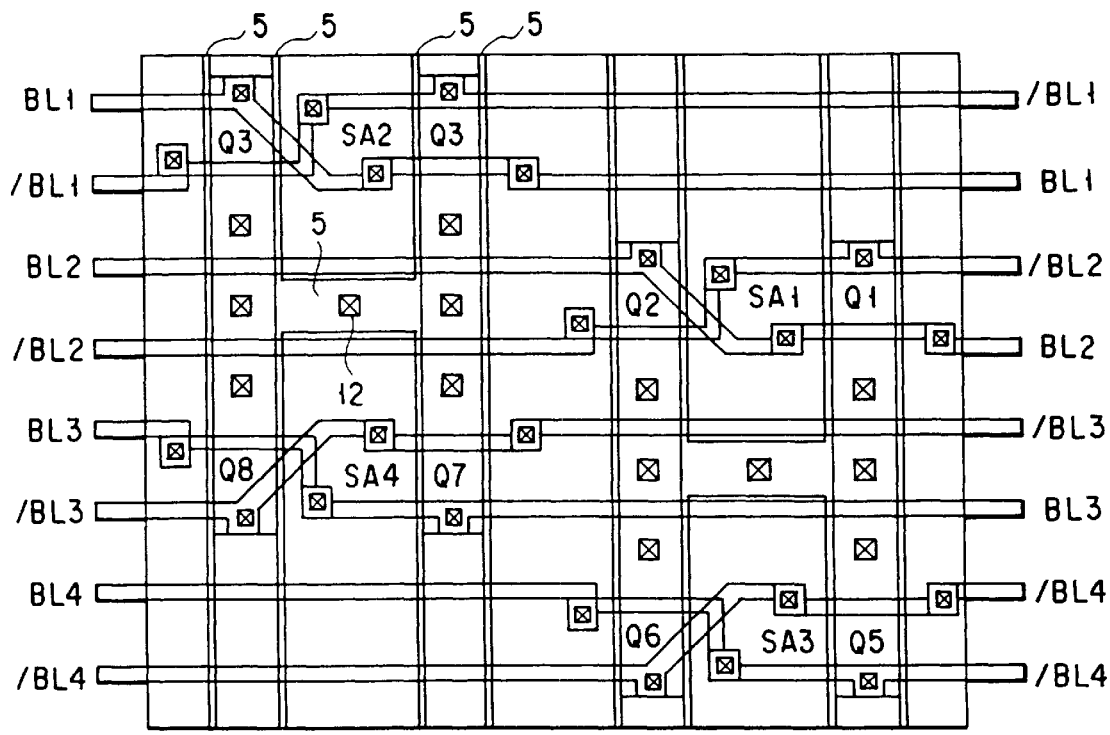
Figure 140:
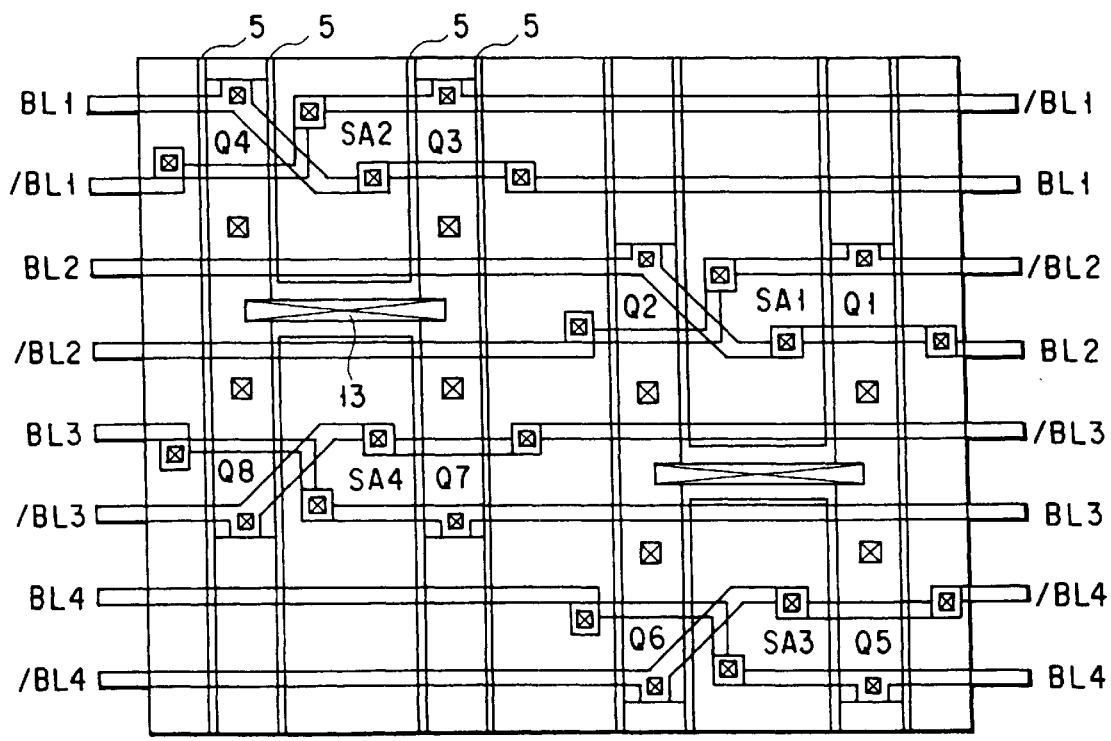

FIG. 131 is a plan view showing a layout pattern of sense amplifiers according to the 77th embodiment;

FIG. 132 is a plan view showing a layout pattern of sense amplifiers according to the 78th embodiment;

FIG. 133 is a plan view showing a layout pattern of sense amplifiers according to the 79th embodiment;

FIG. 134 is a plan view showing a layout pattern of sense amplifiers according to the 80th embodiment;

FIG. 135 is a plan view showing a layout pattern of sense amplifiers according to the 81st embodiment;

FIG. 136 is a plan view showing a layout pattern of sense amplifiers according to the 82nd embodiment;

FIG. 137 is a plan view showing a layout pattern of sense amplifiers according to the 83rd embodiment;

FIG. 138 is a plan view showing a layout pattern of sense amplifiers according to the 84th embodiment;

FIG. 139 is a plan view showing a layout pattern of sense amplifiers according to the 85th embodiment;

FIG. 140 is a plan view showing a layout pattern of sense amplifiers according to the 86th embodiment;

FIG. 141 is a plan view showing a layout pattern of sense amplifiers according to the 87th embodiment;

FIG. 142 is a plan view showing another layout pattern of the sense amplifiers according to the 87th embodiment;

FIG. 143A is a circuit diagram showing the arrangement of a boosting circuit using an SOI-MOSFET according to the 88th embodiment, and FIG. 143B is a timing chart of the boosting circuit in FIG. 143A;

FIG. 144 is a sectional view showing the SOI-MOSFET in the 88th embodiment;

FIGS. 145A and 145B are sectional views showing the element structure of the SOI-MOSFET in the 88th embodiment;

FIG. 146A is a sectional view showing a diode formed by a pn junction according to the 89th embodiment, and FIG. 146B and 146C are equivalent circuits of the diode in FIG. 146A; and FIG. 147 is a circuit diagram showing the arrangement of a circuit using the diode in FIG. 146A.

DETAILED DESCRIPTION OF THE PREFERRED EMBODIMENTS

Embodiments of the present invention will be described below with reference to the accompanying drawings. Note that, in the following description, the same reference numerals denote the same parts, and a description thereof will be omitted.

Embodiment 1

Figure 1:
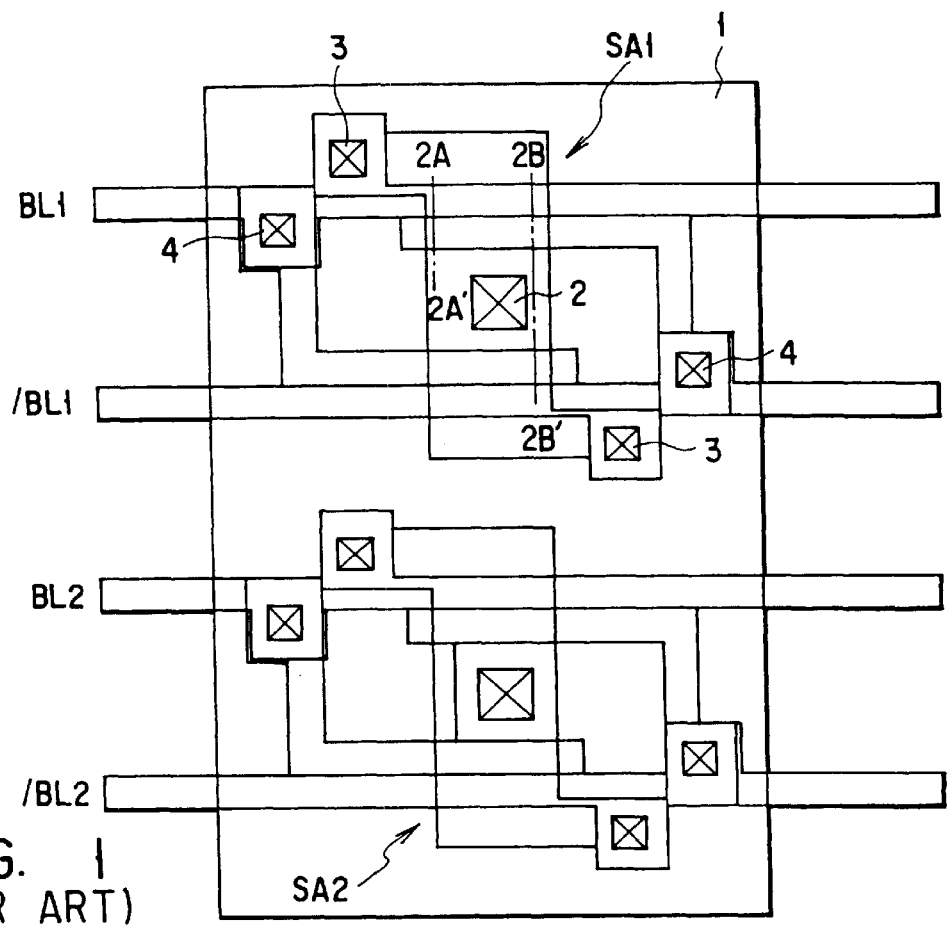
FIG. 1 is a plan view showing a layout pattern of conventional sense amplifiers.
Figure 2A:
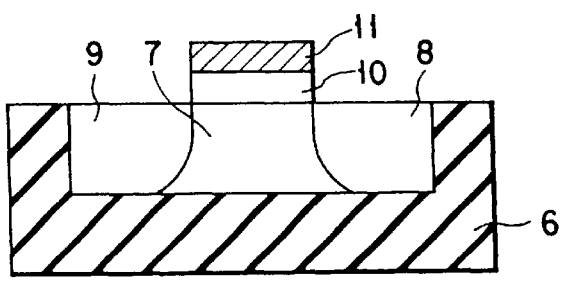
FIGS. 2A and 2B are sectional view showing the conventional sense amplifier along lines 2A—2A and 2B—2B in FIG. 1, respectively.
Figure 2B:
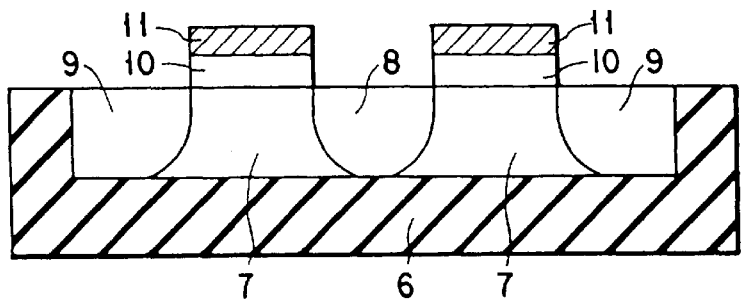
Figure 3:
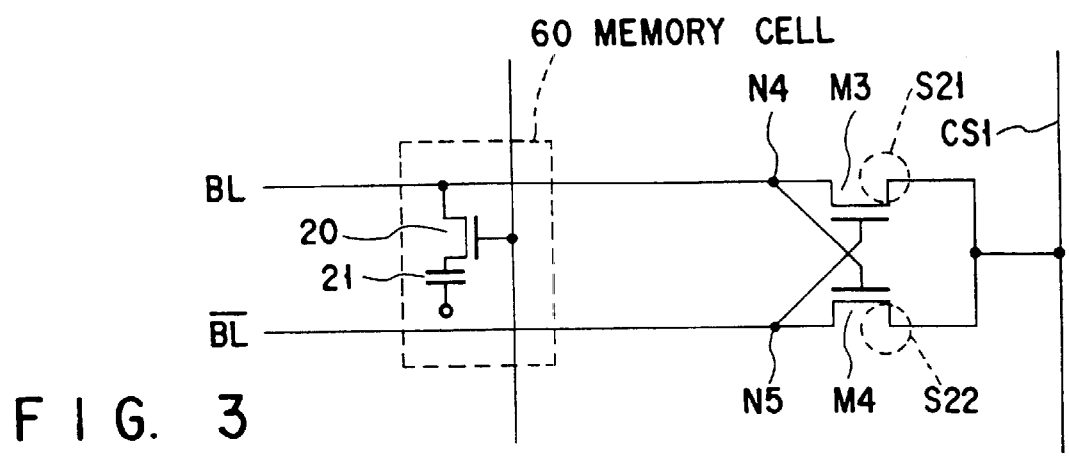
FIG. 3 is a circuit diagram showing the arrangement of a sense amplifier using an SOI-MOSFET according to the first embodiment.
Figure 4:
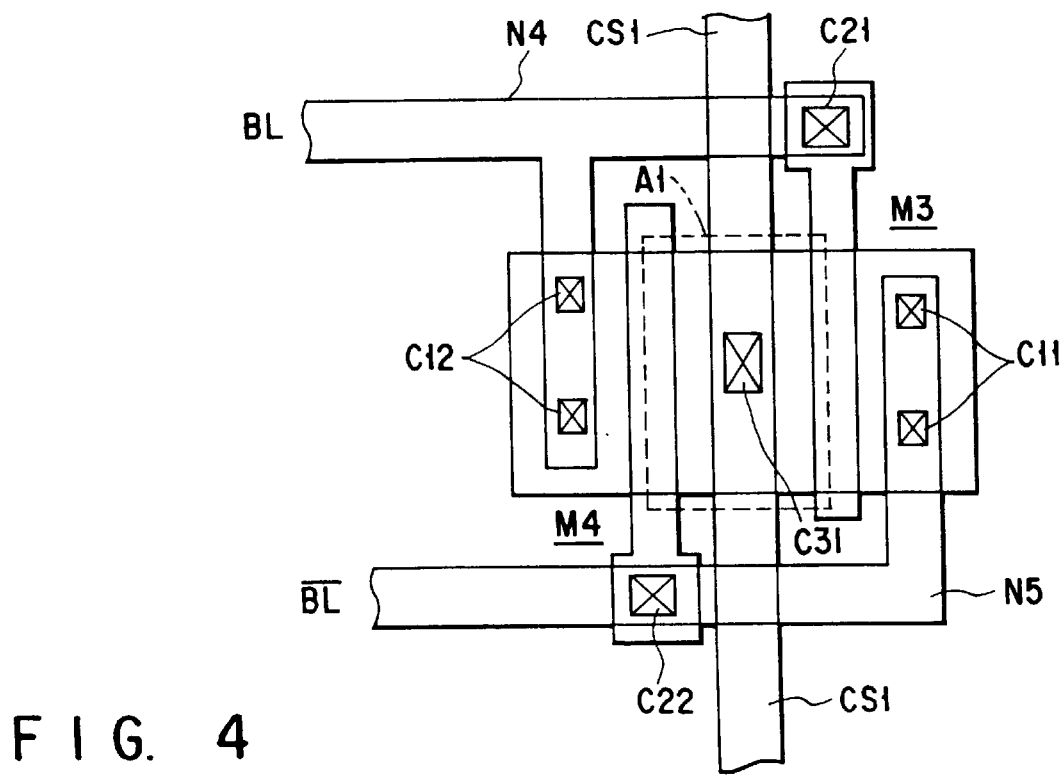
FIG. 4 is a plan view showing a layout pattern of the sense amplifier according to the first embodiment.
Figure 5:
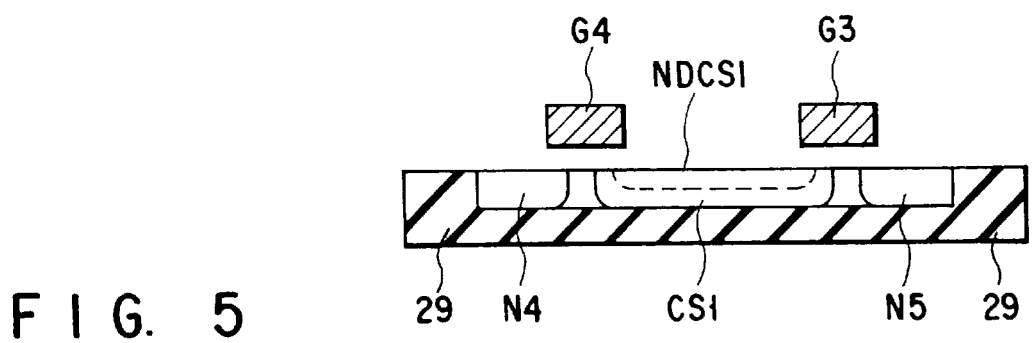
FIG. 5 is a sectional view showing the element structure of the SOI-MOSFET according to the first embodiment.

FIG. 3 shows a sense amplifier using an SOI-MOSFET according to the first embodiment of the present invention, FIG. 4 is a plan view showing the layout of the sense amplifier in FIG. 3, and FIG. 5 is a sectional view showing the SOI-MOSFET of this embodiment.

Referring to FIGS. 3 to 5, a first MOSFET M3 for the sense amplifier, a second MOSFET M4 for the sense amplifier, a first electrode N4 for a sensing operation, a second electrode N5 for a sensing operation, a common source CS1 of the sense amplifier, a gate G3 for the first MOSFET for the sense amplifier, a gate G4 for the second MOSFET for the sense amplifier, a narrow bandgap diffusion layer NDCS1 of the common source of the sense amplifier, narrow bandgap diffusion layers S21 and S22, a memory cell 60, a switching transistor 20, a charge storing capacitor 21, a bit line BL, a word line WL, a region A1 in which Ge ions are implanted, contacts C11, C12, C21, C22, and C31, and an element isolation region 29.

In this embodiment, an SIMOX substrate formed in the following manner was used. That is, after oxygen was ion-implanted in a p-type <100> Si substrate at an acceleration voltage of 180 kV and a dose of $4 \times 10^{17}$ cm$^{-2}$, the resultant structure was annealed at 1,300° C. for 6 hours to form a buried oxide film having a thickness of 80 nm, and the surface of the resultant structure was mono-crystallized to obtain a monocrystal silicon layer. After the silicon film was thinned by thermal oxidization and wet etching to have a thickness of 100 nm, MOS processing using a polysilicon gate electrode obtained by conventional phosphorus diffusion was performed to manufacture an element.

Upon completion of processing of the gate G3 and G4, Ge was implanted in the resultant structure at an acceleration voltage of 50 kV and a dose of $1 \times 10^{16}$ cm$^{-2}$ using the gates G3 and G4 as a mask. The resultant structure was annealed at 850° C. for 30 minutes, and arsenic was implanted in the resultant structure at an acceleration voltage of 40 keV and a dose of $3 \times 10^{15}$ cm$^{-2}$. Thereafter, the resultant structure was annealed at 850° C. for 90 minutes. An Si—Ge region NDCS1 formed at this time had a concentration peak corresponding to 10% of Si at a depth of about 40 nm from the surface of the n-type diffusion layer.

At this time, in at least a DRAM sense amplifier or the like, it is supposed that the region to be implanted with Ge is a common source portion of n-type SOI-MOSFETs connected as a flip-flop type sense amplifier. In a current mirror type differential amplifier using at least one pair of n-type SOI-MOSFETs as a potential detection unit, the region to be implanted with Ge is the source electrode portion of the n-type SOI-MOSFETs of the potential difference detection unit.

In this embodiment, although a method of forming the Si—Ge region by ion-implanting Ge is used as a method of forming a narrow bandgap material, an MBE method or a CVD method can also alternatively be used to form the Si—Ge region as a matter of course. In addition, even if Sn (tin) is implanted in the silicon layer in place of Ge, the above object of the present invention can be achieved. In this case, when Ge and Sn are implanted in the silicon layer at once, the effect can also be achieved. In the above description, although IV group elements are used, the bandgap may be narrowed by a semiconductor material consisting of III–V group elements and II–VI group elements.

Furthermore, the present invention is not limited to a semiconductor element formed on a thin-film SOI substrate, and the present invention can also be applied to a semiconductor element on a thick-film SOI substrate or a semiconductor element using amorphous silicon and represented by a TFT element. According to the present invention, an integrated circuit using an SOI element having a substrate floating effect which is suppressed can be provided.

Figure 6:
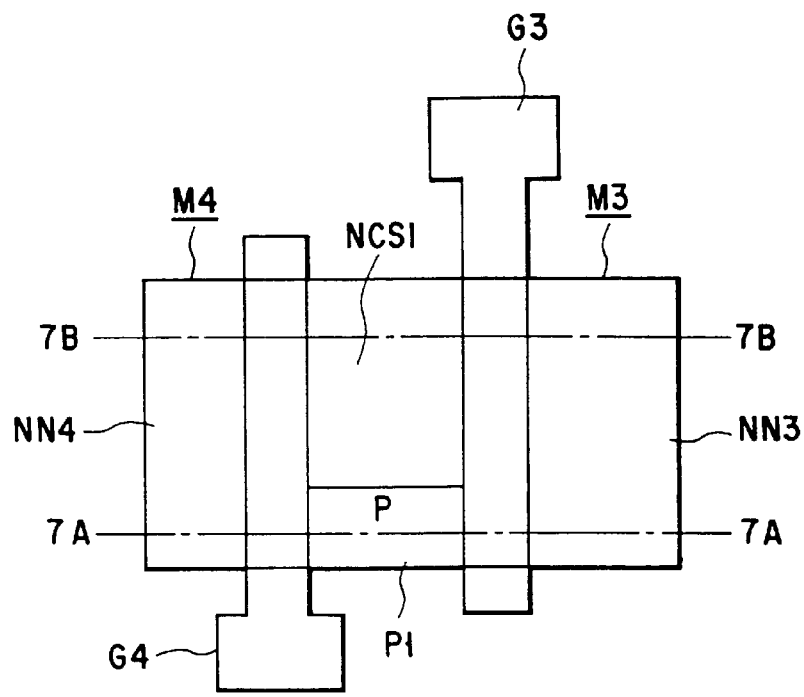
FIG. 6 is a plan view showing another layout pattern of the sense amplifier according to the first embodiment.
Figure 7A:
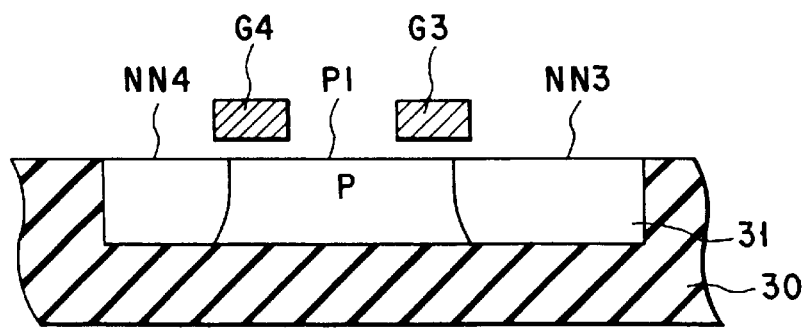
FIGS. 7A and 7B are sectional views showing the sense amplifier along lines 7A—7A and 7B—7B in FIG. 6, respectively.
Figure 7B:
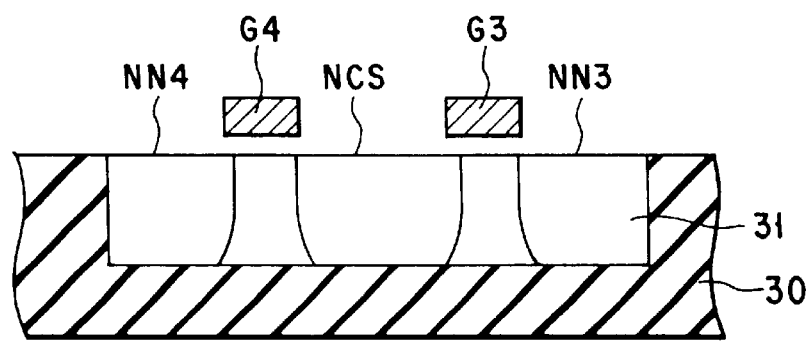

As shown in FIGS. 6, 7A and 7B, a p-type impurity having the same conductivity type as those of the substrates of the two n-type SOI-MOSFETs may be selectively formed, by using ion implantation or the like, in a portion P1 of the common source region of the two n-type SOI-MOSFETs constituting a sense amplifier of the DRAM and connected as a flip-flop type sense amplifier. With this arrangement, the potentials of the substrates of the pair of n-type SOI-MOSFETs can be made equal to each other. For this reason, even if their threshold values change, these changes are equal to each other. Therefore, potential difference detection can be performed without a hitch.

Note that reference symbols NN3, NN4, and NCS1 and reference numeral 30 in FIGS. 6, 7A, and 7B correspond to reference symbols N5, N4, and CS1 and reference numeral 29 in FIGS. 4 and 5, respectively. Reference numeral 31 denotes a monocrystal silicon layer.

Figures 8A, 8B:
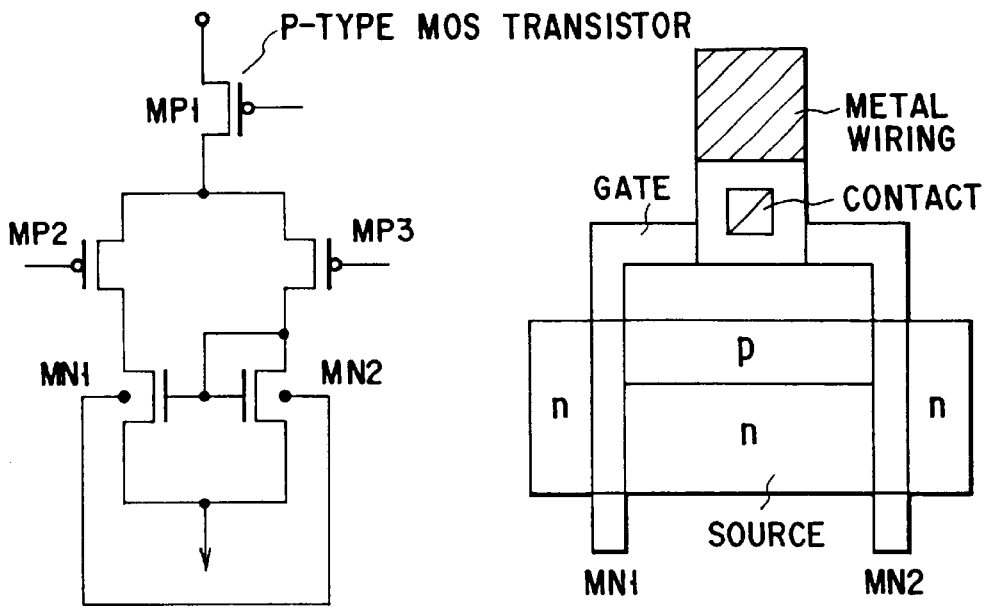
FIG. 8A is a circuit diagram showing the arrangement of a current mirror type sense amplifier.
FIG. 8B is a plan view showing the layout of the current mirror type sense amplifier in FIG. 8A.

The present invention can be applied to not only a flip-flop type sense amplifier, but also a current mirror type sense amplifier as shown in FIGS. 8A and 8B. Referring to FIGS. 8A and 8B, reference symbols MN1 and MN2 denote transistors constituting a current mirror. The gate electrodes of the transistors are connected to each other and formed to have equal gate lengths and equal gate widths, respectively. Since the substrates formed on an insulating film are connected to each other by a region of the same conductivity type as those of the substrates, a conductance difference which is a problem posed when the substrates are not connected to each other and which is caused by the difference between the substrate potentials of the two MOS transistors does not occur. For this reason, the state wherein almost equal currents flow in the two MOS transistors can be realized.

When the equal currents can be assured, for example, the sensitivity of this current mirror type sense amplifier with respect to a sensing operation can be improved in this embodiment.

When the substrates of transistors MP2 and MP3 are connected to each other in the same manner as described above, sensitivity for a sensing operation can be further improved.

Figure 9:
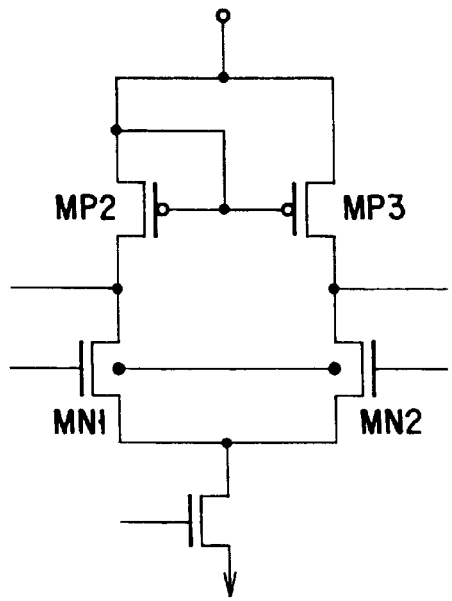
FIG. 9 is a circuit diagram showing the arrangement of a modification of the current mirror type sense amplifier in FIG. 8A.

In addition, an arrangement shown in FIG. 9 is more effective than the arrangement shown in FIG. 8A.

Embodiment 2

Figure 10:
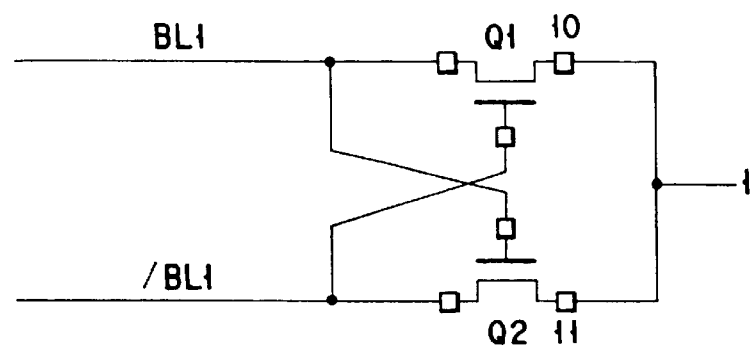
FIG. 10 is a circuit diagram showing the arrangement of a sense amplifier of a DRAM according to the second embodiment.
Figure 11:
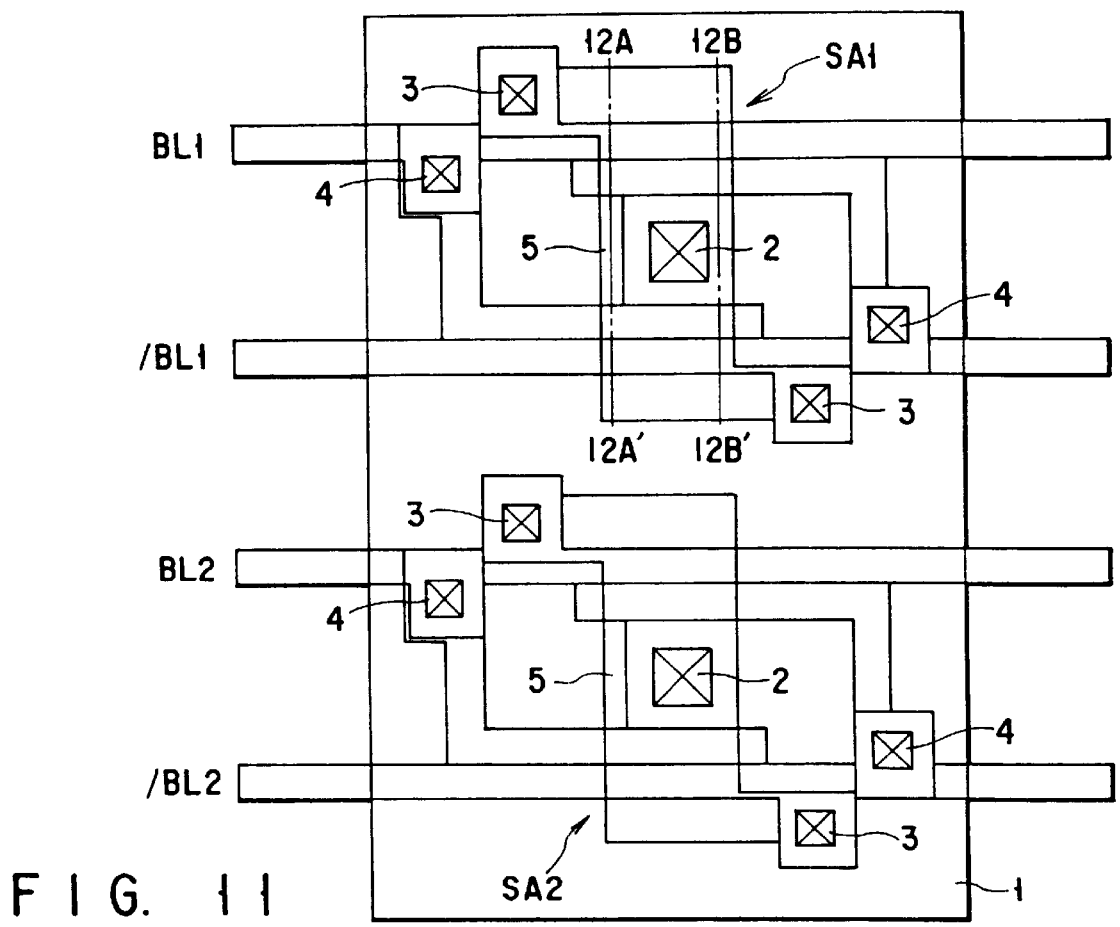
FIG. 11 is a plan view showing a layout pattern of the sense amplifiers according to the second embodiment.

FIGS. 10 to 13 are views for explaining sense amplifiers of a DRAM according to the second embodiment of the present invention. FIG. 10 is a circuit diagram showing the arrangement of a sense amplifier, FIG. 11 is a plan view showing the pattern of sense amplifiers, FIG. 12A is a sectional view showing the sense amplifier along a line 12A—12A in FIG. 11, and FIG. 12B is a sectional view showing the sense amplifier along a line 12B—12B in FIG. 11. FIG. 13 is a plan view showing another pattern of the sense amplifiers according to the second embodiment. In this case, an arrangement 1-1 is employed in FIG. 10, and arrangements 1-1 and 3-1 are employed in FIG. 13.

This embodiment employs a layout in which a pair of SOI-nMOS sense amplifiers are arranged on a pair of bit lines. Reference symbols Q1 and Q2 denote SOI-nMOSFETs constituting sense amplifiers SA arranged on bit lines BL1 and /BL1.

Figure 12A:
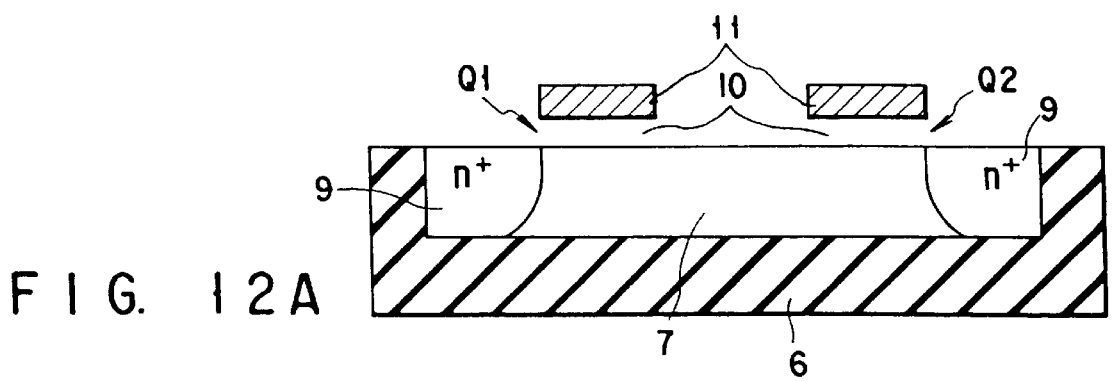
FIGS. 12A and 12B are sectional views showing the sense amplifier along lines 12A—12A and 12B—12B in FIG. 11.
Figure 12B:
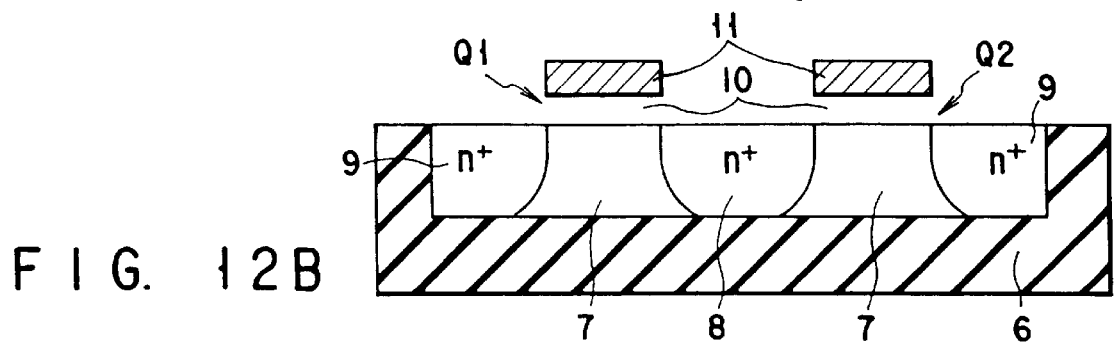

Referring to FIGS. 12A and 12B, a silicon oxide film (SiO$_2$ film) 6 is formed on the bottom and side surfaces of a p-type monocrystal silicon film 7 serving as an SOI film. The silicon oxide film 6 on the bottom surface is the insulating film of the SOI substrate, and the silicon oxide film 6 on each side surface is an element isolation insulation film. FIGS. 12A and 12B shows an n-type source region 8, an n-type drain region 9, a gate oxide film 10, and a gate electrode 11.

Referring to FIGS. 11 and 13, a source-contact portion 2 is connected to a control line 1 to which the common source terminal of a sense amplifier is connected. FIGS. 11 and 13 also show a drain-contact portion 3 for connecting a drain and a bit line, a gate-contact portion 4 for connecting a gate electrode and a bit line, and a p-type region 5 formed on a common source.

The arrangement shown in FIG. 13 is obtained by shifting the sense amplifiers in FIG. 11 from each other in a bit line direction. The arrangement in FIG. 13 is preferable to the arrangement in FIG. 11 because moderation of design rules such as a large bit line-drain contact portion, a large interval between the drain region of the sense amplifier SA1 and the drain region of the sense amplifier SA2, and a large gate length L of a transistor can be obtained. The sense amplifiers SA1 and SA2 in FIG. 13 may be laterally inverted.

Considering the sense amplifier SA1 in FIGS. 10 and 13, the p-type region 5 is formed in a portion of the common source of the two thin-film SOI-nMOSFETs Q1 and Q2. The p-type region 5 is selectively formed by ion-implanting a p-type impurity of the same conductivity type as that of the substrate 7 of the transistors by using a mask.

In this manner, the substrate potentials of the pair of thin-film SOI-nMOSFETs for detecting a potential difference can be made equal to each other. For this reason, even if the threshold values change, the changes in threshold value are equal to each other. Therefore, potential difference detection can be performed without a hitch.

Embodiment 3

Figure 14:
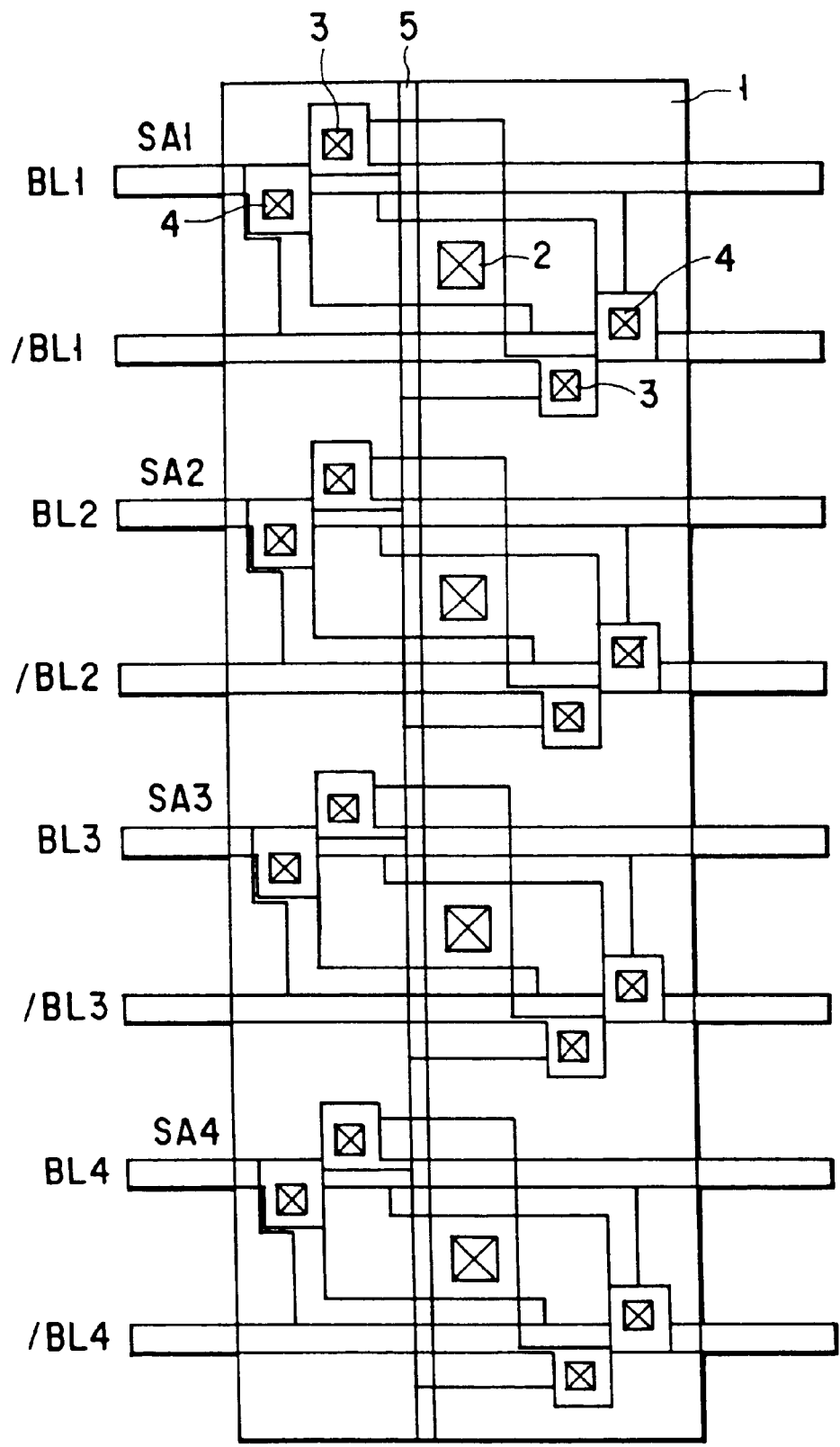
FIG. 14 is a plan view showing a layout pattern of sense amplifiers according to the third embodiment.
Figure 15:
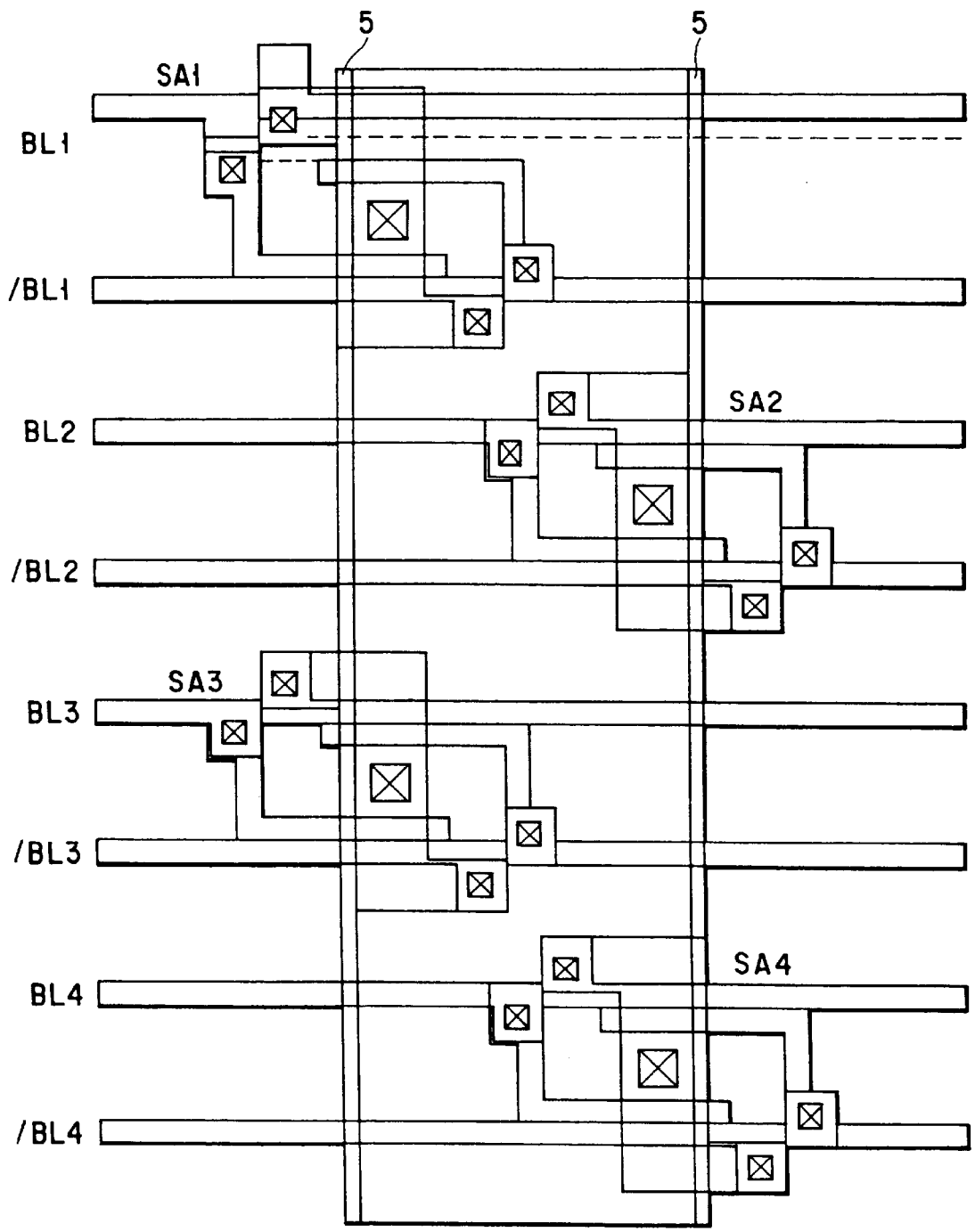
FIG. 15 is a plan view showing another layout pattern of the sense amplifiers according to the third embodiment.

FIGS. 14 and 15 are plan views showing sense amplifier portions of a DRAM according to the third embodiment of the present invention. Referring to FIG. 14, the p-type region 5 of Embodiment 2 in FIG. 11 is extended perpendicularly to the bit line, and the extended p-type region 5 is shared by a plurality of sense amplifiers (arrangements 1-1 and 1-2).

Referring to FIG. 14, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation.

Referring to FIG. 15, the sense amplifiers SA1 to SA4 are alternately shifted from each other one by one in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained. In this case, when the p-type region 5 is vertically extended, the substrate potentials of the sense amplifiers SA1 and SA3 can be made equal to each other, and the substrate potentials of the sense amplifiers SA2 and SA4 can be made equal to each other.

The p-type regions 5 are vertically connected to each other. For this reason, even if masks are vertically shifted from each other, the p-type regions 5 can be reliably formed in the channel portions advantageously (arrangements 1-1, 2-1, and 3-1).

Embodiment 4

Figure 16:
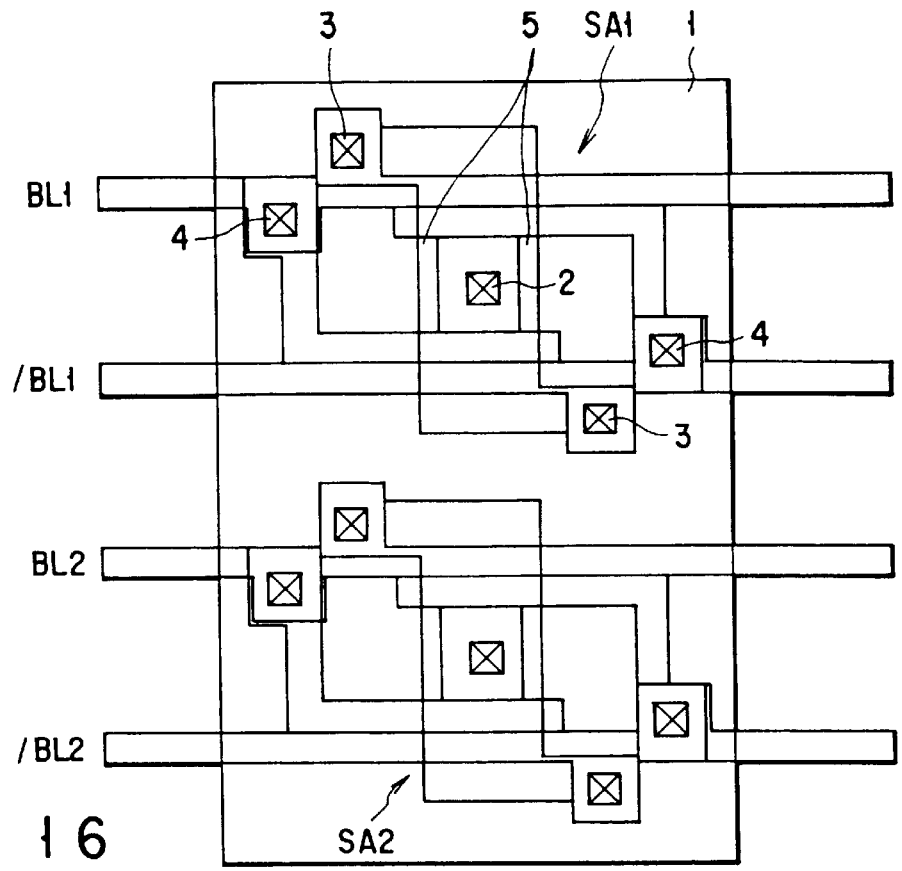
FIG. 16 is a plan view showing a layout pattern of sense amplifiers according to the fourth embodiment.
Figure 17:
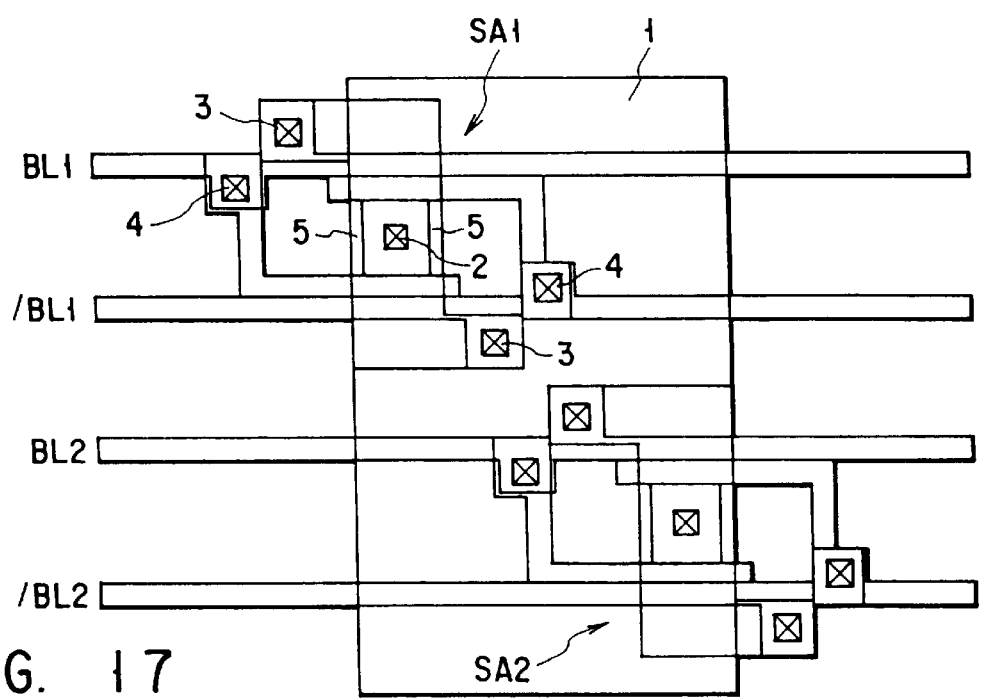
FIG. 17 is a plan view showing another layout pattern of the sense amplifiers according to the fourth embodiment.

FIGS. 16 and 17 plan views showing sense amplifier portions of a DRAM according to the fourth embodiment of the present invention. In this embodiment, two p-type regions 5 are formed in both the gate-width-direction ends of one sense amplifier in Embodiment 2.

FIG. 16 shows sense amplifiers which are parallel arranged in the vertical direction (arrangements 1-1 and 3-4), and FIG. 17 shows sense amplifiers which are alternately shifted from each other in the bit line direction (arrangements 1-1, 3-1, and 3-4).

Referring to FIG. 16, the sense amplifiers are alternately shifted from each other in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained.

In this embodiment, the p-type regions are formed in both the W-direction ends of two thin-film SOI-nMOSFETs constituting the sense amplifier. For this reason, even if masks are shifted from each other in the W direction (bit line direction in this case), a predetermined gate width W can be kept.

Embodiment 5

Figure 19:
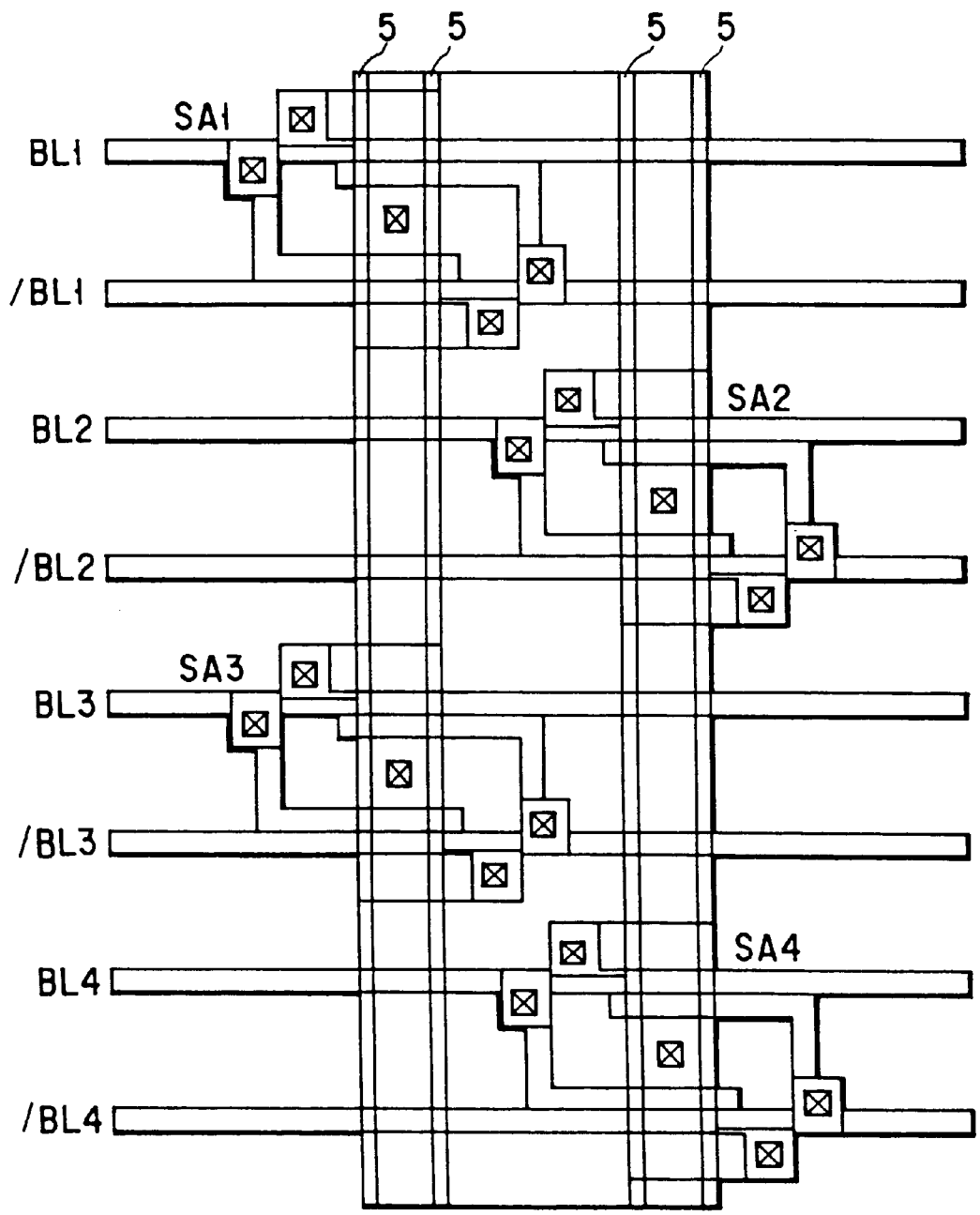
FIG. 19 is a plan view showing another layout pattern of the sense amplifiers according to the fifth embodiment.

FIGS. 18 and 19 are plan views showing sense amplifier portions of a DRAM according to the fifth embodiment of the present invention. In this embodiment, two p-type regions 5 are formed in both the gate-width-direction ends of one sense amplifier in Embodiment 2, and the p-type regions 5 are extended perpendicularly to the bit lines and shared by a plurality of sense amplifiers.

FIG. 18 shows sense amplifiers which are parallel arranged in the vertical direction (arrangements 1-1, 2-2, and 3-4), and FIG. 19 shows sense amplifiers which are alternately shifted from each other one by one in the bit line direction (arrangements 1-1, 2-2, 3-1, and 3-4).

Referring to FIG. 18, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation.

Referring to FIG. 19, the sense amplifiers SA1 to SA4 are alternately shifted from each other one by one in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained. In this case, when the p-type region 5 is vertically extended, the substrate potentials of the sense amplifiers SA1 and SA3 can be made equal to each other, and the substrate potentials of the sense amplifiers SA2 and SA4 can be made equal to each other.

The p-type regions 5 are vertically connected to each other. For this reason, even if masks are vertically shifted from each other, the p-type regions 5 can be reliably formed in the channel portions advantageously. In addition, the p-type regions are formed in both the W-direction ends of two thin-film SOI-nMOSFETs constituting the sense amplifier. For this reason, even if masks are shifted from each other in the W direction (bit line direction in this case), a predetermined gate width W can be kept.

Embodiment 6

Figure 20:
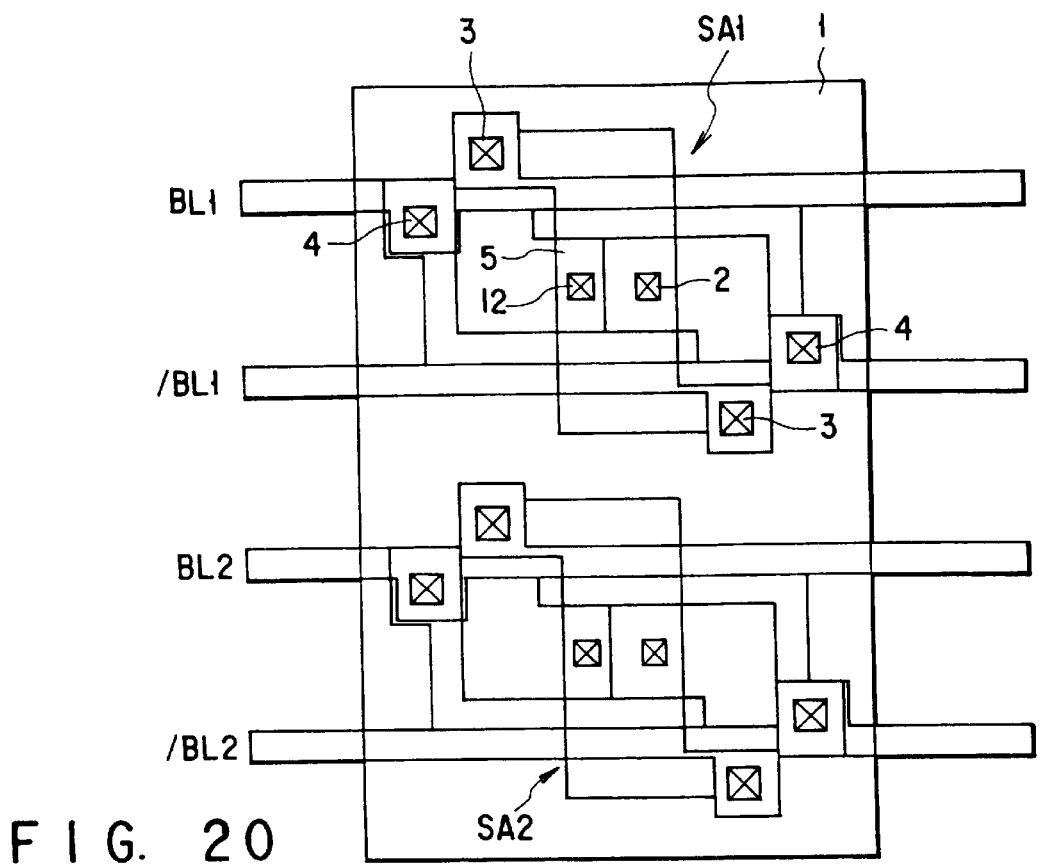
FIG. 20 is a plan view showing a layout pattern of sense amplifiers according to the sixth embodiment.
Figure 21:
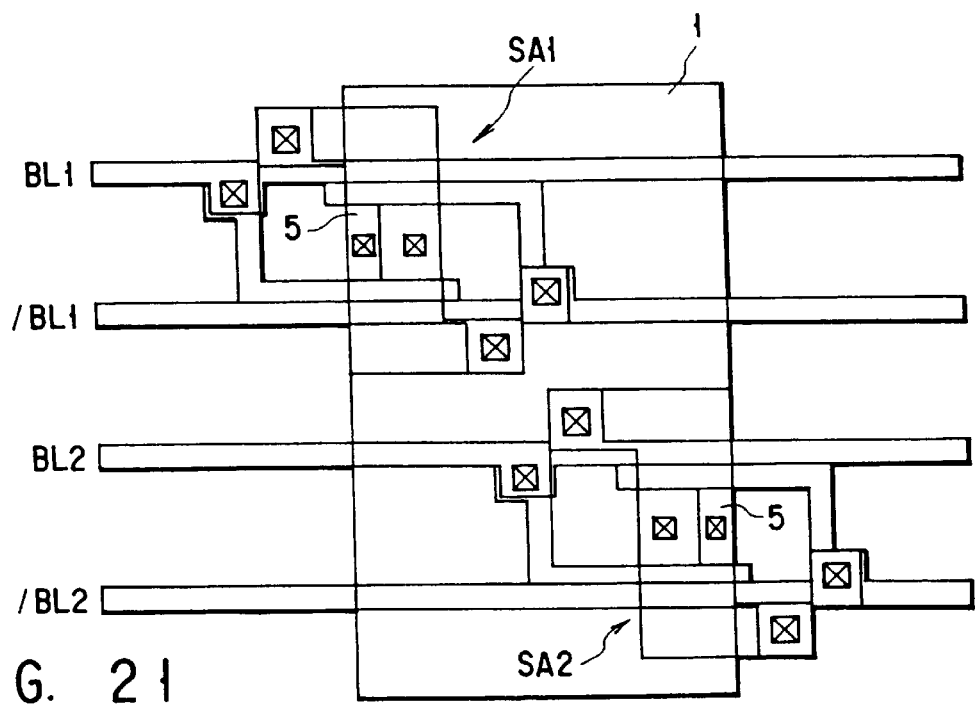
FIG. 21 is a plan view showing another layout pattern of the sense amplifiers according to the sixth embodiment.

FIGS. 20 and 21 are plan views showing sense amplifier portions of a DRAM according to the sixth embodiment of the present invention. In this embodiment, a contact (12 in FIG. 20) with a control line 1 is formed in a p-type region 5 in Embodiment 5.

FIG. 20 shows sense amplifiers SA1 and SA2 which are parallel arranged in the vertical direction (arrangements 1-1 and 1-2), and FIG. 21 shows the sense amplifiers SA1 and SA2 which are alternately shifted from each other in the bit line direction (arrangements 1-1, 1-2, and 3-1).

Referring to FIG. 21, the sense amplifiers SA1 and SA2 are alternately shifted from each other in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained.

In this embodiment, a common source of a pair of transistors is connected to a control line 1 by a source-contact portion 2, and the control line 1 is connected to the p-type region 5 by a body contact 12, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 7

FIGS. 22 and 23 are plan views showing sense amplifier portions of a DRAM according to the seventh embodiment of the present invention. In this embodiment, the contact (body contact) between a p-type region 5 and a control line 1 and the contact (source contact) between a common source and the control line 1 in Embodiment 6 are used common. Reference numeral 13 in FIGS. 22 and 23 denotes a contact serving as both the body and source contacts.

FIG. 22 shows sense amplifiers SA1 and SA2 which are parallel arranged in the vertical direction (arrangements 1-1, 1-2, and 2-1), and FIG. 23 shows the sense amplifiers SA1 and SA2 which are alternately shifted from each other in the bit line direction (arrangements 1-1, 1-2, 2-1, and 3-1).

Referring to FIG. 23, the sense amplifiers SA1 and SA2 are alternately shifted from each other in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained.

In this embodiment, since the contact of the source region and the contact of the p-type region 5 are used common, a mask pattern can be simplified, and a contact-contact interval is not required. For this reason, further micropatterning can be performed.

Embodiment 8

Figure 24:
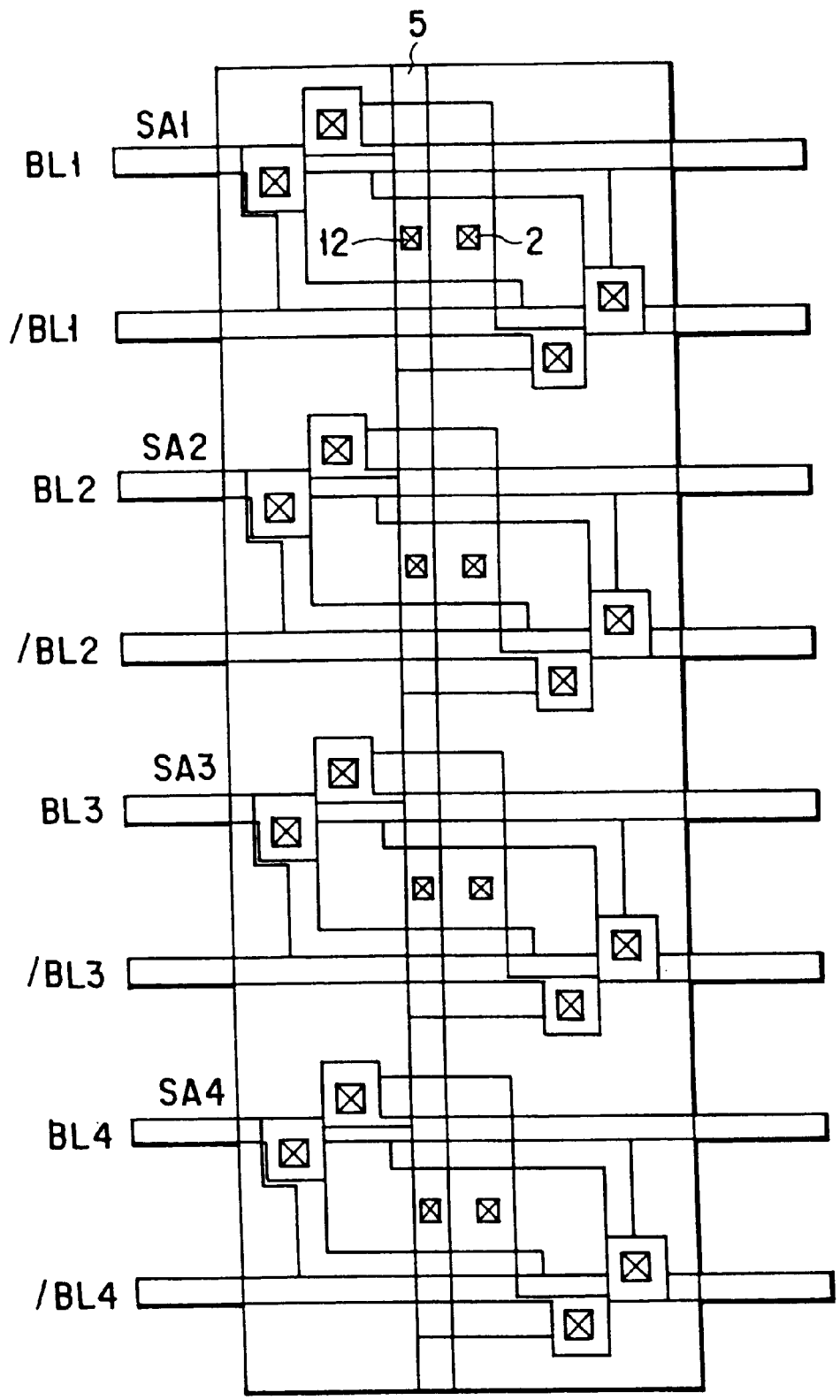
FIG. 24 is a plan view showing a layout pattern of sense amplifiers according to the eighth embodiment.
Figure 25:
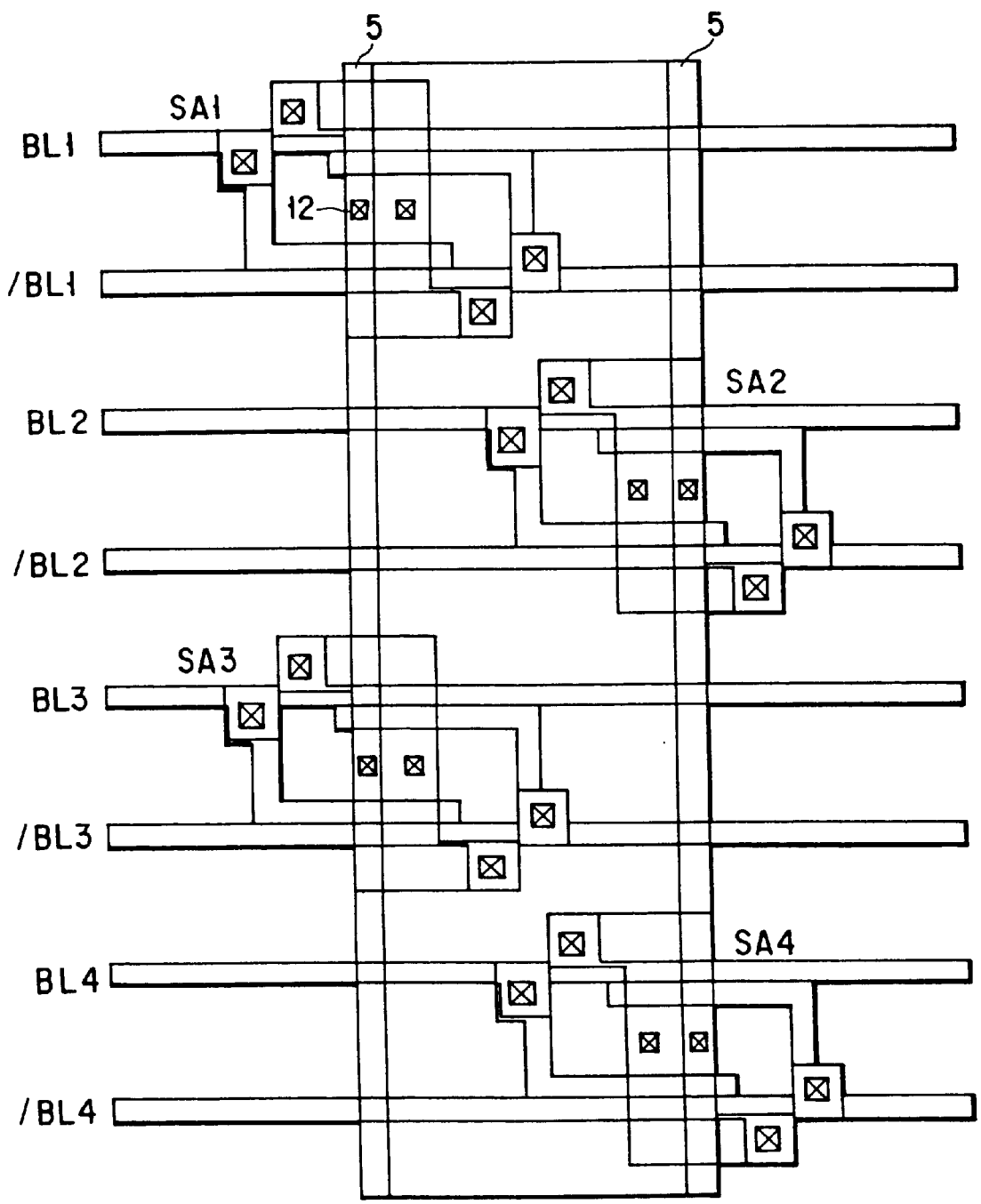
FIG. 25 is a plan view showing another layout pattern of the sense amplifiers according to the eighth embodiment.

FIGS. 24 and 25 are plan views showing sense amplifier portions of a DRAM according to the seventh embodiment of the present invention. In this embodiment, a contact 12 with a control line 1 is formed in a p-type region 5 in Embodiment 3.

Referring to FIG. 24, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation (arrangements 1-1, 1-2, and 2-2).

Referring to FIG. 25, the sense amplifiers SA1 to SA4 are alternately shifted from each other one by one in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained. In this case, when the p-type region 5 is vertically extended, the substrate potentials of the sense amplifiers SA1 and SA3 can be made equal to each other, and the substrate potentials of the sense amplifiers SA2 and SA4 can be made equal to each other.

The p-type regions 5 are vertically connected to each other. For this reason, even if masks are vertically shifted from each other, the p-type regions 5 can be reliably formed in the channel portions advantageously (arrangements 1-1, 1-2, 2-2, and 3-1).

In either of the cases in FIGS. 24 and 25, the common source of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 9

FIGS. 26 and 27 are plan views showing sense amplifier portions of a DRAM according to the ninth embodiment of the present invention. In this embodiment, the contact between a p-type region 5 and a control line 1 and the contact between a common source and the control line 1 in Embodiment 8 are used common. Reference numeral 13 in FIGS. 26 and 27 denotes a common contact serving as these contacts.

FIG. 26 shows sense amplifiers SA1 to SA4 which are parallel arranged in the vertical direction (arrangements 1-1, 1-2, 2-1, and 2-2), and FIG. 27 shows the sense amplifiers SA1 to SA4 which are alternately shifted from each other one by one in the bit line direction (arrangements 1-1, 1-2, 2-1, 2-2, and 3-1).

Referring to FIG. 27, the sense amplifiers SA1 to SA4 are alternately shifted from each other one by one in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained.

In this embodiment, since the contact of the source region and the contact of the p-type region 5 are used common, a mask pattern can be simplified, and a contact-contact interval is not required. For this reason, further micropatterning can be performed.

Embodiment 10

FIGS. 28 and 29 are plan views showing sense amplifier portions of a DRAM according to the 10th embodiment of the present invention. In this embodiment, a contact 12 with a control line 1 is formed in a p-type region 5 in Embodiment 4.

FIG. 28 shows sense amplifiers SA1 and SA2 which are parallel arranged in the vertical direction (arrangements 1-1, 1-2, and 3-4), and FIG. 29 shows the sense amplifiers SA1 and SA2 which are alternately shifted from each other in the bit line direction (arrangements 1-1, 1-2, 3-1, and 3-4).

Referring to FIG. 28, the sense amplifiers SA1 and SA2 are alternately shifted from each other one by one in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained.

In this embodiment, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

Furthermore, a common source of a pair of transistors is connected to a control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 11

Figure 30:
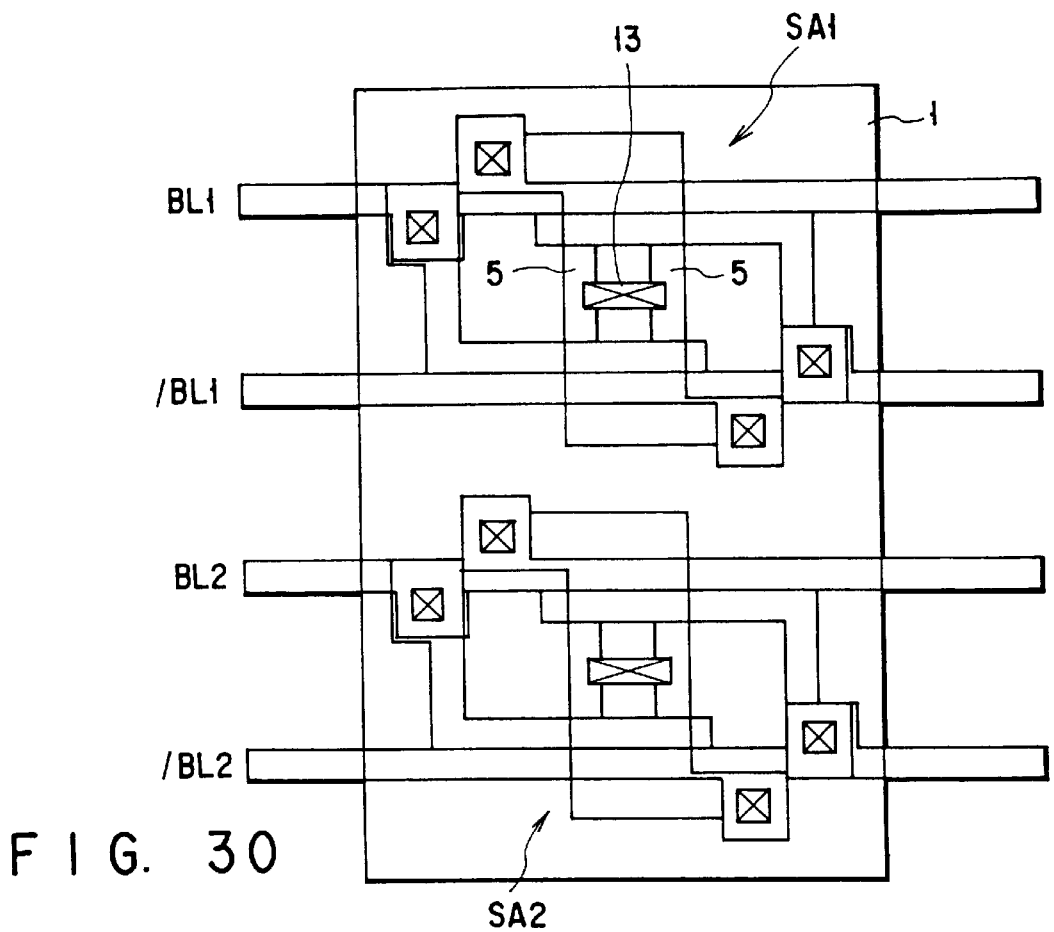
FIG. 30 is a plan view showing a layout pattern of sense amplifiers according to the 11th embodiment.
Figure 31:
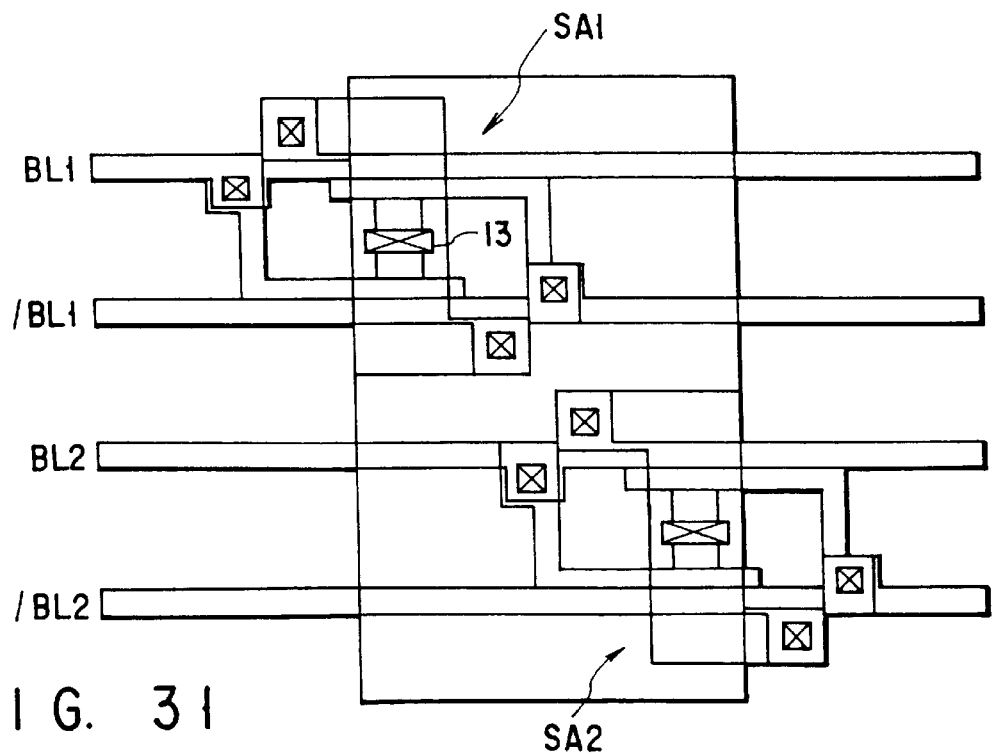
FIG. 31 is a plan view showing another layout pattern of the sense amplifiers according to the 11th embodiment.

FIGS. 30 and 31 are plan views showing sense amplifier portions of a DRAM according to the 11th embodiment of the present invention. In this embodiment, the contact between a p-type region 5 and a control line 1 and the contact between a common source and the control line 1 in Embodiment 10 are used common. Reference numeral 13 in FIGS. 30 and 31 denotes a common contact serving as these contacts.

FIG. 30 shows sense amplifiers SA1 and SA2 which are parallel arranged in the vertical direction (arrangements 1-1, 1-2, 2-1, and 3-4), and FIG. 31 shows the sense amplifiers SA1 and SA2 which are alternately shifted from each other one by one in the bit line direction (arrangements 1-1, 1-2, 2-1, 3-1, and 3-4).

Referring to FIG. 31, the sense amplifiers SA1 and SA2 are alternately shifted from each other one by one in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained.

In this embodiment, since the contact of the source region and the contact of the p-type region 5 are used common, a mask pattern can be simplified, and a contact-contact interval is not required. For this reason, further micropatterning can be performed.

Embodiment 12

Figure 33:
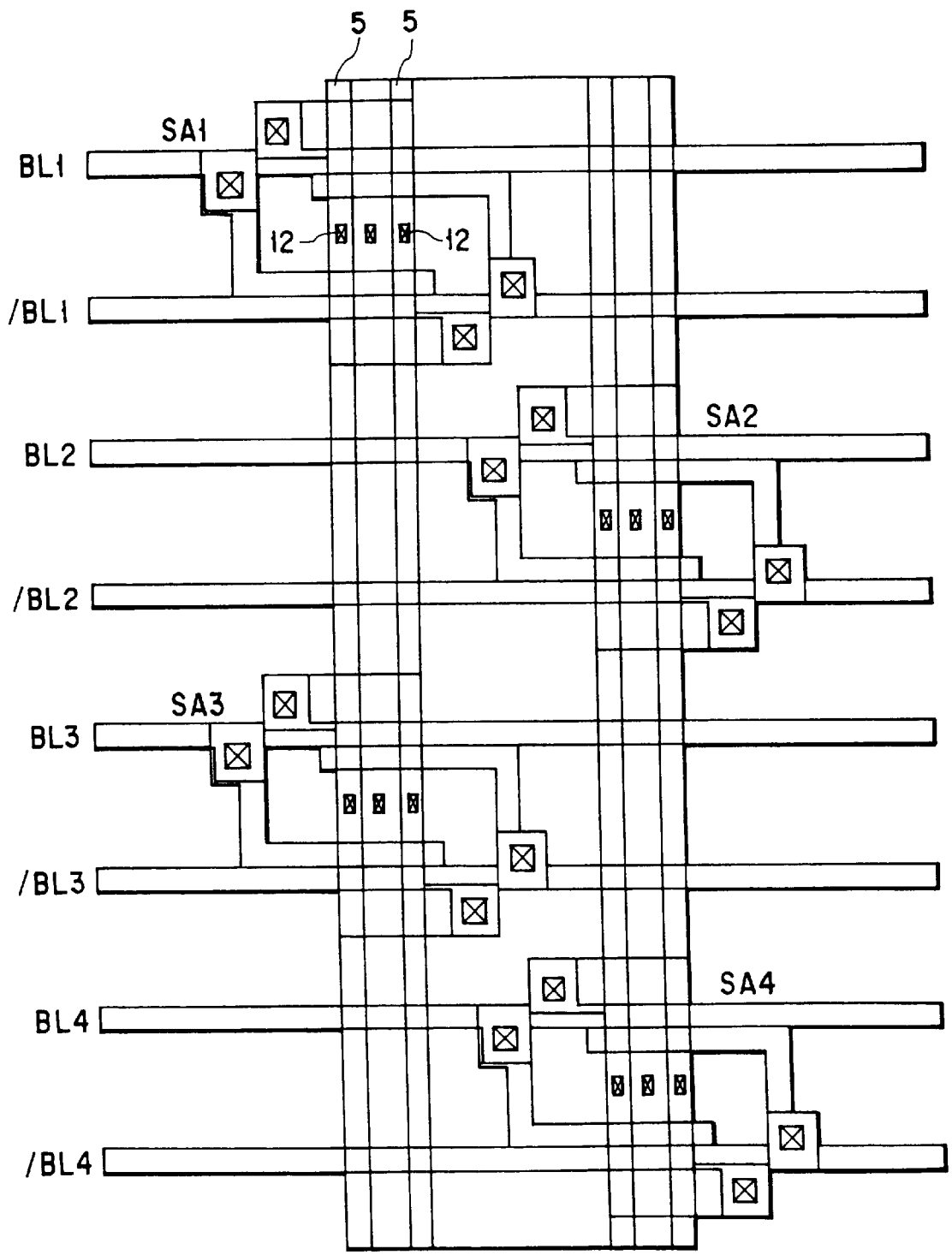
FIG. 33 is a plan view showing another layout pattern of the sense amplifiers according to the 12th embodiment.

FIGS. 32 and 33 are plan views showing sense amplifier portions of a DRAM according to the 12th embodiment of the present invention. In this embodiment, a contact 12 with a control line 1 is formed in a p-type region 5 in Embodiment 5.

Referring to FIG. 32, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation (arrangements 1-1, 1-2, 2-2, and 3-4).

Referring to FIG. 33, the sense amplifiers SA1 to SA4 are alternately shifted from each other one by one in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained. In this case, when the p-type region 5 is vertically extended, the substrate potentials of the sense amplifiers SA1 and SA3 can be made equal to each other, and the substrate potentials of the sense amplifiers SA2 and SA4 can be made equal to each other (arrangements 1-1, 1-2, 2-2, 3-1, and 3-4).

The common source of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

The p-type regions 5 are vertically connected to each other. For this reason, even if masks are vertically shifted from each other, the p-type regions 5 can be reliably formed in the channel portions advantageously. In addition, the p-type regions are formed in both the W-direction ends of two thin-film SOI-nMOSFETs constituting the sense amplifier. For this reason, even if masks are shifted from each other in the W direction (bit line direction in this case), a predetermined gate width W can be kept.

Embodiment 13

Figure 35:
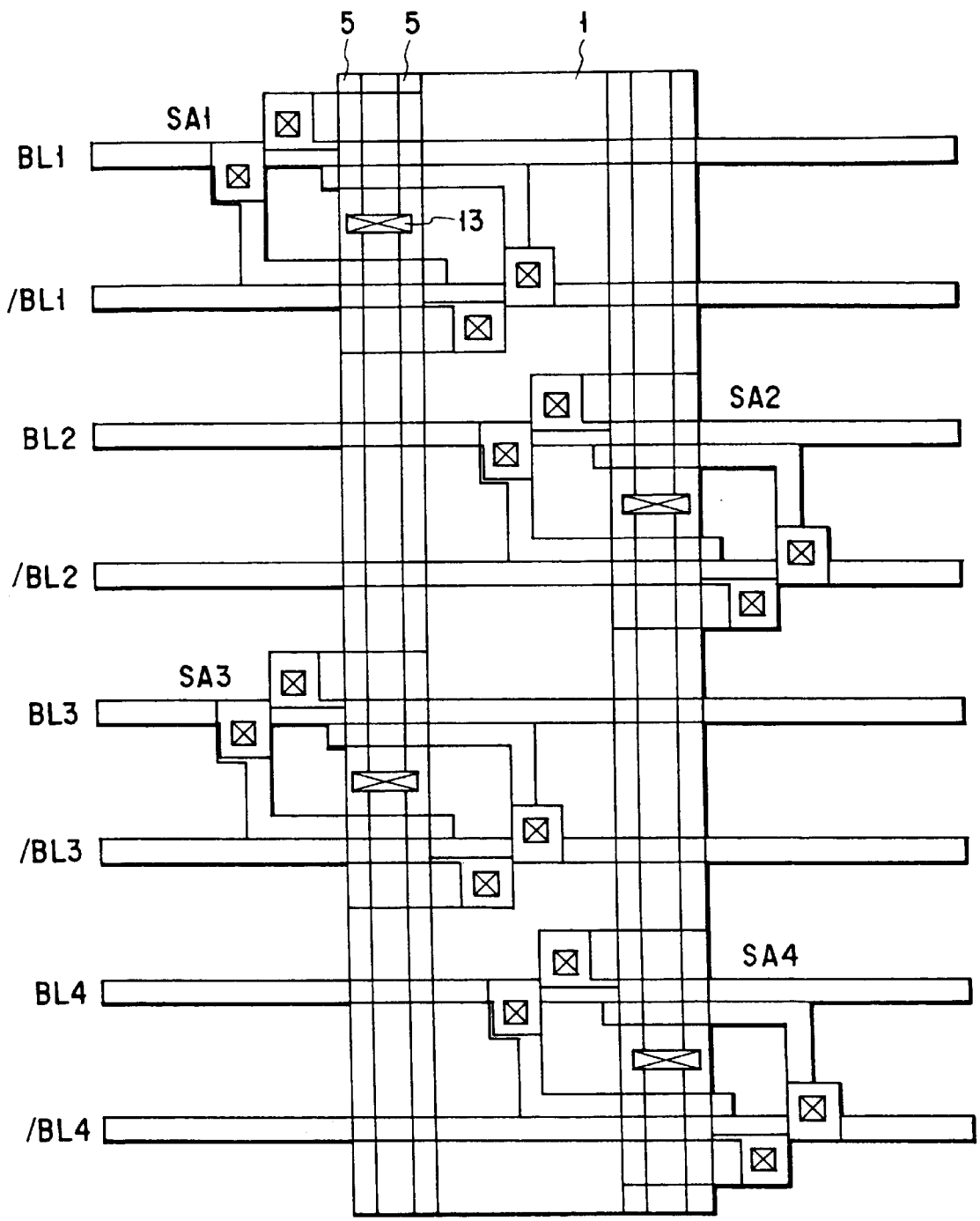
FIG. 35 is a plan view showing another layout pattern of the sense amplifiers according to the 13th embodiment.

FIGS. 34 and 35 are plan views showing sense amplifier portions of a DRAM according to the 13th embodiment of the present invention. In this embodiment, the contact between a p-type region 5 and a control line 1 and the contact between a common source and the control line 1 in Embodiment 12 are used common. Reference numeral 13 in FIGS. 34 and 35 denotes a common contact serving as these contacts.

FIG. 34 shows sense amplifiers SA1 to SA4 which are parallel arranged in the vertical direction (arrangements 1-1, 1-2, 2-1, 2-2, and 3-4), and FIG. 35 shows the sense amplifiers SA1 to SA4 which are alternately shifted from each other in the bit line direction.

Referring to FIG. 35, the sense amplifiers SA1 to SA4 are alternately shifted from each other one by one in the bit line direction. For this reason, moderation of design rules such as a large bit line-drain contact portion, a large interval between the drain region of the sense amplifier SA1 and the drain region of the sense amplifier SA2, and a large gate length L of a transistor can be preferably obtained (arrangements 1-1, 1-2, 2-1, 2-2, 3-1, and 3-4).

In this embodiment, since the contact of the source region and the contact of the p-type region 5 are used common, a mask pattern can be simplified, and a contact-contact interval is not required. For this reason, further micropatterning can be performed.

Embodiment 14

FIGS. 36 and 37 are plan views showing sense amplifier portions of a DRAM according to the 14th embodiment of the present invention. This embodiment employs a layout in which a pair of thin-film SOI-nMOS sense amplifiers are arranged on a pair of bit lines. FIG. 36 shows an arrangement 1-1, and FIG. 37 shows arrangements 1-1 and 3-1.

Reference symbols Q1, Q1', Q2, and Q2' denote thin-film SOI-nMOSFETs constituting a sense amplifier SA1 arranged on bit lines BL1 and /BL1. A sense amplifier SA2 has the same arrangement as that of the sense amplifier SA1.

FIG. 36 shows a control line 1 to which a common source terminal of the sense amplifiers is connected, a source-contact portion 2 connected to the control line 1, a drain-contact portion 3 for connecting a drain and a bit line to each other, and a gate-contact portion 4 for connecting a gate electrode to a bit line.

FIG. 37 shows an arrangement in which the sense amplifiers SA1 and SA2 are shifted from each other in a bit line direction. In this arrangement, moderation of design rules such as a large gate length L of a transistor can be preferably obtained. However, since a source-contact portion can be shared by the sense amplifiers SA1 and SA2 in FIG. 36, the vertical size can be decreased.

In this embodiment, the gate of each sense amplifier are divided by two. For this reason, when a width W is large, a large area is not required in the bit line direction.

In this manner, the substrate potentials of a pair of thin-film SOI-nMOSFETs for detecting a potential difference can be made equal to each other. For this reason, even if the threshold values change, the changes in threshold value are equal to each other. Therefore, potential difference detection can be performed without a hitch.

Embodiment 15

Figure 38:
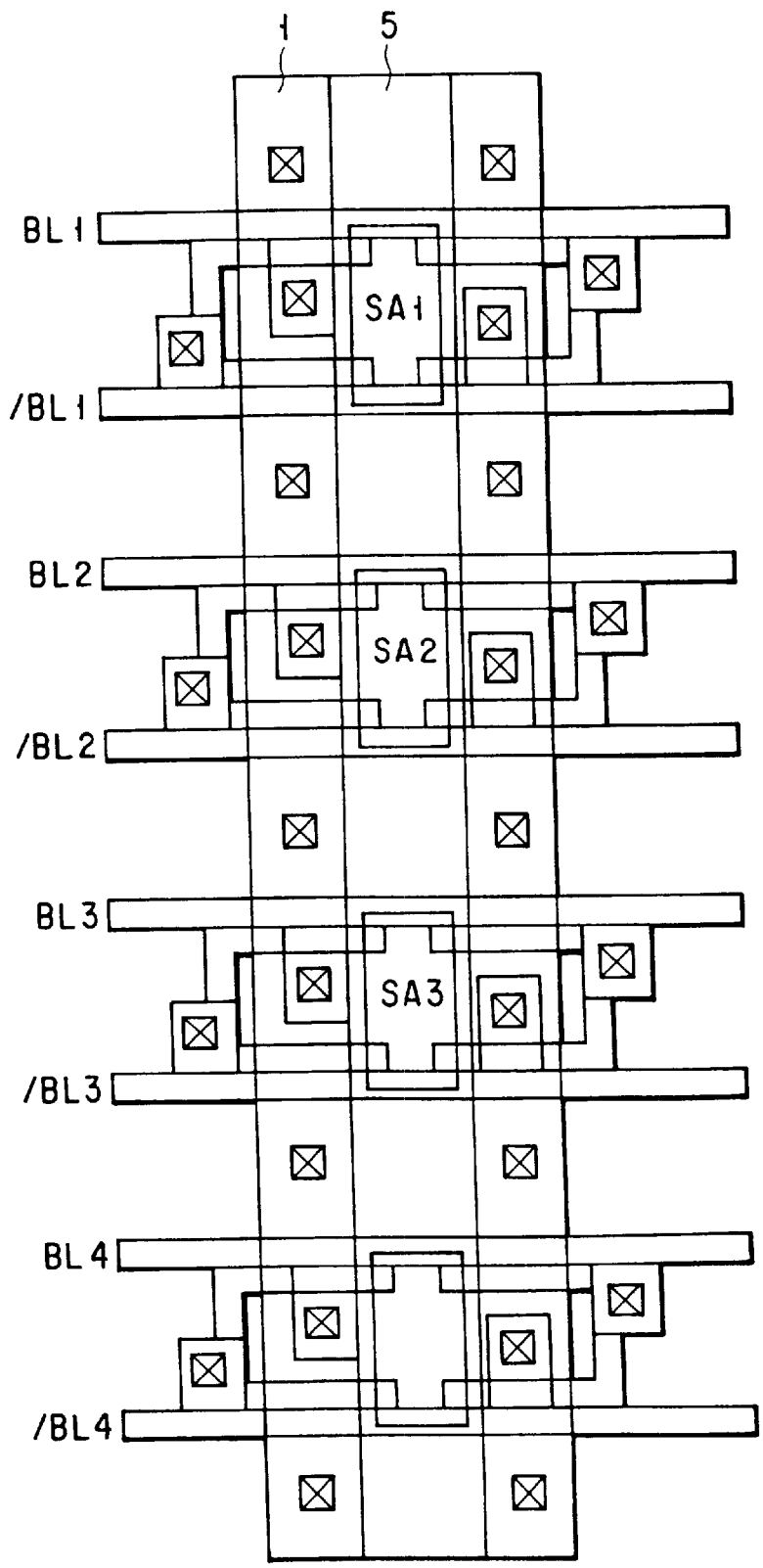
FIG. 38 is a plan view showing a layout pattern of sense amplifiers according to the 15th embodiment.
Figure 39:
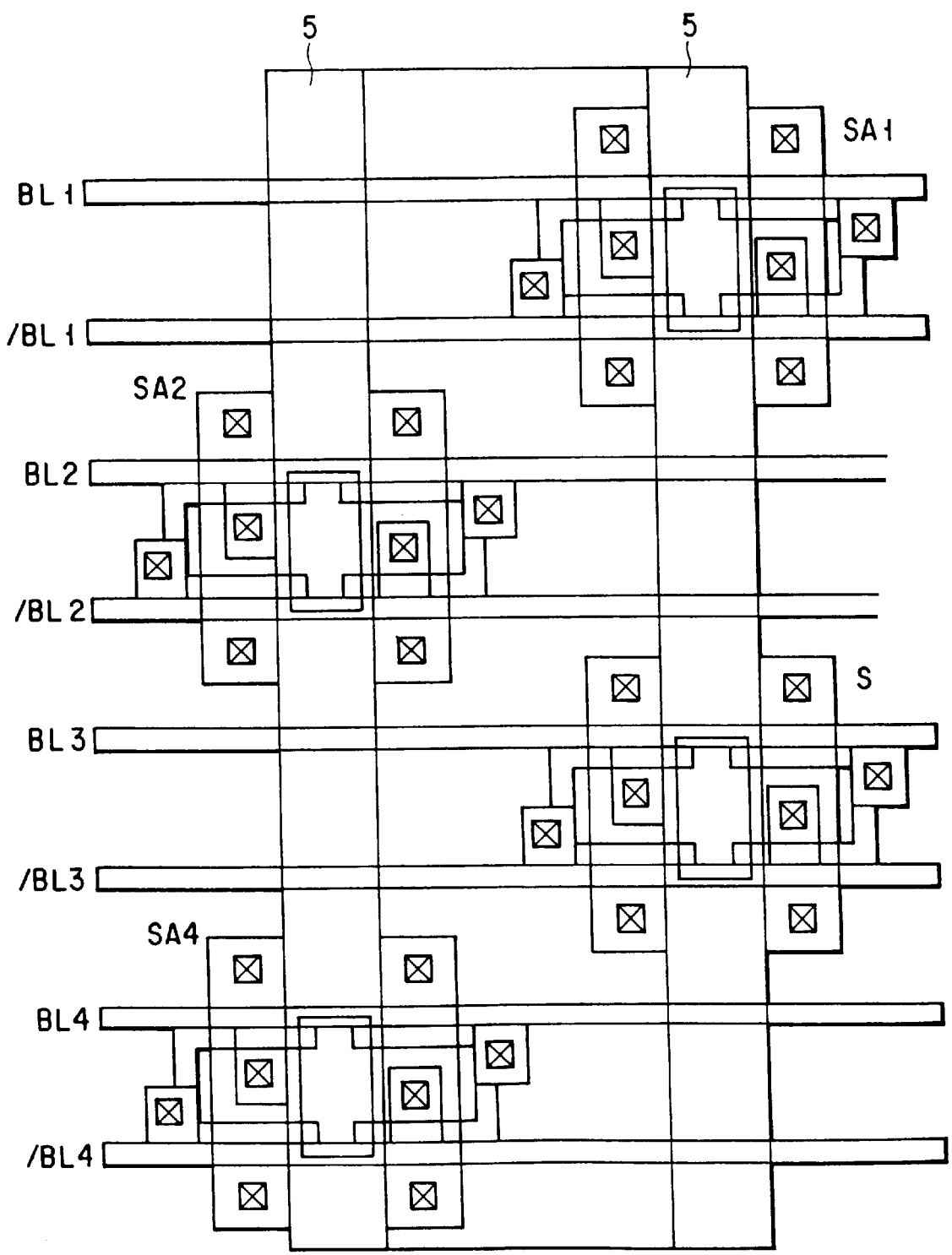
FIG. 39 is a plan view showing another layout pattern of the sense amplifiers according to the 15th embodiment.

FIGS. 38 and 39 are plan views showing sense amplifier portions of a DRAM according to the 15th embodiment of the present invention. In this embodiment, a p-type region 5 is extended perpendicularly to a bit line and shared by a plurality of sense amplifiers SA1 to SA4.

Referring to FIG. 38, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation (arrangements 1-1 and 2-2).

Referring to FIG. 39, the sense amplifiers SA1 to SA4 are alternately shifted from each other one by one in the bit line direction. In this case, when the p-type region 5 is vertically extended, the substrate potentials of the sense amplifiers SA1 and SA3 can be made equal to each other, and the substrate potentials of the sense amplifiers SA2 and SA4 can be made equal to each other (arrangements 1-1, 1-2, and 3-1).

The p-type regions 5 are vertically connected to each other. For this reason, even if masks are vertically shifted from each other, the p-type regions 5 can be reliably formed in the channel portions.

Embodiment 16

FIGS. 40 and 41 are plan views showing sense amplifier portions of a DRAM according to the 16th embodiment of the present invention. In this embodiment, two p-type regions 5 are formed in both the gate-width-direction ends of one sense amplifier in Embodiment 14.

FIG. 40 shows sense amplifiers SA1 and SA2 which are parallel arranged in the vertical direction (arrangements 1-1 and 3-4), and FIG. 41 shows the sense amplifiers SA1 and SA2 which are alternately shifted from each other in the bit line direction (arrangements 1-1, 3-1, and 3-4).

When only one p-type region 5 is formed as in Embodiment 15, if a width W of a transistor Q1 is increased by shifting a mask in the W direction, it is not expected to perform an accurate operation. In this embodiment, two p-type regions 5 are formed in both the W-direction ends of two thin-film SOI-MOSFETs constituting a sense amplifier. For this reason, even if masks are shifted from each other in the W direction (bit line direction in this case), the widths W of the two transistors constituting a pair always change by equal amounts, and the widths W are equal to each other.

Embodiment 17

Figure 43:
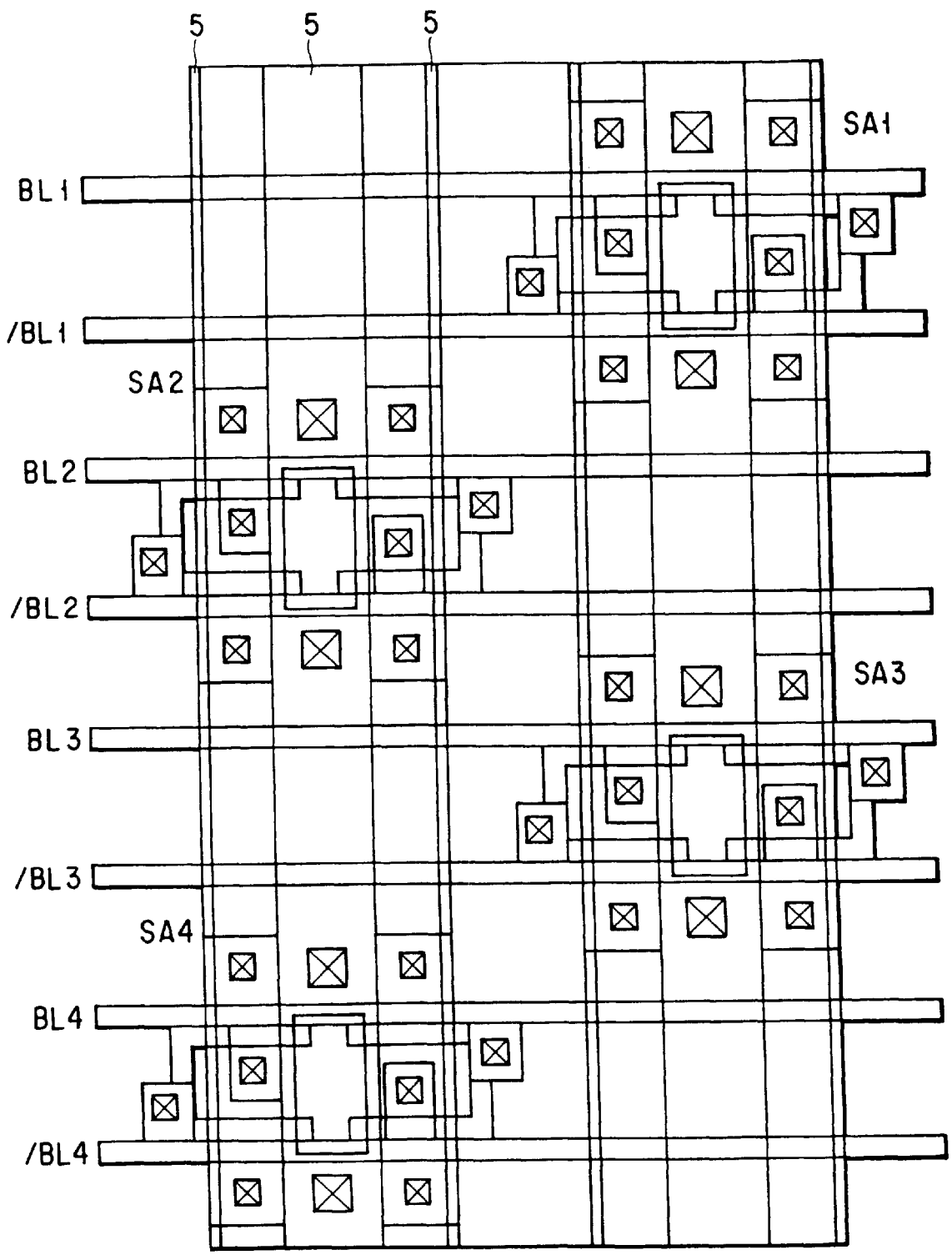
FIG. 43 is a plan view showing another layout pattern of the sense amplifiers according to the 17th embodiment.

FIGS. 42 and 43 are plan views showing sense amplifier portions of a DRAM according to the 17th embodiment of the present invention. In this embodiment, two p-type regions 5 are formed in both the gate-width-direction ends of one sense amplifier in Embodiment 14, and the p-type regions 5 are extended perpendicularly to the bit lines and shared by a plurality of sense amplifiers SA1 to SA4.

FIG. 42 shows sense amplifiers SA1 to SA4 which are parallel arranged in the vertical direction (arrangements 1-1, 2-2, and 3-4), and FIG. 43 shows the sense amplifiers SA1 to SA4 which are alternately shifted from each other in the bit line direction (arrangements 1-1, 2-2, 3-1, and 3-4).

Referring to FIG. 42, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation.

Referring to FIG. 43, the sense amplifiers SA1 to SA4 are alternately shifted from each other one by one in the bit line direction. In this case, when the p-type region 5 is vertically extended, the substrate potentials of the sense amplifiers SA1 and SA3 can be made equal to each other, and the substrate potentials of the sense amplifiers SA2 and SA4 can be made equal to each other.

The p-type regions 5 are vertically connected to each other. For this reason, even if masks are vertically shifted from each other, the p-type regions 5 can be reliably formed in the channel portions. In addition, the two p-type regions 5 are formed in both the W-direction ends of two thin-film SOI-nMOSFETs constituting a sense amplifier. For this reason, even if masks are shifted from each other in the W direction (bit line direction in this case), the widths W of the pair of transistors are can be kept equal to each other.

Embodiment 18

Figure 44:
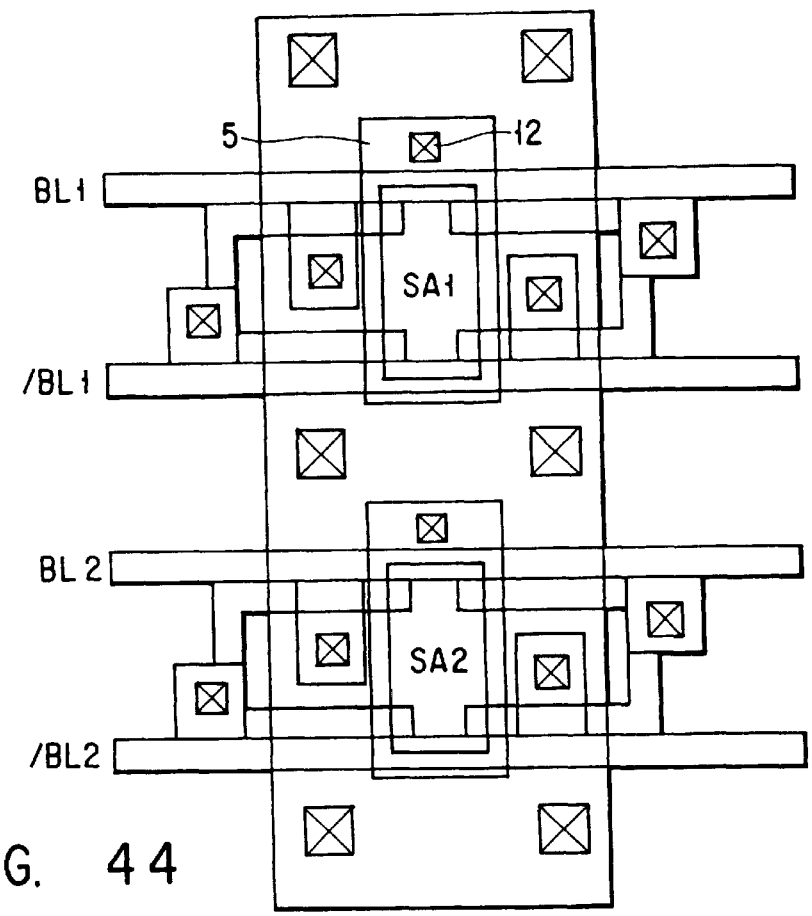
FIG. 44 is a plan view showing a layout pattern of sense amplifiers according to the 18th embodiment.
Figure 45:
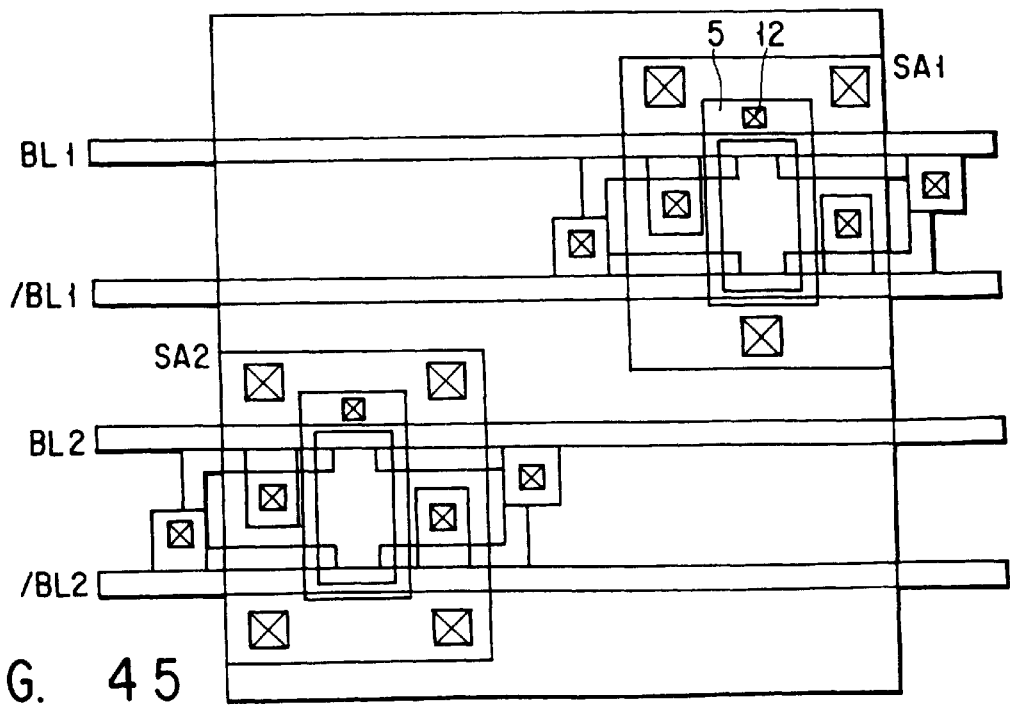
FIG. 45 is a plan view showing another layout pattern of the sense amplifiers according to the 18th embodiment.

FIGS. 44 and 45 are plan views showing sense amplifier portions of a DRAM according to the 18th embodiment of the present invention. In this embodiment, a contact 12 with a control line 1 is formed in a p-type region 5 in Embodiment 14.

FIG. 44 shows sense amplifiers SA1 and SA2 which are parallel arranged in the vertical direction (arrangements 1-1 and 1-2), and FIG. 45 shows the sense amplifiers SA1 and SA2 which are alternately shifted from each other in the bit line direction (arrangements 1-1, 1-2, and 3-1).

In this embodiment, the common source of a pair of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 19

FIGS. 46 and 47 are plan views showing sense amplifier portions of a DRAM according to the 19th embodiment of the present invention. In this embodiment, the contact between a p-type region 5 and a control line 1 and the contact between a common source and the control line 1 in Embodiment 18 are used common. Reference numeral 13 in FIGS. 46 and 47 denotes a common contact serving as these contacts.

FIG. 46 shows sense amplifiers SA1 and SA2 which are parallel arranged in the vertical direction (arrangements 1-1, 1-2, and 2-1), and FIG. 47 shows the sense amplifiers SA1 and SA2 which are alternately shifted from each other in the bit line direction (arrangements 1-1, 1-2, 2-1, and 3-1).

In this embodiment, since the contact of the source region and the contact of the p-type region 5 are used common, a mask pattern can be simplified, and a contact-contact interval is not required. For this reason, further micropatterning can be performed.

Embodiment 20

Figure 48:
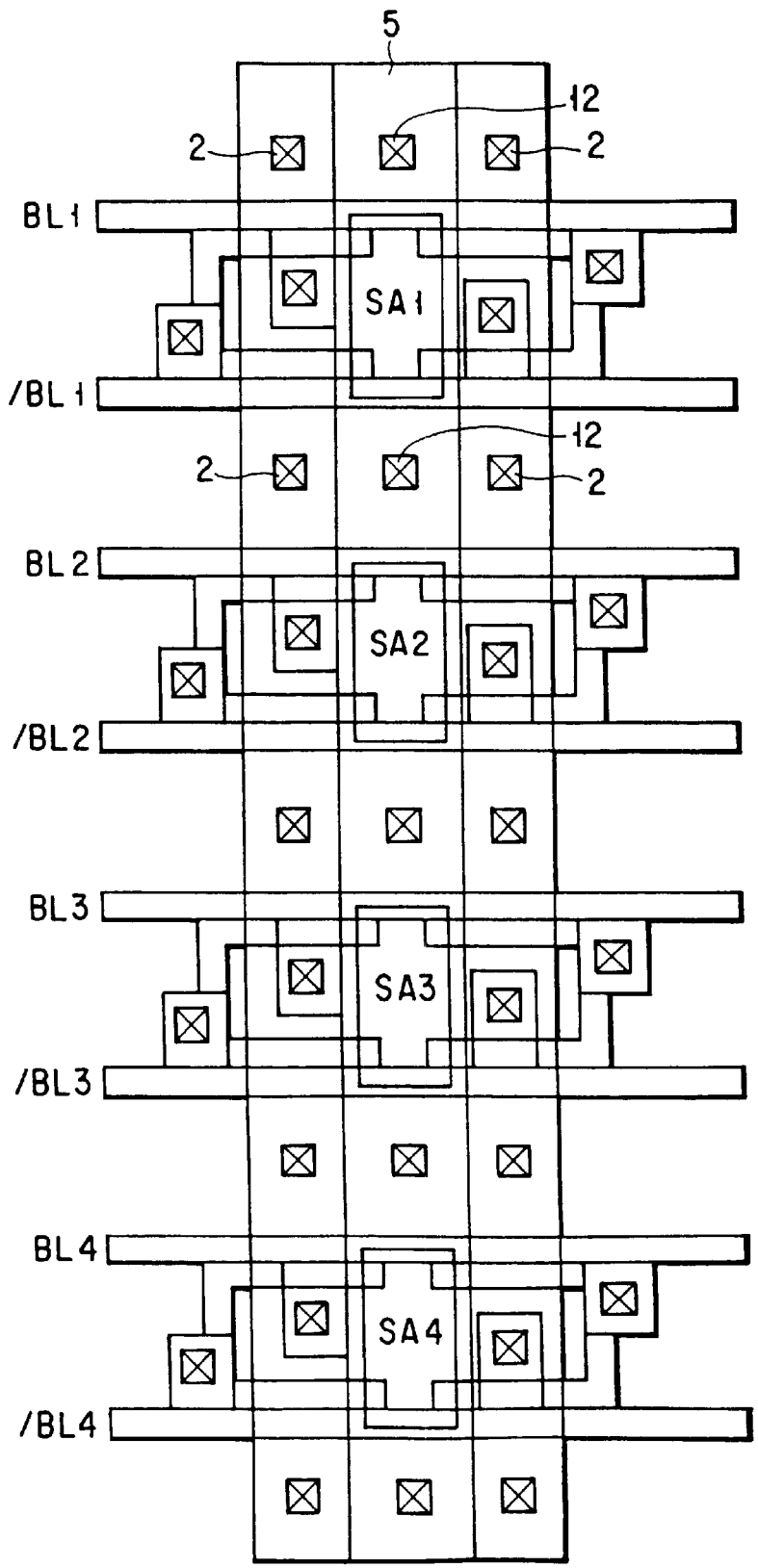
FIG. 48 is a plan view showing a layout pattern of sense amplifiers according to the 20th embodiment.
Figure 49:
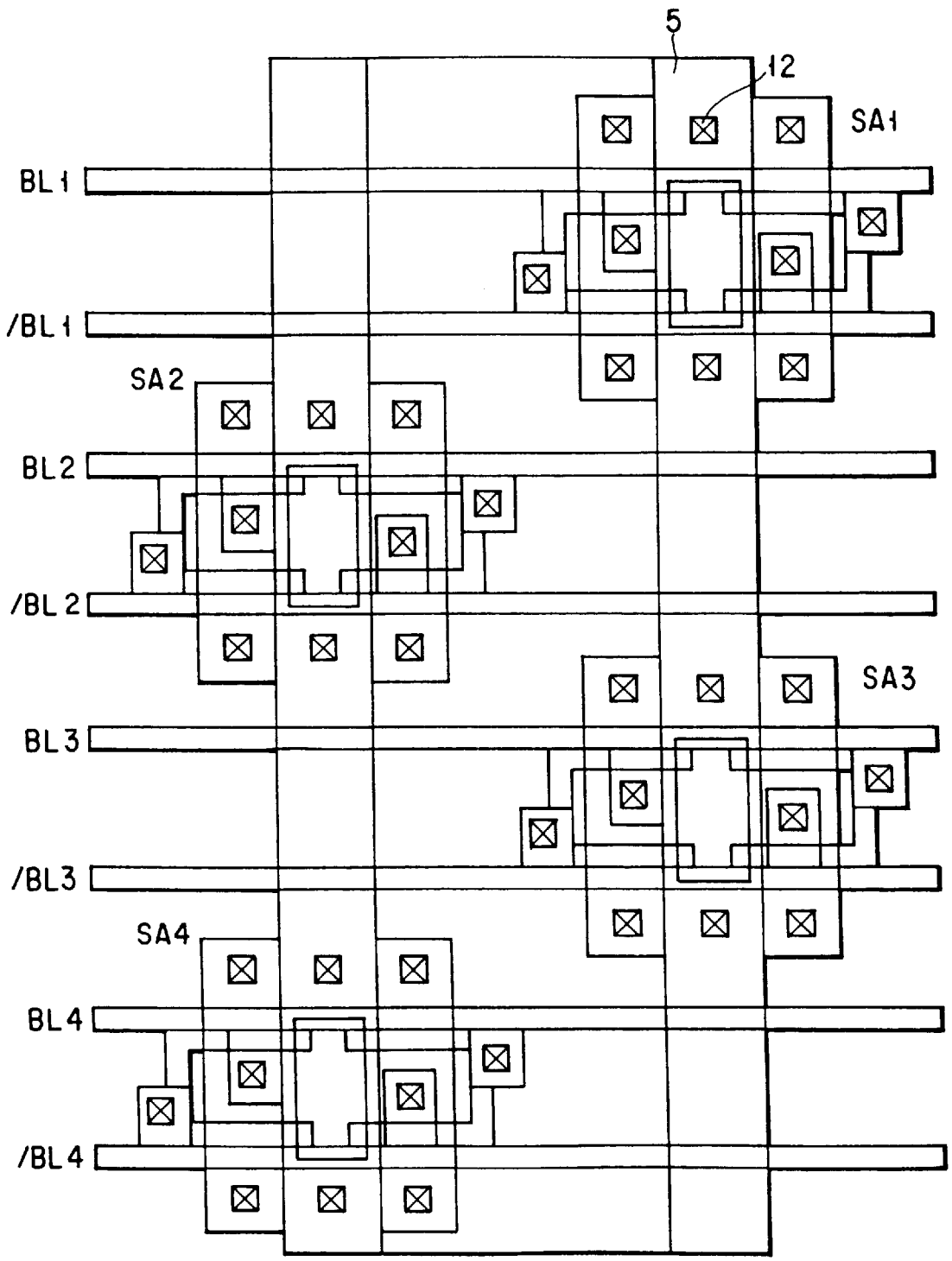
FIG. 49 is a plan view showing another layout pattern of the sense amplifiers according to the 20th embodiment.

FIGS. 48 and 49 are plan views showing sense amplifier portions of a DRAM according to the 20th embodiment of the present invention. In this embodiment, a contact 12 with a control line 1 is formed in a p-type region 5 in Embodiment 15.

Referring to FIG. 48, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation (arrangements 1-1, 1-2 and 2-2).

Referring to FIG. 49, the sense amplifiers SA1 to SA4 are alternately shifted from each other one by one in the bit line direction. In this case, when the p-type region 5 is vertically extended, the substrate potentials of the sense amplifiers SA1 and SA3 can be made equal to each other, and the substrate potentials of the sense amplifiers SA2 and SA4 can be made equal to each other (arrangements 1-1, 1-2, 2-2, and 3-1).

The p-type regions 5 are vertically connected to each other. For this reason, even if masks are vertically shifted from each other, the p-type regions 5 can be reliably formed in the channel portions.

The common source of a pair of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 21

Figure 51:
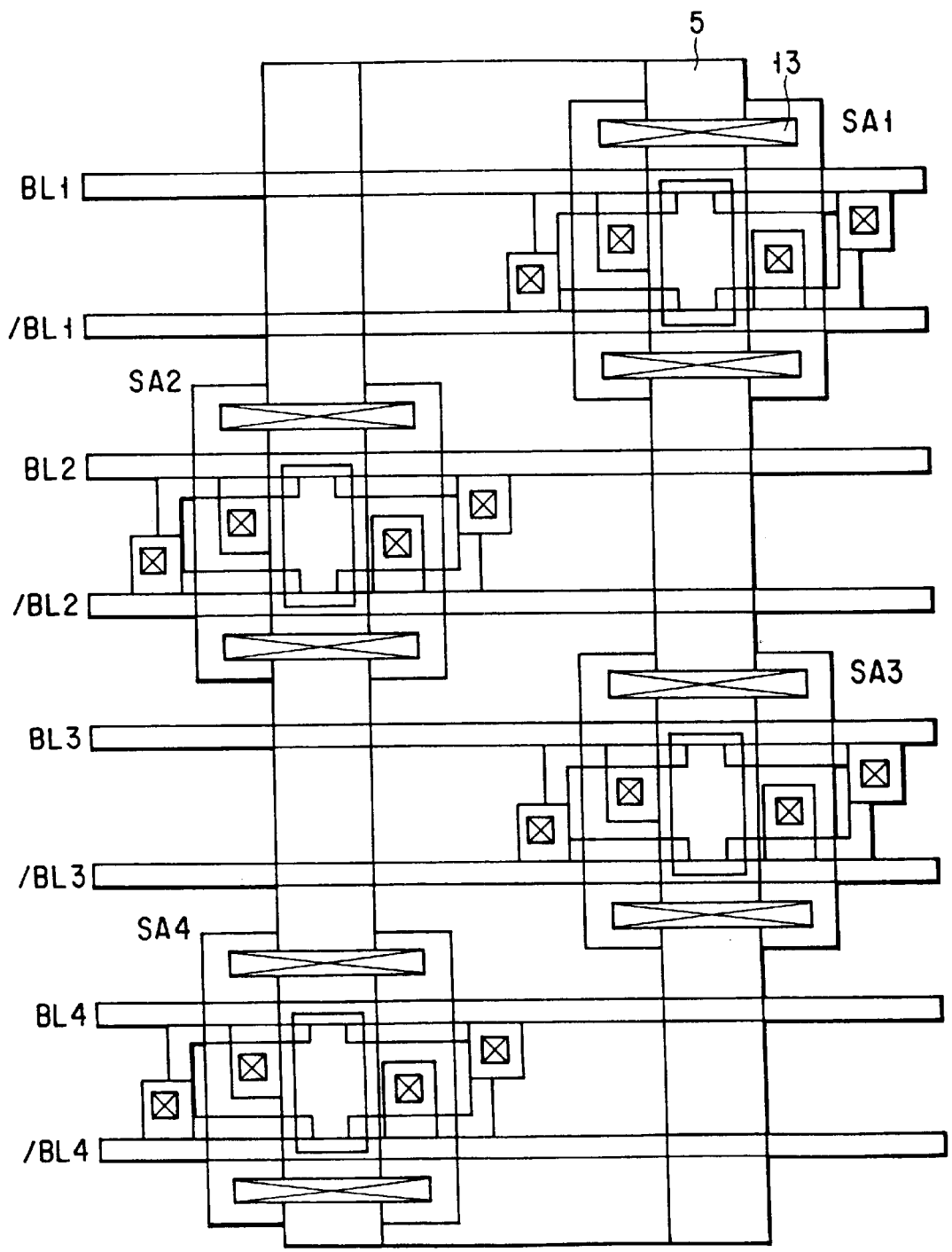
FIG. 51 is a plan view showing another layout pattern of the sense amplifiers according to the 21st embodiment.

FIGS. 50 and 51 are plan views showing sense amplifier portions of a DRAM according to the 21st embodiment of the present invention. In this embodiment, the contact between a p-type region 5 and a control line 1 and the contact between a common source and the control line 1 in Embodiment 20 are used common. Reference numeral 13 in FIGS. 50 and 51 denotes a common contact serving as these contacts.

FIG. 50 shows sense amplifiers SA1 to SA4 which are parallel arranged in the vertical direction (arrangements 1-1, 1-2, 2-1, and 2-2), and FIG. 51 shows the sense amplifiers SA1 to SA4 which are alternately shifted from each other in the bit line direction (arrangements 1-1, 1-2, 2-1, 2-2, and 3-1).

In this embodiment, since the contact of the source region and the contact of the p-type region 5 are used common, a mask pattern can be simplified, and a contact-contact interval is not required. For this reason, further micropatterning can be performed.

Embodiment 22

FIGS. 52 and 53 are plan views showing sense amplifier portions of a DRAM according to the 22nd embodiment of the present invention. In this embodiment, a contact 12 with a control line 1 is formed in a p-type region 5 in Embodiment 16.

FIG. 52 shows sense amplifiers SA1 and SA2 which are parallel arranged in the vertical direction (arrangements 1-1, 1-2, and 3-4), and FIG. 53 shows the sense amplifiers SA1 and SA2 which are alternately shifted from each other in the bit line direction (arrangements 1-1, 1-2, 3-1, and 3-4).

In this embodiment, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

The common source of a pair of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 23

FIGS. 54 and 55 are plan views showing sense amplifier portions of a DRAM according to the 23rd embodiment of the present invention. In this embodiment, the contact between a p-type region 5 and a control line 1 and the contact between a common source and the control line 1 in Embodiment 22 are used common. Reference numeral 13 in FIGS. 54 and 55 denotes a common contact serving as these contacts.

FIG. 54 shows sense amplifiers SA1 and SA2 which are parallel arranged in the vertical direction (arrangements 1-1, 1-2, 2-1, and 3-4), and FIG. 55 shows the sense amplifiers SA1 and SA2 which are alternately shifted from each other in the bit line direction (arrangements 1-1, 1-2, 2-1, 3-1, and 3-4).

In this embodiment, since the contact of the source region and the contact of the p-type region 5 are used common, a mask pattern can be simplified, and a contact-contact interval is not required. For this reason, further micropatterning can be performed.

Embodiment 24

Figure 56:
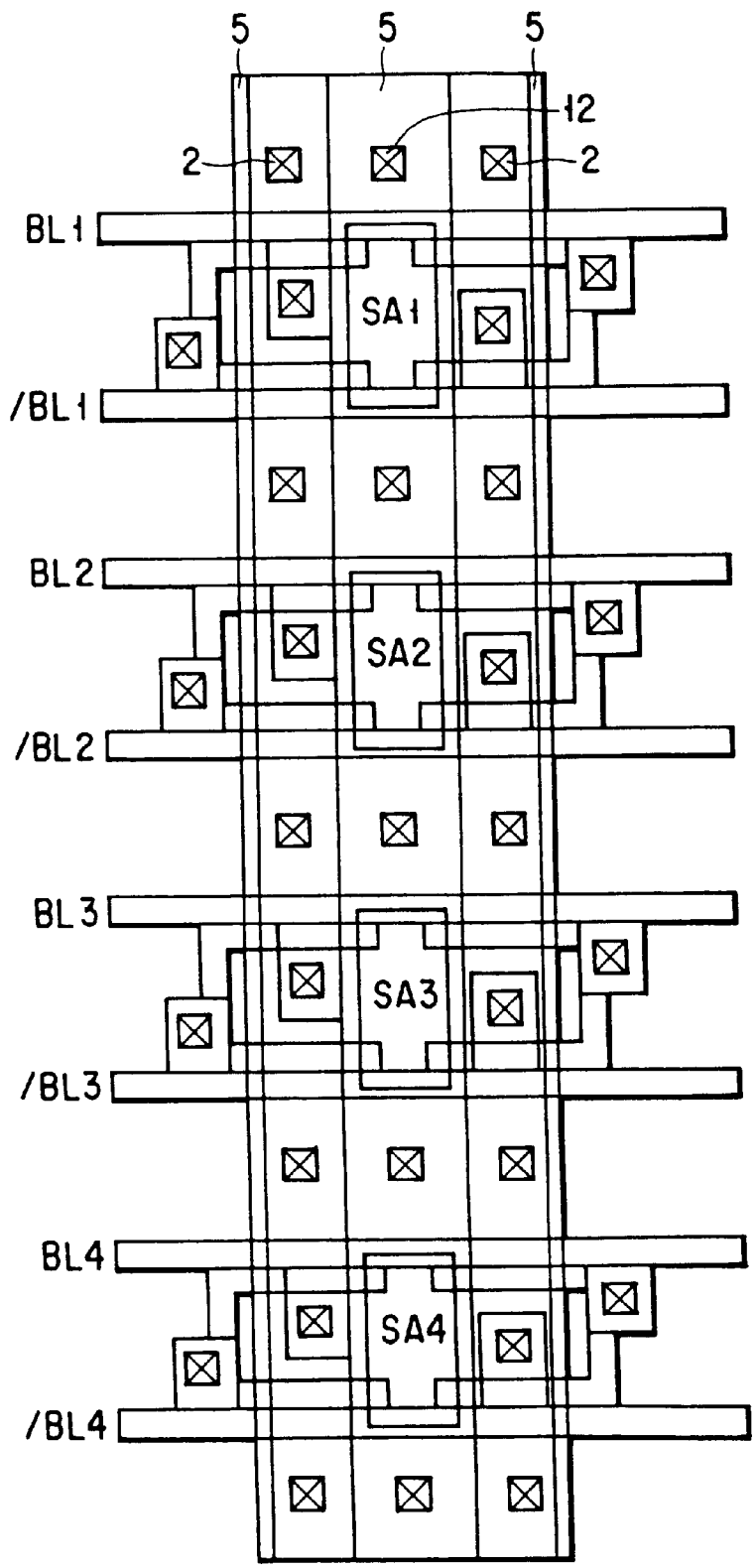
FIG. 56 is a plan view showing a layout pattern of sense amplifiers according to the 24th embodiment.
Figure 57:
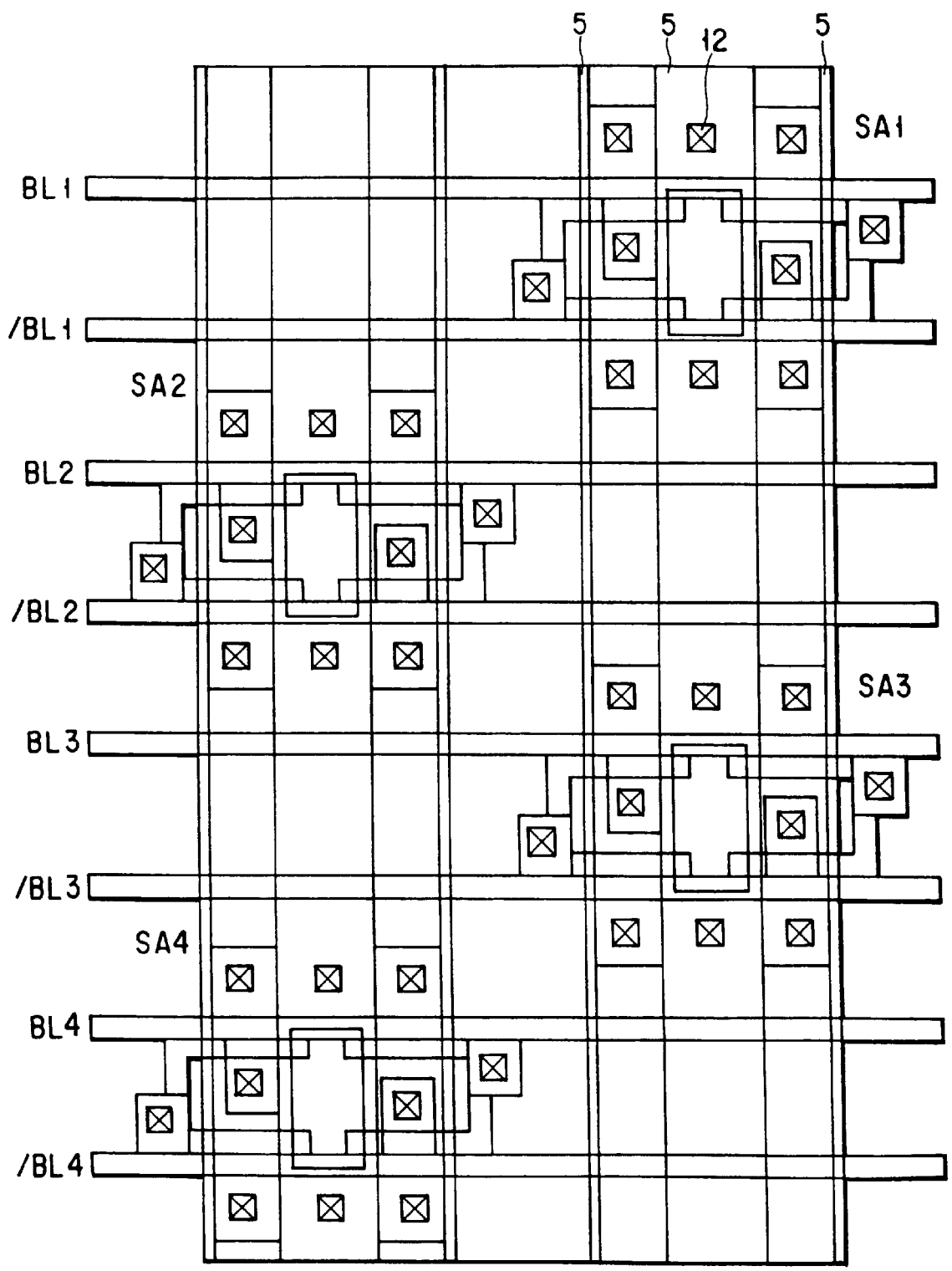
FIG. 57 is a plan view showing another layout pattern of the sense amplifiers according to the 24th embodiment.

FIGS. 56 and 57 are plan views showing sense amplifier portions of a DRAM according to the 24th embodiment of the present invention. In this embodiment, a contact 12 with a control line 1 is formed in a p-type region 5 in Embodiment 17.

Referring to FIG. 56, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation (arrangements 1-1, 1-2, 2-2, and 3-4).

Referring to FIG. 57, the sense amplifiers SA1 to SA4 are alternately shifted from each other one by one in the bit line direction. In this case, when the p-type region 5 is vertically extended, the substrate potentials of the sense amplifiers SA1 and SA3 can be made equal to each other, and the substrate potentials of the sense amplifiers SA2 and SA4 can be made equal to each other (arrangements 1-1, 1-2, 2-2, 3-1, and 3-4).

The common source of a pair of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

The p-type regions 5 are vertically connected to each other. For this reason, even if masks are vertically shifted from each other, the p-type regions 5 can be reliably formed in the channel portions.

The p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

Embodiment 25

Figure 58:
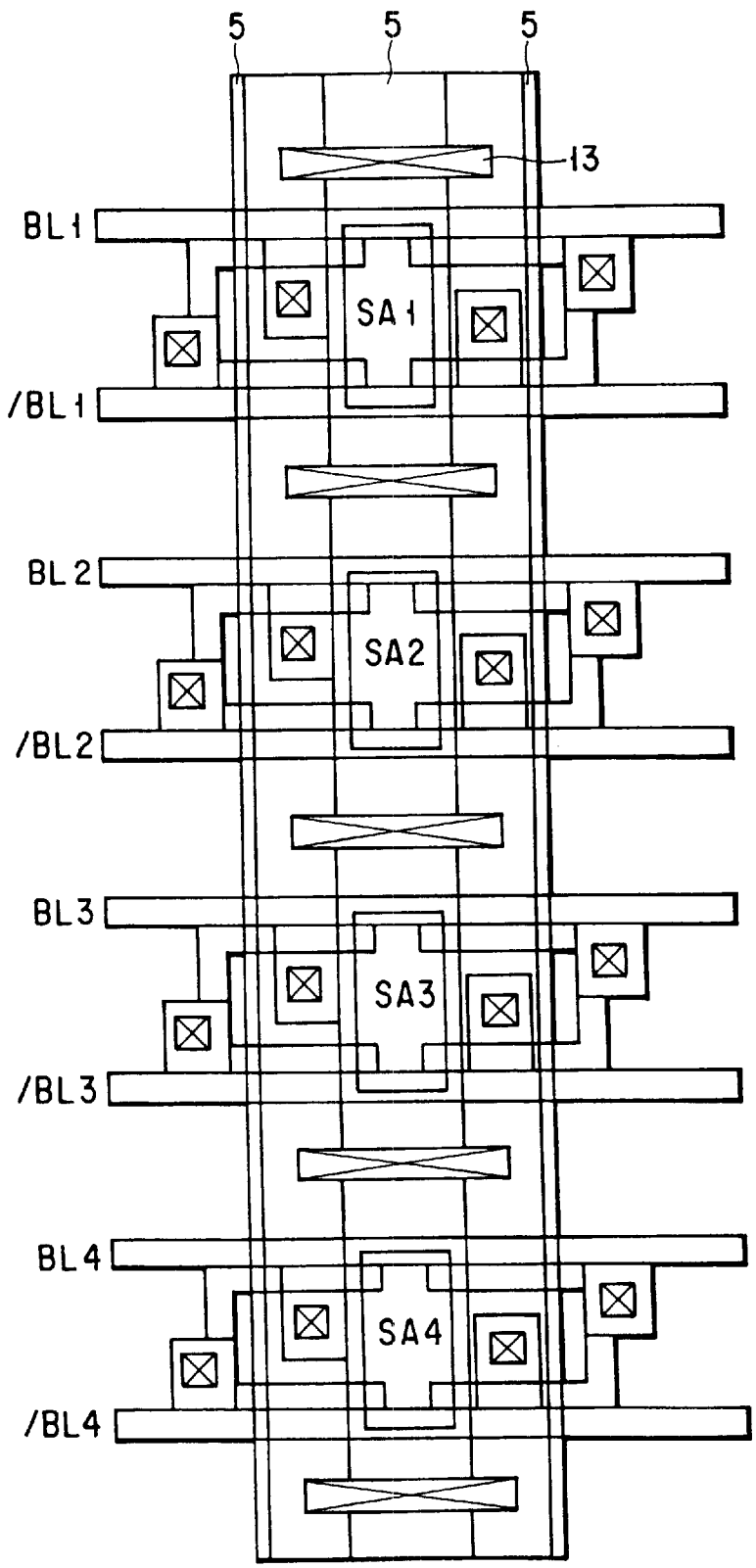
FIG. 58 is a plan view showing a layout pattern of sense amplifiers according to the 25th embodiment.
Figure 59:
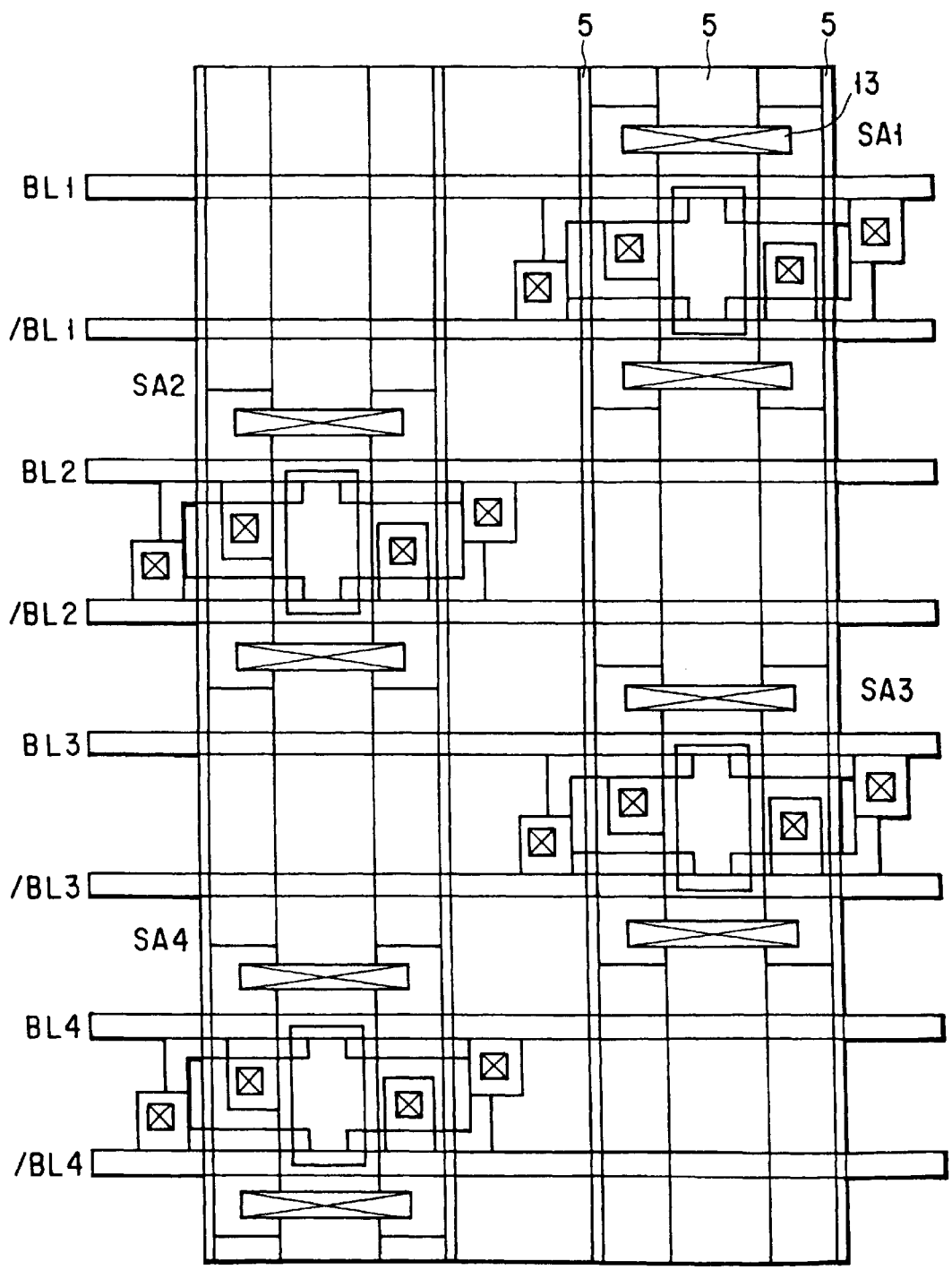
FIG. 59 is a plan view showing another layout pattern of the sense amplifiers according to the 25th embodiment.

FIGS. 58 and 59 are plan views showing sense amplifier portions of a DRAM according to the 25th embodiment of the present invention. In this embodiment, the contact between a p-type region 5 and a control line 1 and the contact between a common source and the control line 1 in Embodiment 24 are used common. Reference numeral 13 in FIGS. 58 and 59 denotes a common contact serving as these contacts.

FIG. 58 shows sense amplifiers SA1 to SA4 which are parallel arranged in the vertical direction (arrangements 1-1, 1-2, 2-1, 2-2, and 3-4), and FIG. 59 shows the sense amplifiers SA1 to SA4 which are alternately shifted from each other in the bit line direction (arrangements 1-1, 1-2, 2-1, 2-2, 3-1, and 3-4).

In this embodiment, since the contact of the source region and the contact of the p-type region 5 are used common, a mask pattern can be simplified, and a contact-contact interval is not required. For this reason, further micropatterning can be performed.

Embodiment 26

Figure 60:
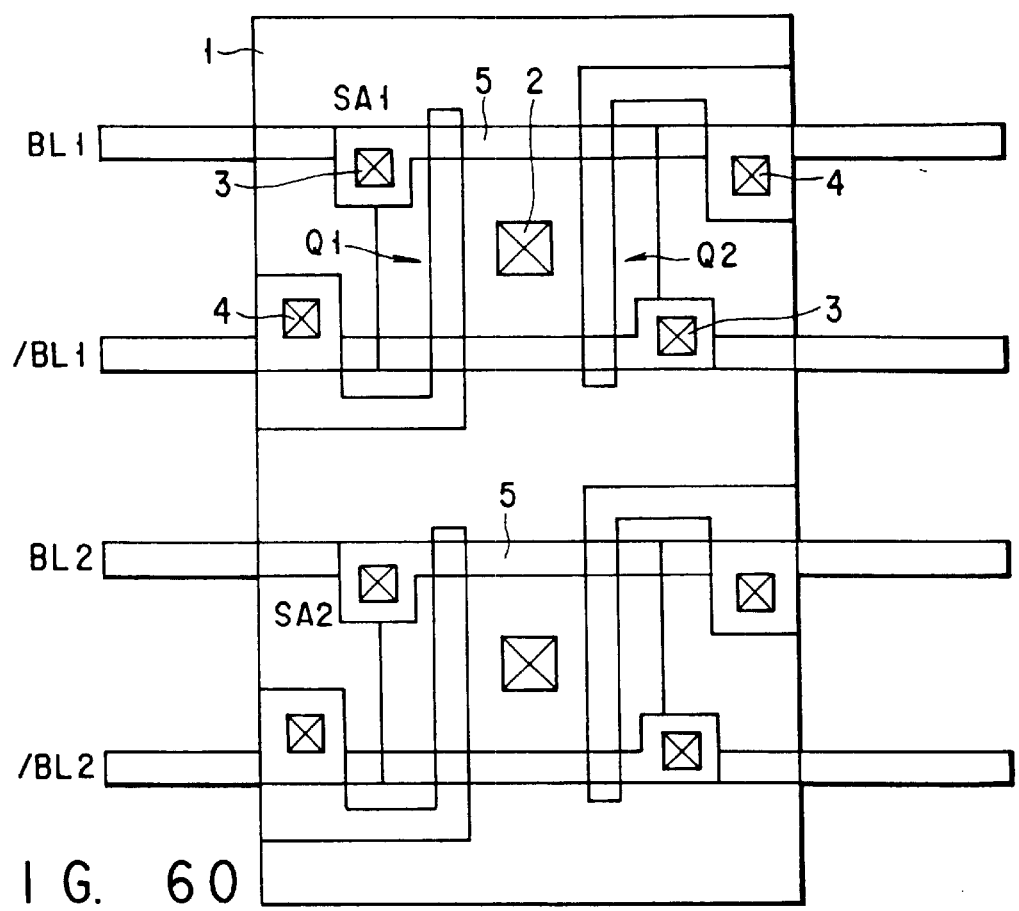
FIG. 60 is a plan view showing a layout pattern of sense amplifiers according to the 26th embodiment.
Figure 61:
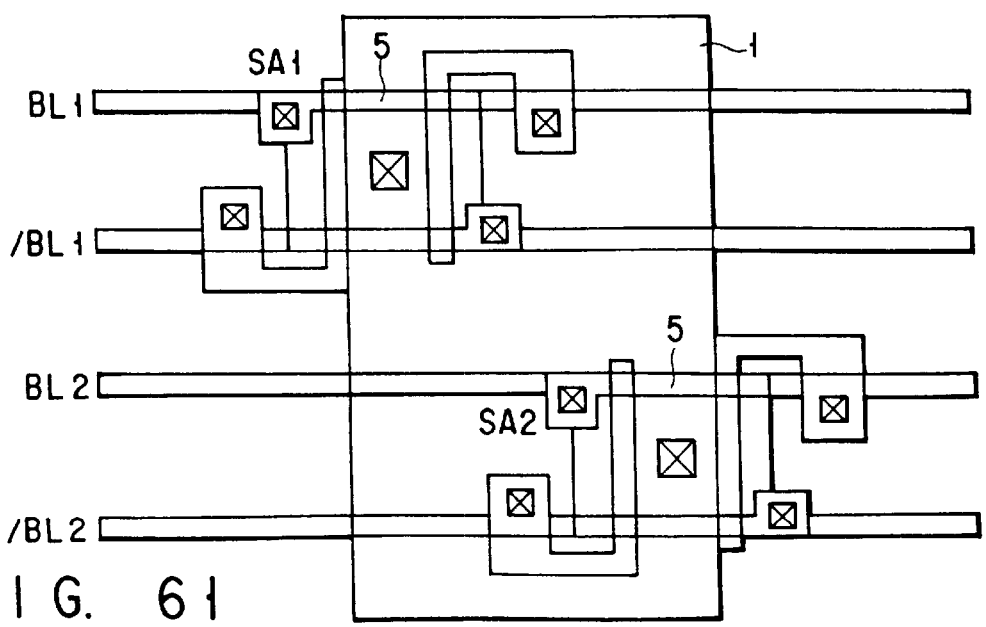
FIG. 61 is a plan view showing another layout pattern of the sense amplifiers according to the 26th embodiment.

FIGS. 60 and 61 are plan views showing sense amplifier portions of a DRAM according to the 26th embodiment of the present invention.

This embodiment employs a layout in which a pair of thin-film SOI-nMOS sense amplifiers are arranged on a pair of bit lines. FIG. 60 shows arrangements 1-1 and 3-3, and FIG. 61 shows arrangements 1-1, 3-1, and 3-3.

Reference symbols Q1 and Q2 denote thin-film SOI-nMOSFETs constituting a sense amplifier SA1 arranged on bit lines BL1 and /BL1. The gate of the thin-film SOI-nMOSFET is perpendicular to the bit lines, a large gate length L can be obtained, thereby decreasing variations in threshold value. A sense amplifier SA2 has the same arrangement as that of the sense amplifier SA1.

FIG. 60 shows a control line 1 to which a common source terminal of the sense amplifiers is connected, a source-contact portion 2 connected to the control line 1, a drain-contact portion 3 for connecting a drain and a bit line to each other, and a gate-contact portion 4 for connecting a gate electrode to a bit line.

FIG. 61 shows an arrangement in which the sense amplifiers SA1 and SA2 are shifted from each other in a bit line direction. In this arrangement, moderation of design rules such as a large gate length L of a transistor can be preferably obtained.

Considering the sense amplifier SA1 in FIGS. 60 and 61, the p-type region 5 is formed in a portion of the common source of the pair of thin-film SOI-nMOSFETs Q1 and Q2. The p-type region 5 is selectively formed by ion-implanting a p-type impurity of the same conductivity type as that of the substrates of the transistors by using a mask.

In this manner, the substrate potentials of the pair of thin-film SOI-nMOSFETs for detecting a potential difference can be made equal to each other. For this reason, even if the threshold values change, the changes in threshold value are equal to each other. Therefore, potential difference detection can be performed without a hitch.

Embodiment 27

FIGS. 62 and 63 are plan views showing sense amplifier portions of a DRAM according to the 27th embodiment of the present invention. In this embodiment, two p-type regions 5 are formed in both the gate-width-direction ends of one sense amplifier in Embodiment 26.

FIG. 62 shows sense amplifiers SA1 and SA2 which are parallel arranged in the vertical direction (arrangements 1-1, 3-3, and 3-4), and FIG. 63 shows the sense amplifiers SA1 and SA2 which are alternately shifted from each other in the bit line direction (arrangements 1-1, 3-1, 3-3, and 3-4).

Referring to FIG. 63, the sense amplifiers SA1 and SA2 are shifted from each other one by one in the bit line direction. For this reason, moderation of design rules such as a large gate interval and a large width W can be preferably obtained.

In this embodiment, since the gate of the transistor is perpendicular to the bit lines, a large gate length L can be obtained, thereby decreasing variations in threshold value.

The p-type regions are formed in both the W-direction ends of two thin-film SOI-nMOSFETs constituting the sense amplifier. For this reason, even if masks are shifted from each other in the W direction (direction perpendicular to the bit line in this case), a predetermined gate width W can be kept.

Embodiment 28

Figure 64:
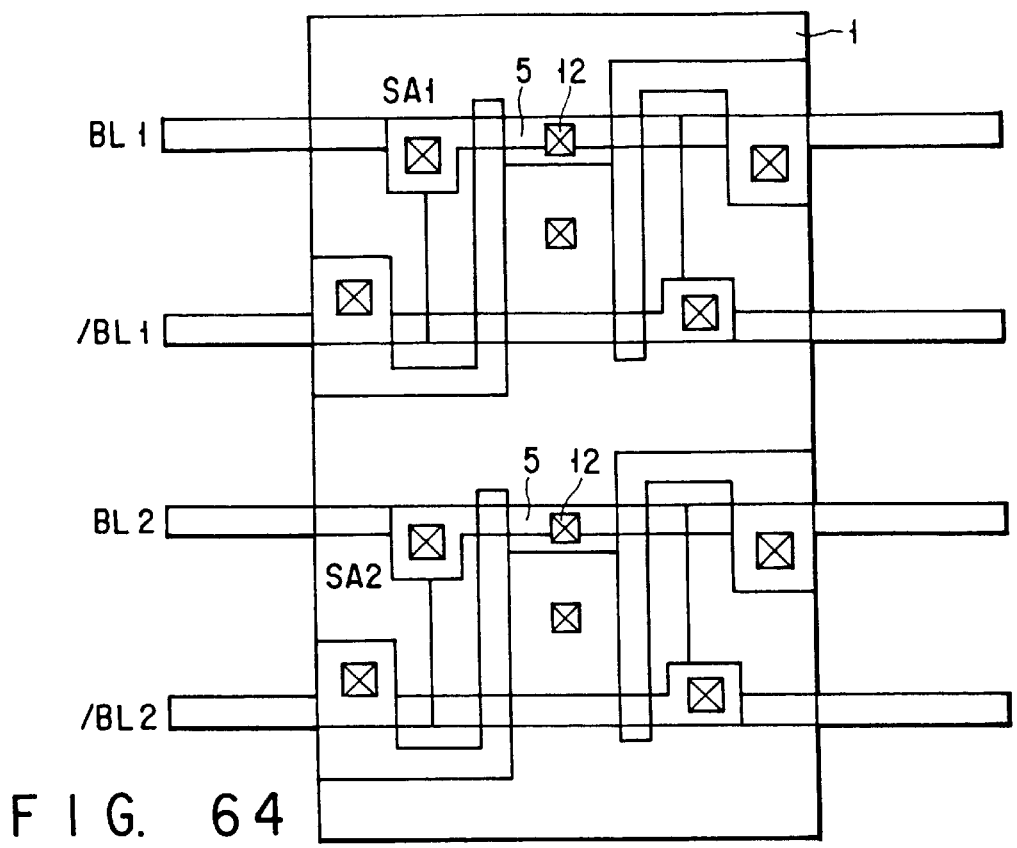
FIG. 64 is a plan view showing a layout pattern of sense amplifiers according to the 28th embodiment.
Figure 65:
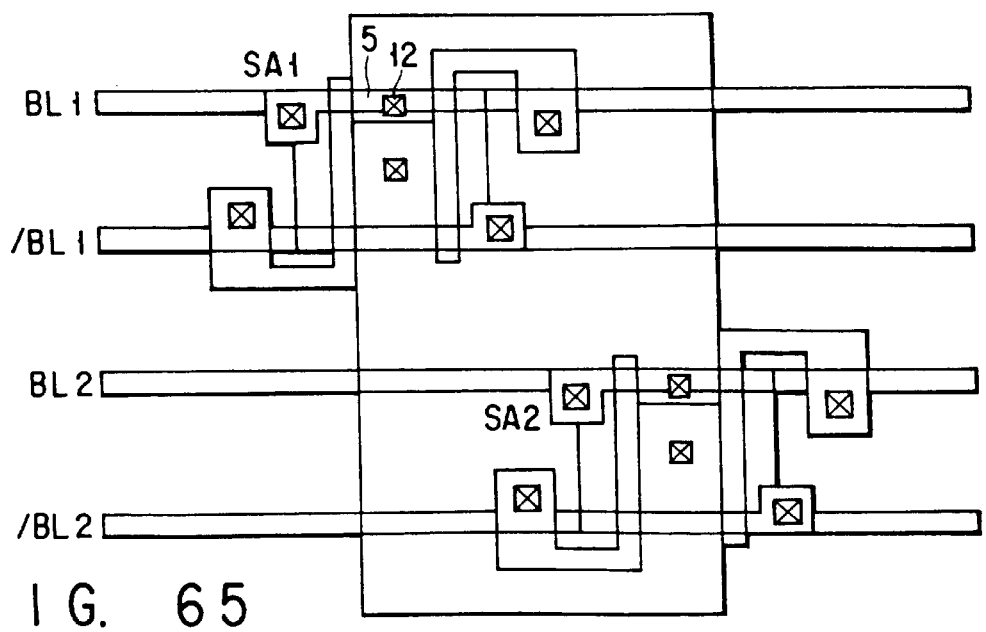
FIG. 65 is a plan view showing another layout pattern of the sense amplifiers according to the 28th embodiment.

FIGS. 64 and 65 are plan views showing sense amplifier portions of a DRAM according to the 28th embodiment of the present invention. In this embodiment, a contact 12 with a control line 1 is formed in a p-type region 5 in Embodiment 26.

FIG. 64 shows sense amplifiers SA1 and SA2 which are parallel arranged in the vertical direction (arrangements 1-1, 1-2, and 3-3), and FIG. 65 shows the sense amplifiers SA1 and SA2 which are alternately shifted from each other in the bit line direction (arrangements 1-1, 1-2, 3-1, and 3-3).

Referring to FIG. 65, the sense amplifiers SA1 and SA2 are shifted from each other one by one in the bit line direction. For this reason, moderation of design rules such as a large gate interval and a large width W can be preferably obtained.

In this embodiment, since the gate of the transistor is perpendicular to the bit lines, a large gate length L can be obtained, thereby decreasing variations in threshold value.

The common source of a pair of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 29

Figure 66:
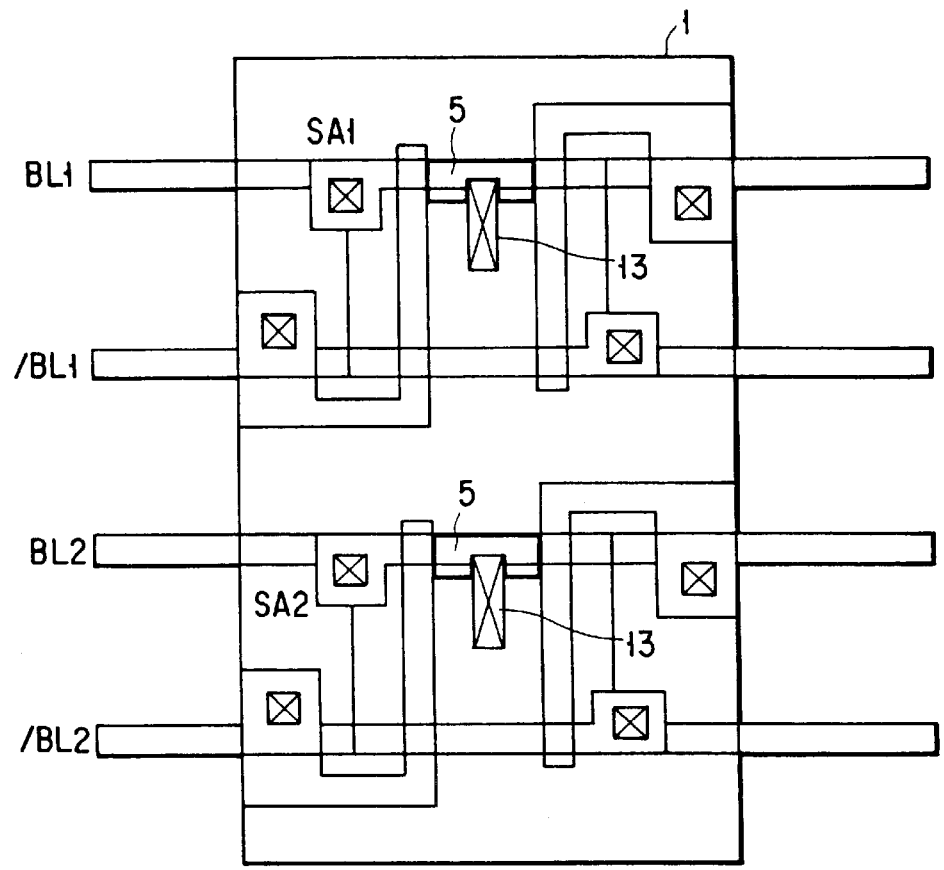
FIG. 66 is a plan view showing a layout pattern of sense amplifiers according to the 29th embodiment.
Figure 67:
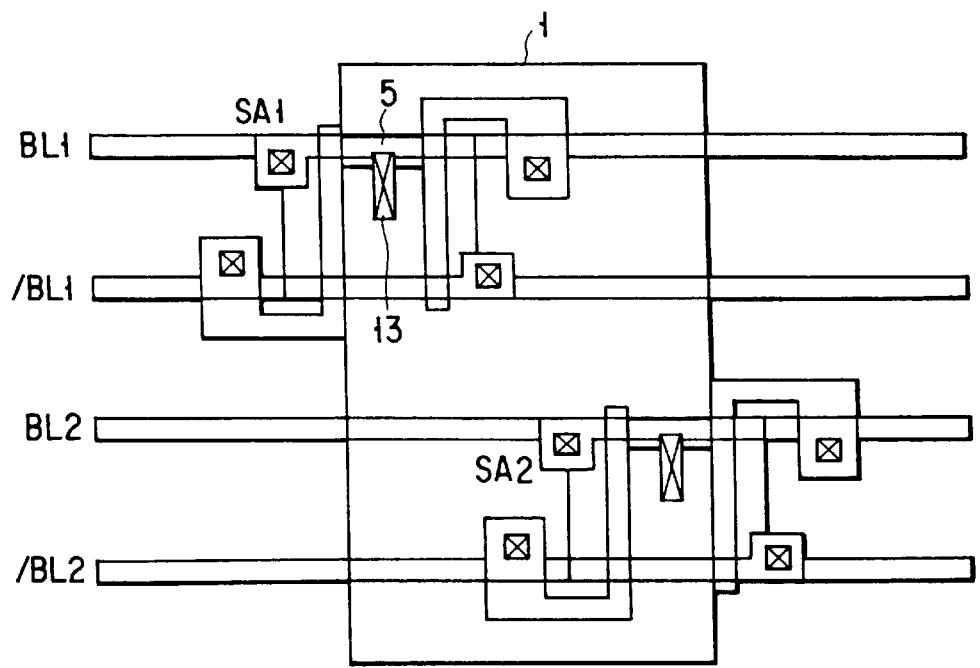
FIG. 67 is a plan view showing another layout pattern of the sense amplifiers according to the 29th embodiment.

FIGS. 66 and 67 are plan views showing sense amplifier portions of a DRAM according to the 29th embodiment of the present invention. In this embodiment, the contact between a p-type region 5 and a control line 1 and the contact between a common source and the control line 1 in Embodiment 28 are used common. Reference numeral 13 in FIGS. 66 and 67 denotes a common contact serving as these contacts.

FIG. 66 shows sense amplifiers SA1 and SA2 which are parallel arranged in the vertical direction (arrangements 1-1, 1-2, 2-1, and 3-3), and FIG. 67 shows the sense amplifiers SA1 and SA2 which are alternately shifted from each other in the bit line direction (arrangements 1-1, 1-2, 2-1, 3-1, and 3-3).

Referring to FIG. 67, the sense amplifiers SA1 and SA2 are shifted from each other one by one in the bit line direction. For this reason, moderation of design rules such as a large gate interval and a large width W can be preferably obtained.

In this embodiment, since the gate of the transistor is perpendicular to the bit lines, a large gate length L can be obtained, thereby decreasing variations in threshold value.

Since the contact of the source region and the contact of the p-type region 5 are used common, a mask pattern can be simplified, and a contact-contact interval is not required. For this reason, further micropatterning can be performed.

Embodiment 30

FIGS. 68 and 69 are plan views showing sense amplifier portions of a DRAM according to the 30th embodiment of the present invention. In this embodiment, a contact 12 with a control line 1 is formed in a p-type region 5 in Embodiment 27.

FIG. 68 shows sense amplifiers SA1 and SA2 which are parallel arranged in the vertical direction (arrangements 1-1, 1-2, 3-3, and 3-4), and FIG. 69 shows the sense amplifiers SA1 and SA2 which are alternately shifted from each other in the bit line direction (arrangements 1-1, 1-2, 3-1, 3-3, and 3-4).

Referring to FIG. 69, the sense amplifiers SA1 and SA2 are shifted from each other one by one in the bit line direction. For this reason, moderation of design rules such as a large gate interval and a large width W can be preferably obtained.

In this embodiment, since the gate of the transistor is perpendicular to the bit lines, a large gate length L can be obtained, thereby decreasing variations in threshold value.

The p-type regions 5 are formed in both the W-direction ends of two thin-film SOI-nMOSFETs constituting the sense amplifier. For this reason, even if masks are shifted from each other in the W direction (direction perpendicular to the bit line in this case), a predetermined gate width W can be kept.

The common source of a pair of transistors is connected to the control line 1, and the control line 1 is connected to the p-type region 5, so that the source is and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 31

FIGS. 70 and 71 are plan views showing sense amplifier portions of a DRAM according to the 31st embodiment of the present invention. In this embodiment, the contact between a p-type region 5 and a control line 1 and the contact between a common source and the control line 1 in Embodiment 30 are used common. Reference numeral 13 in FIGS. 70 and 71 denotes a common contact serving as these contacts.

FIG. 70 shows sense amplifiers SA1 and SA2 which are parallel arranged in the vertical direction (arrangements 1-1, 1-2, 2-1, 3-3, and 3-4), and FIG. 71 shows the sense amplifiers SA1 and SA2 which are alternately shifted from each other in the bit line direction (arrangements 1-1, 1-2, 2-1, 3-1, 3-3, and 3-4).

Referring to FIG. 71, the sense amplifiers SA1 and SA2 are shifted from each other one by one in the bit line direction. For this reason, moderation of design rules such as a large gate interval and a large width W can be preferably obtained.

In this embodiment, since the gate of the transistor is perpendicular to the bit lines, a large gate length L can be obtained, thereby decreasing variations in threshold value.

Since the contact of the source region and the contact of the p-type region 5 are used common, a mask pattern can be simplified, and a contact-contact interval is not required. For this reason, further micropatterning can be performed.

Embodiment 32

Figure 72:
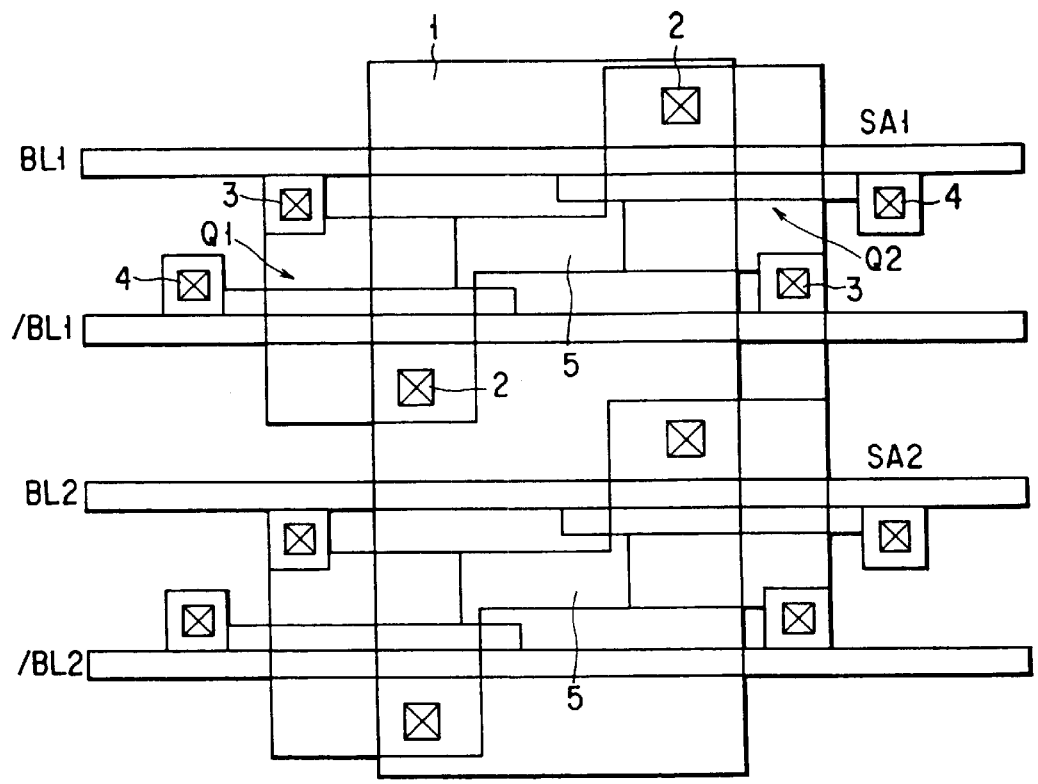
FIG. 72 is a plan view showing a layout pattern of sense amplifiers according to the 32nd embodiment.
Figure 73:
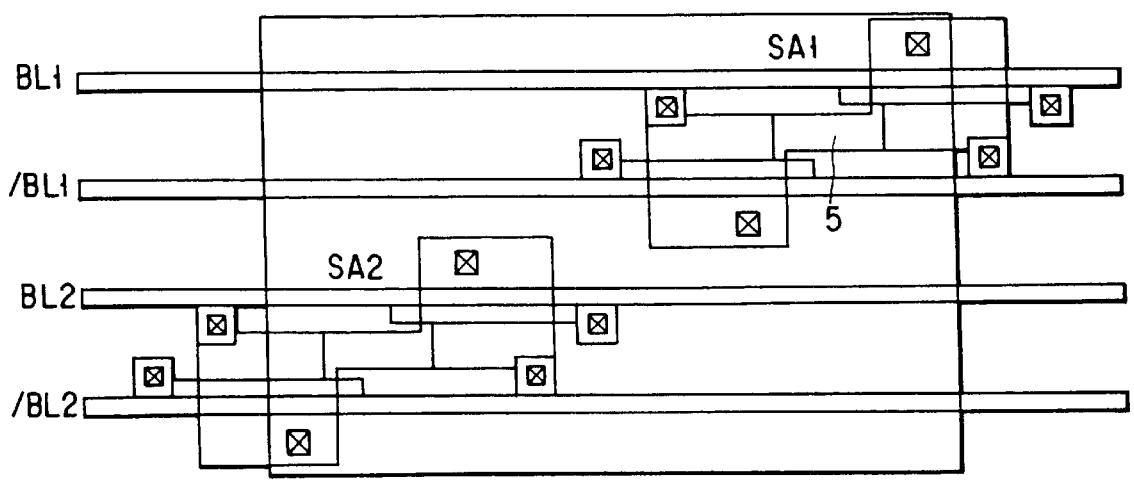
FIG. 73 is a plan view showing another layout pattern of the sense amplifiers according to the 32nd embodiment.

FIGS. 72 and 73 are plan views showing sense amplifier portions of a DRAM according to the 32nd embodiment of the present invention. This embodiment employs a layout in which a pair of thin-film SOI-nMOS sense amplifiers are arranged on a pair of bit lines. FIG. 72 shows an arrangement 1-1, and FIG. 73 shows arrangements 1-1 and 3-1.

Reference symbols Q1 and Q2 denote thin-film SOI-nMOSFETs constituting a sense amplifier SA1 arranged on bit lines BL1 and /BL1. A sense amplifier SA2 has the same arrangement as that of the sense amplifier SA1.

FIG. 72 shows a control line 1 to which a common source terminal of the sense amplifiers is connected, a source-contact portion 2 connected to the control line 1, a drain-contact portion 3 for connecting a drain and a bit line to each other, and a gate-contact portion 4 for connecting a gate electrode to a bit line.

FIG. 73 shows an arrangement in which the sense amplifiers SA1 and SA2 in FIG. 72 are shifted from each other in a bit line direction. In the arrangement in FIG. 73, moderation of design rules such as a large gate length L of a transistor can be preferably obtained.

Considering the sense amplifier SA1 in FIGS. 72 and 73, the p-type region 5 is formed between the drains of the two thin-film SOI-nMOSFETs Q1 and Q2 constituting a pair. The p-type region 5 is selectively formed by ion-implanting a p-type impurity of the same conductivity type as that of the substrates of the transistors by using a mask.

In this manner, the substrate potentials of the pair of thin-film SOI-nMOSFETs for detecting a potential difference can be made equal to each other. For this reason, even if the threshold values change, the changes in threshold value are equal to each other. Therefore, potential difference detection can be performed without a hitch.

Embodiment 33

Figure 75:
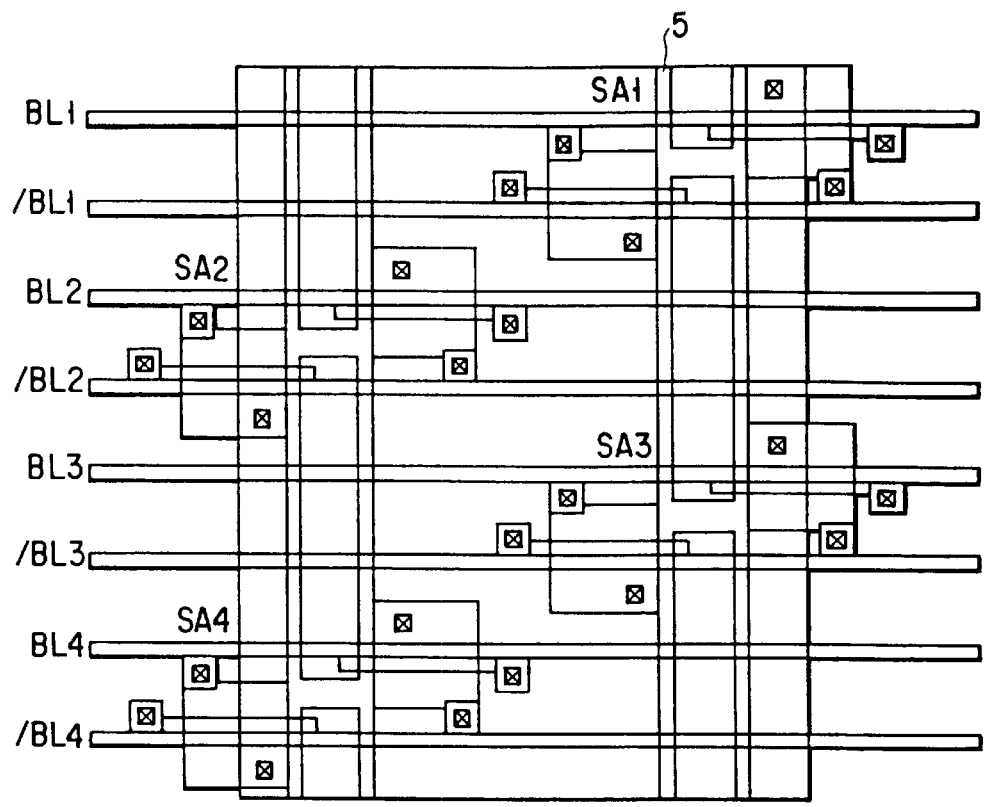
FIG. 75 is a plan view showing another layout pattern of the sense amplifiers according to the 33rd embodiment.

FIGS. 74 and 75 are plan views showing sense amplifier portions of a DRAM according to the 33rd embodiment of the present invention. In this embodiment, a p-type region 5 is extended perpendicularly to bit lines and shared by a plurality of sense amplifiers SA1 to SA4.

Referring to FIG. 74, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation (arrangements 1-1 and 2-2).

Referring to FIG. 75, since the sense amplifiers SA1 to SA4 are alternately shifted from each other one by one in the bit line direction, moderation of design rules such as a large gate length L of a transistor and a large drain contact can be obtained. In this case, when the p-type region 5 is vertically extended, the substrate potentials of the sense amplifiers SA1 and SA3 can be made equal to each other, and the substrate potentials of the sense amplifiers SA2 and SA4 can be made equal to each other (arrangements 1-1, 2-2, and 3-1).

The p-type regions 5 are vertically connected to each other. For this reason, even if masks are vertically shifted from each other, the p-type regions 5 can be reliably formed in the channel portions.

Embodiment 34

Figure 76:
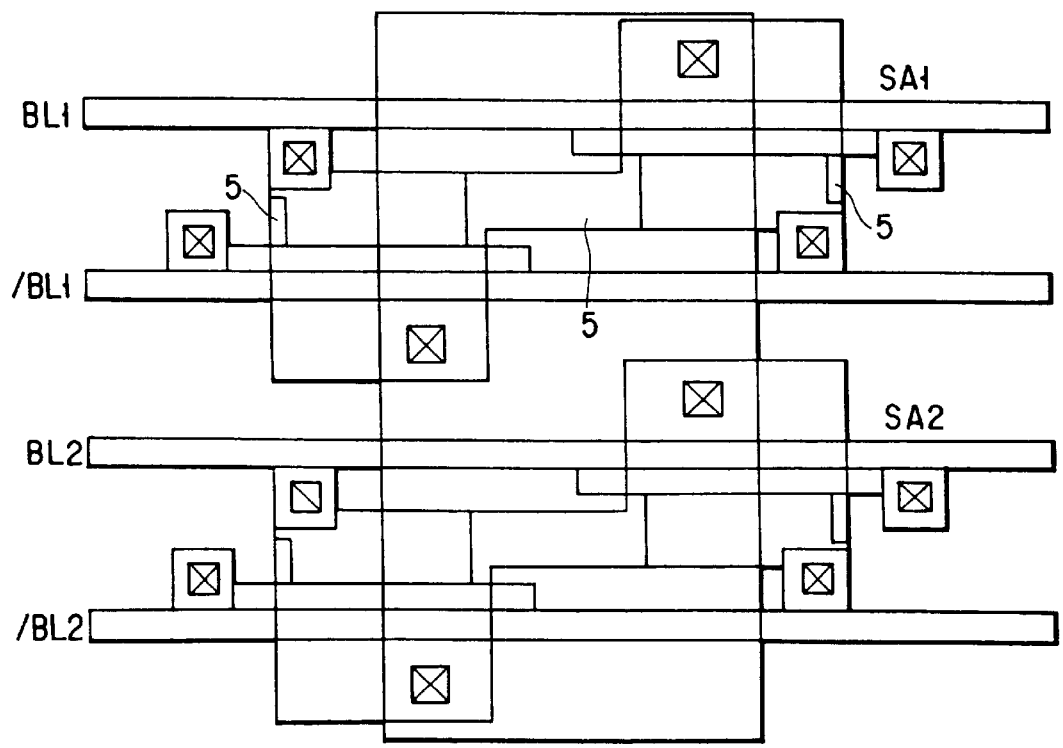
FIG. 76 is a plan view showing a layout pattern of sense amplifiers according to the 34th embodiment.

FIGS. 76 and 77 are plan views showing sense amplifier portions of a DRAM according to the 34th embodiment of the present invention. In this embodiment, two p-type regions 5 are formed in both the gate-width-direction ends of one sense amplifier in Embodiment 32.

FIG. 76 shows sense amplifiers SA1 and SA2 which are parallel arranged in the vertical direction (arrangements 1-1 and 3-4), and FIG. 77 shows the sense amplifiers SA1 and SA2 which are alternately shifted from each other in the bit line direction (arrangements 1-1, 3-1, and 3-4).

Referring to FIG. 77, the sense amplifiers SA1 and SA2 are shifted from each other one by one in the bit line direction. For this reason, moderation of design rules such as a large gate interval and a large drain contact can be preferably obtained.

When only one p-type region is formed as in Embodiment 33, if a width W of a transistor Q1 is increased by shifting a mask in the W direction, a width W of a transistor Q2 decreases, it is not expected to perform an accurate operation. However, in this embodiment, the two p-type regions 5 are formed in both the W-direction ends of two thin-film SOI-nMOSFETs constituting a sense amplifier. For this reason, even if masks are shifted from each other in the W direction (bit line direction in this case), the widths W of the two transistors constituting a pair always change by equal amounts, and the widths W are equal to each other.

Embodiment 35

Figure 78:
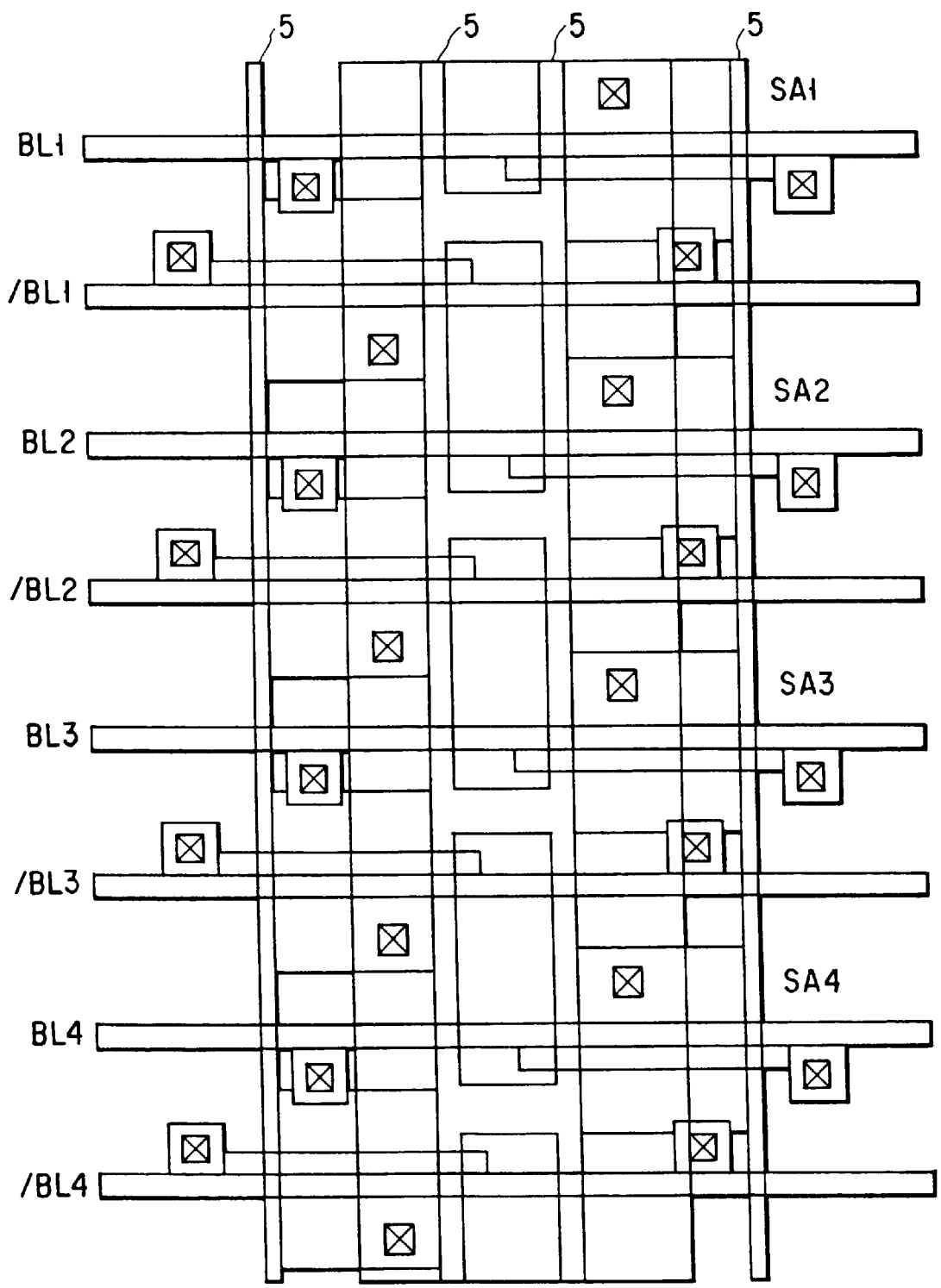
FIG. 78 is a plan view showing a layout pattern of sense amplifiers according to the 35th embodiment.

FIGS. 78 and 79 are plan views showing sense amplifier portions of a DRAM according to the 35th embodiment of the present invention. In this embodiment, two p-type regions 5 are formed in both the gate-width-direction ends of one sense amplifier in Embodiment 32, and the p-type regions 5 are extended perpendicularly to the bit lines and shared by a plurality of sense amplifiers.

FIG. 78 shows sense amplifiers SA1 to SA4 which are parallel arranged in the vertical direction (arrangements 1-1, 2-2, and 3-4), and FIG. 79 shows the sense amplifiers SA1 to SA4 which are alternately shifted from each other in the bit line direction (arrangements 1-1, 2-2, 3-1, and 3-4).

Referring to FIG. 78, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation.

Referring to FIG. 79, since the sense amplifiers SA1 to SA4 are alternately shifted from each other one by one in the bit line direction, moderation of design rules such as a large gate length L of a transistor and a large drain contact can be obtained. In this case, when the p-type region 5 is vertically extended, the substrate potentials of the sense amplifiers SA1 and SA3 can be made equal to each other, and the substrate potentials of the sense amplifiers SA2 and SA4 can be made equal to each other.

The p-type regions 5 are vertically connected to each other. For this reason, even if masks are vertically shifted from each other, the p-type regions 5 can be reliably formed in the channel portions.

In addition, the two p-type regions 5 are formed in both the W-direction ends of two thin-film SOI-nMOSFETs constituting a sense amplifier. For this reason, even if masks are shifted from each other in the W direction (bit line direction in this case), the widths W of the pair of transistors are can be kept equal to each other.

Embodiment 36

Figure 80:
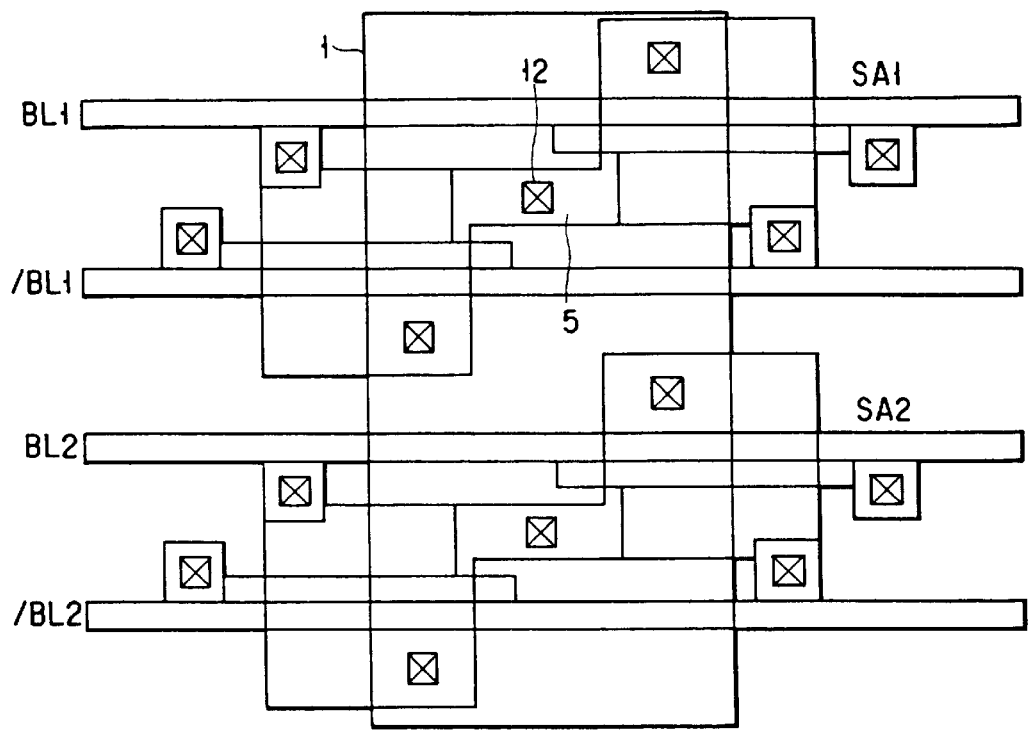
FIG. 80 is a plan view showing a layout pattern of sense amplifiers according to the 36th embodiment.
Figure 81:
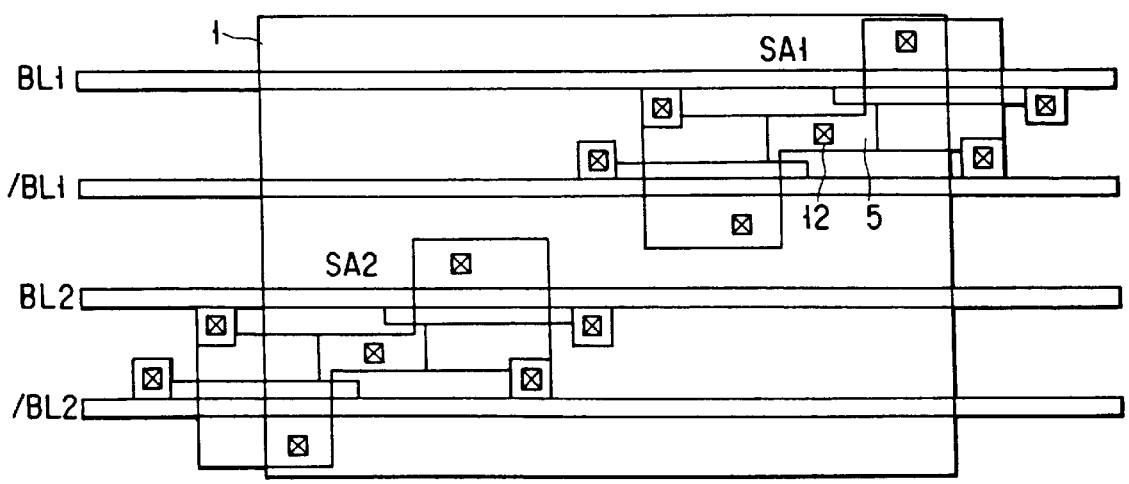
FIG. 81 is a plan view showing another layout pattern of the sense amplifiers according to the 36th embodiment.

FIGS. 80 and 81 are plan views showing sense amplifier portions of a DRAM according to the 36th embodiment of the present invention. In this embodiment, a contact 12 with a control line 1 is formed in a p-type region 5 in Embodiment 32.

FIG. 80 shows sense amplifiers SA1 and SA2 which are parallel arranged in the vertical direction (arrangements 1-1 and 1-2), and FIG. 81 shows the sense amplifiers SA1 and SA2 which are alternately shifted from each other in the bit line direction (arrangements 1-1, 1-2, and 3-1).

Referring to FIG. 81, the sense amplifiers SA1 and SA2 are shifted from each other one by one in the bit line direction. For this reason, moderation of design rules such as a large gate interval and a large drain contact can be preferably obtained.

In this embodiment, the common source of a pair of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 37

FIGS. 82 and 83 are plan views showing sense amplifier portions of a DRAM according to the 37th embodiment of the present invention. In this embodiment, the contact between a p-type region 5 and a control line 1 and the contact between a common source and the control line 1 in Embodiment 36 are used common. Reference numeral 13 in FIGS. 82 and 83 denotes a common contact serving as these contacts.

FIG. 82 shows sense amplifiers SA1 and SA2 which are parallel arranged in the vertical direction (arrangements 1-1, 1-2, and 2-1), and FIG. 83 shows the sense amplifiers SA1 and SA2 which are alternately shifted from each other in the bit line direction (arrangements 1-1, 1-2, and 2-1).

Referring to FIG. 83, the sense amplifiers SA1 and SA2 are shifted from each other one by one in the bit line direction. For this reason, moderation of design rules such as a large gate interval and a large drain contact can be preferably obtained.

Embodiment 38

Figure 84:
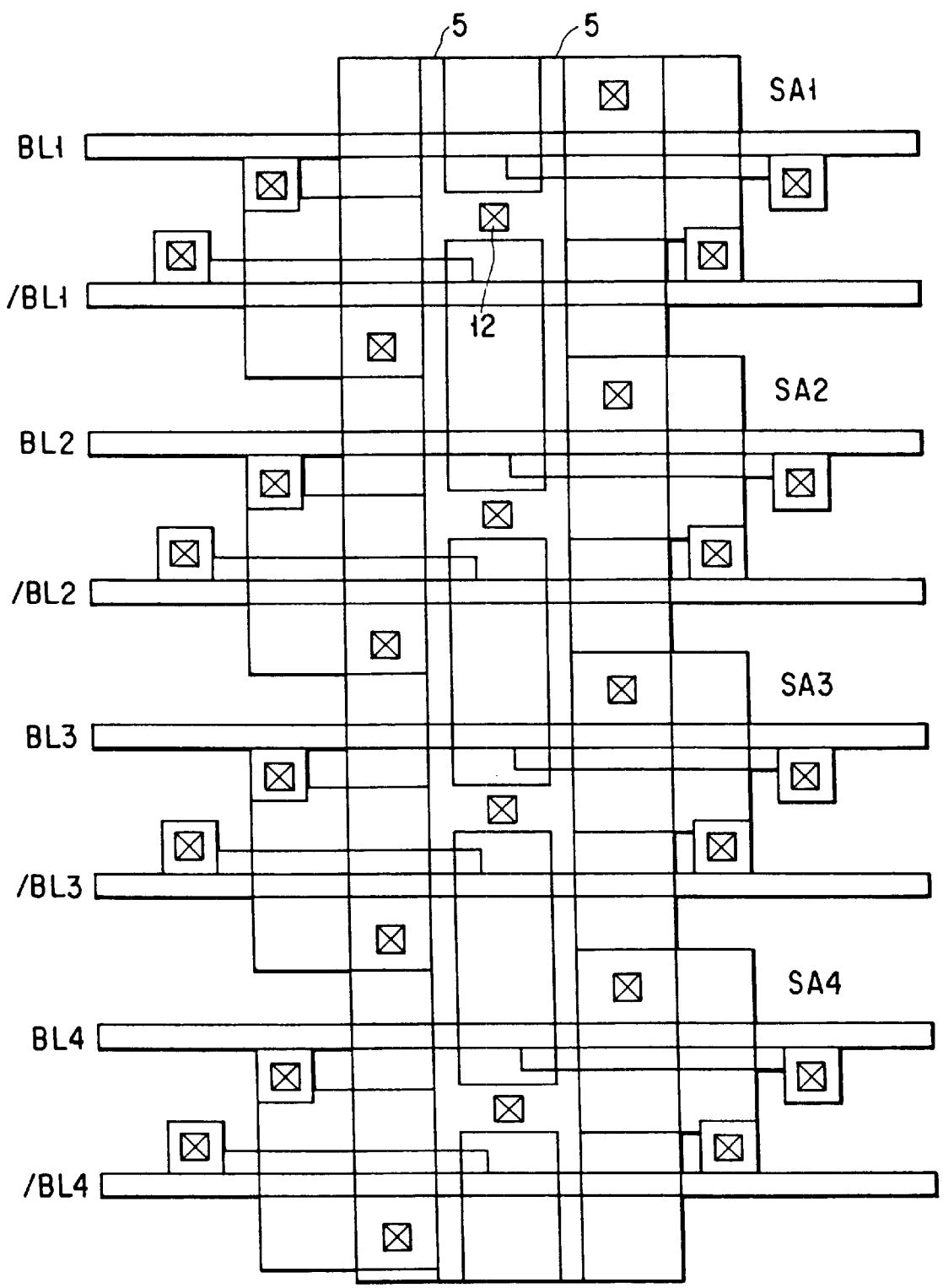
FIG. 84 is a plan view showing a layout pattern of sense amplifiers according to the 38th embodiment.
Figure 85:
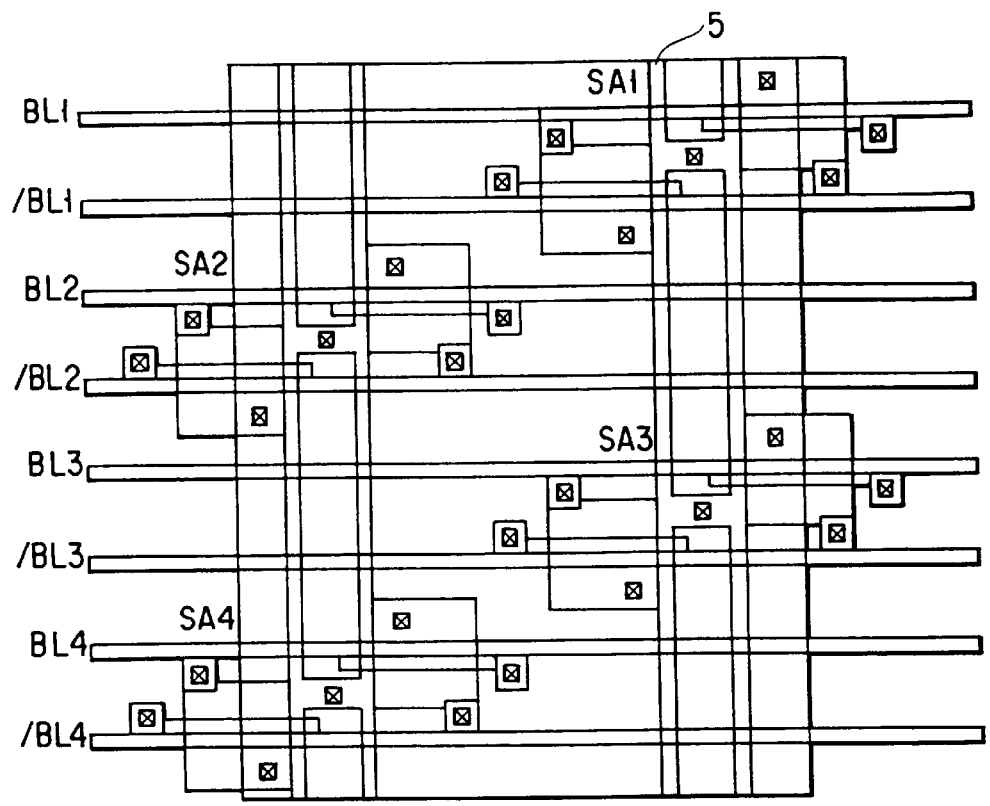
FIG. 85 is a plan view showing another layout pattern of the sense amplifiers according to the 38th embodiment.

FIGS. 84 and 85 are plan views showing sense amplifier portions of a DRAM according to the 38th embodiment of the present invention. In this embodiment, a contact 12 with a control line 1 is formed in a p-type region 5 in Embodiment 33.

Referring to FIG. 84, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation (arrangements 1-1, 1-2, and 2-2).

Referring to FIG. 85, since the sense amplifiers SA1 to SA4 are alternately shifted from each other one by one in the bit line direction, moderation of design rules such as a large gate length L of a transistor and a large drain contact can be obtained. In this case, when the p-type region 5 is vertically extended, the substrate potentials of the sense amplifiers SA1 and SA3 can be made equal to each other, and the substrate potentials of the sense amplifiers SA2 and SA4 can be made equal to each other (arrangements 1-1, 1-2, 2-2, and 3-1).

The p-type regions 5 are vertically connected to each other. For this reason, even if masks are vertically shifted from each other, the p-type regions 5 can be reliably formed in the channel portions.

The common source of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 39

Figure 87:
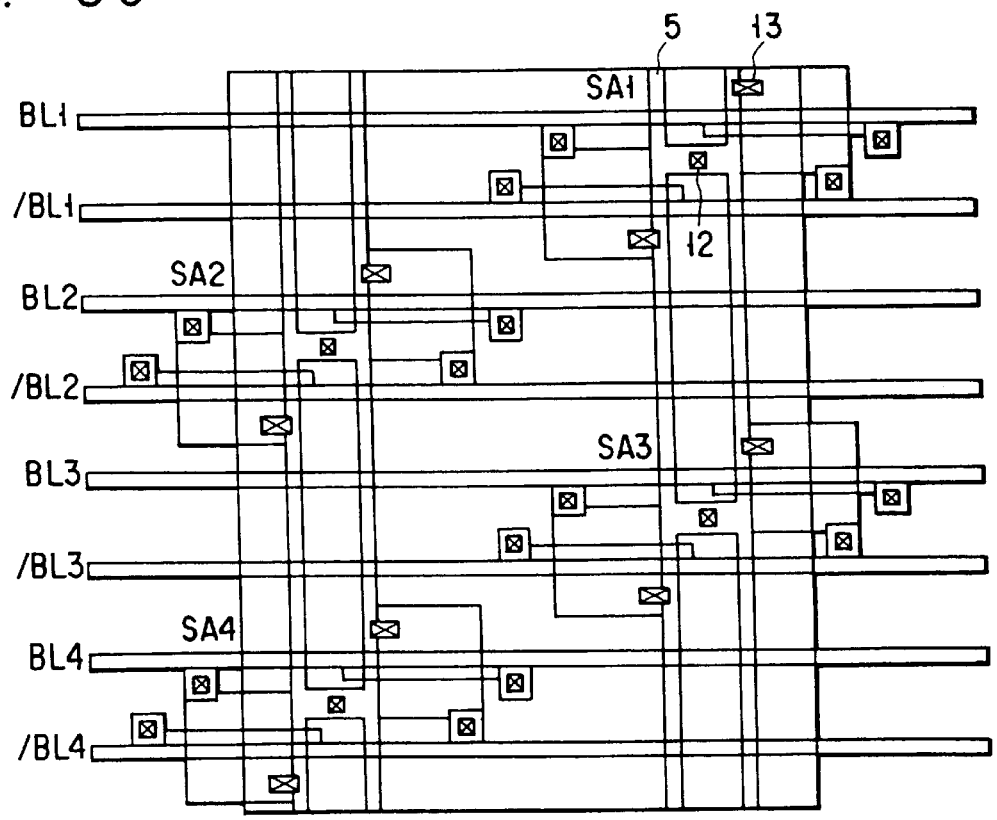
FIG. 87 is a plan view showing another layout pattern of the sense amplifiers according to the 39th embodiment.
Figure 86:
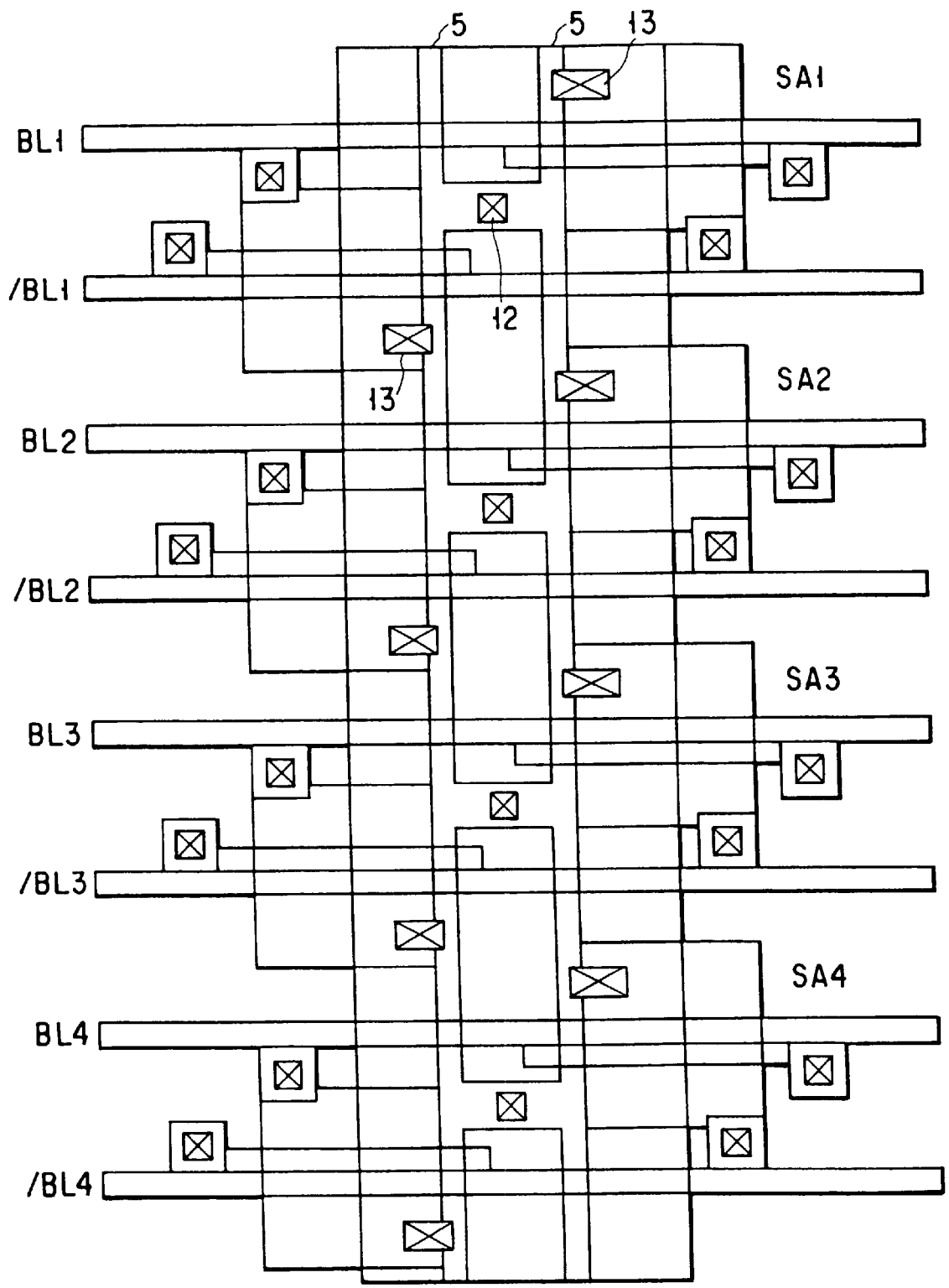
FIG. 86 is a plan view showing a layout pattern of sense amplifiers according to the 39th embodiment.

FIGS. 86 and 87 are plan views showing sense amplifier portions of a DRAM according to the 39th embodiment of the present invention. In this embodiment, the contact between a p-type region 5 and a control line 1 and the contact between a common source and the control line 1 in Embodiment 38 are used common. Reference numeral 13 in FIGS. 86 and 87 denotes a common contact serving as these contacts.

FIG. 86 shows sense amplifiers SA1 to SA4 which are parallel arranged in the vertical direction (arrangements 1-1, 1-2, 2-1, and 2-2), and FIG. 87 shows the sense amplifiers SA1 to SA4 which are alternately shifted from each other in the bit line direction (arrangements 1-1, 1-2, 2-1, 2-2 and 3-1).

Referring to FIG. 87, the sense amplifiers SA1 to SA4 are shifted from each other one by one in the bit line direction. For this reason, moderation of design rules such as a large gate interval and a large drain contact can be preferably obtained.

Embodiment 40

Figure 88:
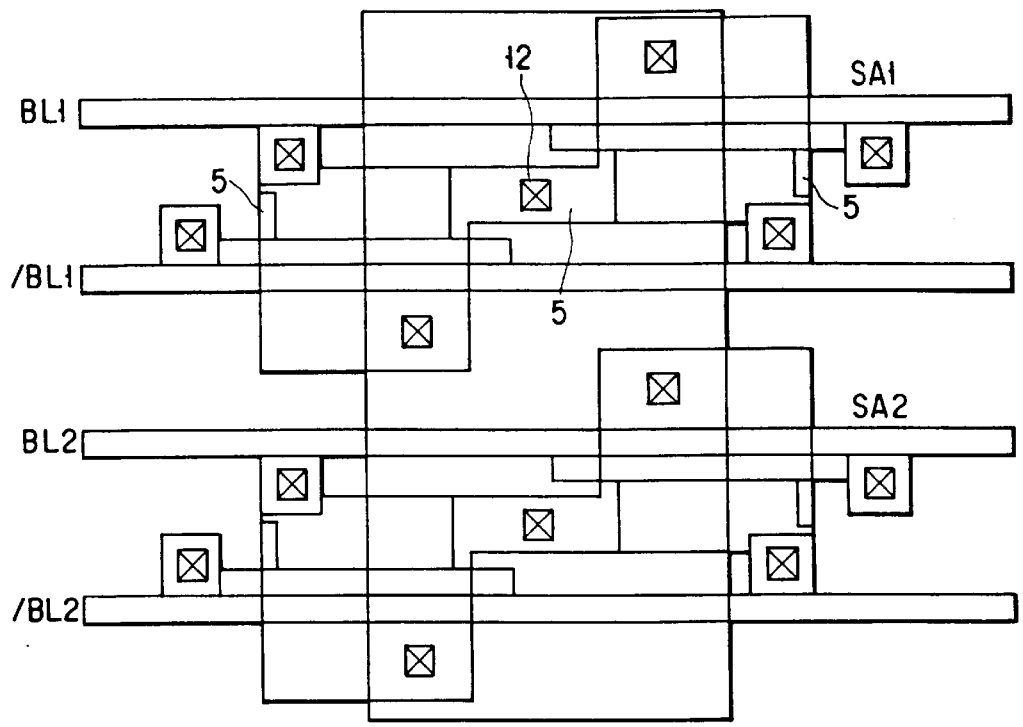
FIG. 88 is a plan view showing a layout pattern of sense amplifiers according to the 40th embodiment.
Figure 89:
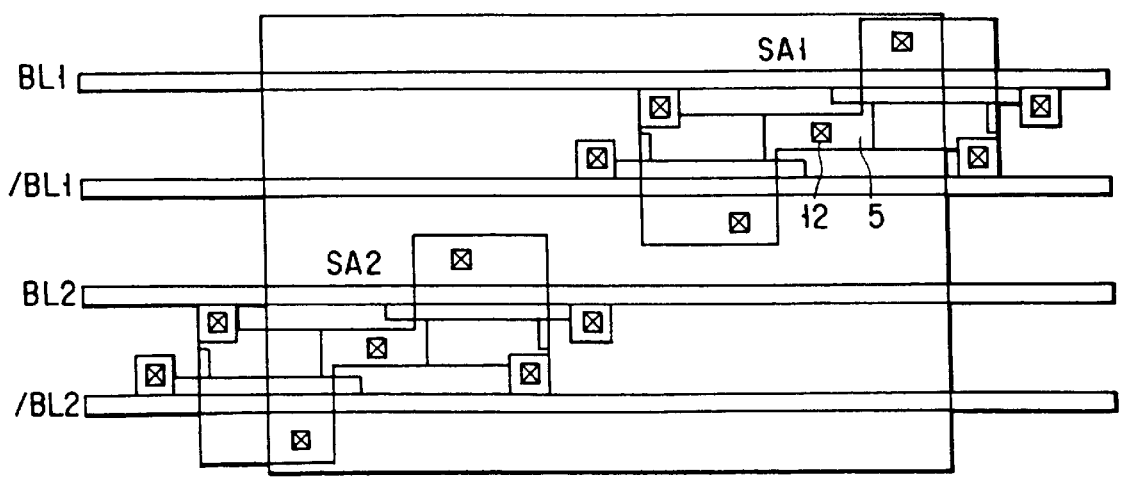
FIG. 89 is a plan view showing another layout pattern of the sense amplifiers according to the 40th embodiment.

FIGS. 88 and 89 are plan views showing sense amplifier portions of a DRAM according to the 40th embodiment of the present invention. In this embodiment, a contact 12 with a control line 1 is formed in a p-type region 5 in Embodiment 34.

FIG. 88 shows sense amplifiers SA1 and SA2 which are parallel arranged in the vertical direction (arrangements 1-1, 1-2, and 3-4), and FIG. 89 shows the sense amplifiers SA1 and SA2 which are alternately shifted from each other in the bit line direction (arrangements 1-1, 1-2, 3-1, and 3-4).

Referring to FIG. 89, the sense amplifiers SA1 and SA2 are shifted from each other one by one in the bit line direction. For this reason, moderation of design rules such as a large gate interval and a large drain contact can be preferably obtained.

In this embodiment, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

The common source of a pair of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 41

FIGS. 90 and 91 are plan views showing sense amplifier portions of a DRAM according to the 41st embodiment of the present invention. In this embodiment, the contact between a p-type region 5 and a control line 1 and the contact between a common source and the control line 1 in Embodiment 40 are used common. Reference numeral 13 in FIGS. 90 and 91 denotes a common contact serving as these contacts.

FIG. 90 shows sense amplifiers SA1 to SA4 which are parallel arranged in the vertical direction (arrangements 1-1, 1-2, 2-1, and 3-4), and FIG. 91 shows the sense amplifiers SA1 to SA4 which are alternately shifted from each other in the bit line direction (arrangements 1-1, 1-2, 2-1, 3-1, and 3-4).

Referring to FIG. 91, the sense amplifiers SA1 and SA2 are shifted from each other one by one in the bit line direction. For this reason, moderation of design rules such as a large gate interval and a large drain contact can be preferably obtained.

In this embodiment, since the contact of the source region and the contact of the p-type region 5 are used common, a mask pattern can be simplified, and a contact-contact interval is not required. For this reason, further micropatterning can be performed.

Embodiment 42

Figure 92:
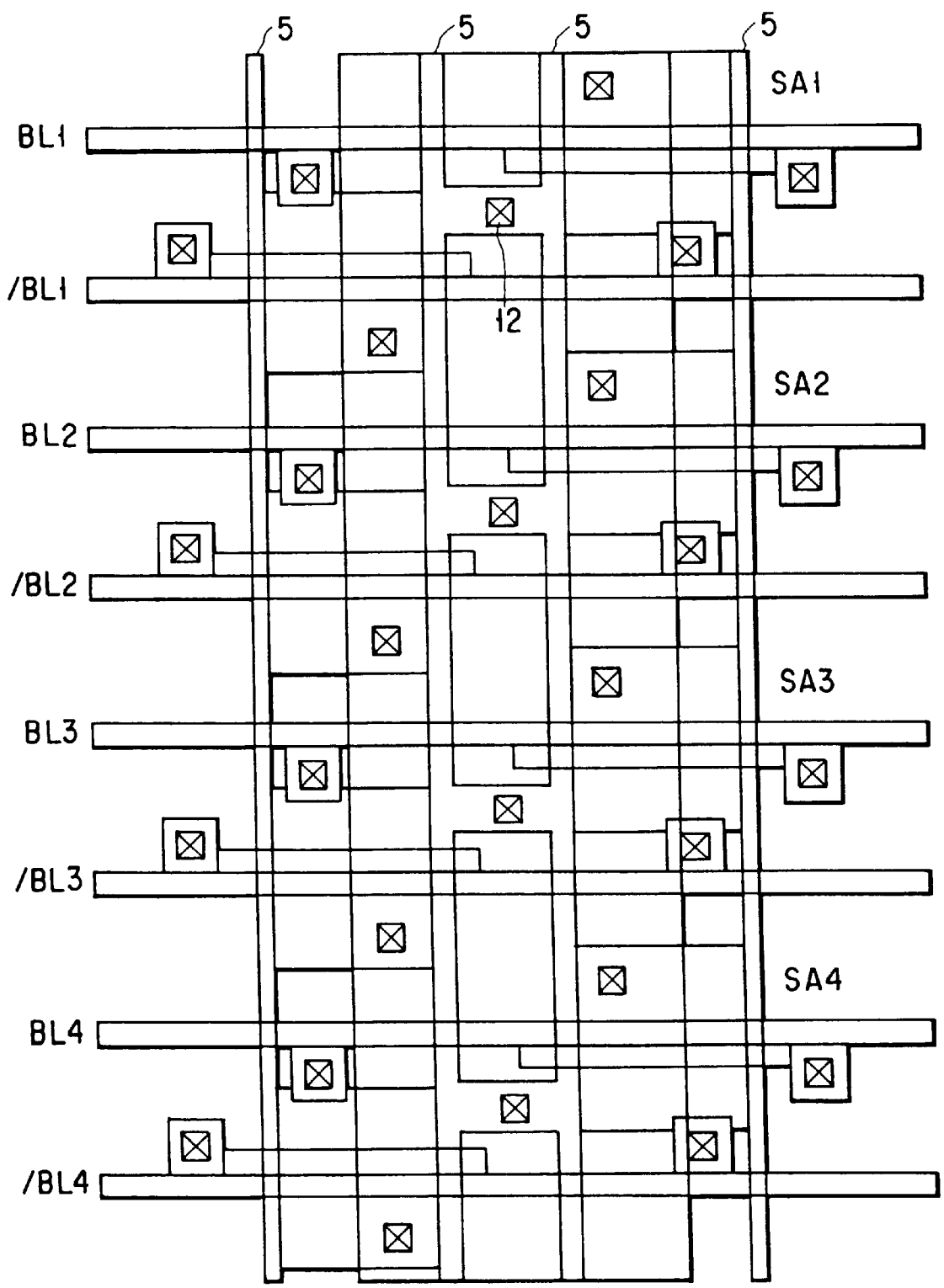
FIG. 92 is a plan view showing a layout pattern of sense amplifiers according to the 42nd embodiment.

FIGS. 92 and 93 are plan views showing sense amplifier portions of a DRAM according to the 42nd embodiment of the present invention. In this embodiment, a contact 12 with a control line 1 is formed in a p-type region 5 in Embodiment 35.

FIG. 92 shows arrangements 1-1, 1-2, 2-2, and 3-4, and FIG. 93 shows arrangements 1-1, 1-2, 2-2, 3-1, and 3-4.

Referring to FIG. 92, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation.

Referring to FIG. 93, since the sense amplifiers SA1 to SA4 are alternately shifted from each other one by one in the bit line direction, moderation of design rules such as a large gate length L of a transistor and a large drain contact can be obtained. In this case, when the p-type region 5 is vertically extended, the substrate potentials of the sense amplifiers SA1 and SA3 can be made equal to each other, and the substrate potentials of the sense amplifiers SA2 and SA4 can be made equal to each other.

The common source of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation. The p-type regions 5 are vertically connected to each other. For this reason, even if masks are vertically shifted from each other, the p-type regions 5 can be reliably formed in the channel portions.

In addition, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

Embodiment 43

Figure 94:
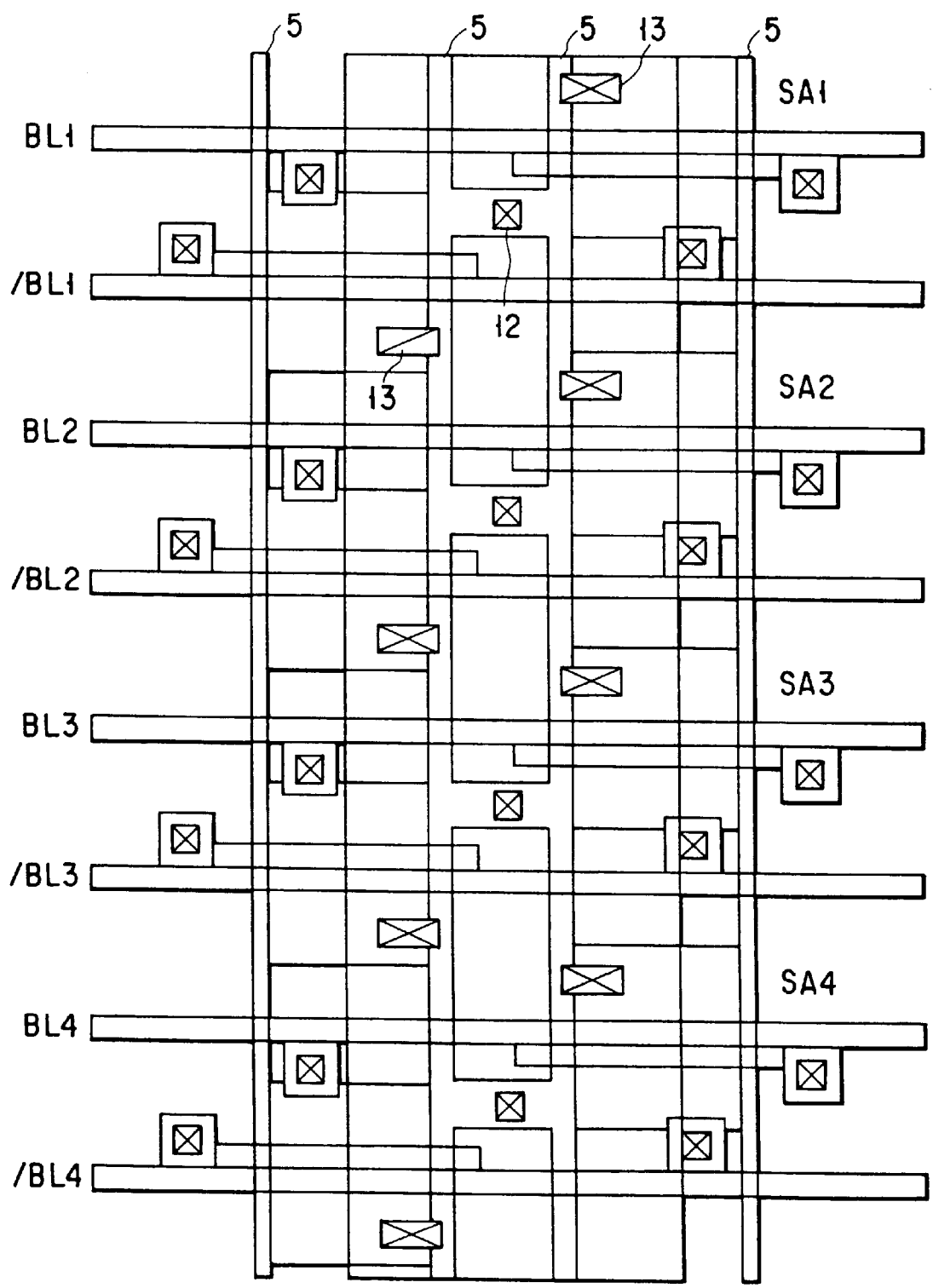
FIG. 94 is a plan view showing a layout pattern of sense amplifiers according to the 43rd embodiment.

FIGS. 94 and 95 are plan views showing sense amplifier portions of a DRAM according to the 43rd embodiment of the present invention. In this embodiment, the contact between a p-type region 5 and a control line 1 and the contact between a common source and the control line 1 in Embodiment 42 are used common. Reference numeral 13 in FIGS. 94 and 95 denotes a common contact serving as these contacts.

FIG. 94 shows sense amplifiers SA1 to SA4 which are parallel arranged in the vertical direction (arrangements 1-1, 1-2, 2-1, 2-2, and 3-4), and FIG. 95 shows the sense amplifiers SA1 to SA4 which are alternately shifted from each other in the bit line direction (arrangements 1-1, 1-2, 2-1, 2-2, 3-1, and 3-4).

Referring to FIG. 95, the sense amplifiers SA1 and SA2 are shifted from each other one by one in the bit line direction. For this reason, moderation of design rules such as a large gate interval and a large drain contact can be preferably obtained.

Embodiment 44

FIGS. 96 and 97 are views for explaining a DRAM according to the 44th embodiment of the present invention, in which FIG. 96 is a circuit diagram showing the arrangement of sense amplifiers and FIG. 97 is a plan view showing the layout pattern of the sense amplifiers.

This embodiment employs a layout in which one pair of thin-film SOI-nMOS sense amplifiers are arranged on four bit lines (arrangements 1-1, 3-1, and 3-2).

Reference symbols Q1 and Q2 denote thin-film SOI-nMOSFETs constituting a sense amplifier SA1 arranged on bit lines BL1 and /BL1, and reference symbols Q3 and Q4 denote thin-film SOI-nMOSFETs constituting a sense amplifier SA2 arranged on bit lines BL2 and /BL2. The sense amplifier SA2 is shifted from the sense amplifier SA1 by a half-pitch in the vertical direction. The sense amplifiers SA1 and SA2 may be of inverted types or the same type as shown in FIG. 97.

FIG. 96 shows a control line 1 to which a common source terminal of the sense amplifiers is connected, a source-contact portion 2 connected to the control line 1, a drain-contact portion 3 for connecting a drain and a bit line to each other, and a gate-contact portion 4 for connecting a gate electrode to a bit line.

In this embodiment, one bit line passes through between the drain-contact portion and gate-contact portion of each transistor. For example, as shown in FIG. 97, the bit line BL2 passes through on the sense amplifier SA1, and the bit line /BL1 passes through on the sense amplifier SA2. That is, one sense amplifier can be arranged every four bit lines. For this reason, design rules can be moderated such a manner that a gate length L of the transistor is made larger than the gate length of a transistor of a conventional arrangement.

Considering the sense amplifier SA1 in FIG. 97, the p-type region 5 is formed in a portion of the drains of the two thin-film SOI-nMOSFETs Q1 and Q2 constituting a pair. The p-type region 5 is selectively formed by ion-implanting a p-type impurity of the same conductivity type as that of the substrates of the transistors by using a mask.

In this manner, the substrate potentials of one pair of thin-film SOI-nMOSFETs for detecting a potential difference can be made equal to each other. For this reason, even if the threshold values change, the changes in threshold value are equal to each other. Therefore, potential difference detection can be performed without a hitch.

Embodiment 45

FIG. 98 is a plan view showing a sense amplifier portion of a DRAM according to the 45th embodiment of the present invention. In this embodiment, a p-type region 5 is extended perpendicularly to the bit lines and shared by a plurality of sense amplifiers in Embodiment 44 (arrangements 1-1, 2-2, 3-1, and 3-2).

Referring to FIG. 98, the substrate potentials of sense amplifiers SA1 and SA3 can be made equal to each other, and the substrate potentials of sense amplifiers SA2 and SA4 can be made equal to each other. Since equal threshold values can be obtained by all the sense amplifiers respectively having equal substrate potentials regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

The p-type regions 5 are vertically connected to each other. For this reason, even if masks are vertically shifted from each other, the p-type regions 5 can be reliably formed in the channel portions.

Embodiment 46

Figure 99:
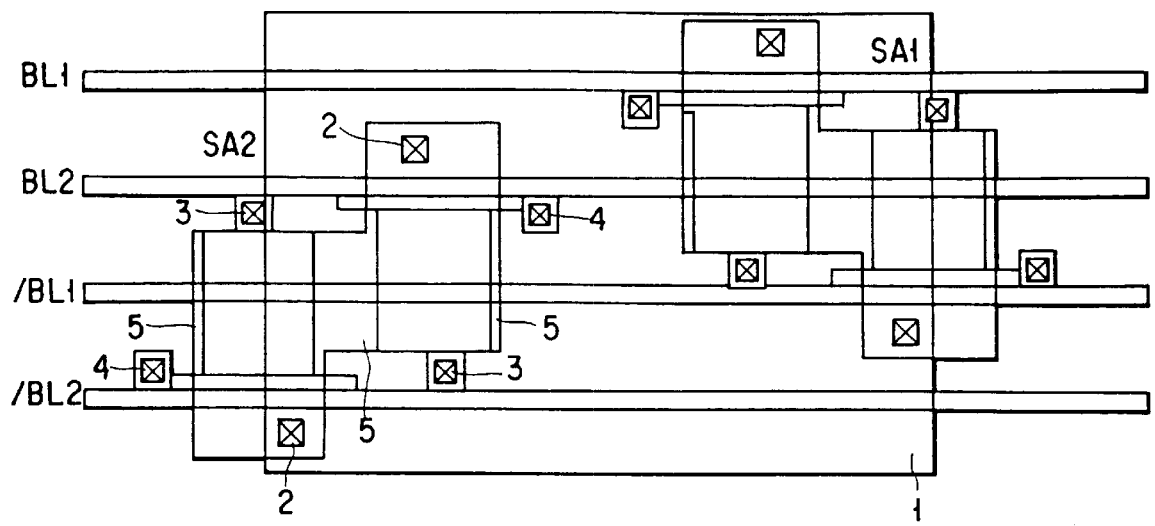
FIG. 99 is a plan view showing a layout pattern of sense amplifiers according to the 46th embodiment.

FIG. 99 is a plan view showing a sense amplifier portion of a DRAM according to the 46th embodiment of the present invention. In this embodiment, two p-type regions 5 are formed in both the gate-width-direction ends of one sense amplifier in Embodiment 44 (arrangements 1-1, 3-1, 3-2, and 3-4).

When only one p-type region 5 is formed as in Embodiment 45, if a width W of a transistor Q1 is increased by shifting a mask in the W direction, a width W of a transistor Q2 decreases, it is not expected to perform an accurate operation. However, in this embodiment, the two p-type regions 5 are formed in both the W-direction ends of two thin-film SOI-nMOSFETs constituting a sense amplifier. For this reason, even if masks are shifted from each other in the W direction (bit line direction in this case), the widths w of the two transistors constituting a pair always change by equal amounts, and the widths W are equal to each other.

Embodiment 47

Figure 100:
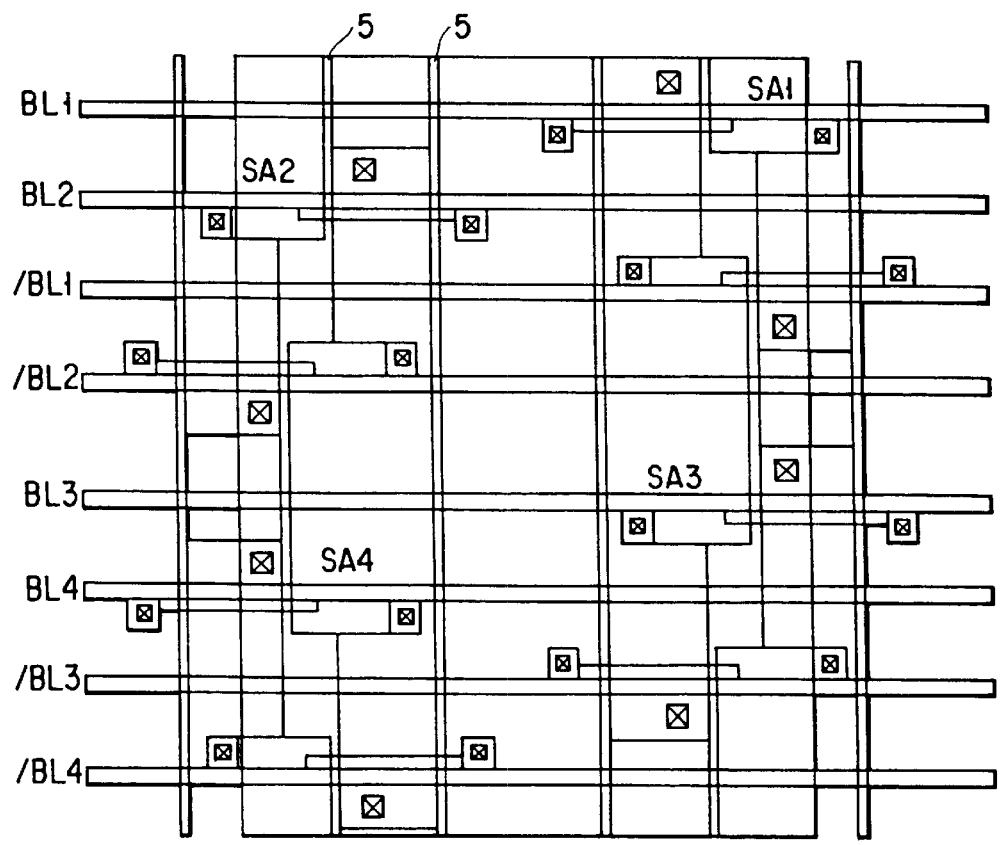
FIG. 100 is a plan view showing a layout pattern of sense amplifiers according to the 47th embodiment.

FIG. 100 is a plan view showing a sense amplifier portion of a DRAM according to the 47th embodiment of the present invention. In this embodiment, two p-type regions 5 are formed in both the gate-width-direction ends of one sense amplifier in Embodiment 44, and the p-type regions 5 are extended perpendicularly to the bit lines and shared by a plurality of sense amplifiers (arrangements 1-1, 2-2, 3-1, 3-2, and 3-4).

Referring to FIG. 100, the substrate potentials of sense amplifiers SA1 and SA3 can be made equal to each other, and the substrate potentials of sense amplifiers SA2 and SA4 can be made equal to each other. Since equal threshold values can be obtained by all the sense amplifiers respectively having equal substrate potentials regardless of the changes of the substrate potentials, the sense amplifiers are simultaneously operated. Therefore, columns (defective columns) which are erroneously operated by receiving noise generated by a change in potential of the adjacent bits caused by delay of the start of a sensing operation advantageously decrease in number.

The p-type regions 5 are vertically connected to each other. For this reason, even if masks are vertically shifted from each other, the p-type regions 5 can be reliably formed in the channel portions.

In addition, the p-type regions 5 are formed in both the W-direction ends of two thin-film SOI-nMOSFETs constituting the sense amplifier. For this reason, even if masks are shifted from each other in the W direction (bit line direction in this case), widths W of a pair of transistors can be kept equal to each other.

Embodiment 48

FIG. 101 is a plan view showing sense amplifier portions of a DRAM according to the 48th embodiment of the present invention. In this embodiment, a contact 12 with a control line 1 is formed in a p-type region 5 in Embodiment 44 (arrangements 1-1, 1-2, 3-1, and 3-2).

The sources of a pair of transistors are connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 49

FIG. 102 is a plan view showing sense amplifier portions of a DRAM according to the 49th embodiment of the present invention. In this embodiment, a contact 12 with a control line 1 is formed in a p-type region 5 in Embodiment 45 (arrangements 1-1, 1-2, 2-2, 3-1, and 3-2).

Referring to FIG. 102, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation.

The p-type regions 5 are vertically connected to each other. For this reason, even if masks are vertically shifted from each other, the p-type regions 5 can be reliably formed in the channel portions.

The common source of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 50

Figure 103:
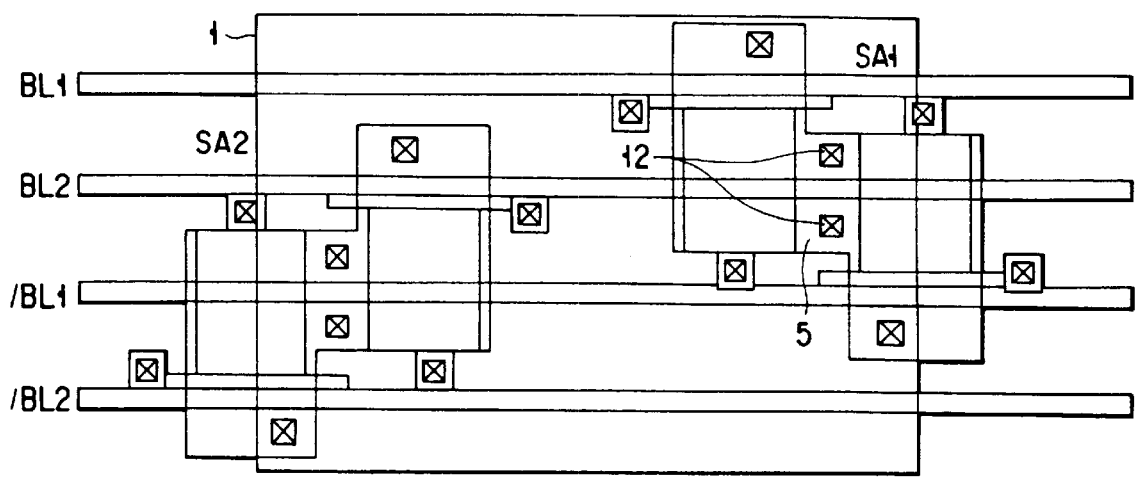
FIG. 103 is a plan view showing a layout pattern of sense amplifiers according to the 50th embodiment.

FIG. 103 is a plan view showing sense amplifier portions of a DRAM according to the 50th embodiment of the present invention. In this embodiment, a contact 12 with a control line 1 is formed in a p-type region 5 in Embodiment 46 (arrangements 1-1, 1-2, 3-1, 3-2, and 3-4).

In this embodiment, the p-type regions 5 are formed in both the W-direction ends of two thin-film SOI-nMOSFETS constituting the sense amplifier. For this reason, even if masks are shifted from each other in the W direction (bit line direction in this case), a width W can be kept constant.

The sources of a pair of transistors are connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 51

Figure 104:
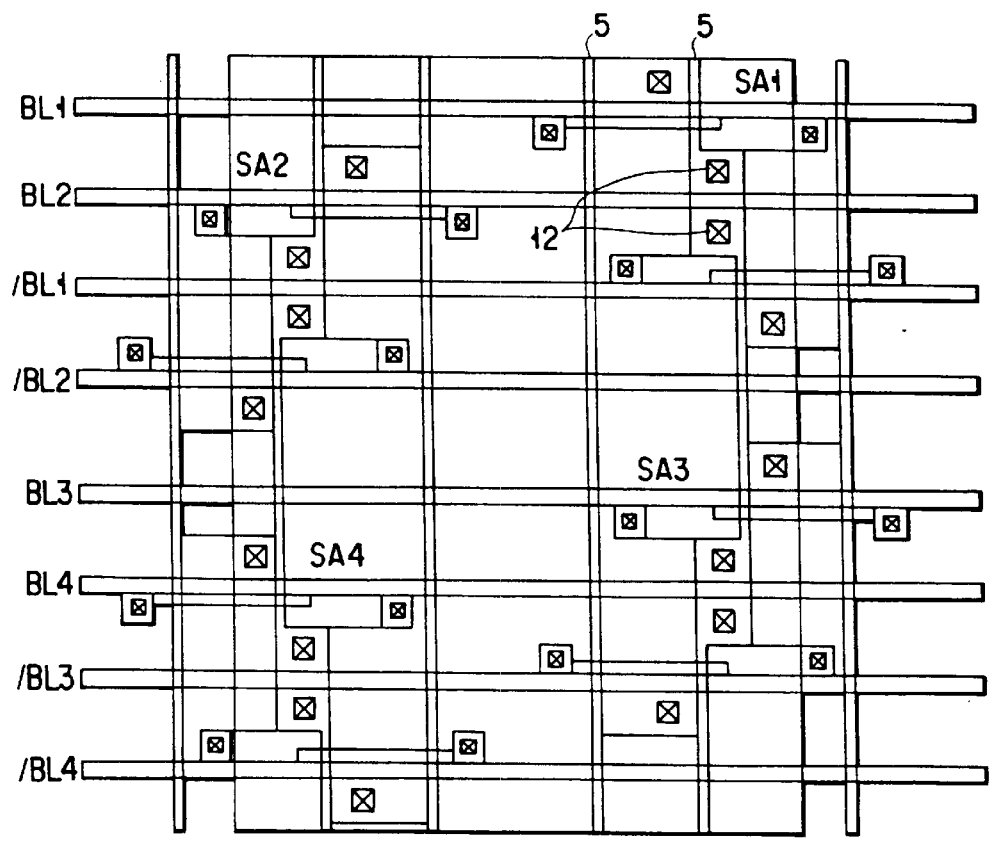
FIG. 104 is a plan view showing a layout pattern of sense amplifiers according to the 51st embodiment.

FIG. 104 is a plan view showing sense amplifier portions of a DRAM according to the 51st embodiment of the present invention. In this embodiment, a contact 12 with a control line 1 is formed in a p-type region 5 in Embodiment 47 (arrangements 1-1, 1-2, 2-2, 3-1, 3-2, and 3-4).

Referring to FIG. 104, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers SA1 to SA4 are simultaneously operated. Therefore, there is advantageously no column (defective column) which is erroneously operated by receiving noise generated by a change in potential of the adjacent bits caused by delay of the start of a sensing operation.

The source of transistor is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

The p-type regions 5 are vertically connected to each other. For this reason, even if masks are vertically shifted from each other, the p-type regions 5 can be reliably formed in the channel portions.

In addition, the p-type regions 5 are formed in both the W-direction ends of two thin-film SOI-nMOSFETs constituting the sense amplifier. For this reason, even if masks are shifted from each other in the W direction (bit line direction in this case), a predetermined gate width w can be kept.

Embodiment 52

Figure 105:
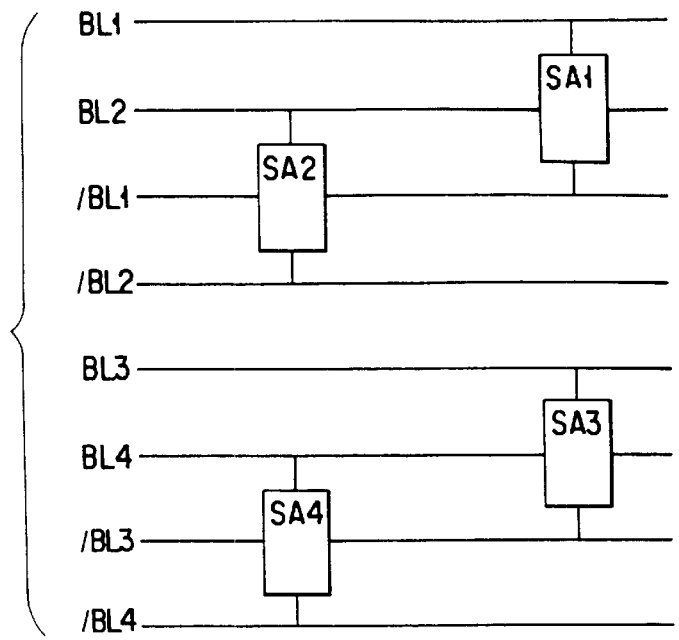
FIG. 105 is a plan view showing a layout pattern of sense amplifiers according to the 52nd embodiment.
Figure 106:
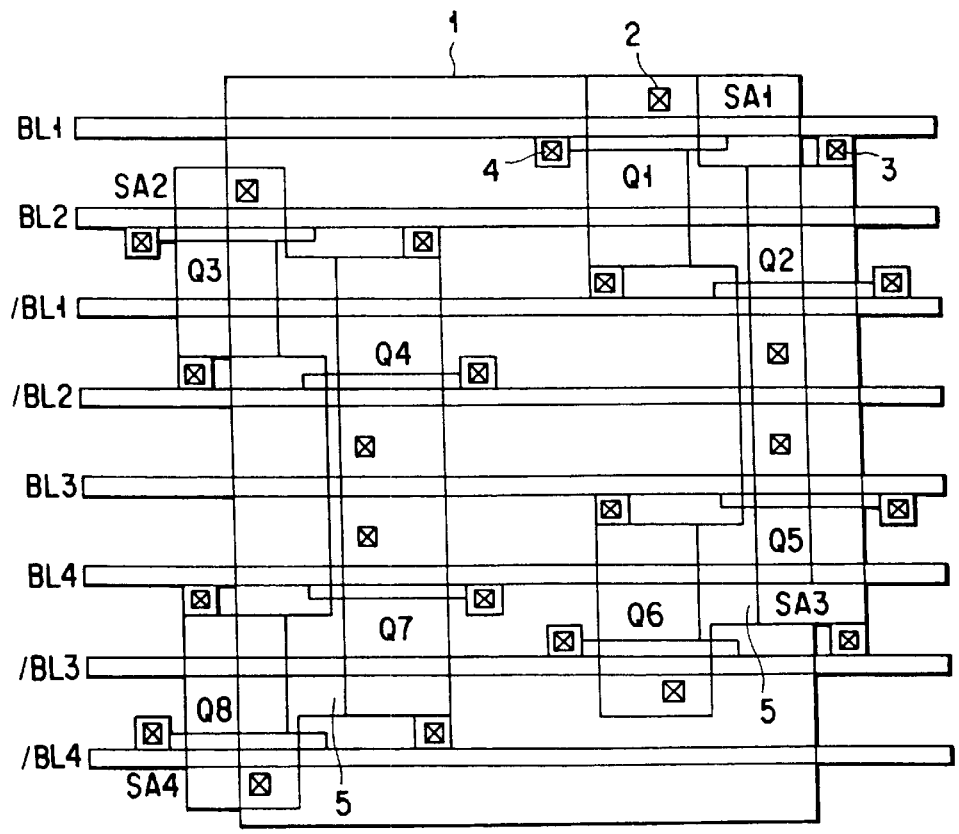
FIG. 106 is a plan view showing a layout pattern of the sense amplifiers according to the 52nd embodiment.

FIGS. 105 and 106 are views for explaining a DRAM according to the 52nd embodiment of the present invention, in which FIG. 105 is a circuit diagram showing the arrangement of sense amplifiers and FIG. 106 is a plan view showing the layout pattern of the sense amplifiers (arrangements 1-1, 3-1 and 3-2).

This embodiment employs a layout in which the sense amplifiers in Embodiment 44 are vertically connected to each other by a source portion. In this embodiment, one thin-film SOI-nMOS sense amplifier is arranged on four bit lines.

Reference symbols Q1 and Q2 denote thin-film SOI-nMOSFETs constituting a sense amplifier SA1 arranged on bit lines BL1 and /BL1, reference symbols Q3 and Q4 denote thin-film SOI-nMOSFETs constituting a sense amplifier SA2 arranged on bit lines BL2 and /BL2, reference symbols Q5 and Q6 denote thin-film SOI-nMOSFETs constituting a sense amplifier SA3 arranged on bit lines BL3 and /BL3, and reference symbols Q7 and Q8 denote thin-film SOI-nMOSFETs constituting a sense amplifier SA4 arranged on bit lines BL4 and /BL4. The sense amplifiers SA2 and SA4 are respectively shifted from the sense amplifiers SA1 and SA3 by a half-pitch in the vertical direction.

FIG. 105 shows a control line 1 to which a common source terminal of the sense amplifiers is connected, a source-contact portion 2 connected to the control line 1, a drain-contact portion 3 for connecting a drain and a bit line to each other, and a gate-contact portion 4 for connecting a gate electrode to a bit line.

In this embodiment, one bit line passes through between the drain-contact portion and gate-contact portion of each transistor and on the source of the transistor. For example, as shown in FIG. 106, the bit line BL2 passes through on the sense amplifier SA1, and the bit line /BL1 passes through on the sense amplifier SA2. That is, one sense amplifier can be arranged every four bit lines. For this reason, design rules can be made moderate more than those of a conventional arrangement.

Considering the sense amplifier SA1 in FIG. 106, a p-type region 5 passes from a portion of the drains of the two thin-film SOI-nMOSFETs Q1 and Q2 to the drains of thin-film SOI-nMOSFETs Q5 and Q6 through a portion of the common source of the thin-film SOI-nMOSFETs Q2 and Q5. This p-type region 5 is selectively formed by ion-implanting a p-type impurity of the same conductivity type as that of the substrates of the transistors by using a mask.

In this manner, the substrate potentials of one pair of thin-film SOI nMOSFETs for detecting a potential difference can be made equal to each other. For this reason, even if the threshold values change, the changes in threshold value are equal to each other. Therefore, potential difference detection can be performed without a hitch.

Embodiment 53

Figure 107:
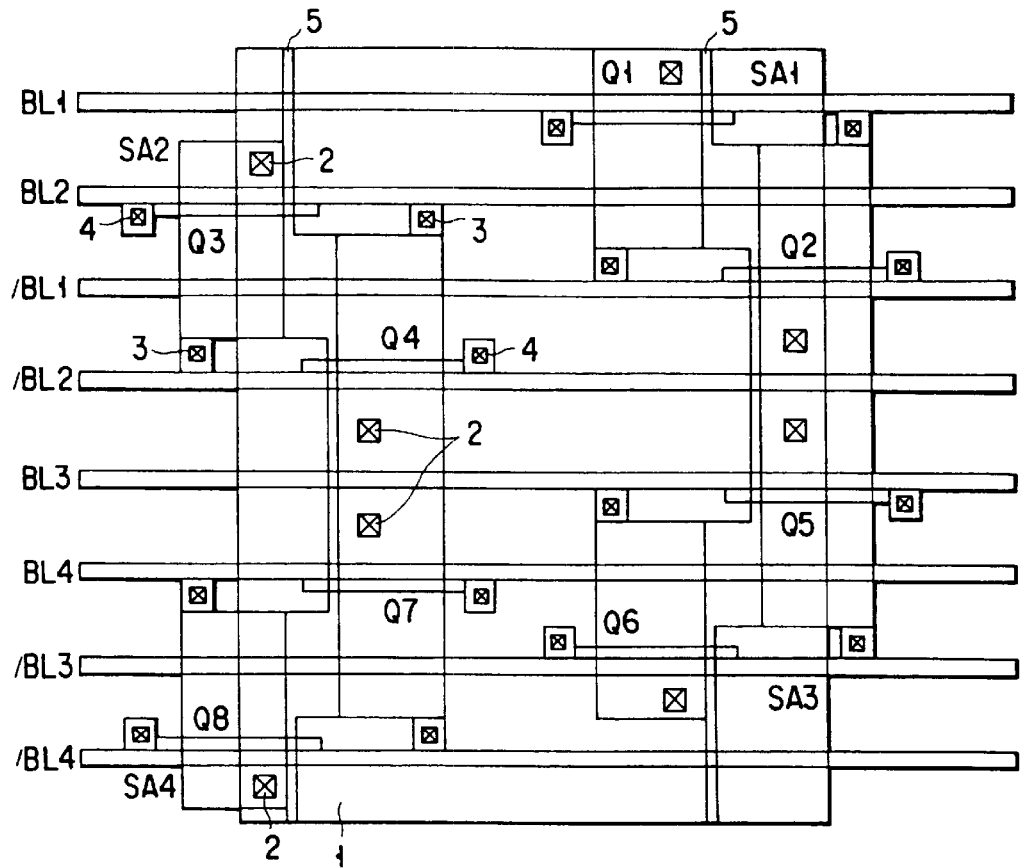
FIG. 107 is a plan view showing a layout pattern of sense amplifiers according to the 53rd embodiment.

FIG. 107 is a plan view showing a sense amplifier portion of a DRAM according to the 53rd embodiment of the present invention. In this embodiment, a p-type region 5 is extended perpendicularly to the bit lines and shared by a plurality of sense amplifiers in Embodiment 52 (arrangements 1-1, 2-2, 3-1, and 3-2).

Referring to FIG. 107, all the substrate potentials of sense amplifiers which are vertically arranged can be made equal to each other. For this reason, since equal threshold values can be obtained by all the sense amplifiers regardless of the changes of the substrate potentials, the sense amplifiers are simultaneously operated. Therefore, columns (defective columns) which are erroneously operated by receiving noise generated by a change in potential of the adjacent bits caused by delay of the start of a sensing operation advantageously decrease in number.

The p-type regions 5 are vertically connected to each other. For this reason, even if masks are vertically shifted from each other, the p-type regions 5 can be reliably formed in the channel portions.

Embodiment 54

Figure 108:
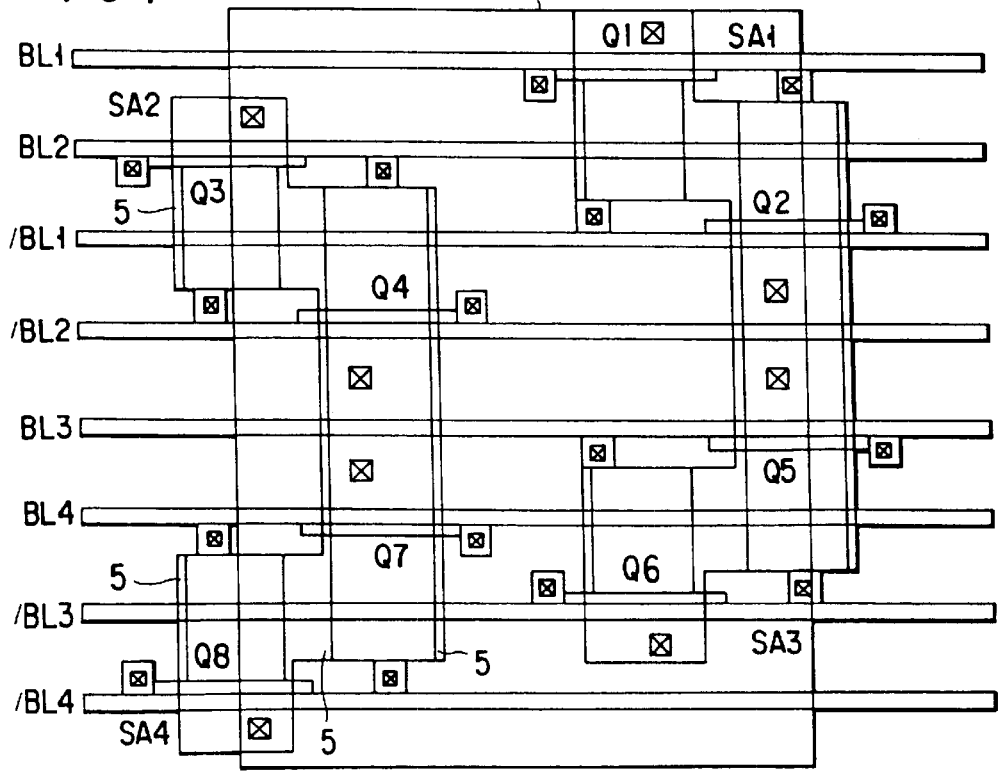
FIG. 108 is a plan view showing a layout pattern of sense amplifiers according to the 54th embodiment.

FIG. 108 is a plan view showing a sense amplifier portion of a DRAM according to the 54th embodiment of the present invention. In this embodiment, two p-type regions 5 are formed in both the gate-width-direction ends of one sense amplifier in Embodiment 52 (arrangements 1-1, 3-1, 3-2, and 3-4).

When only one p-type region 5 is formed as in Embodiment 52, if a width W of a transistor Q1 is increased by shifting a mask in the W direction, a width W of a transistor Q2 decreases, it is not expected to perform an accurate operation. However, in this embodiment, the two p-type regions 5 are formed in both the W-direction ends of two thin-film SOI-nMOSFETs constituting a sense amplifier. For this reason, even if masks are shifted from each other in the W direction (bit line direction in this case), the widths W of the two transistors constituting a pair always change by equal amounts, and the widths W are equal to each other.

Embodiment 55

Figure 109:
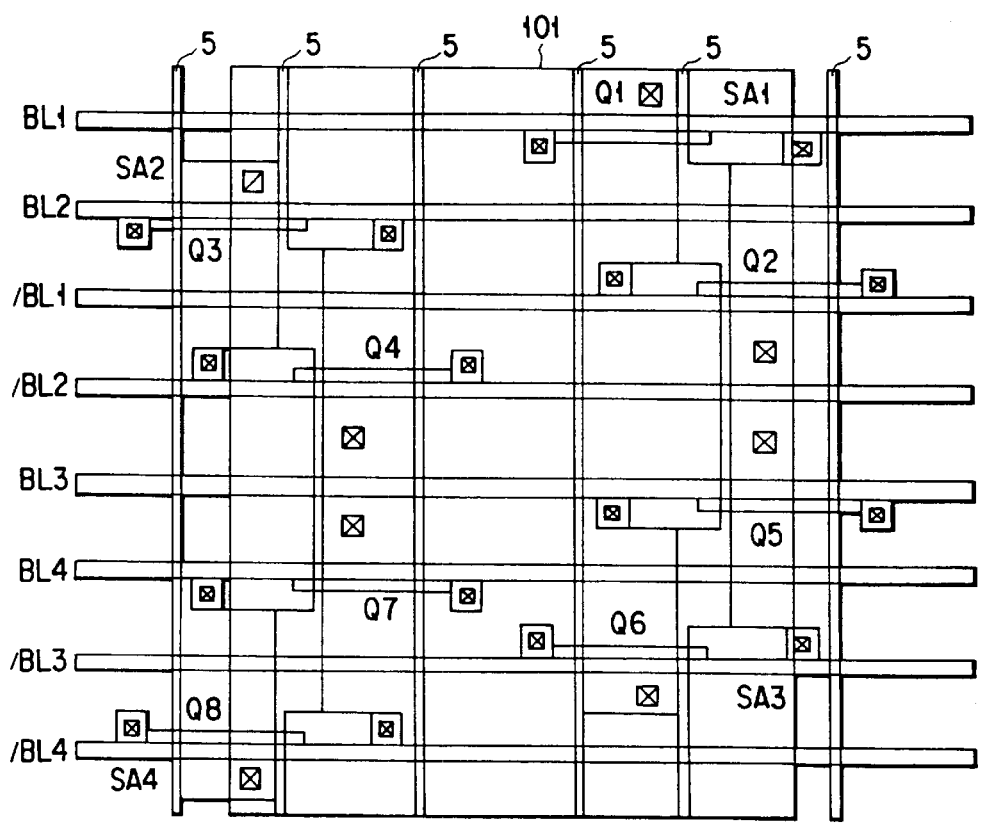
FIG. 109 is a plan view showing a layout pattern of sense amplifiers according to the 55th embodiment.

FIG. 109 is a plan view showing a sense amplifier portion of a DRAM according to the 55th embodiment of the present invention. In this embodiment, two p-type regions 5 are formed in both the gate-width-direction ends of one sense amplifier in Embodiment 52, and the p-type regions 5 are extended perpendicularly to a bit line and shared by a plurality of sense amplifiers (arrangements 1-1, 2-2, 3-1, 3-2, and 3-4).

Referring to FIG. 109, all the substrate potentials of sense amplifiers which are vertically arranged can be made equal to each other. For this reason, since equal threshold values can be obtained by all the sense amplifiers regardless of the changes of the substrate potentials, the sense amplifiers are simultaneously operated. Therefore, columns (defective columns) which are erroneously operated by receiving noise generated by a change in potential of the adjacent bits caused by delay of the start of a sensing operation advantageously decrease in number.

The p-type regions 5 are vertically connected to each other. For this reason, even if masks are vertically shifted from each other, the p-type regions 5 can be reliably formed in the channel portions.

In addition, the p-type regions 5 are formed in both the W-direction ends of two thin-film SOI-nMOSFETs constituting the sense amplifier. For this reason, even if masks are shifted from each other in the W direction (bit line direction in this case), widths W of the pair of transistors can be kept equal to each other.

Embodiment 56

Figure 110:
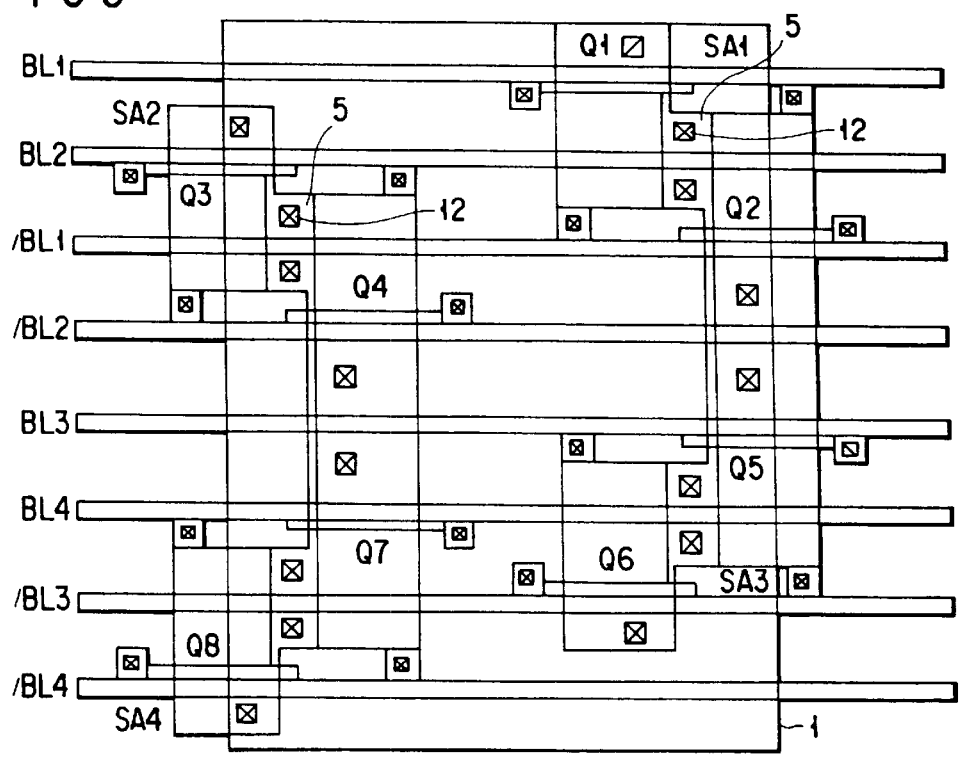
FIG. 110 is a plan view showing a layout pattern of sense amplifiers according to the 56th embodiment.

FIG. 110 is a plan view showing a sense amplifier portion of a DRAM according to the 56th embodiment of the present invention. In this embodiment, a contact 12 with a control line 1 is formed in a p-type region 5 in Embodiment 52 (arrangements 1-1, 1-2, 3-1, and 3-2).

In this embodiment, the common source of a pair of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 57

Figure 111:
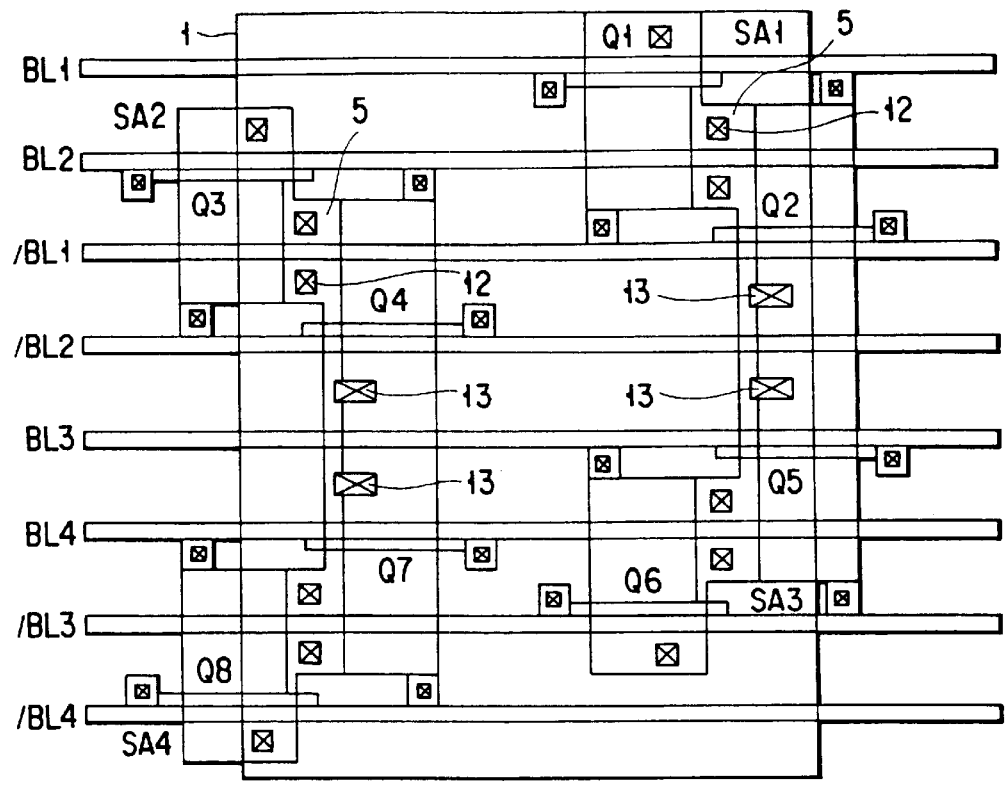
FIG. 111 is a plan view showing a layout pattern of sense amplifiers according to the 57th embodiment.

FIG. 111 is a plan view showing a sense amplifier portion of a DRAM according to the 57th embodiment of the present invention. In this embodiment, the contact between a p-type region 5 and a control line 1 and the contact between a common source and the control line 1 in Embodiment 56 are used common (arrangements 1-1, 1-2, 2-1, 3-1, and 3-2). Reference numeral 13 in FIG. 111 denotes a common contact serving as these contacts.

Embodiment 58

Figure 112:
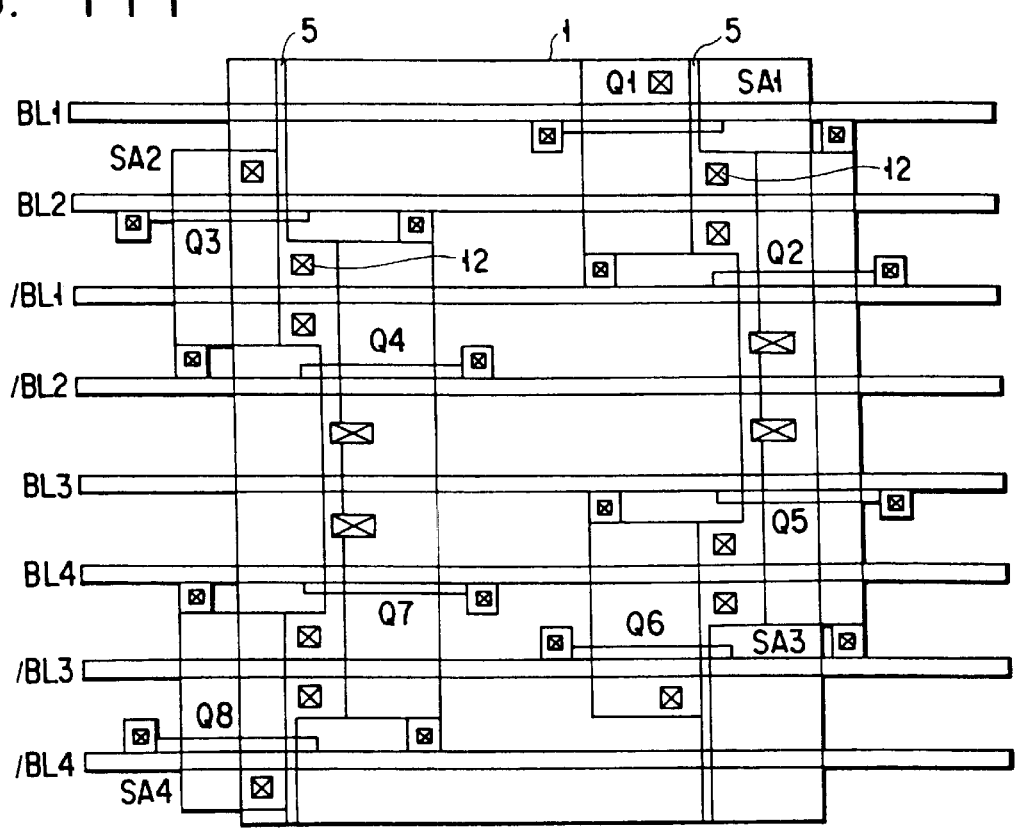
FIG. 112 is a plan view showing a layout pattern of sense amplifiers according to the 58th embodiment.

FIG. 112 is a plan view showing a sense amplifier portion of a DRAM according to the 58th embodiment of the present invention. In this embodiment, a contact 12 with a control line 1 is formed in a p-type region 5 in Embodiment 53 (arrangements 1-1, 1-2, 2-2, 3-1, and 3-2).

Referring to FIG. 112, all the substrate potentials of sense amplifiers on pair of adjacent bit lines can be made equal to each other. For this reason, since equal threshold values can be obtained by all the sense amplifiers regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

The p-type regions 5 are vertically connected to each other. For this reason, even if masks are vertically shifted from each other, the p-type regions 5 can be reliably formed in the channel portions.

The common source of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 59

Figure 113:
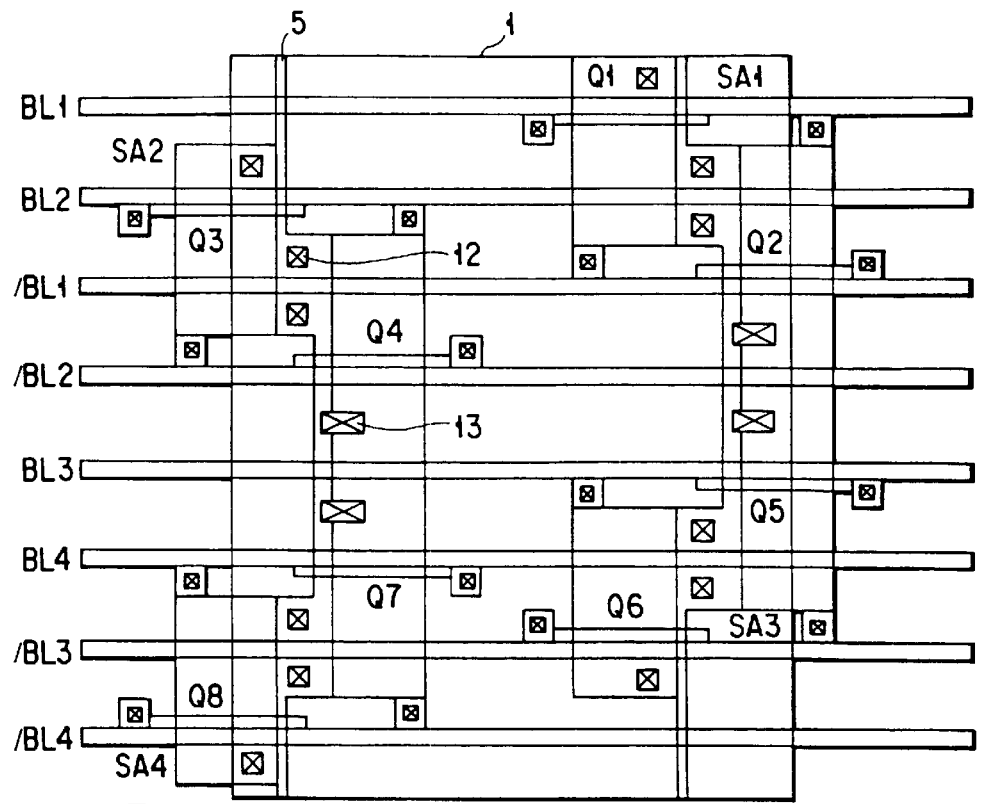
FIG. 113 is a plan view showing a layout pattern of sense amplifiers according to the 59th embodiment.

FIG. 113 is a plan view showing a sense amplifier portion of a DRAM according to the 59th embodiment of the present invention. In this embodiment, the contact between a p-type region 5 and a control line 1 and the contact between a common source and the control line 1 in Embodiment 58 are used common (arrangements 1-1, 1-2, 2-1, 2-2, 3-1, and 3-2). Reference numeral 13 in FIG. 113 denotes a common contact serving as these contacts.

Embodiment 60

Figure 114:
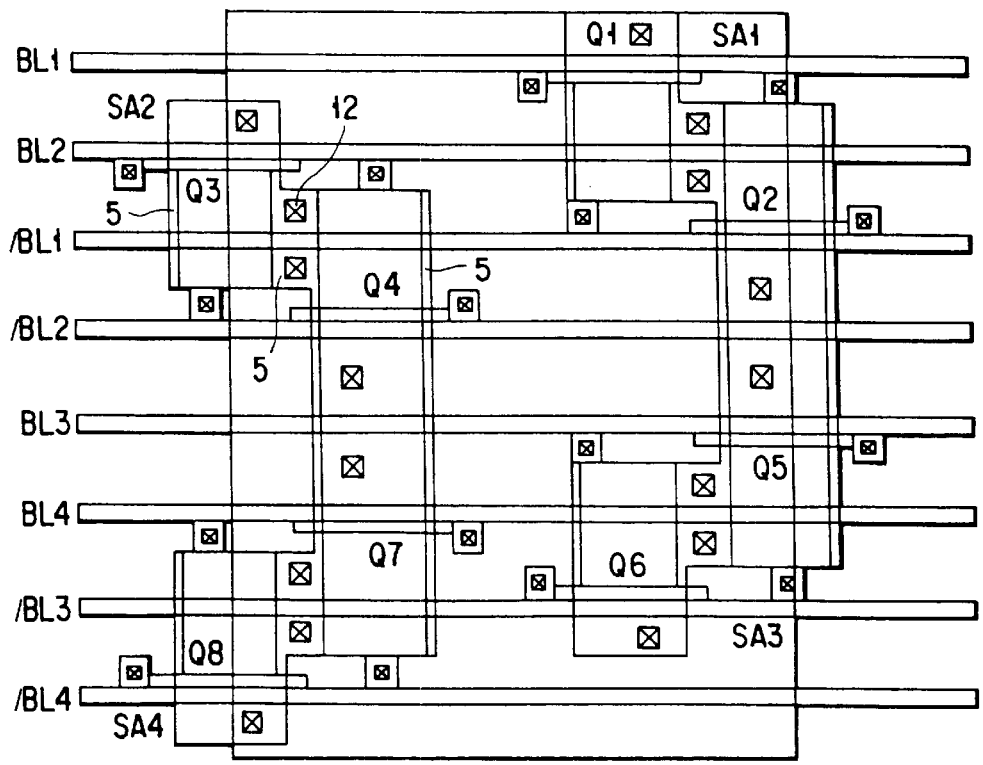
FIG. 114 is a plan view showing a layout pattern of sense amplifiers according to the 60th embodiment.

FIG. 114 is a plan view showing a sense amplifier portion of a DRAM according to the 60th embodiment of the present invention. In this embodiment, a contact 12 with a control line 1 is formed in a p-type region 5 in Embodiment 54 (arrangements 1-1, 1-2, 3-1, 3-2, and 3-4).

In this embodiment, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

In addition, the sources of a pair of transistors are connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 61

FIG. 115 is a plan view showing a sense amplifier portion of a DRAM according to the 61st embodiment of the present invention. In this embodiment, a contact 12 with a control line 1 is formed in a p-type region 5 in Embodiment 55 (arrangements 1-1, 1-2, 2-2, 3-1, 3-2, and 3-4).

Referring to FIG. 115, all the substrate potentials of sense amplifiers on pair of adjacent bit lines can be made equal to each other. For this reason, since equal threshold values can be obtained by all the sense amplifiers regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

The common source of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

The p-type regions 5 are vertically connected to each other. For this reason, even if masks are vertically shifted from each other, the p-type regions 5 can be reliably formed in the channel portions.

In addition, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

Embodiment 62

FIG. 116 is a plan view showing a sense amplifier portion of a DRAM according to the 62nd embodiment of the present invention. In this embodiment, the contact between a p-type region 5 and a control line 1 and the contact between a common source and the control line 1 in Embodiment 61 are used common (arrangements 1-1, 1-2, 2-1, 2-2, 3-1, 3-2, and 3-4). Reference numeral 13 in FIG. 116 denotes a common contact serving as these contacts.

Embodiment 63

Figure 117:
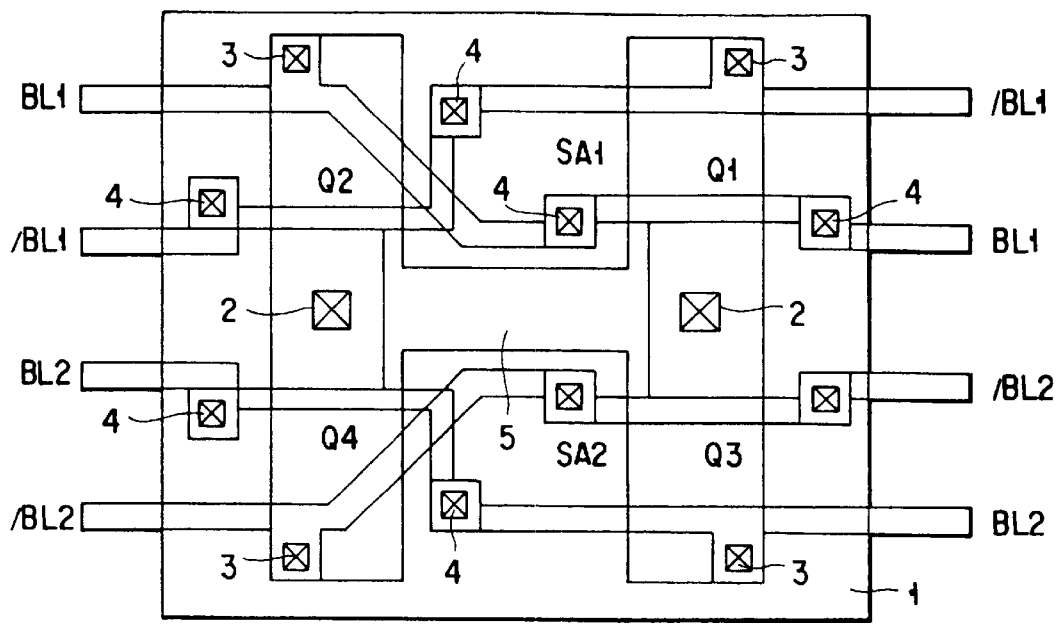
FIG. 117 is a plan view showing a layout pattern of sense amplifiers according to the 63rd embodiment.

FIG. 117 is a plan view showing a sense amplifier portion of a DRAM according to the 63rd embodiment of the present invention. This embodiment employs arrangements 1-1 and 4.

Reference symbols Q1 and Q2 denote thin-film SOI-nMOSFETs constituting a sense amplifier SA1 arranged on bit lines BL1 and /BL1, and reference symbols Q3 and Q4 denote thin-film SOI-nMOSFETs constituting a sense amplifier SA2 arranged on bit lines BL2 and /BL2. The bit line BL1 is partially replaced with the gate polysilicon portion of the thin-film SOI-nMOSFET Q1, and the bit line /BL1 is partially replaced with the gate polysilicon portion of the SOI-nMOSFET Q2. The pairs of bit lines cross each other at the portions the bit lines are partially replaced with the gate polysilicon portions of the thin-film SOI-nMOSFETs Q2 and Q4.

Referring to FIG. 117, the p-type region 5 is formed in a portion of the common source of the sense amplifiers SA1 and SA2. The p-type region 5 is selectively formed by ion-implanting a p-type impurity of the same conductivity type as that of the substrates of the transistors by using a mask.

In this manner, the substrate potentials of one pair of thin-film SOI-nMOSFETs for detecting a potential difference can be made equal to each other. For this reason, even if the threshold values change, the changes in threshold value are equal to each other. Therefore, potential difference detection can be performed without a hitch.

Embodiment 64

Figure 118:
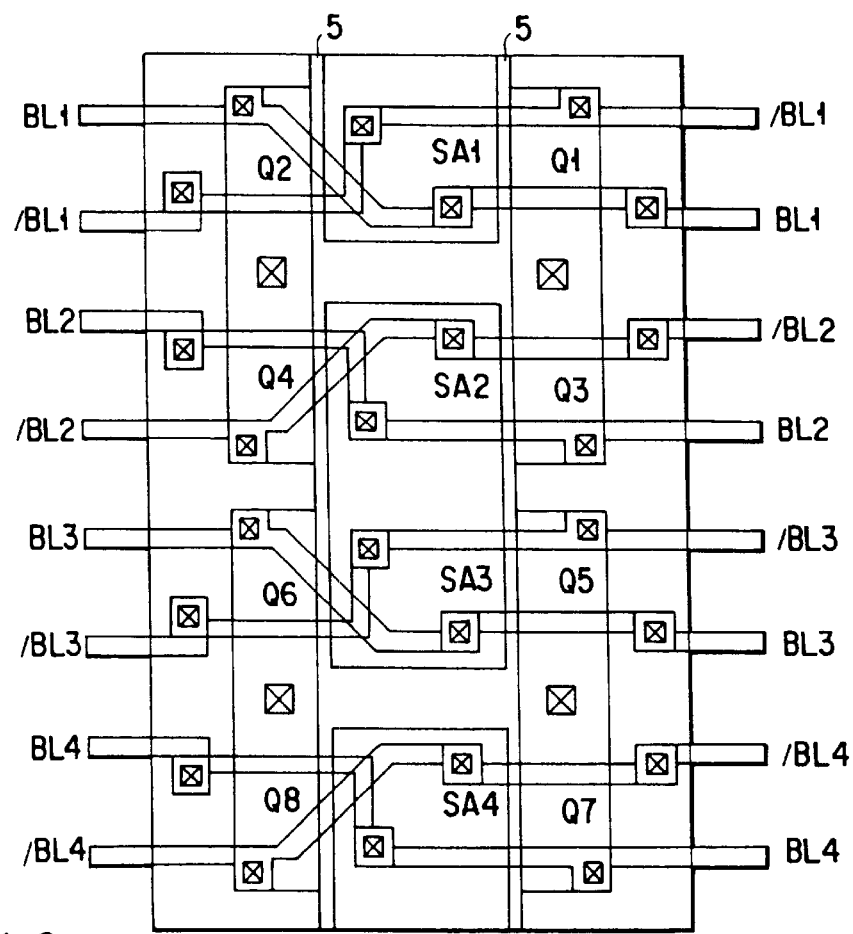
FIG. 118 is a plan view showing a layout pattern of sense amplifiers according to the 64th embodiment.

FIG. 118 is a plan view showing a sense amplifier portion of a DRAM according to the 64th embodiment of the present invention. In this embodiment, a p-type region 5 is extended perpendicularly to a bit line and shared by a plurality of sense amplifiers in Embodiment 63 (arrangements 1-1, 2-2, and 4).

Referring to FIG. 118, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

The p-type regions 5 are vertically connected to each other. For this reason, even if masks are vertically shifted from each other, the p-type regions 5 can be reliably formed in the channel portions.

Embodiment 65

Figure 119:
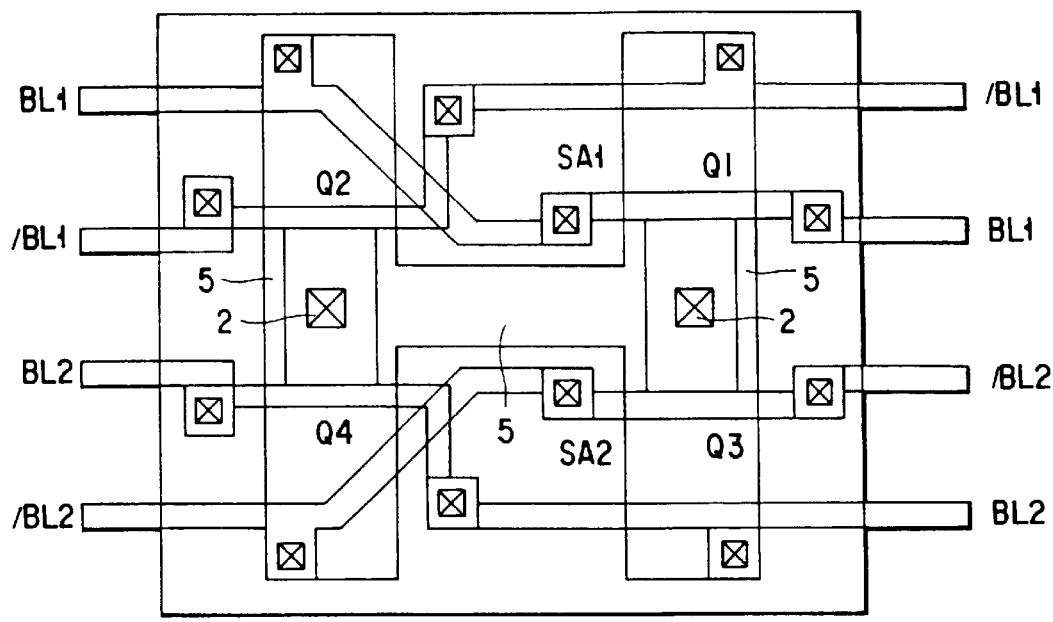

FIG. 119 is a plan view showing a sense amplifier portion of a DRAM according to the 65th embodiment of the present invention. In this embodiment, two p-type regions 5 are formed in both the gate-width-direction ends of one sense amplifier in Embodiment 63 (arrangements 1-1, 2-4, and 4).

When only one p-type region 5 is formed as in Embodiment 63, if masks are shifted from each other in a W direction (bit line direction in this case), the widths W of the transistors Q1 and Q2 are not equal to each other.

However, in this embodiment, the p-type regions S are formed in both the W-direction ends of two thin-film SOI-nMOSFETs constituting the sense amplifier. For this reason, even if masks are shifted from each other in the W direction (bit line direction in this case), widths W of the pair of transistors Q1 and Q2 can be kept equal to each other.

Embodiment 66

Figure 120:
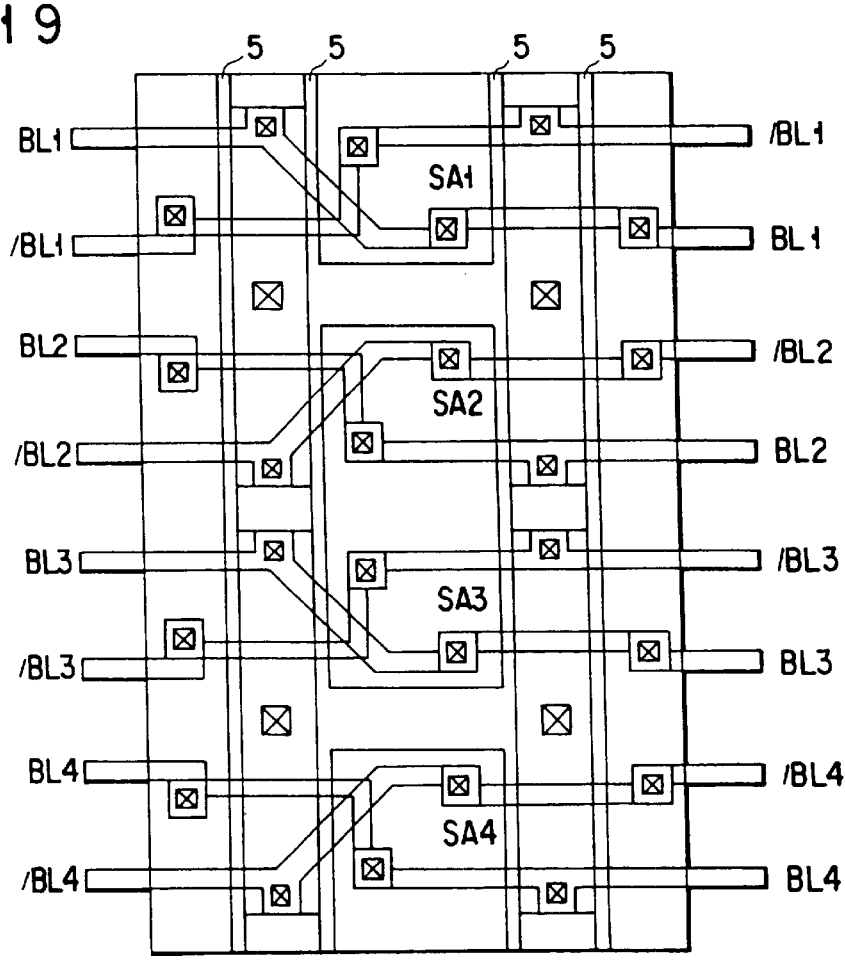

FIG. 120 is a plan view showing a sense amplifier portion of a DRAM according to the 66th embodiment of the present invention. In this embodiment, two p-type regions 5 are formed in both the gate-width-direction ends of one sense amplifier in Embodiment 63, and the p-type regions 5 are extended perpendicularly to the bit lines and shared by a plurality of sense amplifiers (arrangements 1-1, 2-2, 3-4, and 4).

Referring to FIG. 120, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

The p-type regions 5 are vertically connected to each other. For this reason, even if masks are vertically shifted from each other, the p-type regions 5 can be reliably formed in the channel portions.

In addition, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

Embodiment 67

Figure 121:
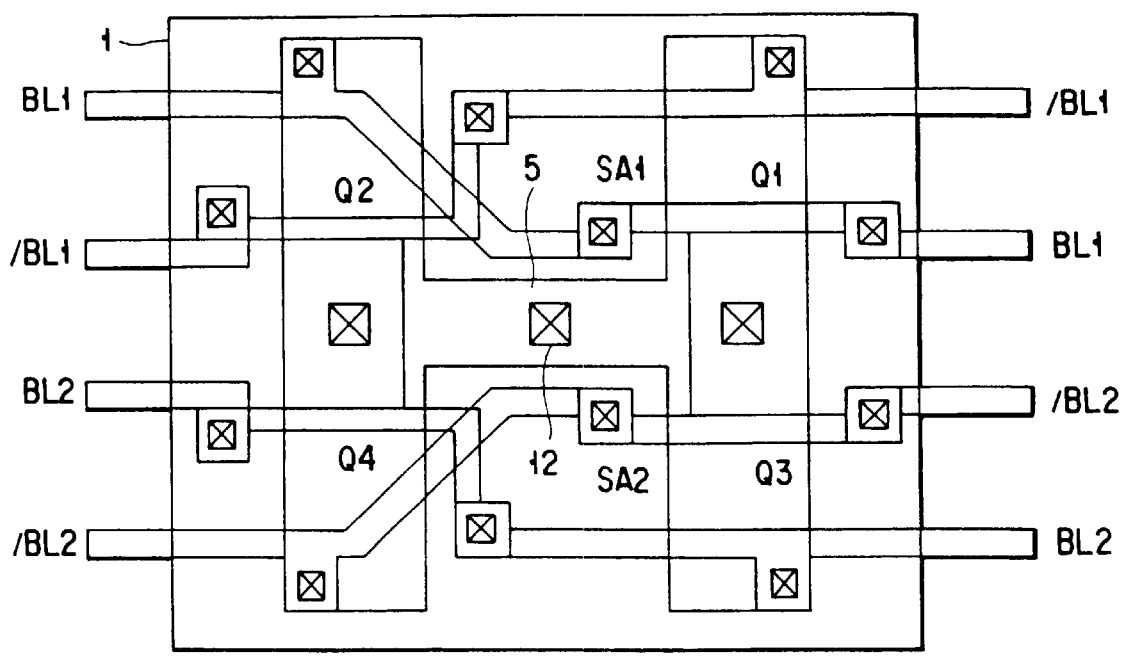

FIG. 121 is a plan view showing a DRAM according to the 67th embodiment of the present invention. In this embodiment, a contact 12 with a control line 1 is formed in a p-type region 5 in Embodiment 63 (arrangements 1-1, 1-2, and 4).

In this embodiment, the common source of a pair of transistors is connected to the control line 1, and the control line 1 is connected to the p-type region 5, so that the source

Embodiment 68

Figure 122:
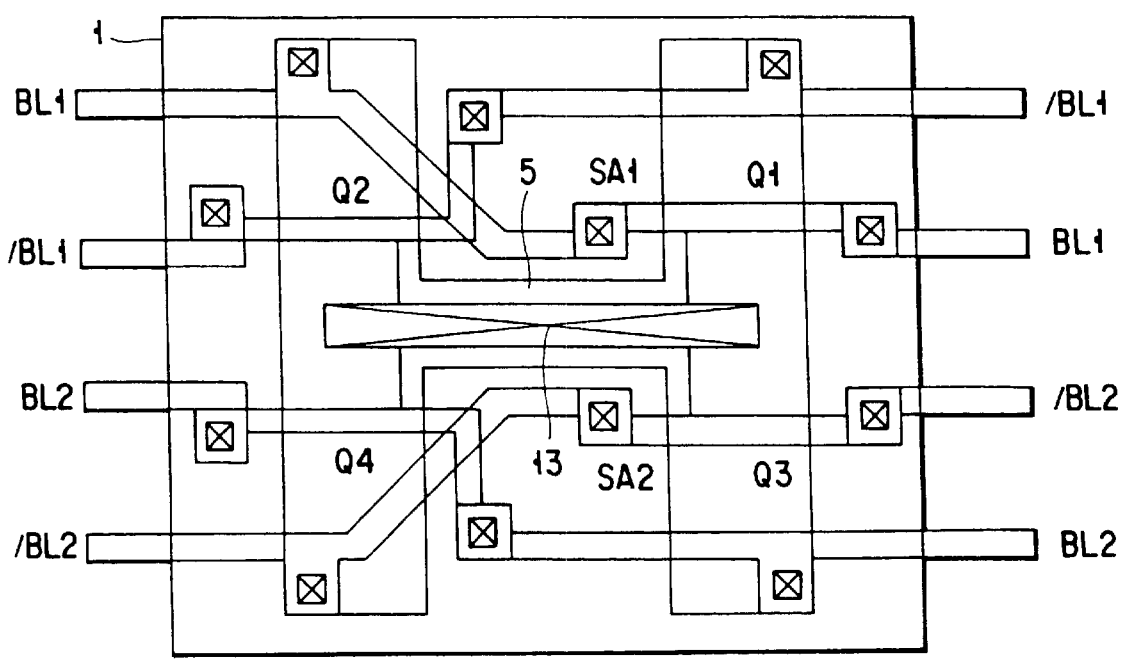

FIG. 122 is a plan view showing a sense amplifier portion of a DRAM according to the 68th embodiment of the present invention. In this embodiment, the contact between a p-type region 5 and a control line 1 and the contact between a common source and the control line 1 in Embodiment 67 are used common (arrangements 1-1, 1-2, 2-1, and 4). Reference numeral 13 in FIG. 122 denotes a common contact serving as these contacts.

In this embodiment, since the contact of a source region and the contact of the p-type region 5 are used common, a mask pattern can be simplified, and a contact-contact interval is not required. For this reason, further micropatterning can be performed.

Embodiment 69

FIG. 123 is a plan view showing a sense amplifier portion of a DRAM according to the 69th embodiment of the present invention. In this embodiment, a contact 12 with a control line 1 is formed in a p-type region 5 in Embodiment 64 (arrangements 1-1, 1-2, 2-2, and 4).

Referring to FIG. 123, all the substrate potentials of sense amplifiers SA1 to SA4 on pair of adjacent bit lines can be made equal to each other. For this reason, since equal threshold values can be is obtained by all the sense amplifiers SA1 to SA4 regardless of the changes of the substrate potentials, the sense amplifiers are simultaneously operated.

Therefore, there is advantageously no column (defective column) which is erroneously operated by receiving noise generated by a change in potential of the adjacent bits caused by delay of the start of a sensing operation.

The p-type regions 5 are vertically connected to each other. For this reason, even if masks are vertically shifted from each other, the p-type regions 5 can be reliably formed in the channel portions.

The common source of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 70

FIG. 124 is a plan view showing a sense amplifier portion of a DRAM according to the 70th embodiment of the present invention. In this embodiment, the contact between a p-type region 5 and a control line 1 and the contact between a common source and the control line 1 in Embodiment 69 are used common (arrangements 1-1, 1-2, 2-1, 2-2 and 4). Reference numeral 13 in FIG. 124 denotes a common contact serving as these contacts.

In this embodiment, since the contact of a source region and the contact of the p-type region 5 are used common, a mask pattern can be simplified, and a contact-contact interval is not required. For this reason, further micropatterning can be performed.

Embodiment 71

FIG. 125 is a plan view showing a sense amplifier portion of a DRAM according to the 71st embodiment of the present invention. In this embodiment, a contact 12 with a control line 1 is formed in a p-type region 5 in Embodiment 65 (arrangements 1-1, 1-2, 3-4, and 4).

In this embodiment, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

In addition, the common source of a pair of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 72

Figure 126:
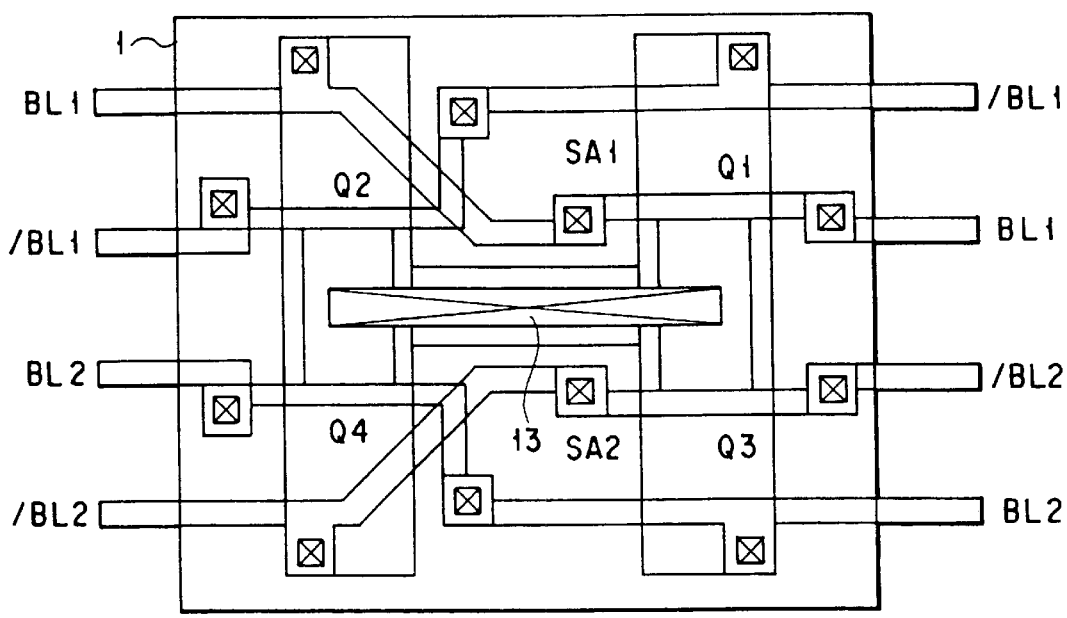

FIG. 126 is a plan view showing a sense amplifier portion of a DRAM according to the 72nd embodiment of the present invention. In this embodiment, the contact between a p-type region 5 and a control line 1 and the contact between a common source and the control line 1 in Embodiment 71 are used common (arrangements 1-1, 1-2, 2-1, 3-4, and 4). Reference numeral 13 in FIG. 126 denotes a common contact serving as these contacts.

In this embodiment, since the contact of a source region and the contact of the p-type region 5 are used common, a mask pattern can be simplified, and a contact-contact interval is not required. For this reason, further micropatterning can be performed.

Embodiment 73

Figure 127:
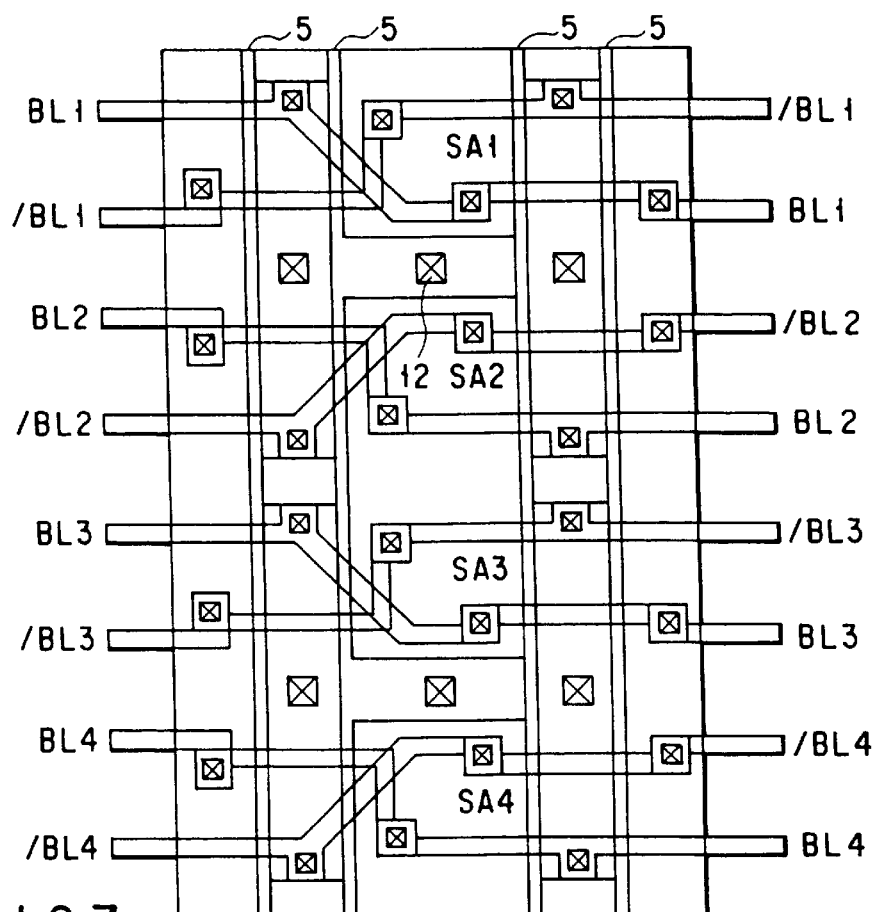

FIG. 127 is a plan view showing a sense amplifier portion of a DRAM according to the 73rd embodiment of the present invention. In this embodiment, a contact 12 with a control line 1 is formed in a p-type region 5 in Embodiment 66 (arrangements 1-1, 1-2, 2-2, 3-4, and 4).

Referring to FIG. 127, all the substrate potentials of sense amplifiers SA1 to SA4 on pair of adjacent bit lines can be made equal to each other. For this reason, since equal threshold values can be obtained by all the sense amplifiers SA1 to SA4 regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

The common source of transistors is connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

The p-type regions 5 are vertically connected to each other. For this reason, even if masks are vertically shifted from each other, the p-type regions 5 can be reliably formed in the channel portions.

In addition, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

Embodiment 74

Figure 128:
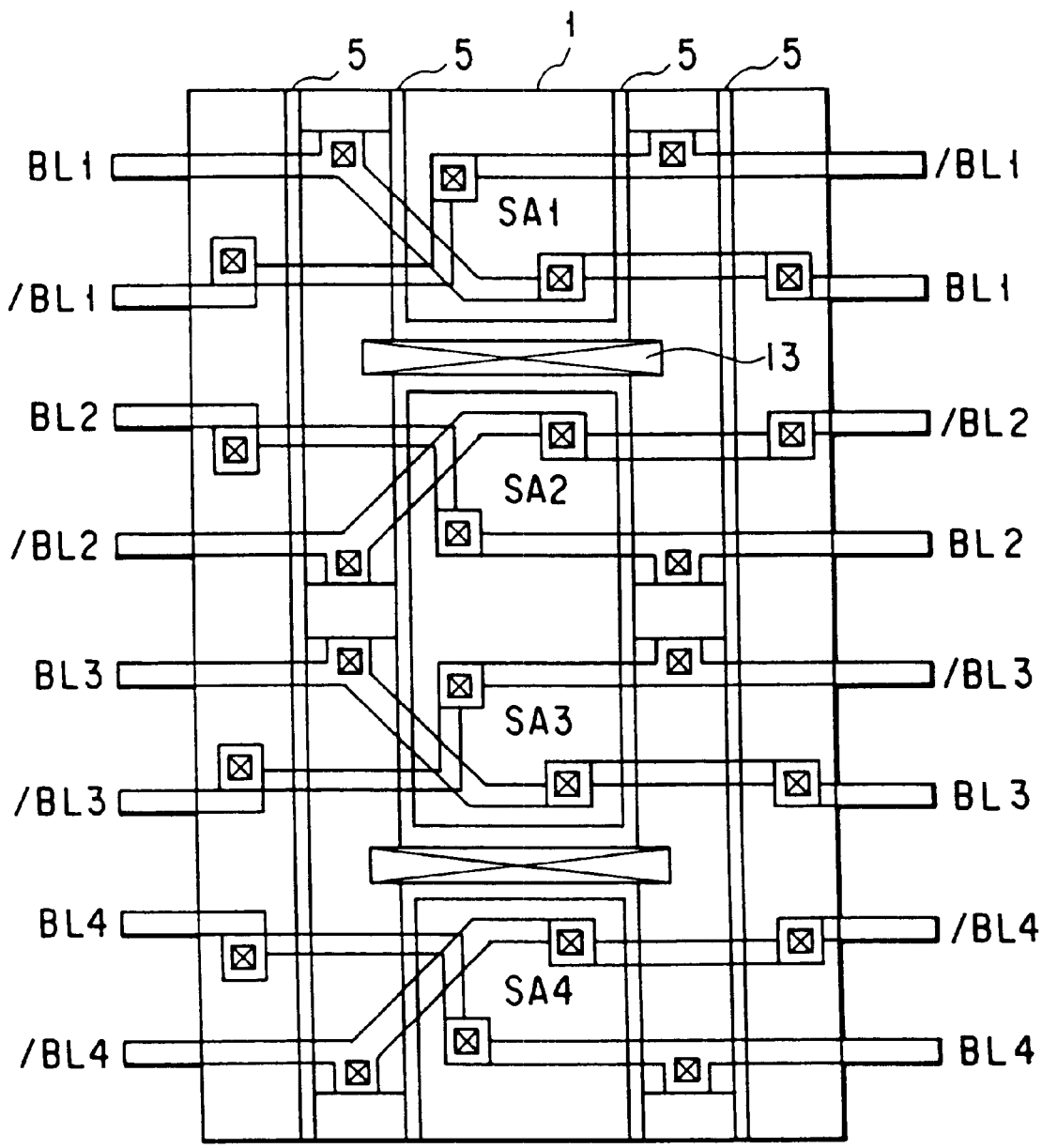

FIG. 128 is a plan view showing a sense amplifier portion of a DRAM according to the 74th embodiment of the present invention. In this embodiment, the contact between a p-type region 5 and a control line 1 and the contact between a common source and the control line 1 in Embodiment 73 are used common (arrangements 1-1, 1-2, 2-1, 2-2, 3-4, and 4). Reference numeral 13 in FIG. 128 denotes a common contact serving as these contacts.

In this embodiment, since the contact of a source region and the contact of the p-type region 5 are used common, a mask pattern can be simplified, and a contact-contact interval is not required. For this reason, further micropatterning can be performed.

Embodiment 75

FIG. 129 is a plan view showing a sense amplifier portion of a DRAM according to the 75th embodiment of the present invention. This embodiment employs arrangements 1-1, 3-1, 3-2, and 4.

Reference symbols Q1 and Q2 denote thin-film SOI-nMOSFETs constituting a sense amplifier SA1 arranged on bit lines BL3 and /BL1, reference symbols Q3 and Q4 denote thin-film SOI-nMOSFETs constituting a sense amplifier SA2 arranged on bit lines BL2 and /BL2, reference symbols Q5 and Q6 denote thin-film SOI-nMOSFETs constituting a sense amplifier SA3 arranged on bit lines BL3 and /BL3, and reference symbols Q7 and Q8 denote thin-film SOI-nMOSFETs constituting a sense amplifier SA4 arranged on bit lines BL4 and /BL4. The sense amplifiers SA2 and SA4 are respectively shifted from the sense amplifiers SA1 and SA3 by one pitch.

FIG. 129 shows a control line 1 to which a common source terminal of the sense amplifiers is connected, a source-contact portion 2 connected to the control line 1, a drain-contact portion 3 for connecting a drain and a bit line to each other, and a gate-contact portion 4 for connecting a gate electrode to a bit line.

In this embodiment, through bit lines are arranged in such a manner that the sense amplifiers in Embodiment 63 are shifted in the bit line direction, and one thin-film SOI-nMOS sense amplifier is arranged on four bit lines. Two bit lines pass through on the source portion of each transistor. For example, in FIG. 129, the bit lines BL3 and /BL3 pass through on the common source of the sense amplifiers SA1 and SA3, the bit lines BL2 and /BL2 pass through on the common source of sense amplifiers SA2 and SA4. For this reason, one sense amplifier may be arranged every four bit lines, design rules can be moderated.

In this embodiment, the bit lines are partially replaced with gate polysilicon portions, and the bit lines cross each other at the gate polysilicon portions. For example, the bit line /BL1 is partially replaced with the gate polysilicon portion of the thin-film SOI-nMOSFET Q1, and the bit line BL1 is partially replaced with the gate polysilicon portion of the thin-film SOI-nMOSFET Q2. In addition, a pair of bit lines cross at a portion where one of the bit lines is partially replaced with the gate polysilicon portion.

Considering the sense amplifiers SA1 and SA3 in FIG. 129, the p-type regions 5 are arranged in portions of the source regions to connect the thin-film SOI-nMOSFETs Q1 and Q2 to each other and the thin-film SOI-nMOSFETs Q3 and Q4 to each other. The p-type region 5 is selectively formed by ion-implanting a p-type impurity of the same conductivity type as that of the substrates of the transistors by using a mask.

In this manner, the substrate potentials of one pair of thin-film SOI-nMOSFETs for detecting a potential difference can be made equal to each other. For this reason, even if the threshold values change, the changes in threshold value are equal to each other. Therefore, potential difference detection can be performed without a hitch.

Embodiment 76

FIG. 130 is a plan view showing a sense amplifier portion of a DRAM according to the 76th embodiment of the present invention. In this embodiment, a p-type region is extended perpendicularly to the bit lines and shared by a plurality of sense amplifiers (arrangements 1-1, 2-2, 3-1, and 3-2, and 4).

Referring to FIG. 130, all the substrate potentials of sense amplifiers SA1, SA3, . . . on pair of adjacent bit lines can be made equal to each other, and all the substrate potentials of sense amplifiers SA2, SA4, . . . on pair of adjacent bit lines can be made equal to each other. For this reason, since equal threshold values can be obtained by all the sense amplifiers connected to each other by the p-type region 5 regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

The p-type regions 5 are vertically connected to each other. For this reason, even if masks are vertically shifted from each other, the p-type regions 5 can be reliably formed in the channel portions.

Embodiment 77

FIG. 131 is a plan view showing a sense amplifier portion of a DRAM according to the 77th embodiment of the present invention. In this embodiment, two p-type regions 5 are formed in both the gate-width-direction ends of one sense amplifier in Embodiment 75 (arrangements 1-1, 3-1, 3-2, 3-4, and 4).

When only one p-type region 5 is formed as in Embodiment 75, if masks are shifted from each other in a W direction (bit line direction in this case), the widths W of transistors Q1 and Q2 are not equal to each other.

However, in this embodiment, the p-type regions 5 are formed in both the W-direction ends of two thin-film SOI-nMOSFETs constituting the sense amplifier. For this reason, even if masks are shifted from each other in the W direction (bit line direction in this case), widths W of the transistors Q1 and Q2 can be kept equal to each other.

Embodiment 78

FIG. 132 is a plan view showing a sense amplifier portion of a DRAM according to the 78th embodiment of the present invention. In this embodiment, two p-type regions 5 are formed in both the gate-width-direction ends of one sense amplifier in Embodiment 75, and the p-type regions 5 are extended perpendicularly to the bit lines and shared by a plurality of sense amplifiers (arrangements 1-1, 2-2, 3-1, 3-2, 3-4, and 4).

Referring to FIG. 132, all the substrate potentials of sense amplifiers SA1, SA3, . . . on pair of adjacent bit lines can be made equal to each other, and all the substrate potentials of sense amplifiers SA2, SA4, . . . on pair of adjacent bit lines can be made equal to each other. For this reason, since equal threshold values can be obtained by all the sense amplifiers connected to each other by the p-type region 5 regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

The p-type regions 5 are vertically connected to each other. For this reason, even if masks are vertically shifted from each other, the p-type regions 5 can be reliably formed in the channel portions.

In addition, the p-type regions are formed in both the W-direction ends of two thin-film SOI-nMOSFETs constituting the sense amplifier. For this reason, even if masks are shifted from each other in the W direction (bit line direction in this case), widths W of a pair of transistors can be kept equal to each other.

Embodiment 79

FIG. 133 is a plan view showing a sense amplifier portion of a DRAM according to the 79th embodiment of the present invention. In this embodiment, a contact 12 with a control line 1 is formed in a p-type region 5 in Embodiment 75 (arrangements 1-1, 1-2, 3-1, 3-2, and 4).

In this embodiment, the sources of transistors are connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

When the transistors are connected to the control line 1, the substrate potentials of all the sense amplifiers can be made equal to each other. For this reason, since equal threshold values can be obtained by all the sense amplifiers connected to each other by the p-type region 5 regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

Embodiment 80

FIG. 134 is a plan view showing a sense amplifier portion of a DRAM according to the 80th embodiment of the present invention. In this embodiment, the contact between a p-type region 5 and a control line 1 and the contact between a common source and the control line 1 in Embodiment 79 are used common (arrangements 1-1, 1-2, 2-1, 3-1, 3-2, and 4). Reference numeral 13 in FIG. 134 denotes a common contact serving as these contacts.

In this embodiment, since the contact of a source region and the contact of the p-type region 5 are used common, a mask pattern can be simplified, and a contact-contact interval is not required. For this reason, further micropatterning can be performed.

Embodiment 81

FIG. 135 is a plan view showing a sense amplifier portion of a DRAM according to the 81st embodiment of the present invention. In this embodiment, a contact 12 with a control line 1 is formed in a p-type region 5 in Embodiment 76 (arrangements 1-1, 1-2, 2-2, 3-1, 3-2, and 4).

Referring to FIG. 135, the substrate potentials of all sense amplifiers can be made equal to each other. For this reason, since equal threshold values can be obtained by all the sense amplifiers regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

The p-type regions 5 are vertically connected to each other. For this reason, even if masks are vertically shifted from each other, the p-type regions 5 can be reliably formed in the channel portions.

The sources of all the transistors are connected to the control line 1, and the control line 1 is connected to the p-type region 5, so that the source and substrate of each transistor have equal potentials. Therefore, the substrate potentials are not set in a floating state, and storage of holes in a channel portion and a decrease in drain breakdown voltage can be prevented, thereby improving reliability of a sensing operation.

Embodiment 82

FIG. 136 is a plan view showing a sense amplifier portion of a DRAM according to the 82nd embodiment of the present invention. In this embodiment, the contact between a p-type region 5 and a control line 1 and the contact between a common source and the control line 1 in Embodiment 81 are used common (arrangements 1-1, 1-2, 2-1, 2-2, 3-1, 3-2, and 4). Reference numeral 13 in FIG. 136 denotes a common contact serving as these contacts.

In this embodiment, since the contact of a source region and the contact of the p-type region 5 are used common, a mask pattern can be simplified, and a contact-contact interval is not required. For this reason, further micropatterning can be performed.

Embodiment 83

FIG. 137 is a plan view showing a sense amplifier portion of a DRAM according to the 83rd embodiment of the present invention. In this embodiment, a contact 12 with a control line 1 is formed in a p-type region 5 in Embodiment 77 (arrangements 1-1, 1-2, 3-1, 3-2, 3-4, and 4).

In this embodiment, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

The sources of all the transistors are connected to the control line 1, and the control line 1 is connected to the p-type region 5, so that the source and substrate of each transistor have equal potentials. That is, the substrate potentials of all the sense amplifiers can be made equal to each other, and equal threshold values can be obtained by all the sense amplifiers regardless of the changes of the substrate potentials. For this reason, the sense amplifiers are simultaneously operated. Therefore, there is advantageously no column (defective column) which is erroneously operated by receiving noise generated by a change in potential of the adjacent bits caused by delay of the start of a sensing operation.

The substrate potentials are not set in a floating state, and storage of holes in a channel portion and a decrease in drain breakdown voltage can be prevented, thereby improving reliability of a sensing operation.

Embodiment 84

FIG. 138 is a plan view showing a sense amplifier portion of a DRAM according to the 84th embodiment of the present invention. In this embodiment, the contact between a p-type region 5 and a control line 1 and the contact between a common source and the control line 1 in Embodiment 83 are used common (arrangements 1-1, 1-2, 2-1, 3-1, 3-2, 3-4, and 4). Reference numeral 13 in FIG. 138 denotes a common contact serving as these contacts.

In this embodiment, since the contact of a source region and the contact of the p-type region 5 are used common, a mask pattern can be simplified, and a contact-contact interval is not required. For this reason, further micropatterning can be performed.

Embodiment 85

FIG. 139 is a plan view showing a sense amplifier portion of a DRAM according to the 85th embodiment of the present invention. In this embodiment, a contact 12 with a control line 1 is formed in a p-type region 5 in Embodiment 78 (arrangements 1-1, 1-2, 2-2, 3-1, 3-2, 3-4, and 4).

Referring to FIG. 139, the substrate potentials of all sense amplifiers can be made equal to each other. For this reason, since equal threshold values can be obtained by all the sense amplifiers regardless of the changes of the substrate potentials, the sense amplifiers are simultaneously operated. Therefore, there is advantageously no column (defective column) which is erroneously operated by receiving noise generated by a change in potential of the adjacent bits caused by delay of the start of a sensing operation.

The common source of transistors is connected to the control line 1, and the control line 1 is connected to the p-type region 5, so that the source and substrate of each transistor have equal potentials. Therefore, the substrate potentials are set not set in a floating state, and storage of holes in a channel portion and a decrease in drain breakdown voltage can be prevented, thereby improving reliability of a sensing operation.

The p-type regions 5 are vertically connected to each other. For this reason, even if masks are vertically shifted from each other, the p-type regions 5 can be reliably formed in the channel portions.

In addition, the p-type regions 5 are formed in both the W-direction ends of two thin-film SOI-nMOSFETs constituting the sense amplifier. For this reason, even if masks are shifted from each other in the W direction (bit line direction in this case), a predetermined gate width W can be kept.

Embodiment 86

FIG. 140 is a plan view showing a sense amplifier portion of a DRAM according to the 86th embodiment of the present invention. In this embodiment, the contact between a p-type region 5 and a control line 1 and the contact between a common source and the control line 1 in Embodiment 85 are used common (arrangements 1-1, 1-2, 2-1, 2-2, 3-2, 3-4, and 4). Reference numeral 13 in FIG. 140 denotes a common contact serving as these contacts.

In this embodiment, since the contact of a source region and the contact of the p-type region 5 are used common, a mask pattern can be simplified, and a contact-contact interval is not required. For this reason, further micropatterning can be performed.

The embodiments have been described with respect to nMOSFETs. However, when an n-type region is formed in a portion of the source or drain of a sense amplifier constituted by pMOSFETs, the same effect as described above can be obtained.

Embodiment 87

FIGS. 141 and 142 are for explaining a DRAM according to the 87th embodiment of the present invention, in which FIGS. 141 and 142 are plan views showing patterns of sense amplifiers.

FIG. 141 employs an arrangement 1-1, and FIG. 142 employs arrangements 1-1 and 3-1.

The arrangement in FIG. 142 is obtained by shifting sense amplifiers SA1 and SA2 from each other in a bit line direction. When the sense amplifiers are shifted from each other as in FIG. 141, moderation of design rules such as a large drain-contact portion, a large source-contact portion, and a large gate length of a transistor can be preferably obtained.

Considering the sense amplifier SA1 in FIGS. 141 and 142, a p-type region 5 is formed in portions of the drains of two thin-film SOI-nMOSFETs Q1 and Q2 constituting a pair.

In this manner, the substrate potentials of one pair of thin-film SOI nMOSFETs for detecting a potential difference can be made equal to each other. For this reason, even if the threshold values change, the changes in threshold value are equal to each other. Therefore, potential difference detection can be performed without a hitch.

Embodiment 88

FIGS. 143A, 143B, and 144 are for explaining a DRAM according to the 88th embodiment of the present invention, in which FIG. 143A is a circuit diagram showing the arrangement of a boosting circuit using SOI-MOSFETs, FIG. 143B is a timing chart of the boosting circuit, and FIG. 144 is a sectional view showing an SOI-MOSFET according to this embodiment.

FIGS. 143A and 144 show a boosting capacitor C1, a capacitor driver I1, an output MOSFET M1, a precharge MOSFET M2, a first electrode N1, a second electrode N2, a third electrode N3, a first clock $\Phi 1$, a second clock $\Phi 2$, a gate G1 of the output MOSFET, a gate oxide film T1 of the output MOSFET, a diffusion layer D1 on the first electrode side of the output MOSFET, a diffusion layer D2 on the third electrode side of the output MOSFET, a narrow bandgap diffusion layer ND1 of the output MOSFET, a narrow bandgap diffusion layer Si of the output MOSFET, a buried oxide film layer 33, and a monocrystal silicon film 34.

In this embodiment, an SIMOX substrate formed in the following manner was used. That is, after oxygen was ion-implanted in a p-type <100> Si substrate at an acceleration voltage of 180 kV and a dose of $4 \times 10^{17}$ cm$^{-2}$, the resultant structure was annealed at 1,300° C. for 6 hours to form the buried oxide film 33 having a thickness of 80 nm, and the surface of the resultant structure was monocrystallized to obtain the monocrystal silicon layer 34. After the silicon film T1 was thinned by thermal oxidization and wet etching to have a thickness of 100 nm, MOS processing using a polysilicon gate electrode obtained by conventional phosphorus diffusion was performed to manufacture an element.

Upon processing of the gate electrode G1, Ge was implanted in the resultant structure at an acceleration voltage of 50 kV and a dose of $1 \times 10^{16}$ cm$^{-2}$ using the gate G1 as a mask. The resultant structure was annealed at 850° C. for 30 minutes, and arsenic was implanted in the resultant structure at an acceleration voltage of 40 keV and a dose of $3 \times 10^{15}$ cm$^{-2}$. Thereafter, the resultant structure was annealed at 850° C. for 90 minutes. The Si—Ge region ND1 formed at this time had a concentration peak corresponding to 10% of Si at a depth of about 40 nm from the surface of the n-type diffusion layer.

At this time, in the boosting pump circuit (FIG. 143A) having the boosting capacitor C having the first electrode N1 and the second electrode N2, Ge was implanted in an impurity diffusion layer region D1 connected to the first electrode N1 of the n-type SOI-MOSFET (M1 in FIG. 143A for connecting at least the first electrode N1 and the output electrode N3. Note that Ge may be implanted in both the region D1 and the impurity diffusion layer region D2 connected to the output electrode N3 of the MOSFET (M1).

The former is shown in FIG. 145A, and the latter is shown in FIG. 145B. In FIGS. 145A and 145B, reference numerals 61 and 71 denote gates; 62 and 72, gate oxide films; 63 and 73, diffusion layers; 64, 74, and 78, narrow bandgap diffusion layers in which Ge is implanted; 65 and 75, diffusion layers; 66 and 76, monocrystal silicon layers; 67 and 77, buried oxide film layers.

In this manner, the boosting capacitor C1 performs discharge from the second electrode N2, and the potential of the first electrode N1 is lowered, in the n-type SOI-MOSFET (M1) in which the first electrode N1 and the output N3 are connected to each other, the potential of the substrate portion of the SOI-MOSFET (M1) is lowered by capacity coupling between the substrate portion and the first electrode N1. For this reason, the cut-off characteristics change to be improved, and trigger which causes drain breakdown can be advantageously avoided.

When the potential of the first electrode N1 is lower than an output voltage, holes generated for some reasons such as slight drain breakdown are absorbed in the narrow bandgap semiconductor portion ND1 to suppress a substrate floating effect, thereby preventing drain breakdown. In addition, when the gate length of the SOI-MOSFET (M1) is increased, an electric field to be applied is moderated, and a drain breakdown voltage can be increased.

As a method of forming a narrow bandgap material in this embodiment, a method in which an Si—Ge region is formed by ion-implanting Ge is used. However, an MBE method or a CVD method may be used to form an Si—Ge region as a matter of course. In addition, when Sn (Tin) is implanted in silicon in place of Ge, the object of the present invention can be achieved. In this case, when Ge and Sn are implanted at once, the same effect as described above can be obtained. Although IV group elements are used in the above description, a bandgap may be narrowed by a semiconductor material consisting of a III–V group element and a II–VI group element.

The present invention is not limited to a semiconductor element formed on a thin-film SOI substrate. The present invention can be applied to a semiconductor element on a thick-film SOI substrate or a semiconductor element using amorphous silicon and represented by a TFT element, and can provide an integrated circuit constituted by an SOI element having a substrate floating effect which is suppressed.

In not only a pump circuit but also a circuit in which a current generally flows in a specific n-type SOI-MOSFET in a single direction, the narrow bandgap semiconductor portion is formed in at least a portion of only a diffusion layer electrode from which a current flows, and a diffusion layer having a bandgap width equal to that of the channel portion of the SOI-MOSFET is formed in an electrode into which a current flows. In this manner, a substrate floating effect is suppressed in a cut-off operation of a current to improve the cut-off characteristics, and the substrate floating effect is not suppressed in a flowing operation of a current to positively decrease the threshold value of the SOI-MOSFET, thereby providing a preferable element having good backward cut-off characteristics and a high forward conductance.

Embodiment 89

FIG. 146A is a sectional view showing a diode obtained by a pn junction according to the 89th embodiment of the present invention, FIGS. 146B and 146C are views showing equivalent circuits of the diode in FIG. 146A, and FIG. 147 is a circuit diagram showing a circuit using the diode in FIG. 146A. FIGS. 146A to 146C and 147 show an element isolation region 40, a p-type diffusion layer 41, an n-type diffusion layer 42, an n-type diffusion layer 43, an n-type diffusion layer 44, narrow bandgap regions 45 obtained by implanting Ge, a p-type diffusion layer 46, a diode D11, a diode D12 according to the present invention, an anode N5 of the diode D11, a cathode N6 of the diode D11, an anode N7 of the diode D12, a cathode N8 of the diode D12, and resistors R11, R12, and R21.

In this embodiment, an SIMOX substrate formed in the following manner was used. That is, after oxygen was ion-implanted in a p-type <100> Si substrate at an acceleration voltage of 180 kV and a dose of $4 \times 10^{17}$ cm$^{-2}$, the resultant structure was annealed at 1,300° C. for 6 hours to form a buried oxide film having a thickness of 80 nm, and the surface of the resultant structure was mono-crystallized to obtain the monocrystal silicon layer. After the silicon film was thinned by thermal oxidization and wet etching to have a thickness of 100 nm, MOS processing using a polysilicon gate electrode obtained by conventional phosphorus diffusion was performed to manufacture an element. Upon processing of a gate electrode, Ge was implanted in the resultant structure at an acceleration voltage of 50 kV and a dose of $1 \times 10^{16}$ cm$^{-2}$ the gate as a mask. The resultant structure was annealed at 850° C. for 30 minutes, and arsenic was implanted in the resultant structure at an acceleration voltage of 40 keV and a dose of $3 \times 10^{15}$ cm$^{-2}$. Thereafter, the resultant structure was annealed at 850° C. for 90 minutes. The Si—Ge region 45 formed at this time had a concentration peak corresponding to 10% of Si at a depth of about 40 nm from the surface of the n-type diffusion layer.

At this time, assuming that a region in which Ge is implanted is the region 45 shown in FIGS. 146A to 146C, the diode D11 obtained by a pn junction of general Si and the diode D12 obtained by a p-type $Si_xGe_{(1-x)}$-n-type Si junction can be simultaneously obtained. About 0.1 V which is the difference between the threshold values of the diodes can be used as a reference potential.

As a method of forming a narrow bandgap material in this embodiment, a method in which an Si—Ge region is formed by ion-implanting Ge is used. However, an MBE method or a CVD method may also alternatively be used to form an Si—Ge region as a matter of course. In addition, when Sn (Tin) is implanted in silicon in place of Ge, the object of the present invention can be achieved. In this case, when Ge and Sn are implanted at once, the same effect as described above can be obtained. Although IV group elements are used in the above description, a bandgap may be narrowed by a semiconductor material consisting of a III–V group element and a II–VI group element.

The present invention is not limited to a semiconductor element formed on a thin-film SOI substrate. The present invention can be applied to a semiconductor element on a thick-film SOI substrate or a semiconductor element using amorphous silicon and represented by a TFT element, and can provide an integrated circuit constituted by an SOI element having a substrate floating effect which is suppressed.

The present invention is not limited to the above embodiments described above, and various changes and modifications of the present invention may be effected without departing from the spirit and scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor layer used as a substrate formed on an insulating film; and
   a plurality of MOS transistors arranged in said semiconductor layer and each having a gate, a source, and a drain, a pair of MOS transistors of said plurality of MOS transistors forming a detection circuit to detect magnitudes of potentials applied to gates of said pair of MOS transistors as a difference between conductances of said pair of MOS transistors,
   wherein at least a portion of at least one of said source and said drain of each of said plurality of MOS transistors comprises a Ge-doped Si region.

2. A semiconductor device according to claim 1, wherein a bottom of said at least one of said source and said drain of each of said pair of MOS transistors reaches said insulating film.

3. A semiconductor device according to claim 2, wherein said detection circuit includes a sense amplifier having a flip-flop arrangement and a sense amplifier having a current mirror arrangement.

4. A semiconductor device according to claim 2, wherein said Ge-doped Si region is a common source portion of an n-type MOS transistor connected to a flip-flop which constructs a sense amplifier.

5. A semiconductor device according to claim 2, wherein said Ge-doped Si region is a source electrode of an n-type MOS transistor of a voltage difference detection portion of a current-mirror differential amplifier, in which a pair of n-type MOS transistors is a voltage detection portion.

6. A semiconductor device according to claim 2, wherein said Ge-doped Si region further includes doped Sn ion.

7. A semiconductor device according to claim 2, further comprising a diffusion layer of a same conductivity type as that of said semiconductor layer, arranged in one of portions of sources and drains of said pair of MOS transistors, for directly connecting portions serving as a substrate of each of said pair of MOS transistors to each other.

8. A semiconductor device according to claim 7, further comprising a contact formed in said diffusion layer to be connected to one of one of a power supply line and a signal line.

9. A semiconductor device according to claim 7, wherein a substrate contact is shared by a source contact.

10. A semiconductor device according to claim 7, wherein said detection circuit includes a plurality of sense amplifiers which are arranged along a plurality of bit lines, and said diffusion layer is shared by said plurality of sense amplifiers and is arranged along a word line direction perpendicular to said plurality of bit lines.

11. A semiconductor device according to claim 7, wherein said detection circuit includes a plurality of sense amplifiers which are arranged along a plurality of bit lines, and said plurality of sense amplifiers are arranged to be shifted from each other along a bit line direction.

12. A semiconductor device according to claim 7, wherein said detection circuit includes a plurality of sense amplifiers which are arranged along a plurality of bit lines, and each of said plurality of sense amplifiers is arranged every four bit lines including a through bit line of said plurality of bit lines.

13. A semiconductor device according to claim 7, wherein gates of said plurality of MOS transistors are vertically arranged.

14. A semiconductor device according to claim 7, wherein said diffusion layer is formed in ends of gates of said plurality of MOS transistors.

15. A semiconductor device according to claim 7, wherein said detection circuit includes a plurality of sense amplifiers which are arranged along a plurality of bit lines, and said plurality of bit lines cross each other.

16. A semiconductor device according to claim 7, wherein a lower portion of said diffusion layer is in contact with said insulating film.

17. A semiconductor device comprising:
   a semiconductor layer used as a substrate formed on an insulating film; and
   a plurality of MOS transistors arranged in said semiconductor layer and each having a gate, a source, and a drain, a pair of MOS transistors of said plurality of MOS transistors forming a detection circuit to detect magnitudes of potentials applied to gates of said pair of MOS transistors as a difference between conductances of said pair of MOS transistors,
   wherein at least a portion of at least one of said source and said drain of each of said plurality of MOS transistors comprises a doped Si region having a bandgap width smaller than that of a Si crystal.

18. A semiconductor device according to claim 17, wherein a bottom of said at least one of said source and drain of each of said MOS transistors reaches said insulating film.

19. A semiconductor device according to claim 18, wherein said detection circuit includes a sense amplifier having a flip-flop arrangement and a sense amplifier having a current mirror arrangement.

20. A semiconductor device according to claim 18, wherein said doped Si region is a common source portion of an n-type MOS transistor connected to a flip-flop which constructs a sense amplifier.

21. A semiconductor device according to claim 18, wherein said doped Si region is a source electrode of an n-type MOS transistor of a voltage difference detection portion of a current-mirror differential amplifier, in which a pair of n-type MOS transistors is a voltage detection portion.

22. A semiconductor device according to claim 18, wherein said doped Si region further includes doped Sn ion.

23. A semiconductor device according to claim 18, further comprising a diffusion layer of a same conductivity type as that of said semiconductor layer, arranged in one of portions of sources and drains of said pair of MOS transistors, for directly connecting portions serving as a substrate of each of said pair of MOS transistors to each other.

24. A semiconductor device according to claim 23, further comprising a contact formed in said diffusion layer to be connected to one of a power supply line and a signal line.

25. A semiconductor device according to claim 23, wherein a substrate contact is shared by a source contact.

26. A semiconductor device according to claim 23, wherein said detection circuit includes a plurality of sense amplifiers which are arranged along a plurality of bit lines, and said diffusion layer is shared by said plurality of sense amplifiers and is arranged along a word line direction perpendicular to said plurality of bit lines.

27. A semiconductor device according to claim 23, wherein said detection circuit includes a plurality of sense amplifiers which are arranged along a plurality of bit lines, and said plurality of sense amplifiers are arranged to be shifted from each other along a bit line direction.

28. A semiconductor device according to claim 23, wherein said detection circuit includes a plurality of sense amplifiers which are arranged along a plurality of bit lines, and each of said plurality of sense amplifiers is arranged every four bit lines including a through bit line of said plurality of bit lines.

29. A semiconductor device according to claim 23, wherein gates of said plurality of MOS transistors are vertically arranged.

30. A semiconductor device according to claim 23, wherein said diffusion layer is formed in ends of gates of said plurality of MOS transistors.

31. A semiconductor device according to claim 23, wherein said detection circuit includes a plurality of sense amplifiers which are arranged along a plurality of bit lines, and said plurality of bit lines cross each other.

32. A semiconductor device according to claim 23, wherein a lower portion of said diffusion layer is in contact with said insulating film.

33. A semiconductor device comprising:

a semiconductor layer used as a substrate formed on an insulating film; and a plurality of MOS transistors arranged in said semiconductor layer and each having a gate, a source, and a drain, a pair of MOS transistors of said plurality of MOS transistors forming a current mirror circuit, gate electrodes of said pair of MOS transistors are electrically connected to each other, and a bottom of said source and said drain of each of said pair of MOS transistors reaches said insulating film, wherein at least a portion of at least one of said source and said drain of each of said pair of MOS transistors comprises a Ge-doped Si region.

34. A semiconductor device according to claim 33, wherein a body of said pair of MOS transistors are electrically connected to each other.

* * * * *